US010539714B2

(12) United States Patent
Ishii et al.

(10) Patent No.: US 10,539,714 B2
(45) Date of Patent: Jan. 21, 2020

(54) RETARDATION PLATE AND CIRCULARLY POLARIZING PLATE

(71) Applicant: DIC Corporation, Tokyo (JP)

(72) Inventors: Toru Ishii, Kita-adachi-gun (JP); Yoshiyuki Ono, Kita-adachi-gun (JP)

(73) Assignee: DIC CORPORATION, Tokyo (JP)

( * ) Notice: Subject to any disclaimer, the term of this patent is extended or adjusted under 35 U.S.C. 154(b) by 0 days.

(21) Appl. No.: 15/543,449

(22) PCT Filed: Jan. 12, 2016

(86) PCT No.: PCT/JP2016/050662

§ 371 (c)(1),
(2) Date: Jul. 13, 2017

(87) PCT Pub. No.: WO2016/114254

PCT Pub. Date: Jul. 21, 2016

(65) Prior Publication Data

US 2018/0031738 A1 Feb. 1, 2018

(30) Foreign Application Priority Data

Jan. 16, 2015 (JP) ................................ 2015-006301

(51) Int. Cl.

| | |
|---|---|
| ***C09K 19/38*** | (2006.01) |
| ***G02B 1/08*** | (2006.01) |
| ***C09K 19/54*** | (2006.01) |
| ***C08F 222/10*** | (2006.01) |
| ***C08F 220/38*** | (2006.01) |
| ***G02B 5/30*** | (2006.01) |
| ***H01L 51/00*** | (2006.01) |
| *H01L 51/52* | (2006.01) |

(52) U.S. Cl.

CPC .............. *G02B 1/08* (2013.01); *C08F 220/38* (2013.01); *C08F 222/10* (2013.01); *C09K 19/38* (2013.01); *C09K 19/3852* (2013.01); *C09K 19/3861* (2013.01); *C09K 19/54* (2013.01); *G02B 5/3016* (2013.01); *H01L 51/004* (2013.01); *H01L 51/0043* (2013.01); *H01L 51/5281* (2013.01)

(58) Field of Classification Search

CPC ...................................................... C09K 19/38

See application file for complete search history.

(56) References Cited

U.S. PATENT DOCUMENTS

| | | | |
|---|---|---|---|
| 6,565,974 | B1 | 5/2003 | Uchiyama et al. |
| 2010/0053510 | A1 | 3/2010 | Bitou et al. |
| 2017/0047555 | A1 | 2/2017 | Ishiguro et al. |

FOREIGN PATENT DOCUMENTS

| | | | | | |
|---|---|---|---|---|---|
| JP | 5-100114 | A | | 4/1993 | |
| JP | 11-231132 | A | | 8/1999 | |
| JP | 2003-270435 | A | | 9/2003 | |
| JP | 2007-304444 | A | | 11/2007 | |
| JP | 2007304444 | A | * | 11/2007 | |
| JP | 2008-165185 | A | | 7/2008 | |
| JP | 2008165185 | A | * | 7/2008 | ........... G02B 5/3083 |
| JP | 2009-134257 | A | | 6/2009 | |
| JP | 2009134257 | A | * | 6/2009 | ............. B29C 55/08 |
| JP | 2013-3212 | A | | 1/2013 | |
| JP | 2013003212 | A | * | 1/2013 | |
| WO | 00/026705 | A1 | | 5/2000 | |
| WO | WO-00/26705 | | * | 5/2000 | |
| WO | 2013/146633 | A1 | | 10/2013 | |
| WO | 2014/132978 | A1 | | 9/2014 | |
| WO | WO-2014132978 | A1 | * | 9/2014 | ........... G02B 5/3083 |
| WO | 2015/166991 | A1 | | 11/2015 | |

OTHER PUBLICATIONS

International Search Report dated Apr. 12, 2016, issued in counterpart International Application No. PCT/JP2016/050662 (2 pages).

* cited by examiner

*Primary Examiner* — Chanceity N Robinson

(74) *Attorney, Agent, or Firm* — Westerman, Hattori, Daniels & Adrian, LLP

(57) ABSTRACT

A retardation plate is formed by laminating at least two retardation plates of a retardation plate 1 and a retardation plate 2, in which at least one of the retardation plate 1 and the retardation plate 2 is formed of a polymer of a polymerizable liquid crystal composition. It is possible to provide a retardation plate imparting a phase difference of ¼ wavelength over a wide wavelength region, a circularly polarizing plate having excellent anti-reflection performance over a wide wavelength region, and a display element or a light-emitting element having excellent visibility.

7 Claims, No Drawings

RETARDATION PLATE AND CIRCULARLY POLARIZING PLATE

TECHNICAL FIELD

The present invention relates to a retardation plate imparting a phase difference of ¼ wavelength over a wide wavelength region, a circularly polarizing plate having excellent anti-reflection performance over a wide wavelength region, and a display element or a light-emitting element having excellent visibility.

BACKGROUND ART

In the related art, a ¼ wavelength plate formed of a sheet of a retardation plate has a problem of poor visibility. Since a wavelength imparting a phase difference of ¼ wavelength is limited to a specific wavelength, anti-reflection performance cannot be sufficiently obtained at wavelengths other than the vicinity of the specific wavelength imparting a phase difference of ¼ wavelength so that a display or the like appears as if it were colored in blue, purple, red, or the like in a case where the ¼ wavelength plate is used as an anti-reflection filter for suppressing surface reflection of a display or the like.

For this problem, a retardation plate formed by laminating a plurality of retardation plates such that the optical axes thereof intersect with each other has been proposed (PTLs 1 to 3). For example, according to PTL 2, it has been reported that, in a case where the wavelength characteristics of a retardation plate are defined using a phase difference ratio represented by a ratio Re (450)/Re (550) of a phase difference Re (450) at a wavelength of 450 nm to a phase difference Re (550) at a wavelength of 550 nm, excellent anti-reflection performance can be obtained when a retardation plate formed by laminating two retardation plates, which are one retardation plate having a phase difference ratio of 1.16 and another retardation plate having a phase difference ratio of 1.025, is used. Further, according to PTL 3, it has been reported that excellent anti-reflection performance can be obtained when a retardation plate formed by laminating two retardation plates, both of which have a phase difference ratio of 1.005, is used.

However, in all cases of the retardation plates of PTLs 1 to 3, the wavelength region imparting a phase difference of ¼ wavelength is not sufficiently wide and the wavelength region imparting excellent anti-reflection performance is also not sufficiently wide in a case where a circularly polarizing plate is produced by laminating a polarizing plate on any of these retardation plate. As the result, the visibility of a display or the like which includes the retardation plate or the circularly polarizing plate is not sufficiently improved. Specifically, a slight amount of reflected light which cannot be prevented when the display or the like is observed from an oblique direction is always generated, but there is a problem in that the slight amount of reflected light does not appear achromatic but appears as if the light were colored in blue, purple, red, or the like. This coloration means that the surrounding environment of an observer, particularly, a fluorescent lamp or the sun is reflected on a display or the like by being colored in blue, purple, red, or the like. Accordingly, this coloration is an extremely serious problem from the viewpoint, of the visibility of a display or the like.

Further, all of PTLs 1 to 3 have a problem in that the thickness of the retardation plate is extremely thick for a display or the like which is constantly required to be thin because a stretched film having a film thickness of several tens of micrometers is laminated so that the thickness of the retardation plate on which the stretched film is laminated is 150 to 200 μm.

In addition, all of PTLs 1 to 3 also have a problem in that a single wafer system having poor production efficiency must be adopted in a process of laminating a polarizing plate and a retardation plate such that a slow axis of the retardation plate and a transmission axis of the polarizing plate intersect with each other because a stretched film in which a slow axis is fixed in a stretching direction, is used.

CITATION LIST

Patent Literature

[PTL 1] JP-A-05-100114
[PTL 2] JP-A-11-231132
[PTL 3] JP-A-2003-270435

SUMMARY OF INVENTION

Technical Problem

An object, of the present invention is to provide a retardation plate imparting a phase difference of ¼ wavelength over a wide wavelength region, a circularly polarizing plate having excellent anti-reflection performance over a wide wavelength region, and a display element or a light-emitting element having excellent visibility.

Solution to Problem

The present inventors have conducted intensive research by focusing on the wavelength characteristics of the retardation plate to be laminated in order to solve the problems, thereby completing the present invention. In other words, the present invention provides a retardation plate which is formed by laminating at least two retardation plates of a retardation plate 1 and a retardation plate 2, in which at least one of the retardation plate 1 and the retardation plate 2 is formed of a polymer of a polymerizable liquid crystal composition, a phase difference at a wavelength of 550 nm of the retardation plate 1 is greater than a phase difference at a wavelength of 550 nm of the retardation plate 2, a phase difference ratio represented by Re (450)/Re (550), which is a ratio of a phase difference Re (450) at a wavelength of 450 nm to a phase difference Re (550) at a wavelength of 550 nm of one of the retardation plate 1 and the retardation plate 2, is 0.95 or less, and the phase difference ratio represented by Re (450)/Re (550) of the other retardation plate is 1.05 or less; a circularly polarizing plate which is formed by laminating a polarizing plate on the retardation plate; and a display element, or a light-emitting element which includes the circularly polarizing plate.

Advantageous Effects of Invention

The retardation plate of the present, invention is a retardation plate imparting a phase difference of ¼ wavelength over a wide wavelength region, the circularly polarizing plate of the present invention formed by laminating a polarizing plate on the retardation plate of the present invention is a circularly polarizing plate having excellent anti-reflection performance over a wide wavelength region, and the display or the like including the retardation plate of the present invention or the circularly polarizing plate of the present invention has remarkably excellent visibility and is capable of making a slight amount of reflected light appear achromatic when observed from an oblique direction.

Further, the thickness of the retardation layer of the present invention is 1 to 50 μm and the thickness thereof can be reduced to 1% to 50% as compared with the thickness of a retardation layer of the related art. Further, since the slow axis of the polarizable liquid crystal can be adjusted in an arbitrary direction by an alignment treatment of a base material, a roll-to-roll system with extremely high production efficiency can be adopted in the process of laminating the retardation plate and the polarizing plate such that the slow axis of the retardation plate and the transmission axis of the polarizing plate intersect with each other.

DESCRIPTION OF EMBODIMENTS

A retardation plate of the present invention is a retardation plate which is formed by laminating at least, two retardation plates of a retardation plate 1 and a retardation plate 2, in which at least one of the retardation plate 1 and the retardation plate 2 is formed of a polymer of a polymerizable liquid crystal composition, a phase difference at a wavelength of 550 nm of the retardation plate 1 is greater than a phase difference at a wavelength of 550 nm of the retardation plate 2, a phase difference ratio represented by Re (450)/Re (550), which is a ratio of a phase difference Re (450) at a wavelength of 450 nm to a phase difference Re (550) at a wavelength of 550 nm, of one of the retardation plate 1 and the retardation plate 2, is 0.95 or less, and the phase difference ratio represented by Re (450)/Re (550) of the other retardation plate is 1.05 or less.

<Retardation Plate>

The retardation plate of the present invention is formed by laminating at least two retardation plates of the retardation plate 1 and the retardation plate 2.

As the retardation plate 1 and the retardation plate 2, various materials such as a stretched film, optical crystals, and a polymer of a polymerizable liquid crystal composition can be used, but at least one of the retardation plate 1 and the retardation plate 2 is formed of a polymer of a polymerizable liquid crystal composition.

As the stretched film, a stretched cyclic polyolefin (COP) film, a stretched triacetyl cellulose (TAC) film, a stretched diacetyl cellulose (DAC) film, a stretched cellulose acetate propionate (CAP) film, a stretched cellulose acetate butyrate (CAB) film, a stretched polyethylene terephthalate (PET) film, a stretched polycarbonate (PC) film, a stretched polypropylene (PP) film, or a stretched polyethylene (PE) film can be used.

As the optical crystals, calcite, barium borate crystals, yttrium vanadate crystals, or titanium oxide single crystal can be used.

As the polymer of a polymerizable liquid crystal composition, a polymer formed by polymerizing the following polymerizable liquid crystal composition can be used.

At least one of the retardation plate 1 and the retardation plate 2 is formed of a polymer of a polymerizable liquid crystal composition, but it is more preferable that the both of the retardation plate 1 and the retardation plate 2 are formed of a polymer of a polymerizable liquid crystal composition.

The phase difference at a wavelength of 550 nm of the retardation plate 1 is greater than the phase difference at a wavelength of 550 nm of the retardation plate 2, the phase difference ratio represented by Re (450)/Re (550), which is a ratio of the phase difference Re (450) at a wavelength of 450 nm to the phase difference Re (550) at a wavelength of 550 nm of one of the retardation plate 1 and the retardation plate 2, is 0.95 or less, and the phase difference ratio represented by Re (450)/Re (550) of the other retardation plate is 1.05 or less. It is preferable that the retardation plate 1 with a larger phase difference which has a phase difference ratio of 0.95 or less and the retardation plate 2 with a smaller phase difference which has a phase difference ratio of 1.05 or less are used. It is more preferable that the retardation plate 1 and the retardation plate 2, both of which have a phase difference ratio of 0.95 or less, are used.

In the retardation plate of the present invention, a phase difference of ¼ wavelength over a wide wavelength region can be obtained by setting the phase difference ratio of at least, one retardation plate of the retardation plate 1 and the retardation plate 2 to 0.95 or less and setting the phase difference ratio of the other retardation plate to 1.05 or less.

A phase difference Re1 (550) at a wavelength of 550 nm of the retardation plate 1 is preferably 230 to 290 nm and more preferably 250 to 270 nm. A retardation Re2 (550) at a wavelength of 550 nm of the retardation plate 2 is preferably 115 to 145 nm and more preferably 120 to 140 nm.

<Polymerizable Liquid Crystal Composition>

As the polymerizable liquid crystal composition used in the present invention, a polymerizable liquid crystal composition containing a liquid crystalline compound having one or more polymerizable groups can be used. In the present invention, the "liquid crystalline compound" is intended to show a compound having a mesogenic skeleton and the compound alone does not need to exhibit liquid crystallinity. Further, a polymerizable compound can be made into a polymer (or a film) by performing a polymerization treatment by means of irradiating the polymerizable composition with light such as ultraviolet rays or heating the polymerizable composition.

It is preferable that the birefringence of the liquid crystalline compound having one or more polymerizable groups is larger on a long wavelength side than on a short wavelength side in a visible light region. Among the examples of the liquid crystalline compound, a liquid crystalline compound which contains one polymerizable group and satisfies Formula (I) is preferable. Further, it is sufficient that the liquid crystalline compound containing one or more polymerizable groups satisfies Formula (I), and the birefringence thereof does not need to be larger on a long wavelength side than on a short wavelength side in an ultraviolet region or an infrared region.

$$\mathrm{Re}(450\ \mathrm{nm})/\mathrm{Re}(550\ \mathrm{nm})<1.0 \tag{I}$$

(In the formula, Re (450 nm) represents an in-plane phase difference of the liquid crystalline compound at a wavelength of 450 nm when a long axis direction of a molecule on a substrate is substantially aligned horizontally with respect to the substrate and Re (550 nm) represents an in-plane phase difference of the liquid crystalline compound at a wavelength of 550 nm when a long axis direction of a molecule on a substrate is substantially aligned horizontally with respect to the substrate.)

It is preferable that the polymerizable liquid crystal composition used in the present invention contains at least one liquid crystalline compound represented by any of Formulae (1) to (7).

[Chem. 1]

$$P^{11}\!-\!\left(S^{11}-X^{11}\right)_{m11}\!-\!MG^{11}\!-\!R^{11} \tag{1}$$

-continued $$P^{21}-(S^{21}-X^{21})_{m2}-MG^{21}-(X^{22}-S^{22})_{n2}-P^{22} \quad (2)$$

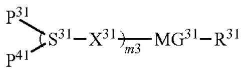

(3)

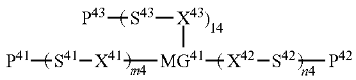

(4)

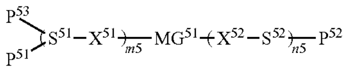

(5)

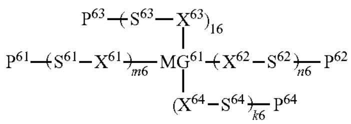

(6)

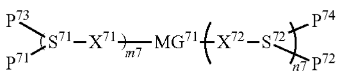

(7)

(In Formulae, $P^{11}$ to $P^{74}$ each represent a polymerizable group, $S^{11}$ to $S^{72}$ each represent a spacer group or a single bond, and in a case where a plurality of each of $S^{11}$ to $S^{72}$ is present, these may be the same as or different from each other, $X^{11}$ to $X^{72}$ represent —O—, —S—, —$OCH_2$—, —$CH_2O$—, —CO—, —COO—, —OCO—, —CO—S—, —S—CO—, —O—CO—O—, —CO—NH—, —NH—CO—, —$SCH_2$—, —$CH_2S$—, —$CF_2O$—, —$OCF_2$—, —$CF_2S$—, —$SCF_2$—, —CH═CH—COO—, —CH═CH—OCO—, —COO—CH═CH—, —OCO—CH═CH—, —COO—$CH_2CH_2$—, —OCO—$CH_2CH_2$—, —$CH_2CH_2$—COO—, —$CH_2CH_2$—OCO—, —COO—$CH_2$—, —OCO—$CH_2$—, —$CH_2$—COO—, —$CH_2$—OCO—, —CH═CH—, —N═N—, —CH═N—N═CH—, —CF═CF—, —C≡C—, or a single bond, and in a case where a plurality of each of $X^{11}$ to $X^{72}$ is present, these may be the same as or different from each other (where, each P—(S—X)— bond does not have —O—O—), $MG^{11}$ to $MG^{71}$ each independently represent Formula (a):

[Chem. 2]

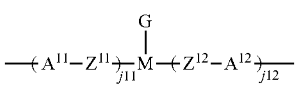

(a)

(in the formula, $A^{11}$ and $A^{12}$ each independently represent, a 1,4-phenylene group, a 1,4-cyclohexylene group, a pyridine-2,5-diyl group, a pyrimidine-2,5-diyl group, a naphthalene-2,6-diyl group, a naphthalene-1,4-diyl group, a tetrahydronaphthalene-2,6-diyl group, a decahydronaphthalene-2,6-diyl group, or a 1,3-dioxane-2,5-diyl group, these groups may be unsubstituted or substituted with one or more of $L^1$'s, and in a case where a plurality of each of $A^{11}$ and $A^{12}$ is present, these may be the same as or different from each other, $Z^{11}$ and $Z^{12}$ each independently represent —O—, —S—, —$OCH_2$—, —$CH_2O$—, —$CH_2CH_2$—, —CO—, —COO—, —OCO—, —CO—S—, —S—CO—, —O—CO—O—, —CO—NH—, —NH—CO—, —$SCH_2$—, —$CH_2S$—, —$CF_2O$—, —$OCF_2$—, —$CF_2S$—, —$SCF_2$—, —CH═CH—COO—, —CH═CH—OCO—, —COO—CH═CH—, —OCO—CH═CH—, —COO—$CH_2CH_2$—, —OCO—$CH_2CH_2$—, —$CH_2CH_2$—COO—, —$CH_2CH_2$—OCO—, —COO—$CH_2$—, —OCO—$CH_2$—, —$CH_2$—COO—, —$CH_2$—OCO—, —CH═CH—, —N═N—, —CH═N—, —N═CH—, —CH═N—N═CH—, —CF═CF—, —C≡C—, or a single bond, and in a case where a plurality of each of $Z^{11}$ and $Z^{12}$ is present, these may be the same as or different from each other, M represents a group selected from groups represented by Formula (M-1) to Formula (M-11), and these groups may be unsubstituted or substituted with one or more of $L^1$'s,

[Chem. 3]

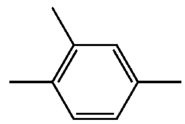

(M-1)

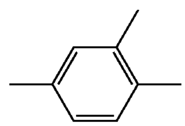

(M-2)

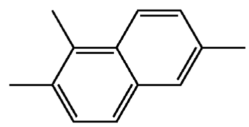

(M-3)

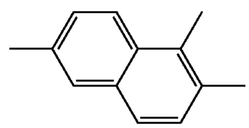

(M-4)

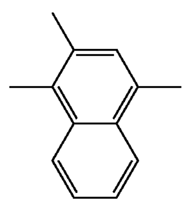

(M-5)

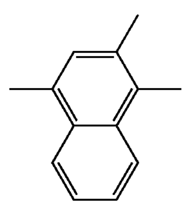

(M-6)

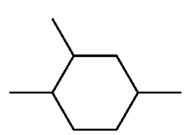

(M-7)

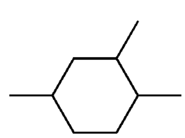

(M-8)

-continued (M-9)

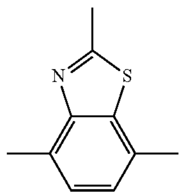

(M-10)

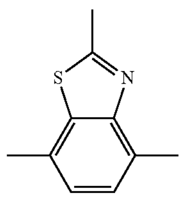

(M-11)

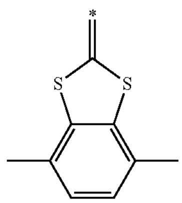

G represents a group selected from groups represented by Formula (G-1) to Formula (G-6):

[Chem. 4]

(G-1)

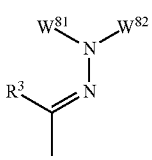

(G-2)

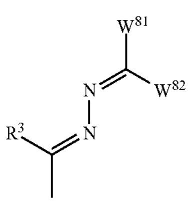

(G-3)

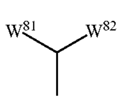

(G-4)

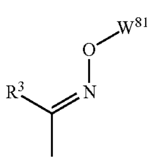

(G-5)

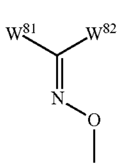

-continued (G-6)

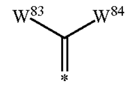

(in the formulae, $R^3$ represents a hydrogen atom or an alkyl group having 1 to 20 carbon atoms, the alkyl group may be linear or branched, one or more of arbitrary hydrogen atoms in the alkyl group may be substituted with a fluorine atom, and one —$CH_2$— or two or more of (—$CH_2$—)'s which are not adjacent to each other in the alkyl group may be each independently substituted with —O—, —S—, —CO—, —COO—, —OCO—, —CO—S—, —S—CO—, —O—CO—O—, —CO—NH—, —NH—CO—, or —C≡C—, $W^{81}$ represents a group having at least one aromatic group and 5 to 30 carbon atoms and the group may be unsubstituted or substituted with one or more of $L^1$'s, $W^{82}$ represents a hydrogen atom or an alkyl group having 1 to 20 carbon atoms, the alkyl group may be linear or branched, one or more of arbitrary hydrogen atoms in the alkyl group may be substituted with a fluorine atom, one —$CH_2$— or two or more of (—$CH_2$—)'s which are not adjacent to each other in the alkyl group may be each independently substituted with —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—, $W^{82}$ may have the same definition as that for $W^{81}$, $W^{81}$ and $W^{82}$ may be linked to each other to form the same ring structure, or $W^{82}$ represents a group represented by the following formula,

[Chem. 5]

$$P^{W82}\text{—}\left(S^{W82}\text{—}X^{W82}\right)_{nW82}$$

(in the formula, $P^{W82}$ has the same definition as that for $P^{11}$, $S^{W82}$ has the same definition as that for $S^{11}$, $X^{W82}$ has the same definition as that for $X^{11}$, and $n^{W82}$ has the same definition as that for m11), $W^{83}$ and $W^{84}$ each independently represent a halogen atom, a cyano group, a hydroxy group, a nitro group, a carboxyl group, a carbamoyloxy group, an amino group, a sulfamoyl group, a group having at least one aromatic group and 5 to 30 carbon atoms, an alkyl group having 1 to 20 carbon atoms, a cycloalkyl group having 3 to 20 carbon atoms, an alkenyl group having 2 to 20 carbon atoms, a cycloalkenyl group having 3 to 20 carbon atoms, an alkoxy group having 1 to 20 carbon atoms, an acyloxy group having 2 to 20 carbon atoms, or an alkylcarbonyloxy group having 2 to 20 carbon atoms, one —$CH_2$— or two or more of (—$CH_2$—)'s which are not adjacent to each other in the alkyl group, the cycloalkyl group, the alkenyl group, the cycloalkenyl group, the alkoxy group, the acyloxy group, and the alkylcarbonyloxy group may be each independently substituted with a group selected from —O—, —S—, —CO—, —COO—, —OCO—, —CO—S—, —S—CO—, —O—CO—O—, —CO—NH—, —NH—CO—, or —C≡C—, and G represents a group selected from, groups represented by Formula (G-1) to Formula (G-5) in a case where M represents a group selected from groups represented by Formula (M-1) to Formula (M-10) and G represents a group represented by Formula (G-6) in a case where M represents a group represented by Formula (M-11), $L^1$ represents a fluorine atom, a chlorine atom, a bromine atom, an iodine atom, a pentafluorosulfuranyl group, a nitro group, an isocyano group, an amino group, a hydroxyl group, a mercapto group, a methylamino group, a dimethylamino group, a diethylamino group, a diisopropylamino group, a trimethylsilyl group, a dimethylsilyl group, a thioisocyano group, or an alkyl group having 1 to 20 carbon atoms which may be linear or branched, in which one or more of arbitrary hydrogen atoms may be substituted with a fluorine atom, one —$CH_2$— or two or more of (—$CH_2$—)'s which are not adjacent to each other in the alkyl group may be each independently substituted with a group selected from —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—, and in a case where a plurality of $L^1$ is present, these may be the same as or different from each other, j11 represents an integer of 1 to 5, j12 represents an integer of 1 to 5, and j11+j12 represents an integer of 2 to 5), $R^{11}$ and $R^{31}$ represent a hydrogen atom, a fluorine atom, a chlorine atom, a bromine atom, an iodine atom, a pentafluorosulfuranyl group, a cyano group, a nitro group, an isocyano group, a thioisocyano group, or an alkyl group having 1 to 20 carbon atoms, the alkyl group may be linear or branched, one or more of arbitrary hydrogen atoms in the alkyl group may be substituted with a fluorine atom, and one —$CH_2$— or two or more of (—$CH_2$—)'s which are not adjacent to each other in the alkyl group may be each independently substituted with —O—, —S—, —CO—, —COO—, —OCO—, —CO—S—, —S—CO—, —O—CO—O—, —CO—NH—, —NH—CO—, or —C≡C—, m11 represents an integer of 0 to 8, and m2 to m7, n2 to n7, l4 to l6, and k6 each independently represent an integer of 0 to 5).

In Formulae (1) to (7), it is preferable that polymerizable groups $P^{11}$ to $P^{74}$ represent a group selected from groups represented by Formulae (P-1) to (P-20) and these polymerizable groups are polymerized by radical polymerization, radical addition polymerization, cationic polymerization, and anionic polymerization.

[Chem. 6]

(P-1)

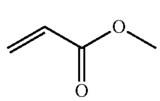

(P-2)

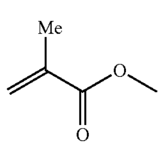

(P-3)

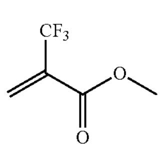

(P-4)

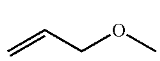

-continued (P-5)

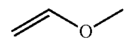

(P-6)

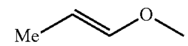

(P-7)

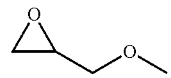

(P-8)

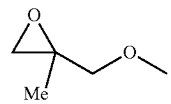

(P-9)

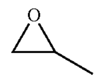

(P-10)

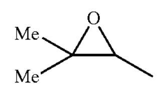

(P-11)

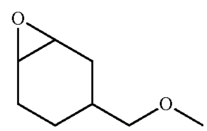

(P-12)

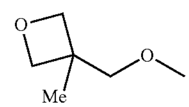

(P-13)

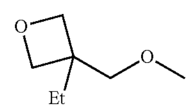

(P-14)

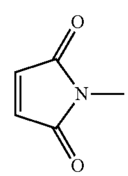

(P-15)

(P-16)

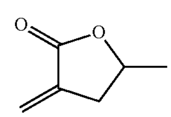

(P-17)

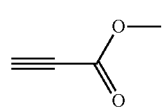

(P-18)

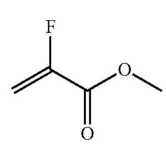

(P-19)

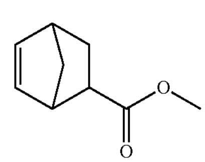

-continued (P-20)

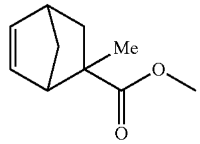

Particularly, in a case where ultraviolet polymerization is performed as a polymerization method, Formula (P-1), Formula (P-2), Formula (P-3), Formula (P-4), Formula (P-5), Formula (P-7), Formula (P-11), Formula (P-13), Formula (P-15), or Formula (P-18) is preferable, Formula (P-1), Formula (P-2), Formula (P-7), Formula (P-11), or Formula (P-13) is more preferable, Formula (P-1), Formula (P-2), or Formula (P-3) is still more preferable, and Formula (P-1) or Formula (P-2) is particularly preferable.

In Formulae (1) to (7), $S^{11}$ to $S^{72}$ represent a spacer group or a single bond, and in a case where a plurality of each of $S^{11}$ to $S^{72}$ is present, these may be the same as or different from each other. Further, it is preferable that the spacer group is an alkylene group having 1 to 20 carbon atoms in which one —$CH_2$— or two or more of (—$CH_2$—)'s which are not adjacent to each other may be each independently substituted with —O—, —COO—, —OCO—, —OCO—O—, —CO—NH—, —NH—CO—, —CH═CH—, —C≡C—, or a group represented by Formula (S-1).

[Chem. 7]

(S-1)

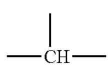

From the viewpoints of easily obtaining raw materials and ease of synthesis, in a case where a plurality of S is present, these may be the same as or different from each other. It is more preferable that S's each independently represent a single bond or an alkylene group having 1 to 10 carbon atoms in which one —$CH_2$— or two or more of (—$CH_2$—)'s which are not adjacent to each other may be each independently substituted with —O—, —COO—, or —OCO— and it is still more preferable that S's each independently represent an alkylene group having 1 to 10 carbon atoms or a single bond. Further, in the case where a plurality of S is present, these may be the same as or different from each other, and it is particularly preferable that S's each independently represent an alkylene group having 1 to 8 carbon atoms.

In Formulae (1) to (7), $X^{11}$ to $X^{72}$ represent —O—, —S—, —$OCH_2$—, —$CH_2O$—, —CO—, —COO—, —OCO—, —CO—S—, —S—CO—, —O—CO—O—, —CO—NH—, —NH—CO—, —$SCH_2$—, —$CH_2S$—, —$CF_2O$—, —$OCF_2$—, —$CF_2S$—, —$SCF_2$—, —CH═CH—COO—, —CH═CH—OCO—, —COO—CH═CH—, —OCO—CH═CH—, —COO—$CH_2CH_2$—, —OCO—$CH_2CH_2$—, —$CH_2CH_2$—COO—, —$CH_2CH_2$—OCO—, —COO—$CH_2$—, —OCO—$CH_2$—, —$CH_2$—COO—, —$CH_2$—OCO—, —CH═CH—, —N═N—, —CH═N—N═CH—, —CF═CF—, —C≡C—, or a single bond, and in a case where a plurality of each of $X^{11}$ to $X^{72}$ is present, these may be the same as or different from each other (where, each P—(S—X)— bond does not have —O—O—). From the viewpoints of easily obtaining raw materials and ease of synthesis, in the case where a plurality of each of $X^{11}$ to $X^{72}$ is present, these may be the same as or different from each other, and it is preferable that $X^{11}$'s to $X^{72}$'s each independently represent —O—, —S—, —$OCH_2$—, —$CH_2O$—, —COO—, —OCO—, —CO—S—, —S—CO—, —O—CO—O—, —CO—NH—, —NH—CO—, —COO—$CH_2CH_2$—, —OCO—$CH_2CH_2$—, —$CH_2CH_2$—COO—, —$CH_2CH_2$—OCO—, or a single bond and more preferable that $X^{11}$'s to $X^{72}$'s each independently represent —O—, —$OCH^2$—, —$CH_2O$—, —COO—, —OCO—, —COO—$CH_2CH_2$—, —OCO—$CH_2CH_2$—, —$CH_2CH_2$—COO—, —$CH_2CH_2$—OCO—, or a single bond. In the case where a plurality of each of $X^{11}$ to $X^{72}$ is present, these may be the same as or different from each other, and it is particularly preferable that $X^{11}$'s to $X^{72}$'s each independently represent —O—, —COO—, —OCO—, or a single bond.

In Formulae (1) to (7), $A^{11}$ and $A^{12}$ each independently represent a 1,4-phenylene group, a 1,4-cyclohexylene group, a pyridine-2,5-diyl group, a pyrimidine-2,5-diyl group, a naphthalene-2,6-diyl group, a naphthalene-1,4-diyl group, a tetrahydronaphthalene-2,6-diyl group, a decahydronaphthalene-2,6-diyl group, or a 1,3-dioxane-2,5-diyl group, these groups may be unsubstituted or substituted with one or more of L's, and in a case where a plurality of each of $A^{11}$ and $A^{12}$ is present, these may be the same as or different from each other. From the viewpoints of easily obtaining raw materials and ease of synthesis, it is preferable that $A^{11}$ and $A^{12}$ each independently represent a 1,4-phenylene group, a 1,4-cyclohexylene group, or a naphthalene-2,6-diyl group which may be unsubstituted or substituted with one or more L's, more preferable that $A^{11}$ and $A^{12}$ each independently represent a group selected from groups represented by Formulae (A-1) to (A-11), still more preferable that $A^{11}$ and $A^{12}$ each independently represent a group selected from groups represented by Formulae (A-1) to (A-8), and particularly preferable that $A^{11}$ and $A^{12}$ each independently represent a group selected from groups represented by Formulae (A-1) to (A-4).

[Chem. 8]

(A-1)

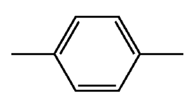

(A-2)

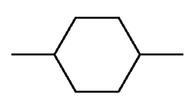

(A-3)

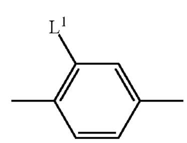

(A-4)

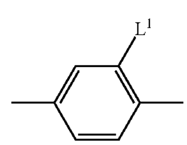

(A-5)

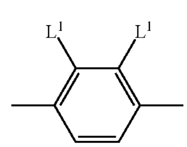

-continued (A-6)

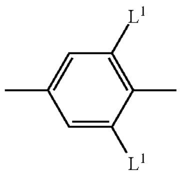

(A-7)

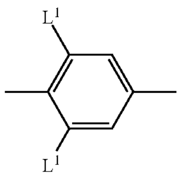

(A-8)

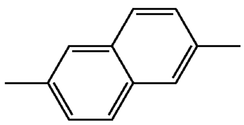

(A-9)

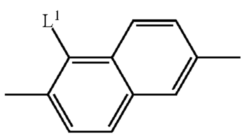

(A-10)

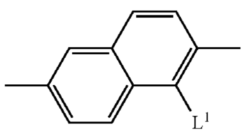

(A-11)

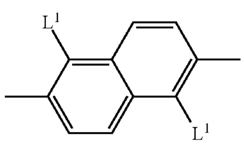

In Formulae (1) to (7), $Z^{11}$ and $Z^{12}$ each independently represent —O—, —S—, —OCH$_2$—, —CH$_2$O—, —CH$_2$CH$_2$—, —CO—, —COO—, —OCO—, —CO—S—, —S—CO—, —O—CO—O—, —CO—NH—, —NH—CO—, —OCO—NH—, —NH—COO—, —NH—CO—NH—, —NH—O—, —O—NH—, —SCH$_2$—, —CH$_2$S—, —CF$_2$O—, —OCF$_2$—, —CF$_2$S—, —SCF$_2$—, —CH═CH—COO—, —CH═CH—OCO—, —COO—CH═CH—, —OCO—CH═CH—, —COO—CH$_2$CH$_2$—, —OCO—CH$_2$CH$_2$—, —CH$_2$CH$_2$—COO—, —CH$_2$CH$_2$—OCO—, —COO—CH$_2$—, —OCO—CH$_2$—, —CH$_2$—COO—, —CH$_2$—OCO—, —CH═CH—, —N═N—, —CH═N—, —N═CH—, —CH═N—N═CH—, —CF═CF—, —C≡C—, or a single bond, and in a case where a plurality of each of $Z^{11}$ and $Z^{12}$ is present, these may be the same as or different from each other. From the viewpoints of liquid crystallinity, easily obtaining raw materials, and ease of synthesis, it is preferable that $Z^{11}$ and $Z^{12}$ each independently represent a single bond, —OCH$_2$—, —CH$_2$O—, —COO—, —OCO—, —CF$_2$O—, —OCF$_2$—, —CH$_2$CH$_2$—, —CF$_2$CF$_2$—, —CH═CH—COO—, —CH═CH—OCO—, —COO—CH═CH—, —OCO—CH═CH—, —COO—CH$_2$CH$_2$—, —OCO—CH$_2$CH$_2$—, —CH$_2$CH$_2$—COO—, —CH$_2$CH$_2$—OCO—, —CH═CH—, —CF═CF—, —C≡C—, or a single bond, more preferable that $Z^{11}$ and $Z^{12}$ each independently represent —OCH$_2$—, —CH$_2$O—, —CH$_2$CH$_2$—, —COO—, —OCO—, —COO—CH$_2$CH$_2$—, —OCO—CH$_2$CH$_2$—, —CH$_2$CH$_2$—COO—, —CH$_2$CH$_2$—OCO—, —CH═CH—, —C≡C—, or a single bond, still more preferable that $Z^{11}$ and $Z^{12}$ each independently represent —CH$_2$CH$_2$—, —COO—, —OCO—, —COO—CH$_2$CH$_2$—, —OCO—CH$_2$CH$_2$—, —CH$_2$CH$_2$—COO—, —CH$_2$CH$_2$—OCO—, or a single bond, and particularly preferable that $Z^{11}$ and $Z^{12}$ each independently represent —CH$_2$CH$_2$—, —COO—, —OCO—, or a single bond.

In Formulae (1) to (7), M represents a group selected from groups represented by Formula (M-1) to Formula (M-11), and these groups may be unsubstituted or substituted with one or more of L's.

[Chem. 9]

(M-1)

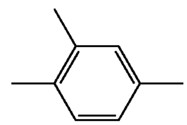

(M-2)

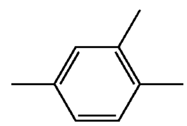

(M-3)

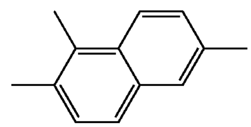

(M-4)

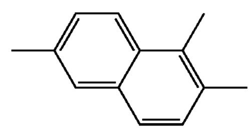

(M-5)

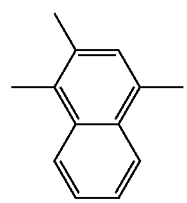

(M-6)

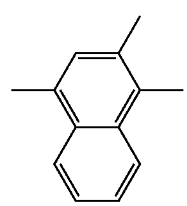

(M-7)

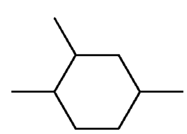

(M-8)

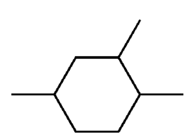

-continued (M-9)

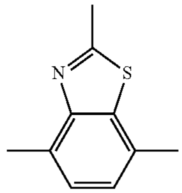

(M-10)

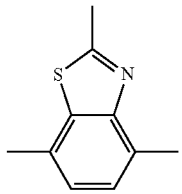

(M-11)

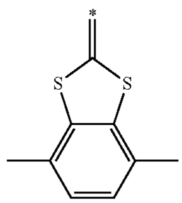

From the viewpoints of easily obtaining raw materials and ease of synthesis, it is preferable that M's each independently represent a group selected from groups represented by Formula (M-1) and (M-2) which may be unsubstituted or substituted with one or more of $L^1$'s or Formulae (M-3) to (M-6) which are unsubstituted, it is more preferable that M's each independently represent, a group selected from groups represented by Formula (M-1) and (M-2) which may be unsubstituted or substituted with one or more of $L^1$'s, and it is particularly preferable that M's each independently represent a group selected from groups represented by Formula (M-1) and (M-2) which are unsubstituted.

In Formulae (1) to (7), $R^{11}$ and $R^{31}$ represent a hydrogen atom, a fluorine atom, a chlorine atom, a bromine atom, an iodine atom, a pentafluorosulfuranyl group, a cyano group, a nitro group, an isocyano group, a thioisocyano group, or a linear or branched alkyl group having 1 to 20 carbon atoms in which one —$CH_2$— or two or more of (—$CH_2$—)'s which are not adjacent to each other may be each independently substituted with —O—, —S—, —CO—, —COO—, —OCO—, —CO—S—, —S—CO—, —O—CO—O—, —CO—NH—, —NH—CO—, or —C≡C—, and one or more of arbitrary hydrogen atoms in the alkyl group may be substituted with a fluorine atom. From the viewpoint of liquid crystallinity and ease of synthesis, it is preferable that $R^1$ represents a hydrogen atom, a fluorine atom, a chlorine atom, a cyano group, or a linear or branched alkyl group having 1 to 12 carbon atoms in which one —$CH_2$— or two or more of (—$CH_2$—)'s which are not adjacent to each other may be each independently substituted with —O—, —COO—, —OCO—, or —O—CO—O—, more preferable that $R^1$ represents a hydrogen atom, a fluorine atom, a chlorine atom, a cyano group, or a linear alkyl group or a linear alkoxy group having 1 to 12 carbon atoms, and particularly preferable that $R^1$ represents a linear alkyl group or a linear alkoxy group having 1 to 12 carbon atoms.

In Formulae (1) to (7), G represents a group selected from groups represented by Formulae (G-1) to (G-6).

[Chem. 10]

(G-1)

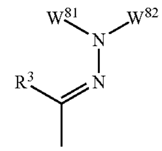

(G-2)

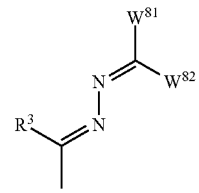

(G-3)

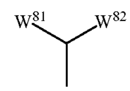

(G-4)

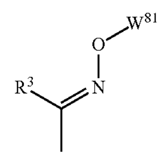

(G-5)

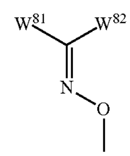

(G-6)

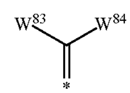

In the formulae, $R^3$ represents a hydrogen atom or an alkyl group having 1 to 20 carbon atoms, the alkyl group may be linear or branched, one or more of arbitrary hydrogen atoms in the alkyl group may be substituted with a fluorine atom, and one —$CH_2$— or two or more of (—$CH^2$—)'s which are not adjacent to each other in the alkyl group may be each independently substituted with —O—, —S—, —CO—, —COO—, —OCO—, —CO—S—, —S—CO—, —O—CO—O—, —CO—NH—, —NH—CO—, or —C≡C—, $W^{81}$ represents a group having at least one aromatic group and 5 to 30 carbon atoms and the group may be unsubstituted or substituted with one or more of $L^1$'s, $W^{82}$ represents a hydrogen atom or an alkyl group having 1 to 20 carbon atoms, the alkyl group may be linear or branched, one or more of arbitrary hydrogen atoms in the alkyl group may be substituted with a fluorine atom, one —$CH_2$— or two or more of (—$CH_2$—)'s which are not adjacent to each other in the alkyl group may be each independently substituted with —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—, $W^{82}$ may have the same definition as that for $W^{81}$, $W^{81}$ and $W^{82}$ may be linked to each other to form a ring structure, and $W^{82}$ represents a group represented by the following formula.

[Chem. 11]

$$P^{W82}-\!\!\left(S^{W82}-X^{W82}\right)_{n^{W82}}$$

(In the formula, $P^{W82}$ has the same definition as that for $P^{11}$, $S^{W82}$ has the same definition as that for $S^{11}$, $X^{W82}$ has the same definition as that for $X^{11}$, and $n^{W82}$ has the same definition as that for m11.)

The aromatic group included in the group represented by $W^{81}$ may be an aromatic hydrocarbon group or an aromatic heterocyclic group and the group may include both of an aromatic hydrocarbon group and an aromatic heterocyclic group. These aromatic groups may be bonded to each other through a single bond or a linking group (—OCO—, —COO—, —CO—, or —O—) and may form a fused ring. Further, in addition to an aromatic group, the group represented by $W^{81}$ may further have an acyclic structure and/or a cyclic structure other than the aromatic group. From the viewpoints of easily obtaining raw materials and ease of synthesis, it is preferable that the aromatic group included in the group represented by $W^{81}$ is a group represented by any of Formulae (W-1) to (W-19) which may be unsubstituted or substituted with one or more of $L^1$'s.

[Chem. 12]

(W-1)

(W-2)

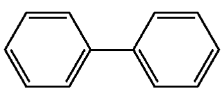

(W-3)

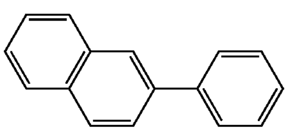

(W-4)

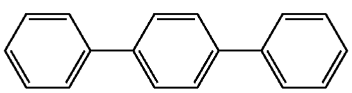

(W-5)

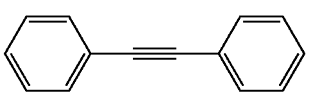

(W-6)

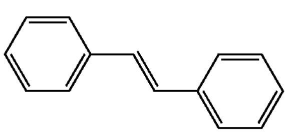

(W-7)

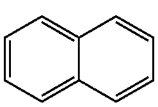

(W-8)

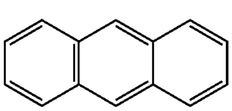

-continued (W-9)

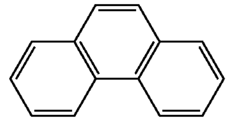

(W-10)

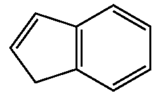

(W-11)

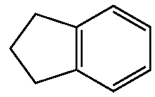

(W-12)

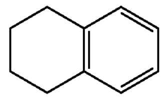

(W-13)

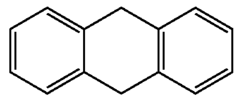

(W-14)

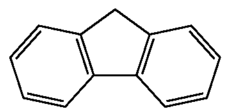

(W-15)

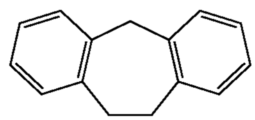

(W-16)

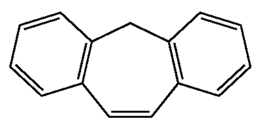

(W-17)

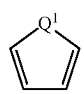

(W-18)

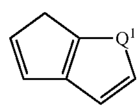

(W-19)

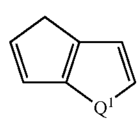

(In the formulae, these groups may have a binding site at an arbitrary position, a group formed by linking two or more of aromatic groups selected from these groups with a single bond may be formed, and $Q^1$ represents —O—, —S—, —$NR^5$— (in the formula, $R^5$ represents a hydrogen atom or an alkyl group having 1 to 8 carbon atoms), or —CO—. (—CH═)'s in these aromatic groups may be each independently substituted with —N═, (—$CH_2$—)'s may be each independently substituted with —O—, —S—, —$NR^4$— (in the formula, $R^4$ represents a hydrogen atom or an alkyl group having 1 to 8 carbon atoms), or —CO— and does not have a —O—O— bond.)

It is preferable that the group represented by Formula (W-1) is a group selected from groups represented by Formulae (W-1-1) to (W-1-8) which may be unsubstituted or substituted with one or more of $L^2$'s.

[Chem. 13]

(W-1-1)

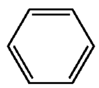

(W-1-2)

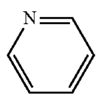

(W-1-3)

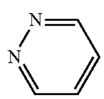

(W-1-4)

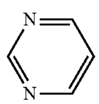

(W-1-5)

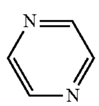

(W-1-6)

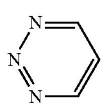

(W-1-7)

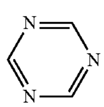

(W-1-8)

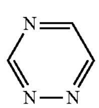

(In the formulae, these groups may have a binding site at an arbitrary position.)

It is preferable that the group represented by Formula (W-7) is a group selected from groups represented by Formulae (W-7-1) to (W-7-7) which may be unsubstituted or substituted with one or more of $L^1$'s.

[Chem. 14]

(W-7-1)

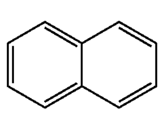

(W-7-2)

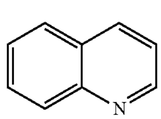

-continued (W-7-3)

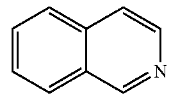

(W-7-4)

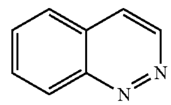

(W-7-5)

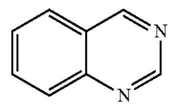

(W-7-6)

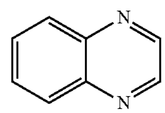

(W-7-7)

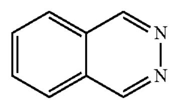

(In the formulae, these groups may have a binding site at an arbitrary position.)

It is preferable that the group represented by Formula (W-10) is a group selected from groups represented by Formulae (W-10-1) to (W-10-8) which may be unsubstituted or substituted with one or more of $L^1$'s.

[Chem. 15]

(W-10-1)

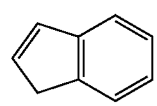

(W-10-2)

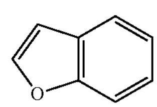

(W-10-3)

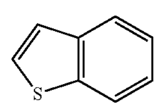

(W-10-4)

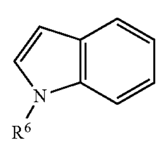

(W-10-5)

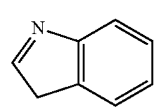

(W-10-6)

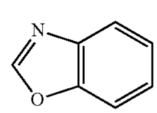

-continued (W-10-7)

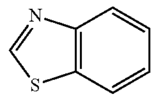

(W-10-8)

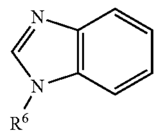

(In the formulae, these groups may have a binding site at an arbitrary position and $R^6$ represents a hydrogen atom or an alkyl group having 1 to 8 carbon atoms.)

It is preferable that the group represented by Formula (W-11) is a group selected from groups represented by Formulae (W-11-1) to (W-11-13) which may be unsubstituted or substituted with one or more of $L^1$'s.

[Chem. 16]

(W-11-1)

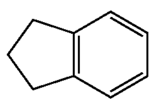

(W-11-2)

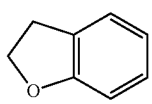

(W-11-3)

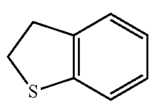

(W-11-4)

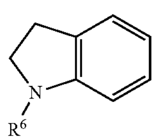

(W-11-5)

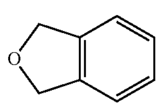

(W-11-6)

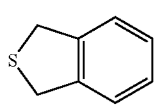

(W-11-7)

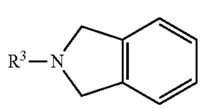

(W-11-8)

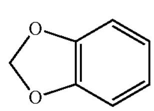

(W-11-9)

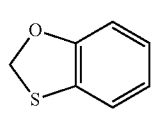

-continued (W-11-10)

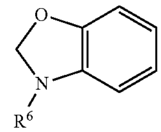

(W-11-11)

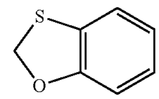

(W-11-12)

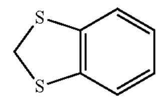

(W-11-13)

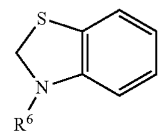

(In the formulae, these groups may have a binding site at an arbitrary position and $R^6$ represents a hydrogen atom or an alkyl group having 1 to 8 carbon atoms.)

It is preferable that the group represented by Formula (W-12) is a group selected from groups represented by Formulae (W-12-1) to (W-12-19) which may be unsubstituted or substituted with one or more of $L^1$'s.

[Chem. 17]

(W-12-1)

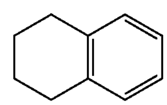

(W-12-2)

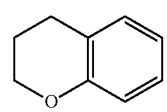

(W-12-3)

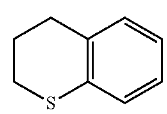

(W-12-4)

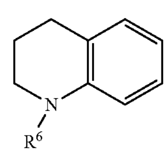

(W-12-5)

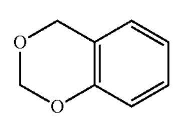

(W-12-6)

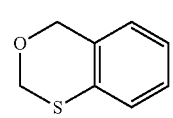

-continued (W-12-7)

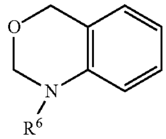

(W-12-8)

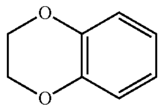

(W-12-9)

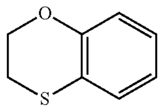

(W-12-10)

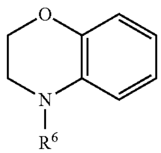

(W-12-11)

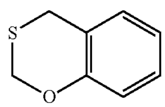

(W-12-12)

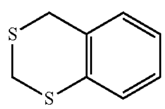

(W-12-13)

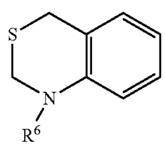

(W-12-14)

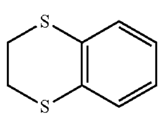

(W-12-15)

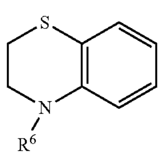

(W-12-16)

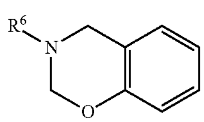

(W-12-17)

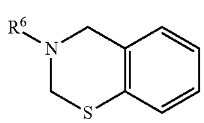

(W-12-18)

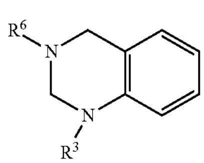

-continued (W-12-19)

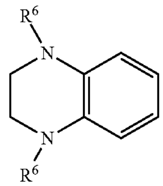

(In the formulae, these groups may have a binding site at an arbitrary position, $R^6$ represents a hydrogen atom or an alkyl group having 1 to 8 carbon atoms, and in a case where a plurality of $R^6$ is present, these may be the same as or different from each other.)

It is preferable that the group represented by Formula (W-13) is a group selected from groups represented by Formulae (W-13-1) to (W-13-10) which may be unsubstituted or substituted with one or more of $L^1$'s.

[Chem. 18]

(W-13-1)

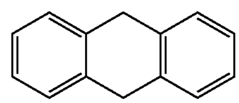

(W-13-2)

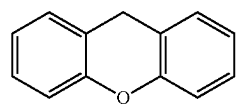

(W-13-3)

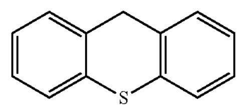

(W-13-4)

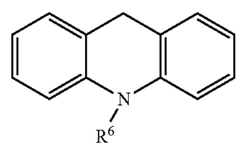

(W-13-5)

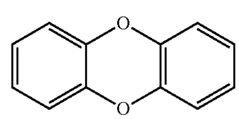

(W-13-6)

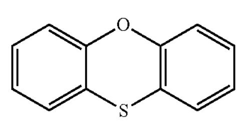

(W-13-7)

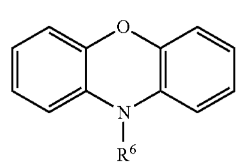

(W-13-8)

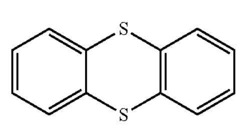

-continued (W-13-9)

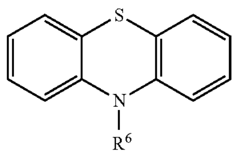

(W-13-10)

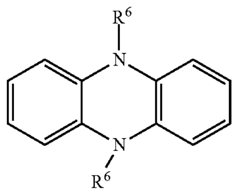

(In the formulae, these groups may have a binding site at an arbitrary position, $R^6$ represents a hydrogen atom or an alkyl group having 1 to 8 carbon atoms, and in a case where a plurality of $R^6$ is present, these may be the same as or different from each other.)

It is preferable that the group represented by Formula (W-14) is a group selected from groups represented by Formulae (W-14-1) to (W-14-4) which may be unsubstituted or substituted with one or more of $L^1$'s.

[Chem. 19]

(W-14-1)

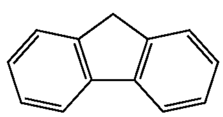

(W-14-2)

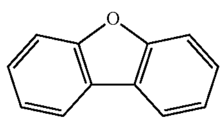

(W-14-3)

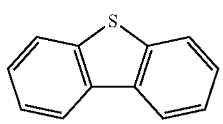

(W-14-4)

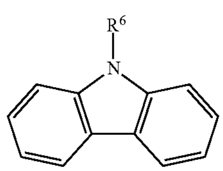

(In the formulae, these groups may have a binding site at an arbitrary position and $R^6$ represents a hydrogen atom or an alkyl group having 1 to 8 carbon atoms.)

It is preferable that the group represented by Formula (W-15) is a group selected from groups represented by Formulae (W-15-1) to (W-15-18) which may be unsubstituted or substituted with one or more of $L^1$'s.

[Chem. 20]

(W-15-1)

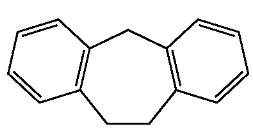

-continued (W-15-2)

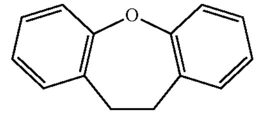

(W-15-3)

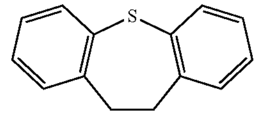

(W-15-4)

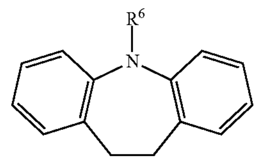

(W-15-5)

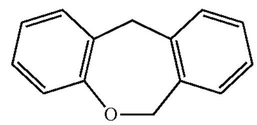

(W-15-6)

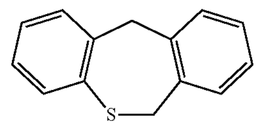

(W-15-7)

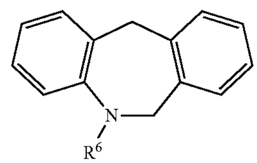

(W-15-8)

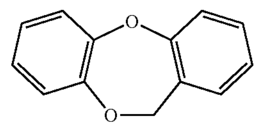

(W-15-11)

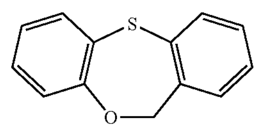

(W-15-12)

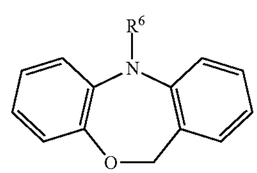

(W-15-13)

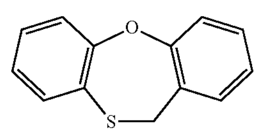

(W-15-14)

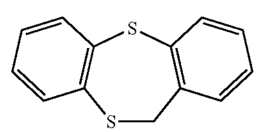

-continued (W-15-15)

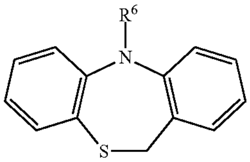

(W-15-16)

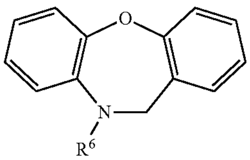

(W-15-17)

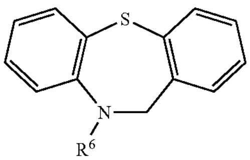

(W-15-18)

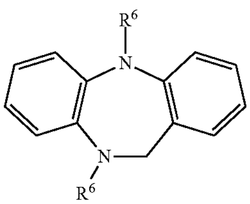

(In the formulae, these groups may have a binding site at an arbitrary position and $R^6$ represents a hydrogen atom or an alkyl group having 1 to 8 carbon atoms.)

It is preferable that the group represented by Formula (W-16) is a group selected from groups represented by Formulae (W-16-1) to (W-16-4) which may be unsubstituted or substituted with one or more of $L^1$'s.

[Chem. 21]

(W-16-1)

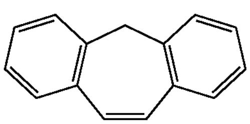

(W-16-2)

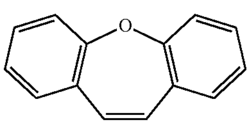

(W-16-3)

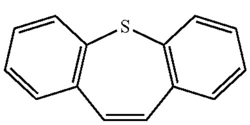

(W-16-4)

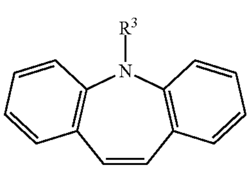

(In the formulae, these groups may have a binding site at an arbitrary position and $R^6$ represents a hydrogen atom or an alkyl group having 1 to 8 carbon atoms.)

It is preferable that the group represented by Formula (W-17) is a group selected from groups represented by Formulae (W-17-1) to (W-17-6) which may be unsubstituted or substituted with one or more of $L^1$'s.

[Chem. 22]

(W-17-1)

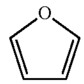

(W-17-2)

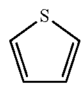

(W-17-3)

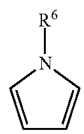

(W-17-4)

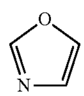

(W-17-5)

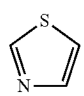

(W-17-6)

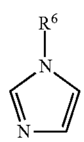

(In the formulae, these groups may have a binding site at an arbitrary position and $R^6$ represents a hydrogen atom or an alkyl group having 1 to 8 carbon atoms.)

It is preferable that the group represented by Formula (W-18) is a group selected from groups represented by Formulae (W-18-1) to (W-18-6) which may be unsubstituted or substituted with one or more of $L^1$'s.

[Chem. 23]

(W-18-1)

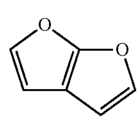

(W-18-2)

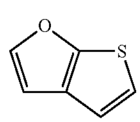

(W-18-3)

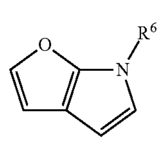

-continued (W-18-4)

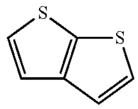

(W-18-5)

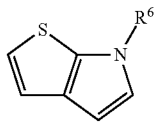

(W-18-6)

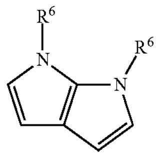

(In the formulae, these groups may have a binding site at an arbitrary position, $R^6$ represents a hydrogen atom or an alkyl group having 1 to 8 carbon atoms, and in a case where a plurality of $R^6$ is present, these may be the same as or different from each other.)

It is preferable that the group represented by Formula (W-19) is a group selected from groups represented by Formulae (W-19-1) to (W-19-9) which may be unsubstituted or substituted with one or more of $L^1$'s.

[Chem. 24]

(W-19-1)

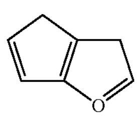

(W-19-2)

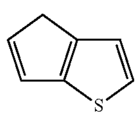

(W-19-3)

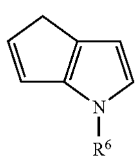

(W-19-4)

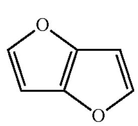

(W-19-5)

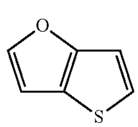

(W-19-6)

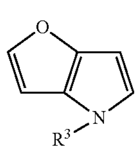

-continued (W-19-7)

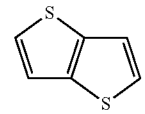

(W-19-8)

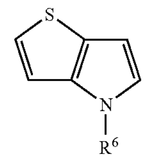

(W-19-9)

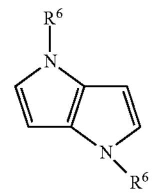

(In the formulae, these groups may have a binding site at an arbitrary position, $R^6$ represents a hydrogen atom or an alkyl group having 1 to 8 carbon atoms, and in a case where a plurality of $R^6$ is present, these may be the same as or different from each other.)

It is more preferable that the aromatic group included in the group represented by $W^{81}$ is a group selected from groups represented by Formulae (W-1-1), (W-7-1), (W-7-2), (W-7-7), (W-8), (W-10-6), (W-10-7), (W-10-8), (W-11-8), (W-11-9), (W-11-10), (W-11-11), (W-11-12), and (W-11-13) which may be unsubstituted or substituted with one or more of $L^1$'s and particularly preferable that the aromatic group included in the group represented by $W^{81}$ is a group selected from groups represented by Formulae (W-1-1), (W-7-1), (W-7-2), (W-7-7), (W-10-6), (W-10-7), and (W-10-8) which may be unsubstituted or substituted with one or more of $L^1$'s. Further, it is particularly preferable that $W^{81}$ represents a group selected from groups represented by Formulae (W-a-1) to (W-a-6).

[Chem. 25]

(W-a-1)

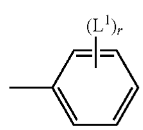

(W-a-2)

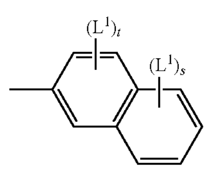

(W-a-3)

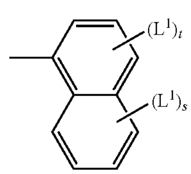

-continued (W-a-4)

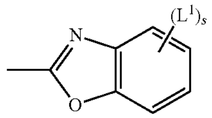

(W-a-5)

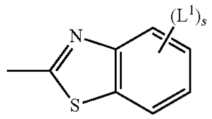

(W-a-6)

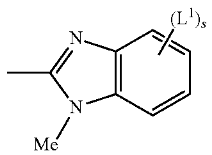

(In the formulae, r represents an integer of 0 to 5, s represents an integer of 0 to 4, and t represents an integer of 0 to 3.)

$W^{82}$ represents a hydrogen atom or a linear or branched alkyl group having 1 to 20 carbon atoms in which one —$CH_2$— or two or more of (—$CH_2$—)'s which are not adjacent to each other may be each independently substituted with —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—, one or more of arbitrary hydrogen atoms in the alkyl group may be substituted with a fluorine atom, $W^{82}$ may have the same definition as that for $W^{81}$, $W^{81}$ and $W^{82}$ may be linked to each other to form a ring structure, and $W^{82}$ represents a group represented by the following formula.

[Chem. 26]

$$P^{W82}\text{—}(S^{W82}\text{—}X^{W82})_{nW82}\text{—}$$

(In the formula, $P^{W82}$ has the same definition as that for $P^{11}$, $S^{W82}$ has the same definition as that for $S^{11}$, $X^{W82}$ has the same definition as that for $X^{11}$, and $n^{W82}$ has the same definition as that for m11.)

From the viewpoints of easily obtaining raw materials and ease of synthesis, it is preferable that $W^{82}$ represents a hydrogen atom or a linear or branched alkyl group having 1 to 20 carbon atoms in which one or more of arbitrary hydrogen atoms may be substituted with a fluorine atom and one —$CH_2$— or two or more of (—$CH_2$—)'s which are not adjacent to each other may be each independently substituted with —O—, —CO—, —COO—, —OCO—, —CH═CH—COO—, —OCO—CH═CH—, —CH═CH—, —CF═CF—, or —C≡C—, more preferable that $W^{82}$ represents a hydrogen atom or a linear or branched alkyl group having 1 to 20 carbon atoms, and particularly preferable that $W^{82}$ represents a hydrogen atom or a linear or branched alkyl group having 1 to 12 carbon atoms. Further, in a case where $W^{82}$ has the same definition as that for $W^{81}$, $W^{82}$ and $W^{81}$ may be the same as or different from each other and preferable groups as $W^{82}$ are the same as those for $W^{81}$. Further, in a case where $W^{81}$ and $W^{82}$ are linked to each other to form a ring structure, it is preferable that the cyclic group represented by —$NW^{81}W^{82}$ is a group selected from groups represented by Formulae (W-b-1) to (W-b-42) which may be unsubstituted or substituted with one or more of $L^1$'s.

[Chem. 27]

(W-b-1)

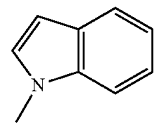

(W-b-2)

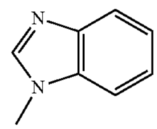

(W-b-3)

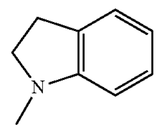

(W-b-4)

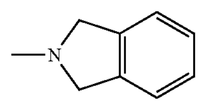

(W-b-5)

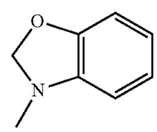

(W-b-6)

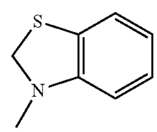

(W-b-7)

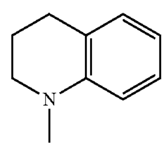

(W-b-8)

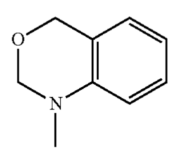

(W-b-9)

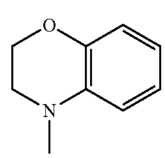

(W-b-9)

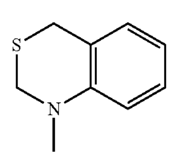

-continued
(W-b-10)
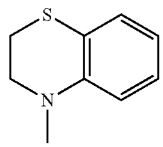
(W-b-11)
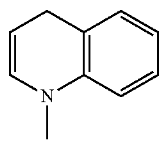
(W-b-11)
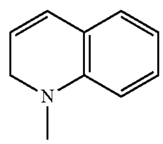
(W-b-12)
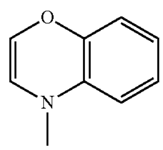
(W-b-13)
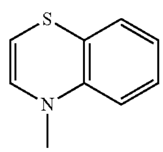
(W-b-14)
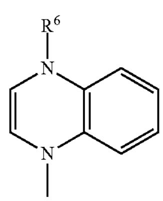
(W-b-15)
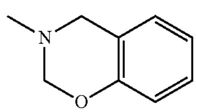
(W-b-16)
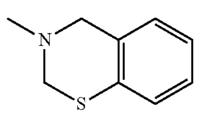
(W-b-17)
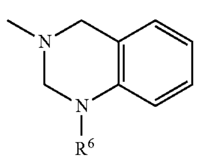
(W-b-18)
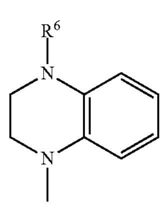
-continued
(W-b-19)
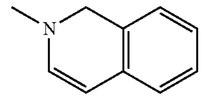
[Chem. 28]
(W-b-20)
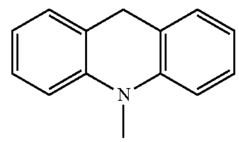
(W-b-21)
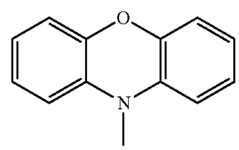
(W-b-22)
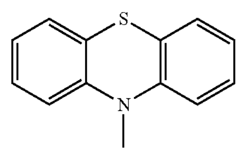
(W-b-23)
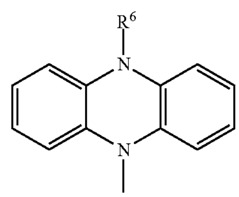
(W-b-24)
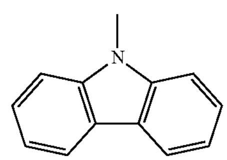
(W-b-25)
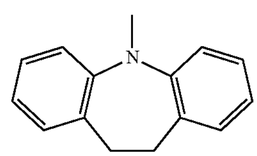
(W-b-26)
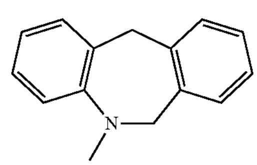
(W-b-27)
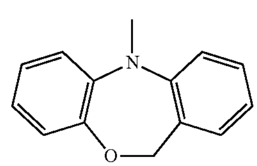
(W-b-28)
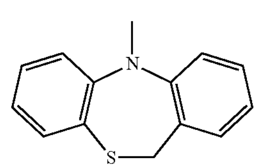

-continued (W-b-29)

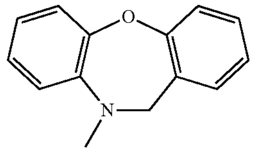

(W-b-30)

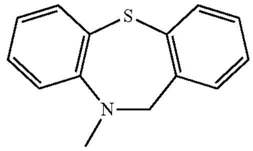

(W-b-31)

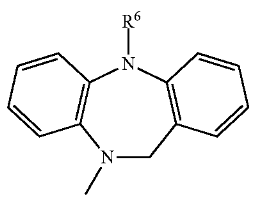

(W-b-32)

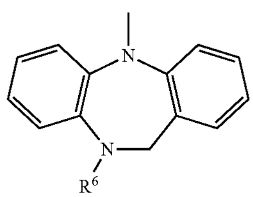

(W-b-33)

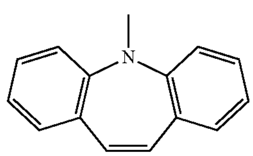

(W-b-34)

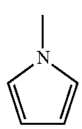

(W-b-35)

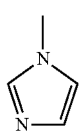

(W-b-36)

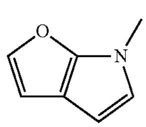

(W-b-37)

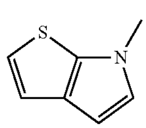

(W-b-38)

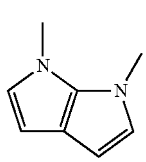

-continued (W-b-39)

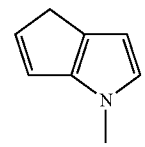

(W-b-40)

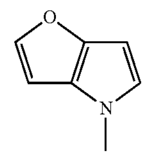

(W-b-41)

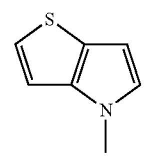

(W-b-42)

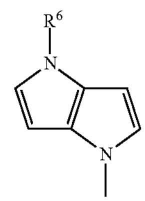

(In the formulae, $R^6$ represents a hydrogen atom or an alkyl group having 1 to 8 carbon atoms.)

From the viewpoints of easily obtaining raw materials and ease of synthesis, it is particularly preferable that the cyclic group represented by $—NW^{81}W^{82}$ is a group selected from groups represented by Formulae (W-b-20), (W-b-21), (W-b-22), (W-b-23), (W-b-24), (W-b-25), and (W-b-33) which may be unsubstituted or substituted with one or more of $L^1$'s.

Further, it is preferable that the cyclic group represented by $=CW^{81}W^{82}$ is a group selected from groups represented by Formulae (W-c-1) to (W-c-81) which may be unsubstituted or substituted with one or more of $L^1$'s.

[Chem. 29]

(W-c-1)

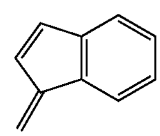

(W-c-2)

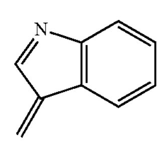

(W-c-3)

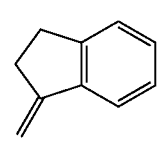

-continued
(W-c-4)
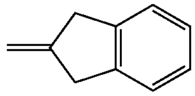
(W-c-5)
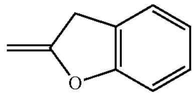
(W-c-6)
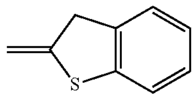
(W-c-7)
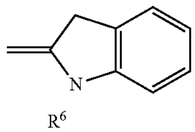
(W-c-8)
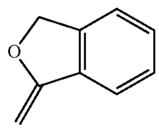
(W-c-9)
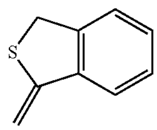
(W-c-9)
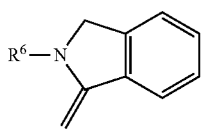
(W-c-10)
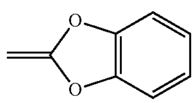
(W-c-11)
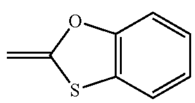
(W-c-11)
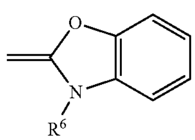
(W-c-12)
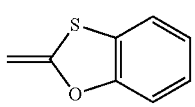
(W-c-13)
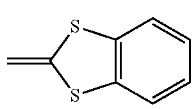
(W-c-14)
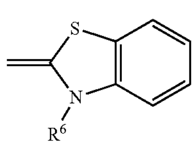
-continued
(W-c-15)
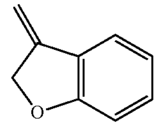
(W-c-16)
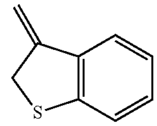
(W-c-17)
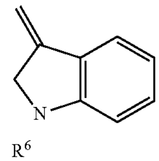
(W-c-18)
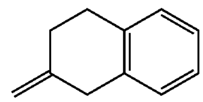
(W-c-19)
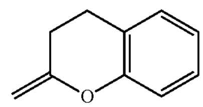
(W-c-20)
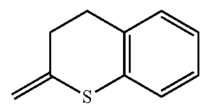
(W-c-21)
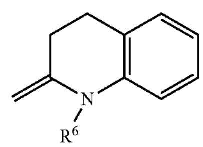
(W-c-22)
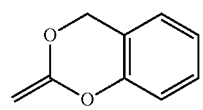
(W-c-23)
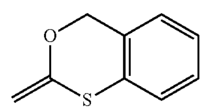
(W-c-24)
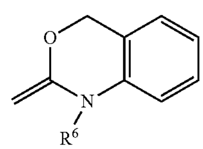
(W-c-25)
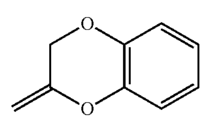
(W-c-26)
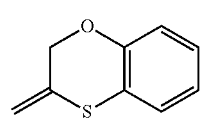

-continued
(W-c-27)
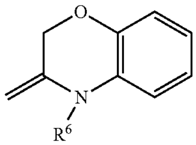
(W-c-28)
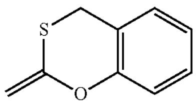
[Chem. 30]
(W-c-29)
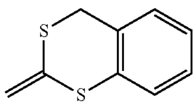
(W-c-30)
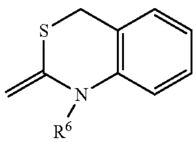
(W-c-31)
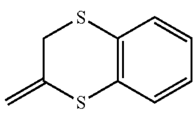
(W-c-32)
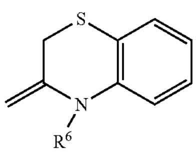
(W-c-33)
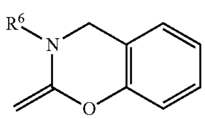
(W-c-34)
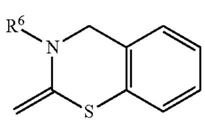
(W-c-35)
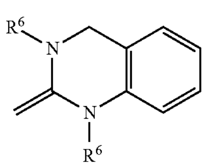
(W-c-36)
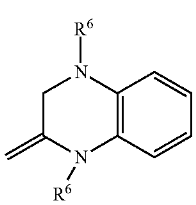
(W-c-37)
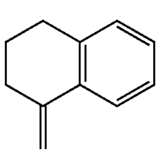
-continued
(W-c-38)
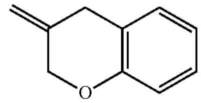
(W-c-39)
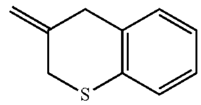
(W-c-40)
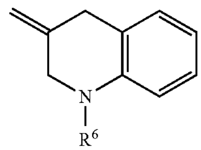
(W-c-41)
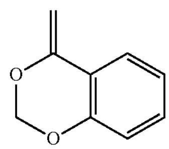
(W-c-42)
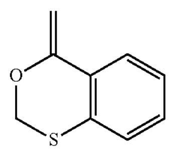
(W-c-43)
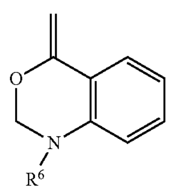
(W-c-44)
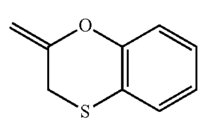
(W-c-45)
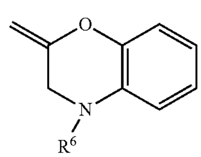
(W-c-46)
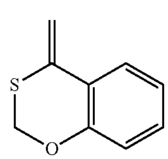
(W-c-47)
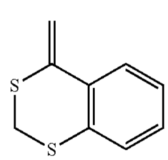

-continued
(W-c-48)
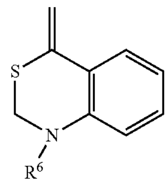
(W-c-49)
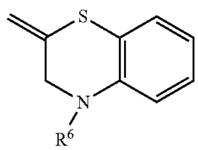
(W-c-50)
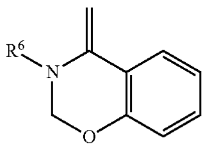
(W-c-51)
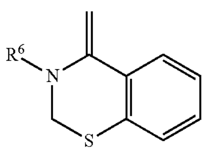
(W-c-52)
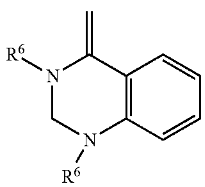
(W-c-53)
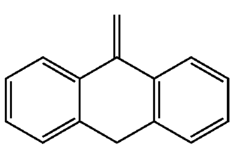
(W-c-54)
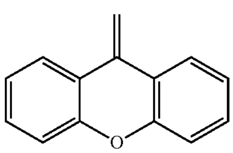
(W-c-55)
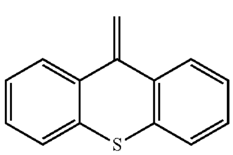
(W-c-56)
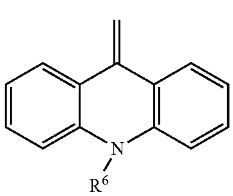
-continued
(W-c-57)
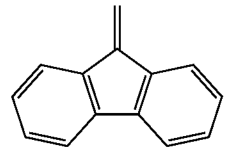
[Chem. 31]
(W-c-58)
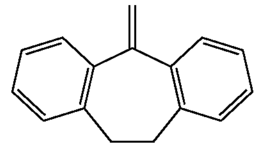
(W-c-59)
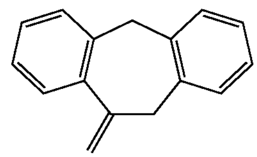
(W-c-60)
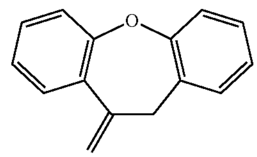
(W-c-61)
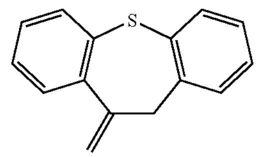
(W-c-62)
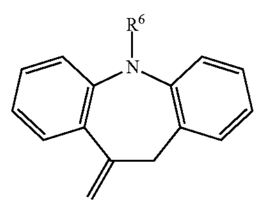
(W-c-63)
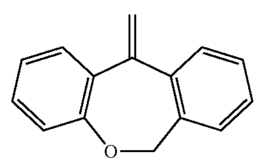
(W-c-64)
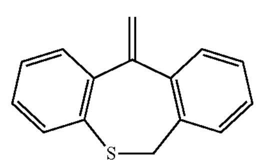
(W-c-65)
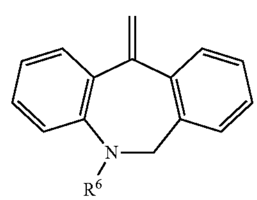

-continued (W-c-66)

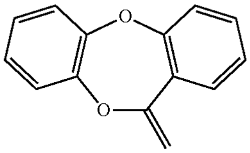

(W-c-67)

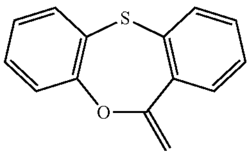

(W-c-68)

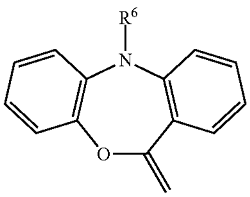

(W-c-69)

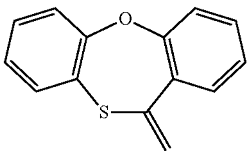

(W-c-70)

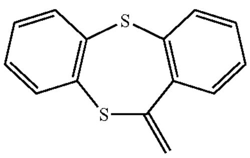

(W-c-71)

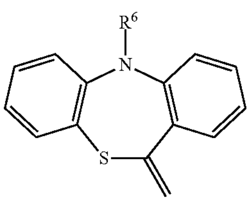

(W-c-72)

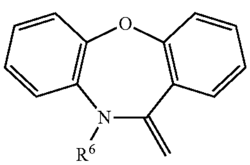

(W-c-73)

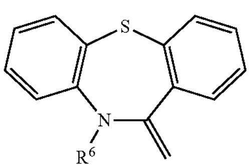

(W-c-74)

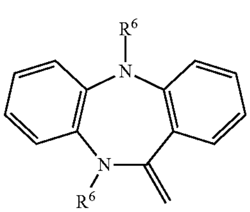

-continued (W-c-75)

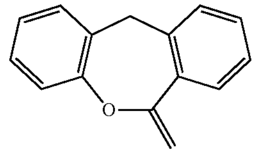

(W-c-76)

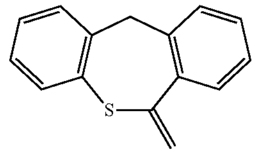

(W-c-77)

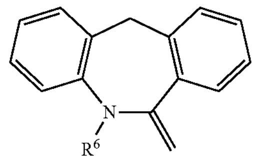

(W-c-78)

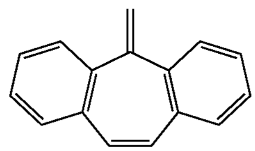

(W-c-79)

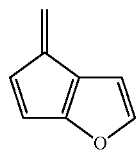

(W-c-80)

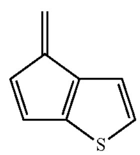

(W-c-81)

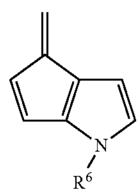

(In the formulae, $R^6$ represents a hydrogen atom or an alkyl group having 1 to 8 carbon atoms, and in a case where a plurality of $R^6$ is present, these may be the same as or different from each other.)

From the viewpoints of easily obtaining raw materials and ease of synthesis, it is particularly preferable that the cyclic group represented by $=CW^{81}W^{82}$ is a group selected from groups represented by Formulae (W-c-11), (W-c-12), (W-c-13), (W-c-14), (W-c-53), (W-c-54), (W-c-55), (W-c-56), (W-c-57), and (W-c-78) which may be unsubstituted or substituted with one or more of L's.

In a case where $W^{82}$ represents a group represented by the following formula, preferable groups as $P^{W82}$ are the same as those for $P^{11}$, preferable groups as $S^{W82}$ are the same as those for $S^{11}$, preferable groups as $X^{W82}$ are the same as those for $X^{11}$, and preferable groups as $n^{W82}$ are the same as those for m11.

[Chem. 32]

$$P^{W82}\text{—}(S^{W82}\text{—}X^{W82})_{nW82}\text{—}$$

The total number of π electrons included in the group represented by $W^{81}$ and $W^{82}$ is preferably 4 to 24 from the viewpoints of wavelength dispersion characteristics, storage stability, liquid crystallinity, and ease of synthesis.

$W^{83}$ and $W^{84}$ each independently represent a halogen atom, a cyano group, a hydroxy group, a nitro group, a carboxyl group, a carbamoyloxy group, an amino group, a sulfamoyl group, a group having at least one aromatic group and 5 to 30 carbon atoms, an alkyl group having 1 to 20 carbon atoms, a cycloalkyl group having 3 to 20 carbon atoms, an alkenyl group having 2 to 20 carbon atoms, a cycloalkenyl group having 3 to 20 carbon atoms, an alkoxy group having 1 to 20 carbon atoms, an acyloxy group having 2 to 20 carbon atoms, or an alkylcarbonyloxy group having 2 to 20 carbon atoms, one —$CH_2$— or two or more of (—$CH_2$—)'s which are not adjacent to each other in the alkyl group, the cycloalkyl group, the alkenyl group, the cycloalkenyl group, the alkoxy group, the acyloxy group, and the alkylcarbonyloxy group may be each independently substituted with —O—, —S—, —CO—, —COO—, —OCO—, —CO—S—, —S—CO—, —O—CO—O—, —CO—NH—, —NH—CO—, or —C≡C—, it is more preferable that $W^{83}$ represents a group selected from a cyano group, a nitro group, a carboxyl group, and an alkyl group having 1 to 20 carbon atoms, an alkenyl group, an acyloxy group, and an alkylcarbonyloxy group in which one —$CH_2$— or two or more of (—$CH_2$—)'s which are not adjacent to each other may be each independently substituted with —O—, —S—, —CO—, —COO—, —OCO—, —CO—S—, —S—CO—, —O—CO—O—, —CO—NH—, —NH—CO—, or —C≡C— and particularly preferable that $W^{83}$ represents a group selected from a cyano group, a carboxyl group, and an alkyl group having 1 to 20 carbon atoms, an alkenyl group, an acyloxy group, and an alkylcarbonyloxy group in which one —$CH_2$— or two or more of (—$CH_2$—)'s which are not adjacent to each other may be each independently substituted with —CO—, —COO—, —OCO—, —O—CO—O—, —CO—NH—, —NH—CO—, or —C≡C—, and it is more preferable that $W^{84}$ represents a group selected from a cyano group, a nitro group, a carboxyl group, and an alkyl group having 1 to 20 carbon atoms, an alkenyl group, an acyloxy group, and an alkylcarbonyloxy group in which one —$CH_2$— or two or more of (—$CH_2$—)'s which are not adjacent to each other may be each independently substituted with —O—, —S—, —CO—, —COO—, —OCO—, —CO—S—, —S—CO—, —O—CO—O—, —CO—NH—, —NH—CO—, or —C≡C— and particularly preferable that $W^{84}$ represents a group selected from a cyano group, a carboxyl group, and an alkyl group having 1 to 20 carbon atoms, an alkenyl group, an acyloxy group, and an alkylcarbonyloxy group in which one —$CH_2$— or two or more of (—$CH_2$—)'s which are not adjacent to each other may be each independently substituted with —CO—, —COO—, —OCO—, —O—CO—O—, —CO—NH—, —NH—CO—, or —C≡C—.

$L^1$ represents a fluorine atom, a chlorine atom, a bromine atom, an iodine atom, a pentafluorosulfuranyl group, a nitro group, an isocyano group, an amino group, a hydroxyl group, a mercapto group, a methylamino group, a dimethylamino group, a diethylamino group, a diisopropylamino group, a trimethylsilyl group, a dimethylsilyl group, a thioisocyano group, or a linear or branched alkyl group having 1 to 20 carbon atoms in which one —$CH_2$— or two or more of (—$CH_2$—)'s which are not adjacent to each other may be each independently substituted with —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—, and one or more of arbitrary hydrogen atoms in the alkyl group may be substituted with a fluorine atom. From the viewpoints of liquid crystallinity and ease of synthesis, it is preferable that $L^1$ represents a fluorine atom, a chlorine atom, a pentafluorosulfuranyl group, a nitro group, a methylamino group, a dimethylamino group, a diethylamino group, a diisopropylamino group, or a linear or branched alkyl group having 1 to 20 carbon atoms in which one or more of arbitrary hydrogen atoms may be substituted with a fluorine atom and one —$CH_2$— or two or more of (—$CH_2$—)'s which are not adjacent to each other may be each independently substituted with a group selected from —O—, —S—, —CO—, —COO—, —OCO—, —O—CO—O—, —CH═CH—, —CF═CF—, and —C≡C—, it is more preferable that $L^1$ represents a fluorine atom, a chlorine atom, or a linear or branched alkyl group having 1 to 12 carbon atoms in which one or more of arbitrary hydrogen atoms may be substituted with a fluorine atom and one —$CH_2$— or two or more of (—$CH_2$—)'s which are not adjacent to each other may be each independently substituted with a group selected from —O—, —COO—, and —OCO—, it is still more preferable that $L^1$ represents a fluorine atom, a chlorine atom, or a linear or branched alkyl group or alkoxy group having 1 to 12 carbon atoms in which one or more of arbitrary hydrogen atoms may be substituted with a fluorine atom, and it is particularly preferable that $L^1$ represents a fluorine atom, a chlorine atom, or a linear alkyl group or a linear alkoxy group having 1 to 8 carbon atoms.

In Formula (1), m11 represents an integer of 0 to 8. From the viewpoints of liquid crystallinity, easily obtaining raw materials, and ease of synthesis, m11 represents preferably an integer of 0 to 4, more preferably an integer of 0 to 2, still more preferably 0 or 1, and particularly preferably 1.

In Formulae (2) to (7), m2 to m7 represent an integer of 0 to 5. From the viewpoints of liquid crystallinity, easily obtaining raw materials, and ease of synthesis, m2 to m7 represent preferably an integer of 0 to 4, more preferably an integer of 0 to 2, still more preferably 0 or 1, and particularly preferably 1.

In Formula (a), j11 and j12 each independently represent an integer of 1 to 5 and j11+j12 represents an integer of 2 to 5. From the viewpoints of liquid crystallinity, ease of synthesis, and storage stability, j11 and j12 each independently represent preferably an integer of 1 to 4, more preferably an integer of 1 to 3, and particularly preferably 1 or 2. It is preferable that j11+j12 represents an integer of 2 to 4.

Preferred specific examples of the compound represented by Formula (I) include compounds represented by Formulae (1-a-1) to (1-a-105).

[Chem. 33]
(1-a-1)
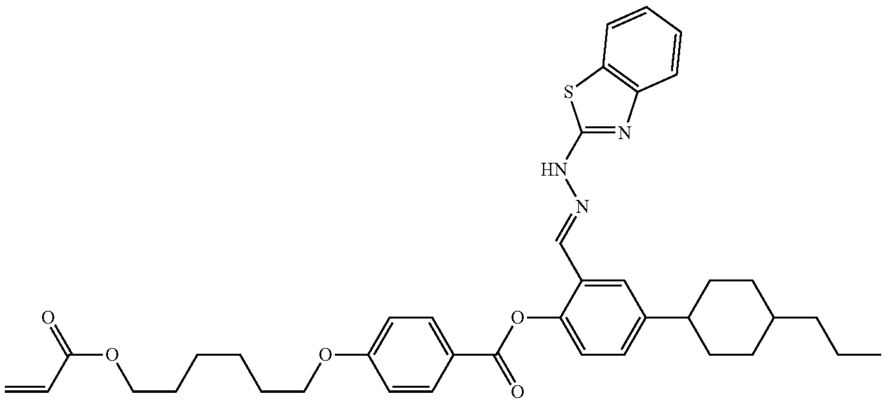
(1-a-2)
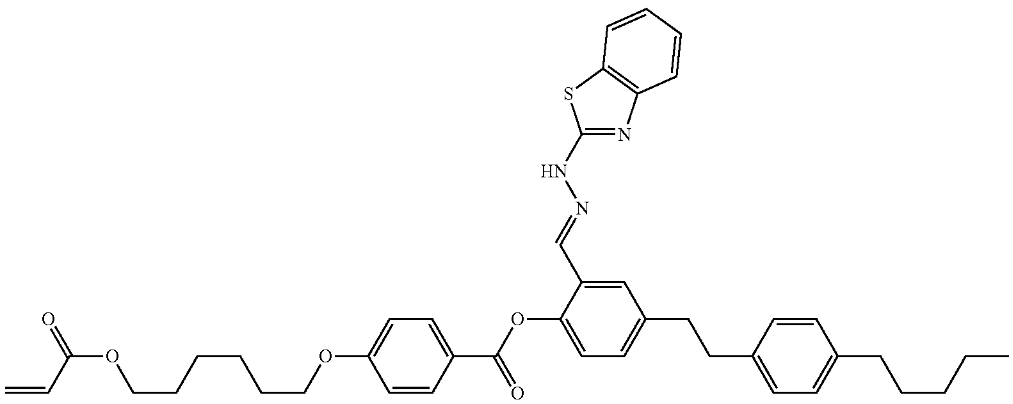
(1-a-3)
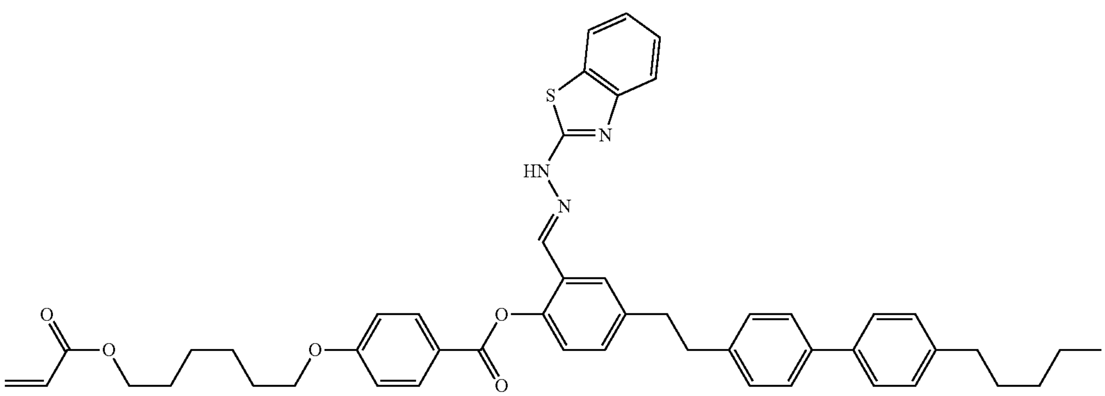
(1-a-4)
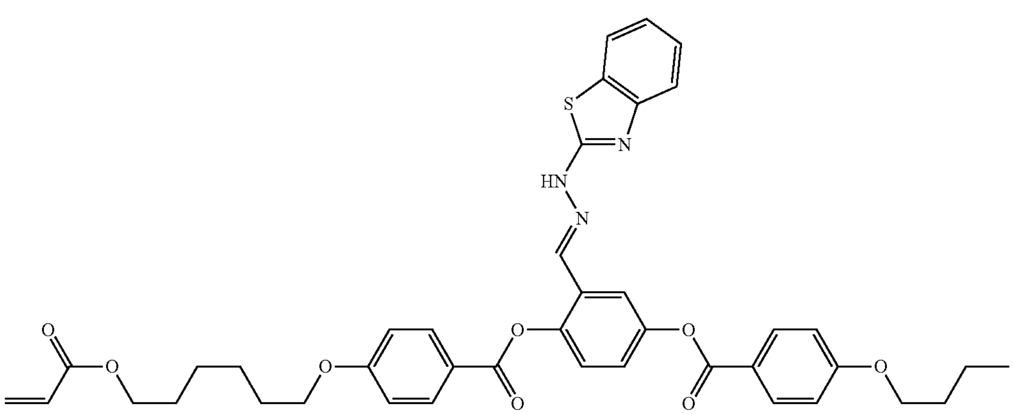

-continued
(1-a-5)
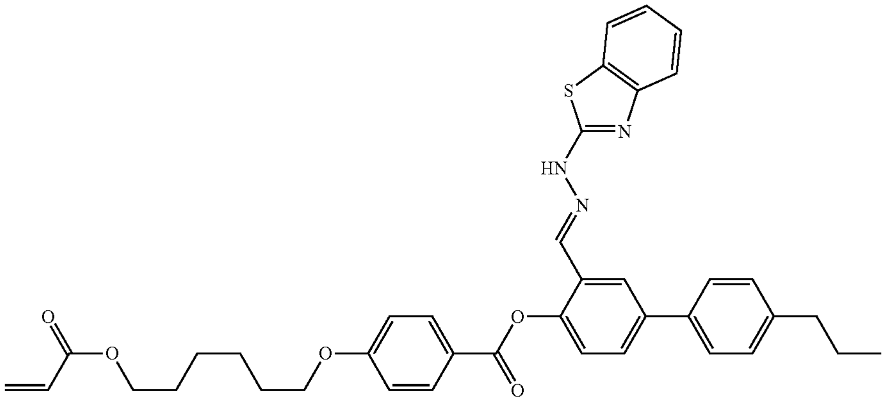
[Chem. 34]
(1-a-6)
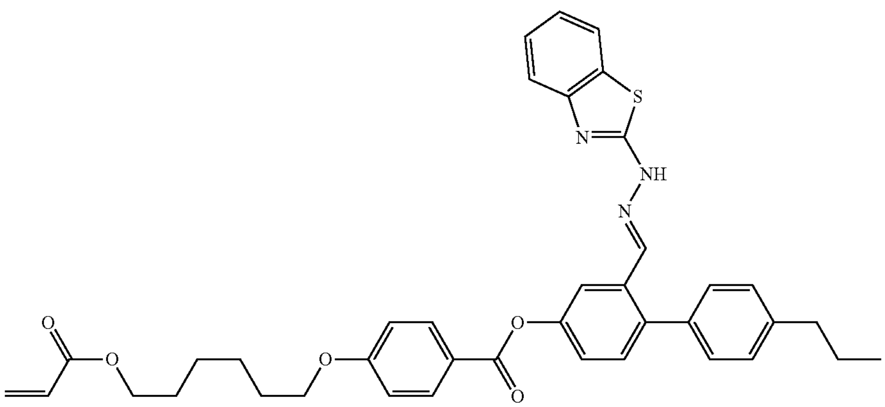
(1-a-7)
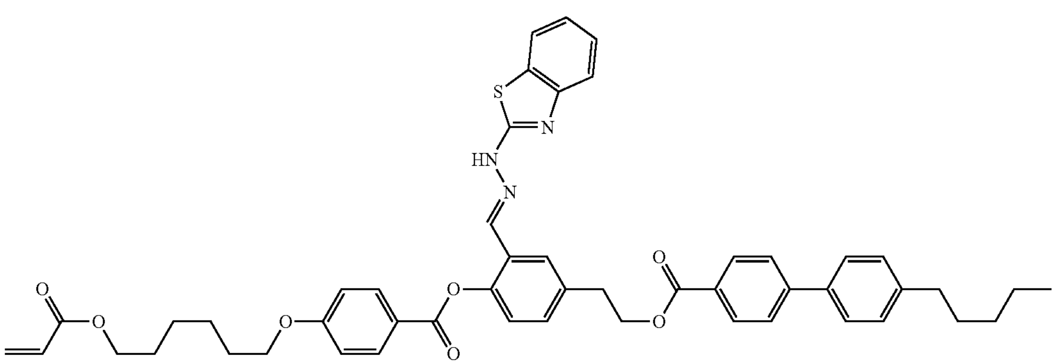

-continued
(1-a-8)
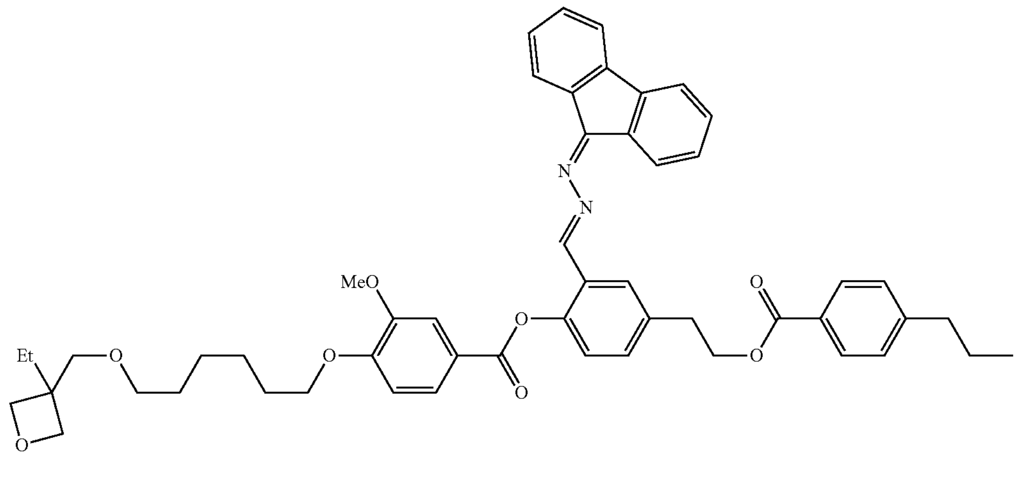
(1-a-9)
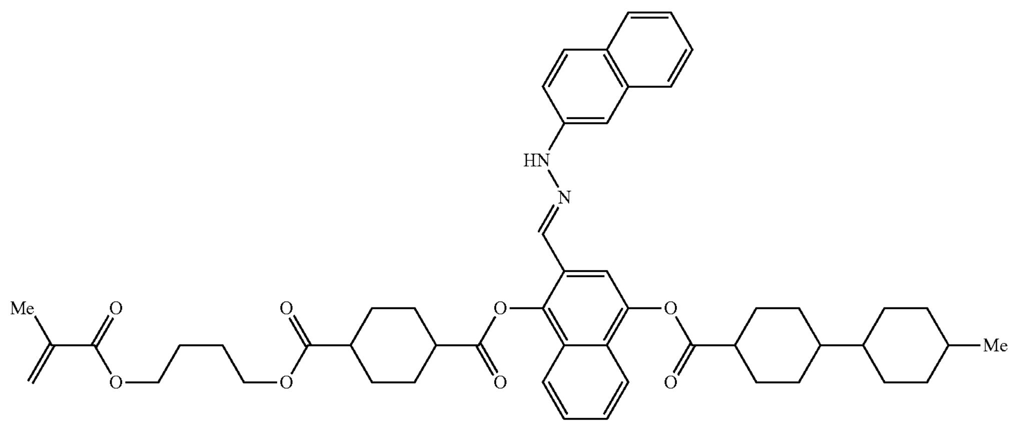
[Chem. 35]
(1-a-10)
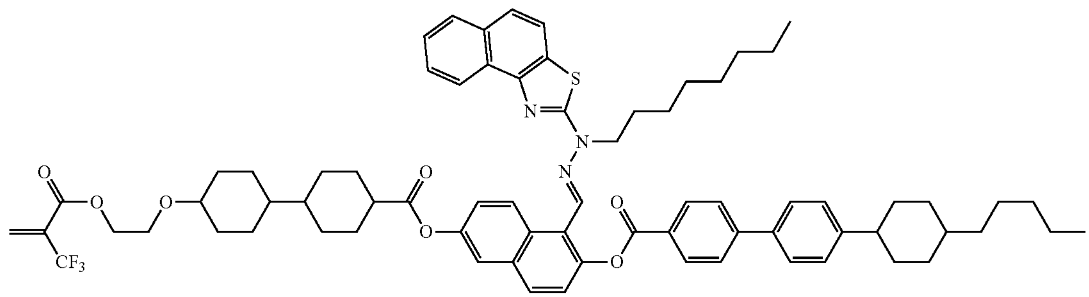
(1-a-11)
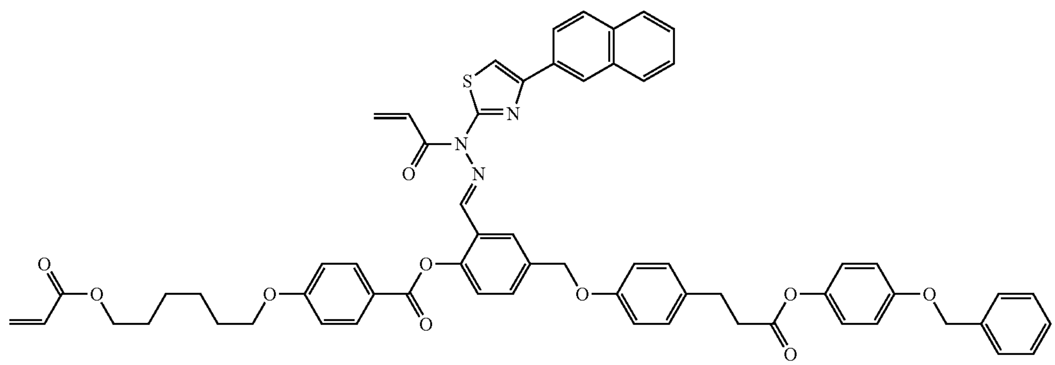

-continued
(1-a-12)
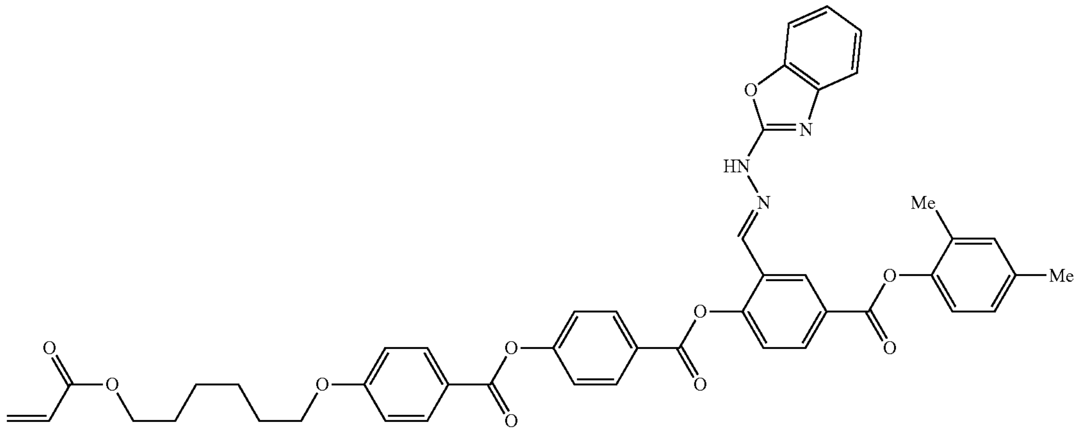
(1-a-13)
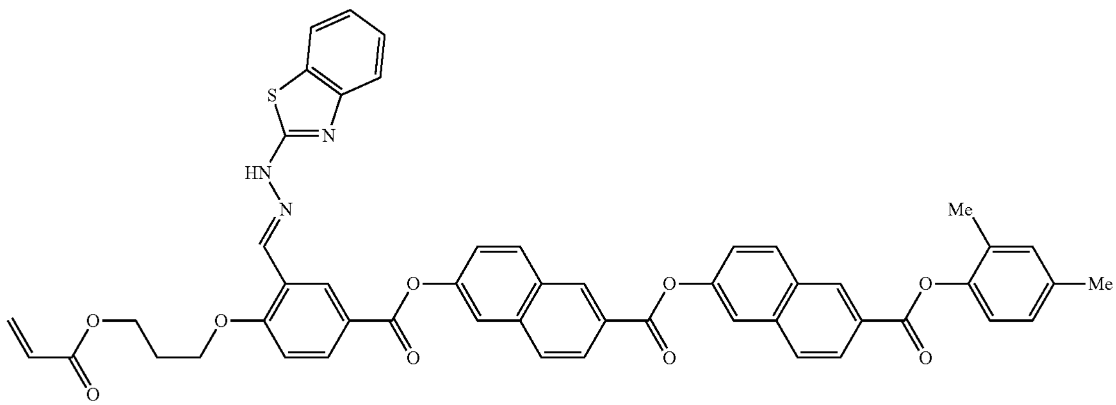
[Chem. 36]
(1-a-14)
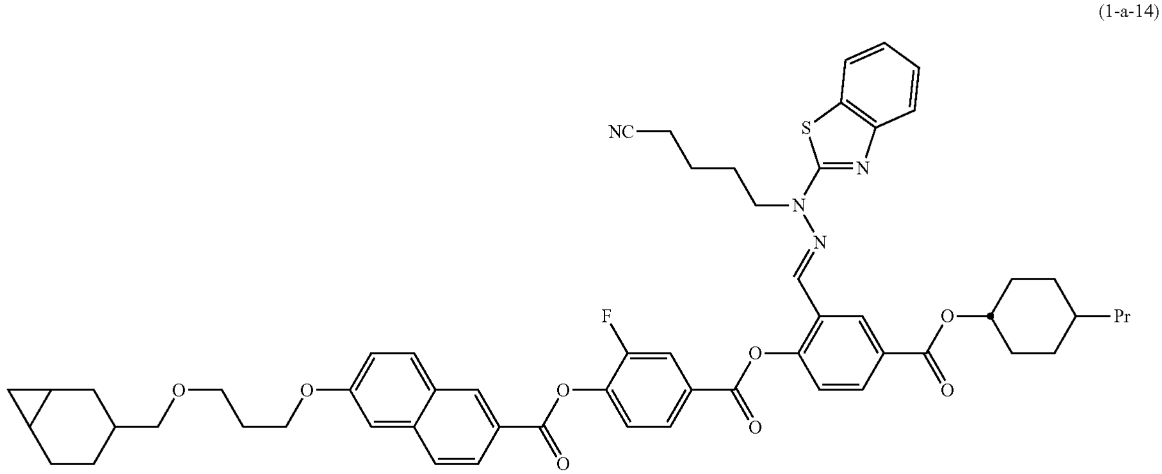

-continued
(1-a-15)
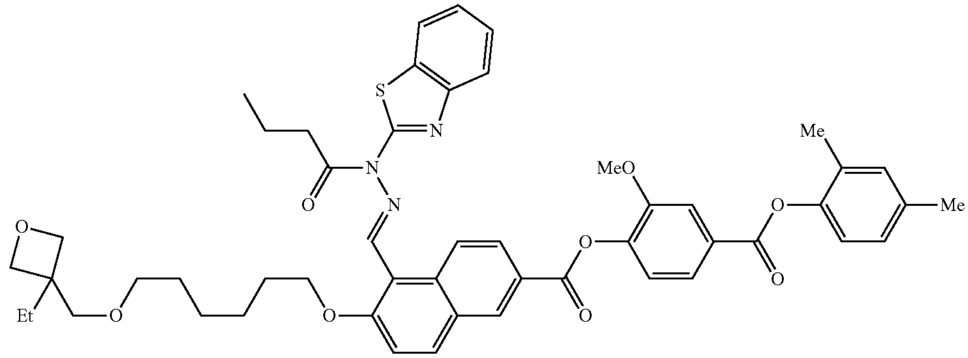
(1-a-16)
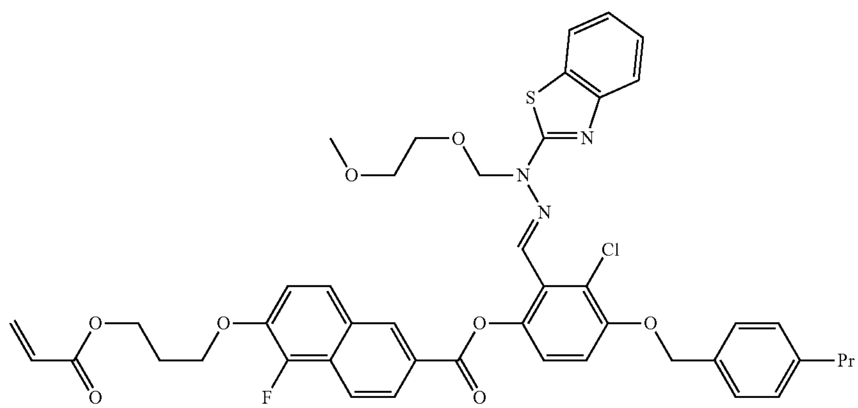
(1-a-17)
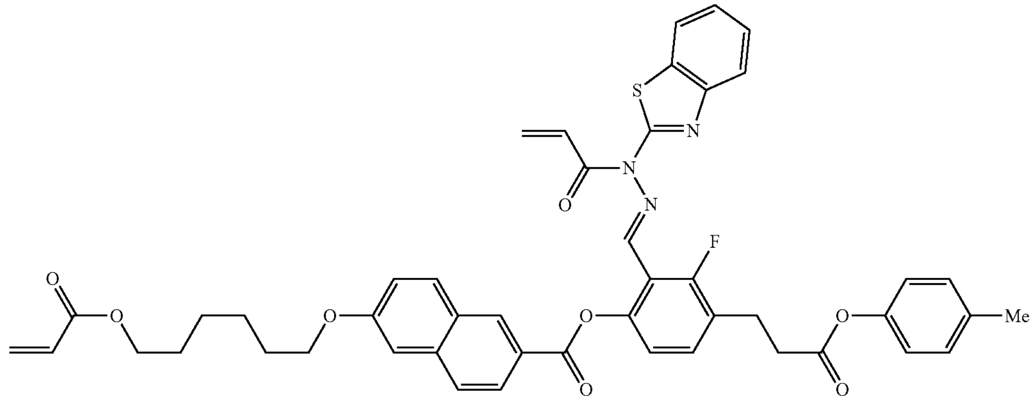

-continued
[Chem. 37]
(1-a-20)
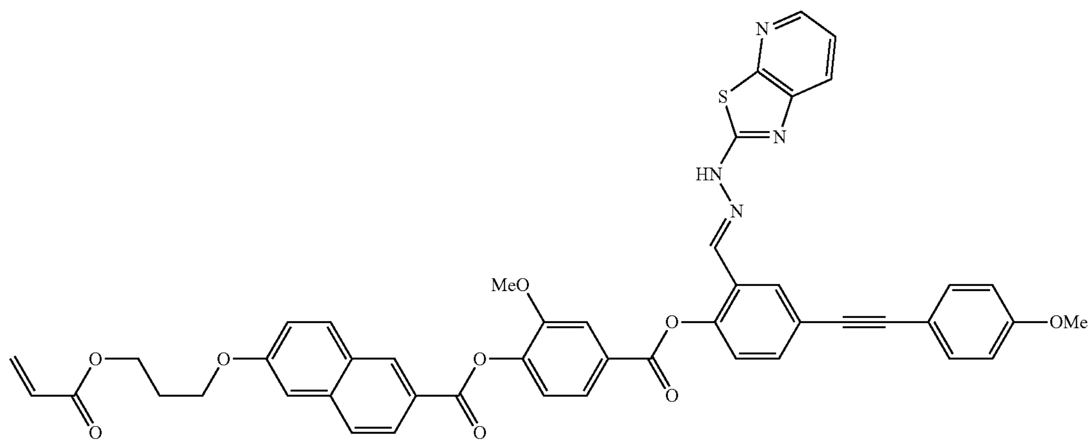
(1-a-21)
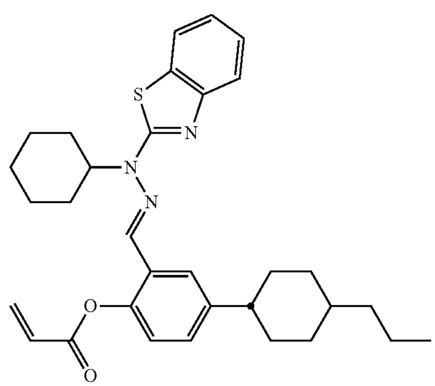
(1-a-22)
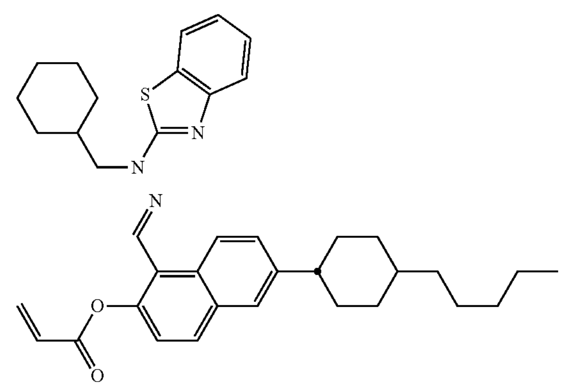
[Chem. 38]
(1-a-23)
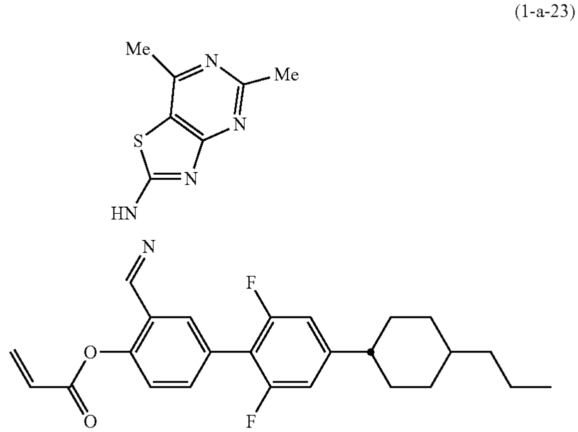
(1-a-24)
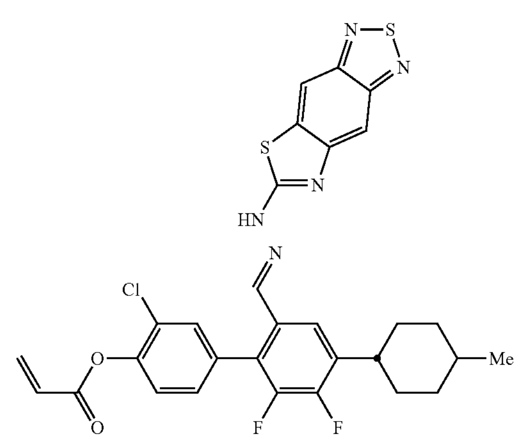

-continued
(1-a-25)
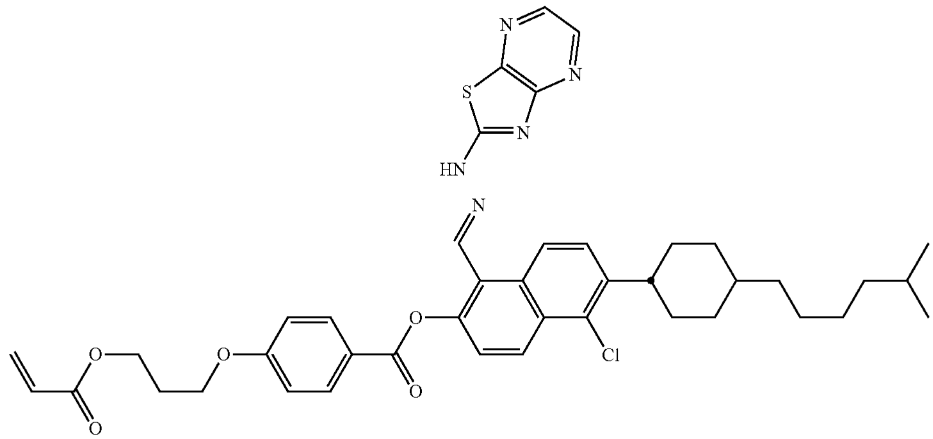
(1-a-26)
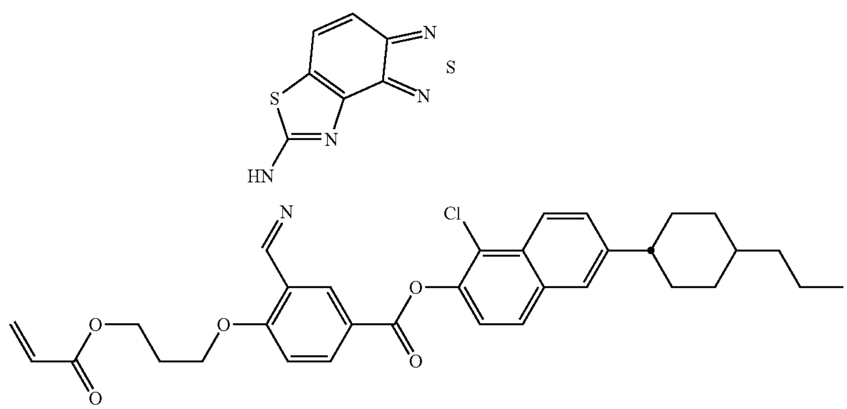
(1-a-27)
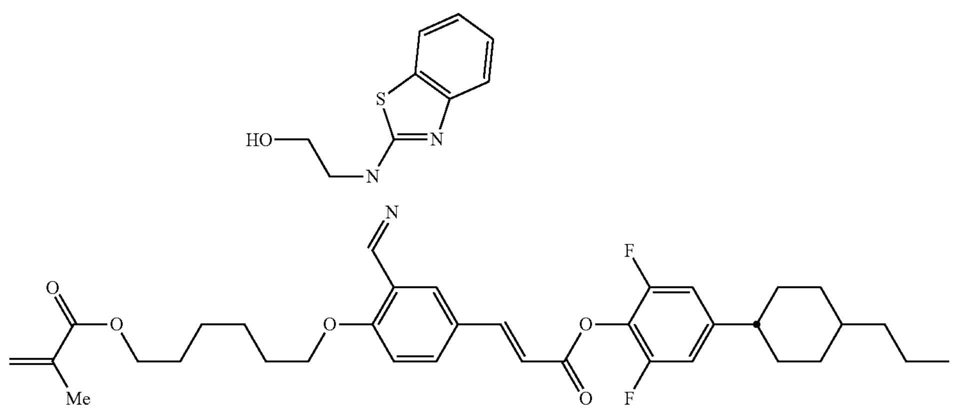
[Chem. 39]
(1-a-28)
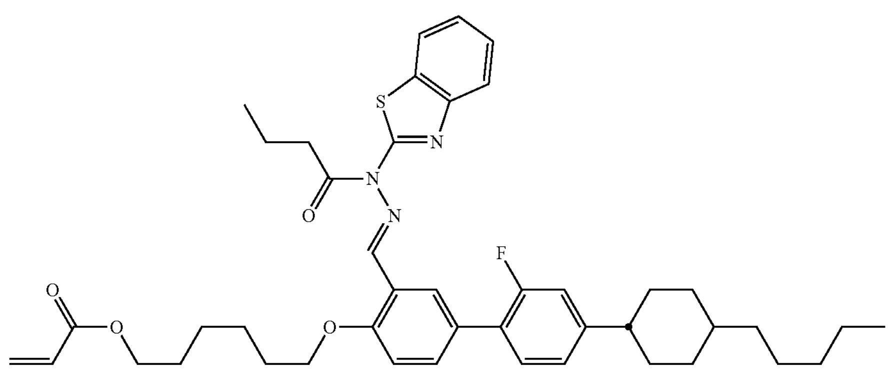

-continued
(1-a-29)
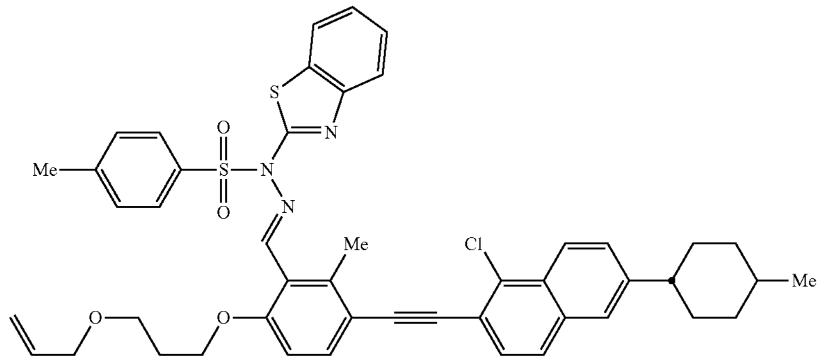
(1-a-30)
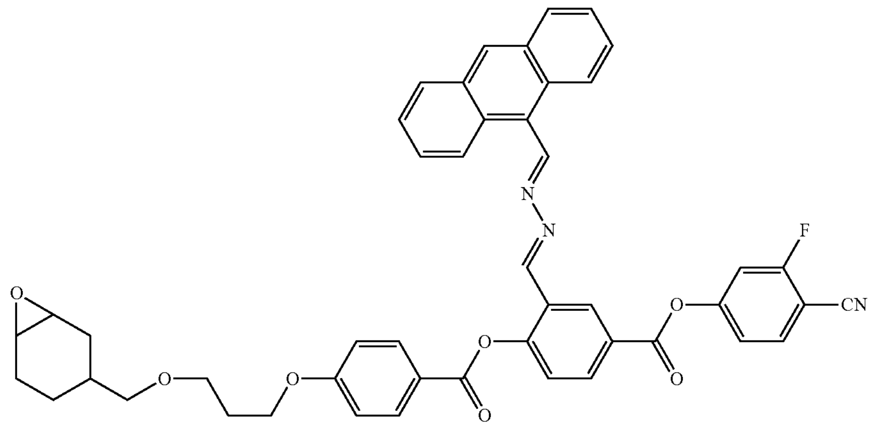
(1-a-31)
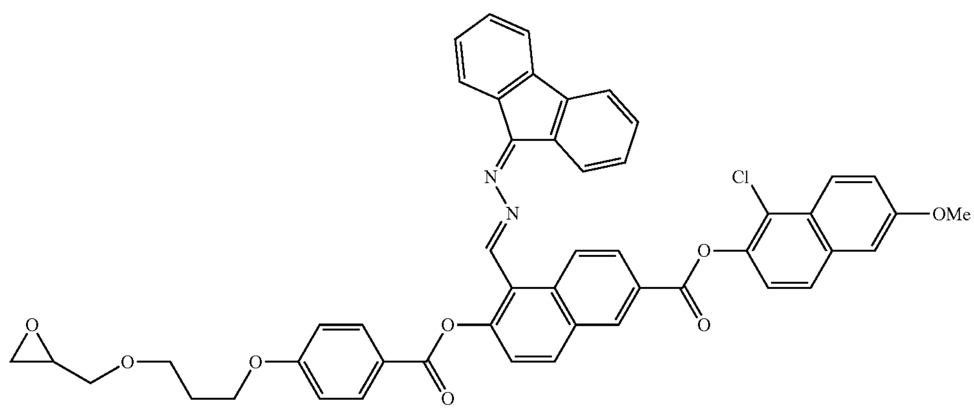
(1-a-32)
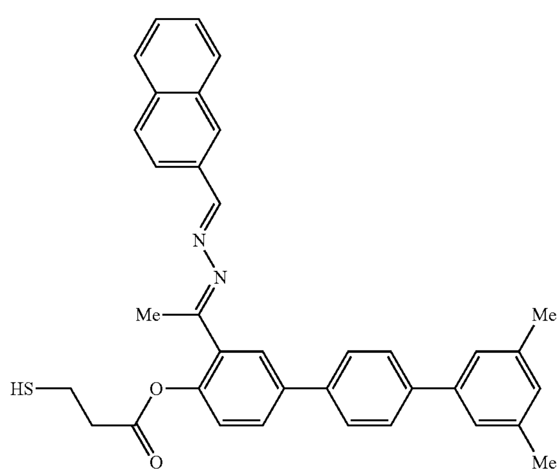

-continued
[Chem. 40]
(1-a-33)
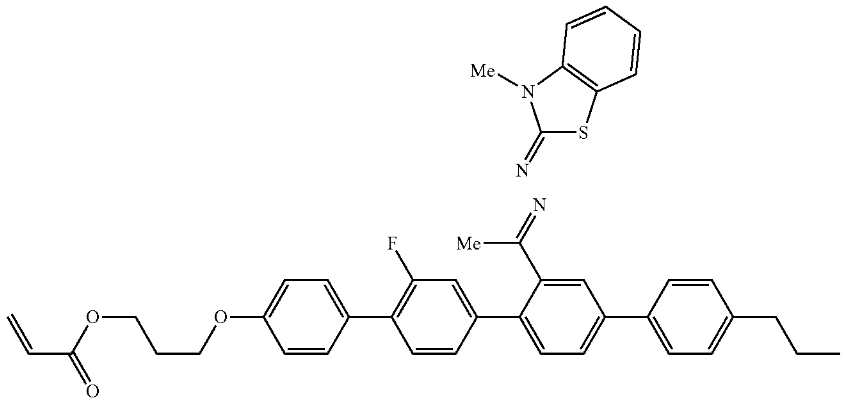
(1-a-34)
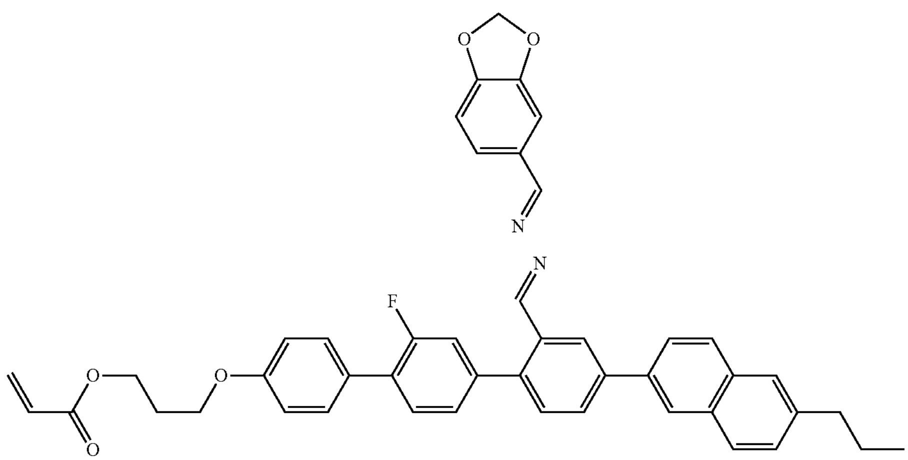
(1-a-35)
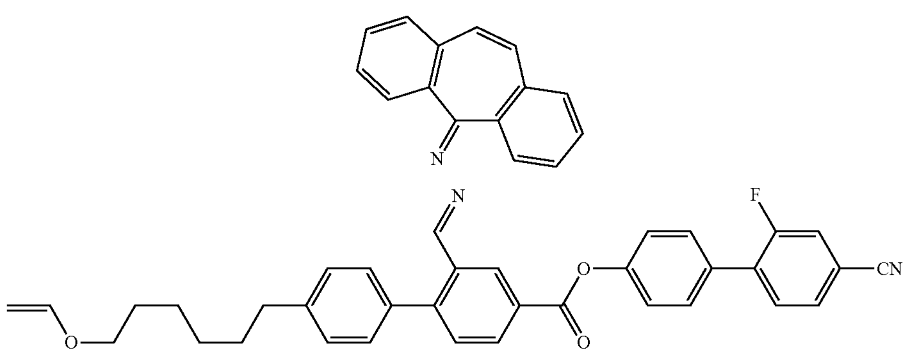

-continued
(1-a-36)
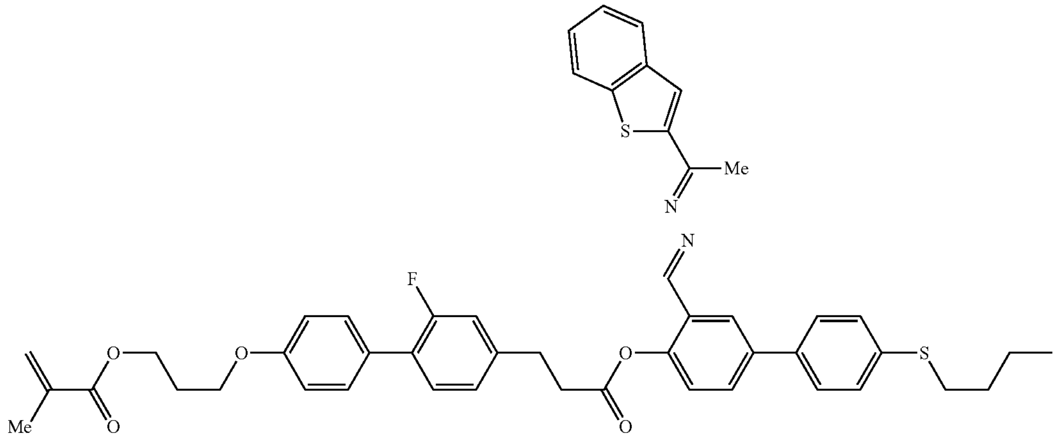
(1-a-37)
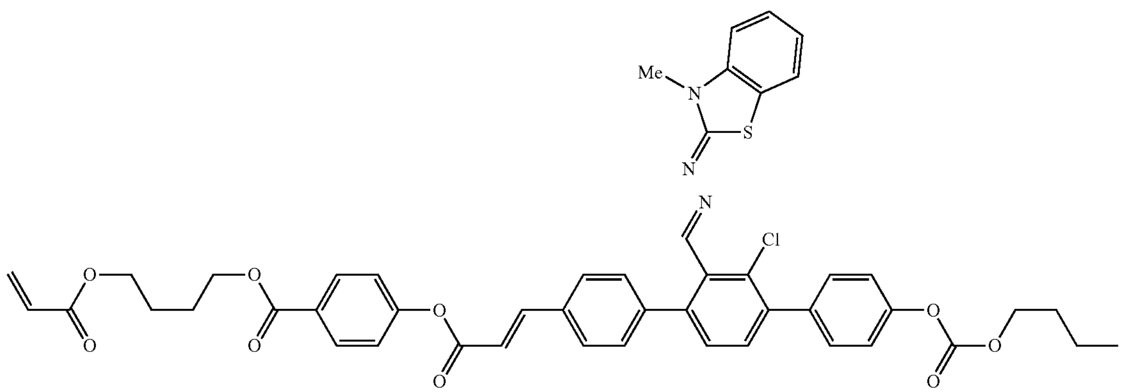
[Chem. 41]
(1-a-38)
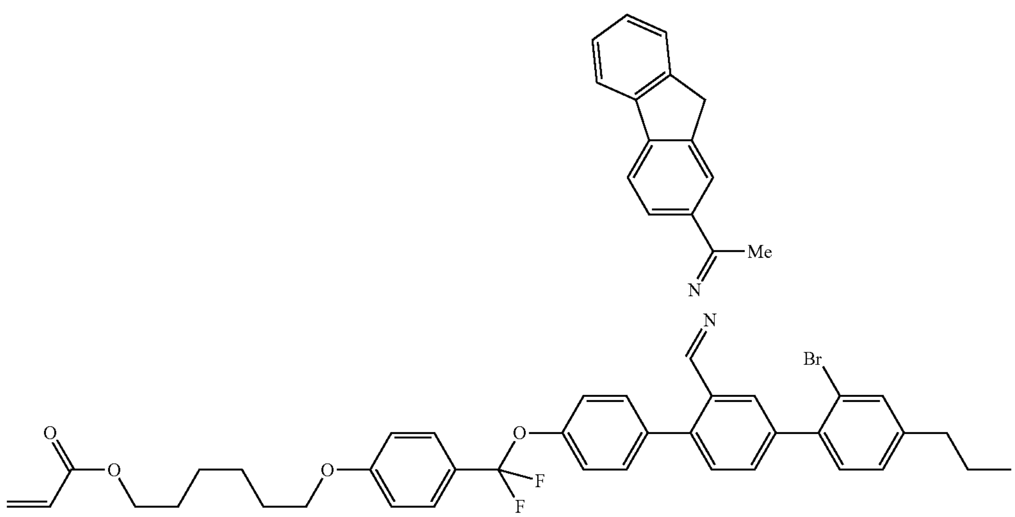

-continued
(1-a-39)
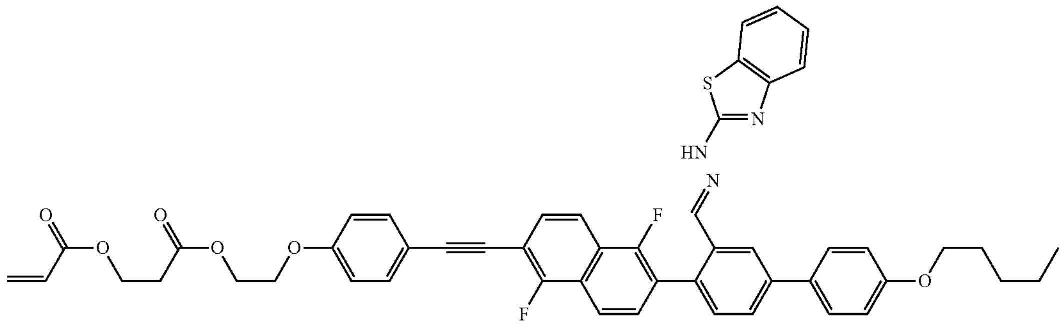
(1-a-40)
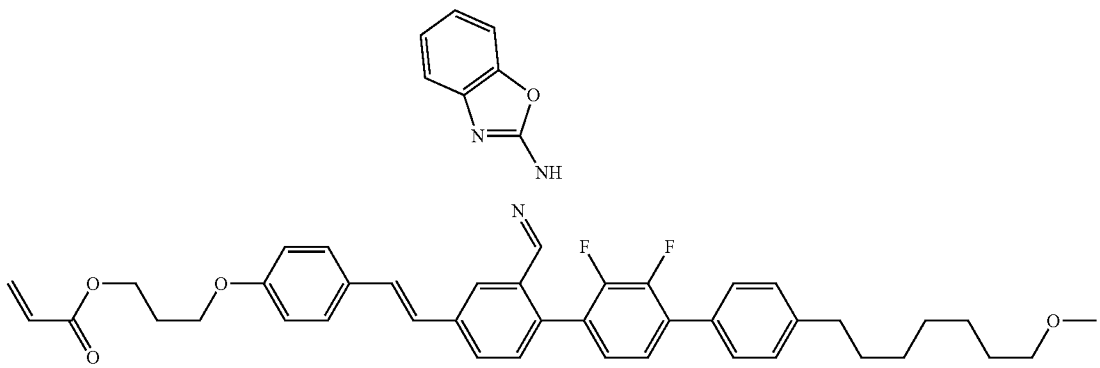
(1-a-41)
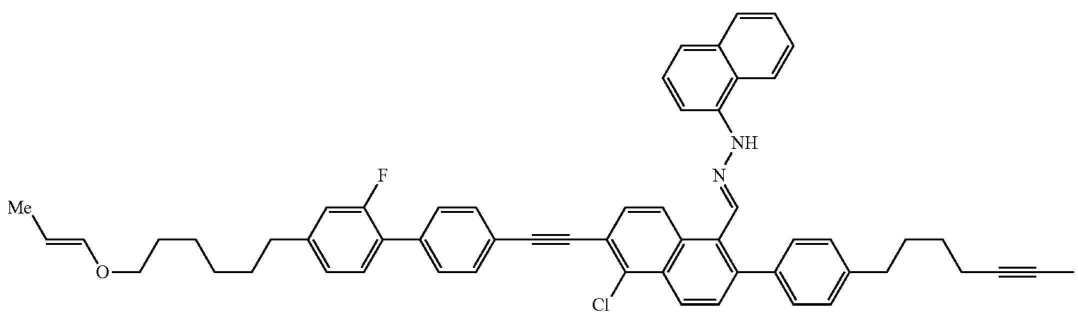
(1-a-42)
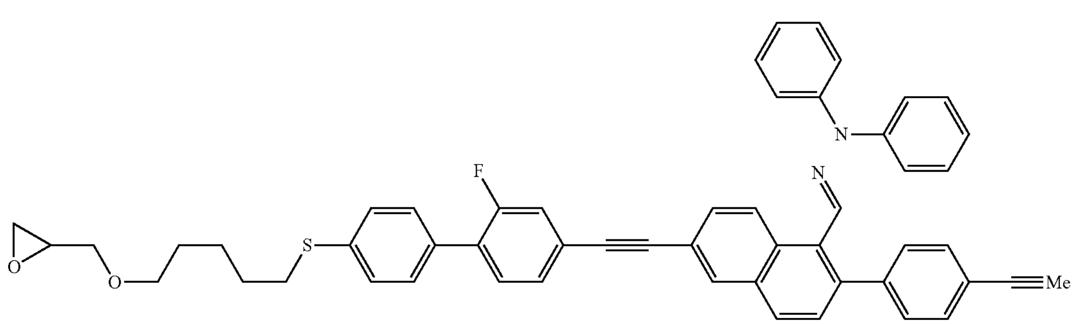

-continued
[Chem. 42]
(1-a-43)
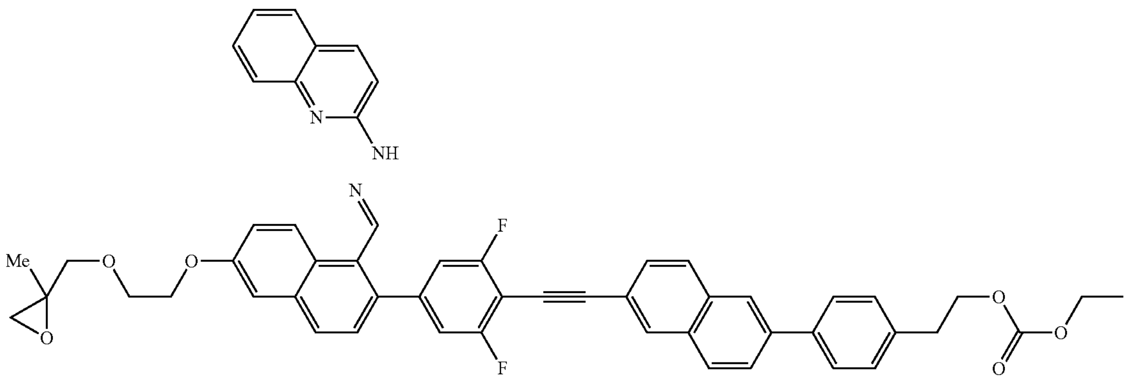
(1-a-44)
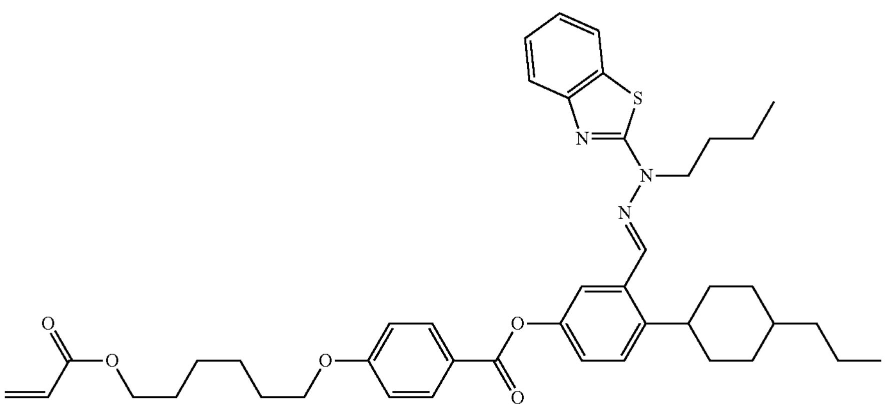
(1-a-45)
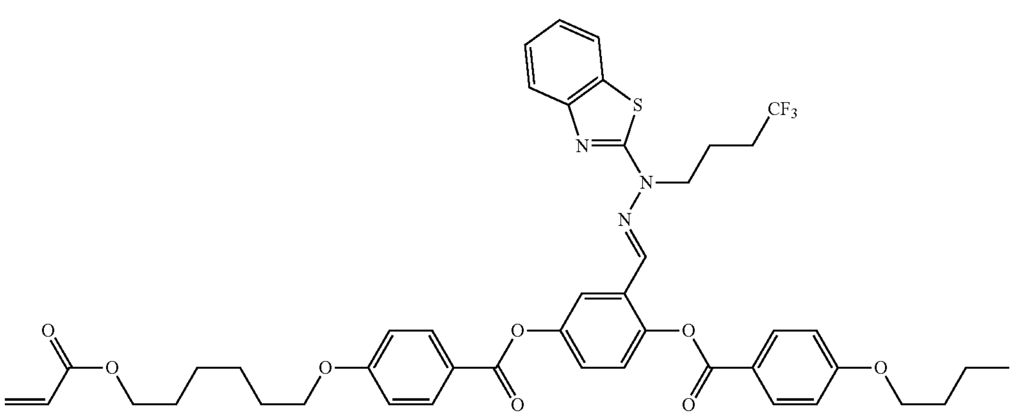

-continued
(1-a-47)
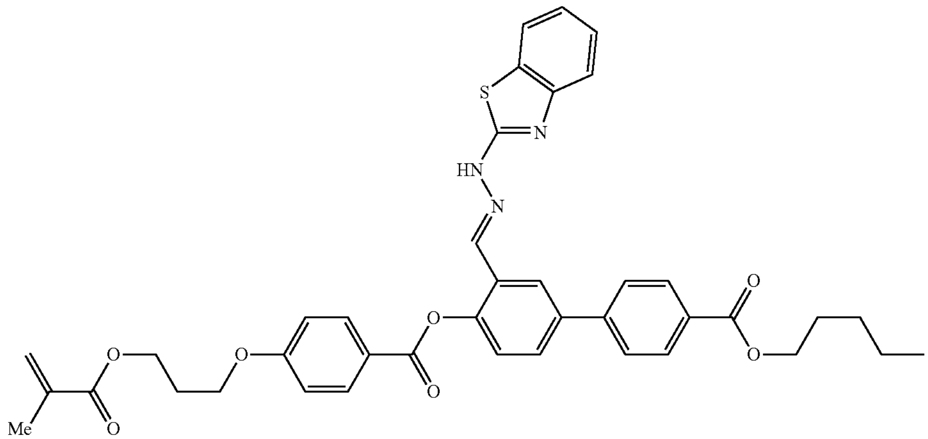
(1-a-48)
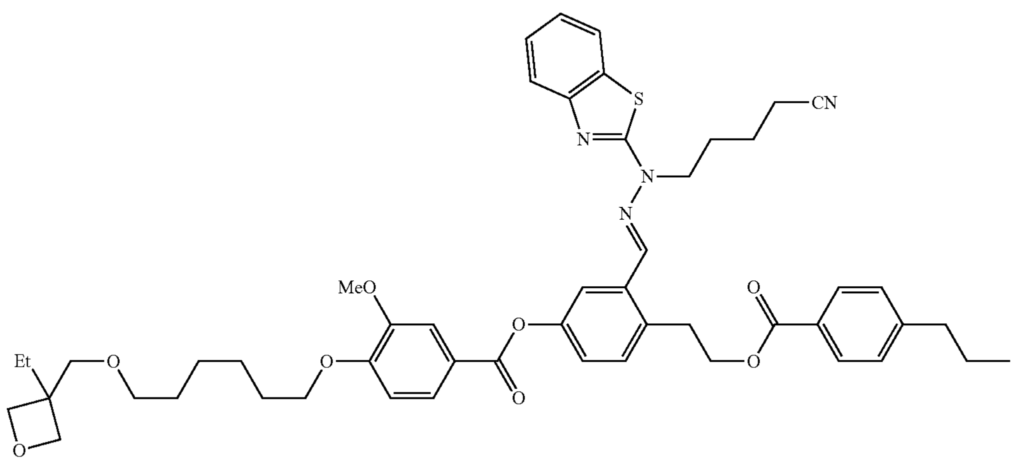
(1-a-49)
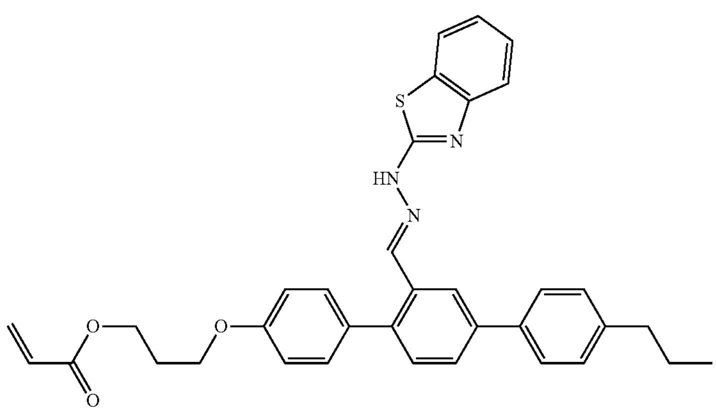

-continued
[Chem. 43]
(1-a-50)
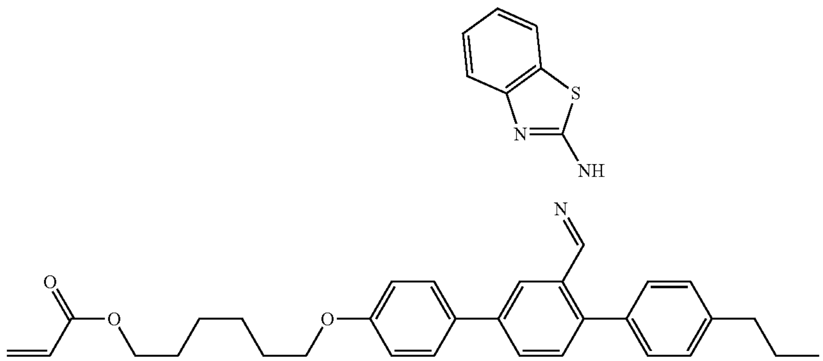
(1-a-51)
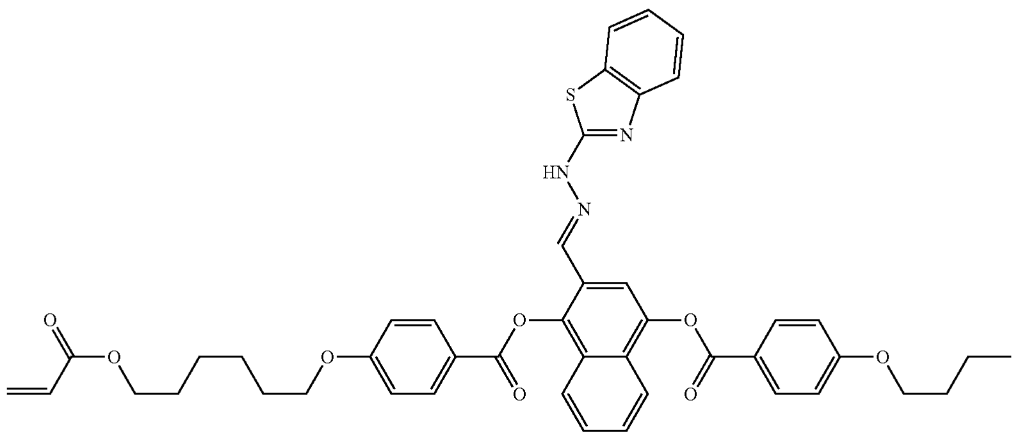
(1-a-52)
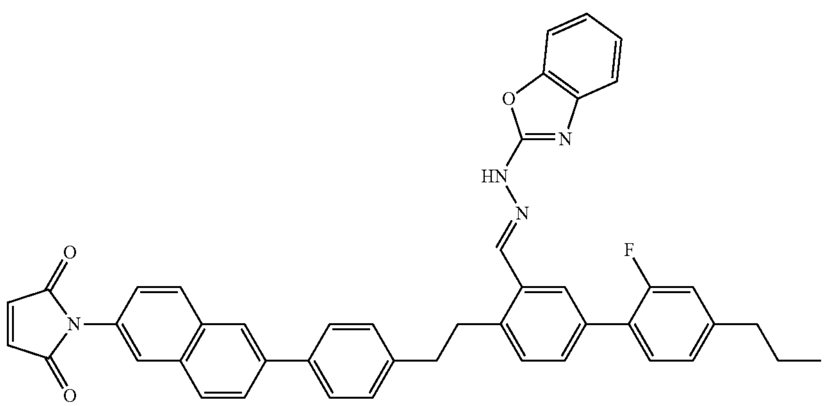
(1-a-53)
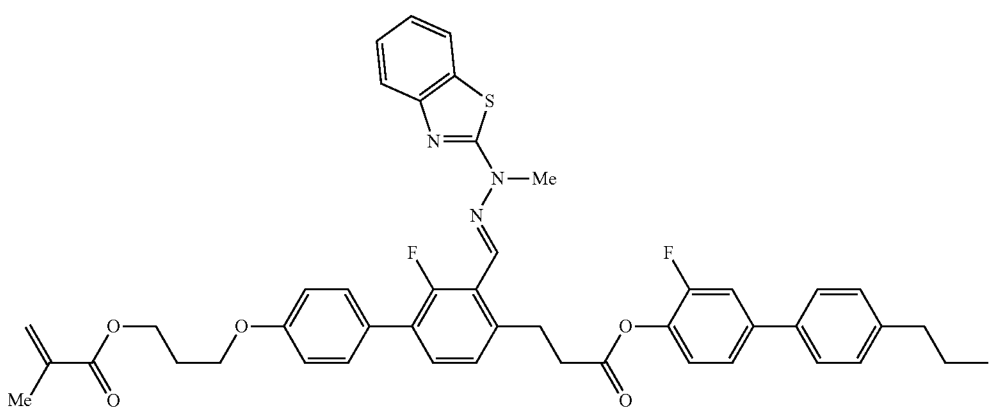

-continued
(1-a-54)
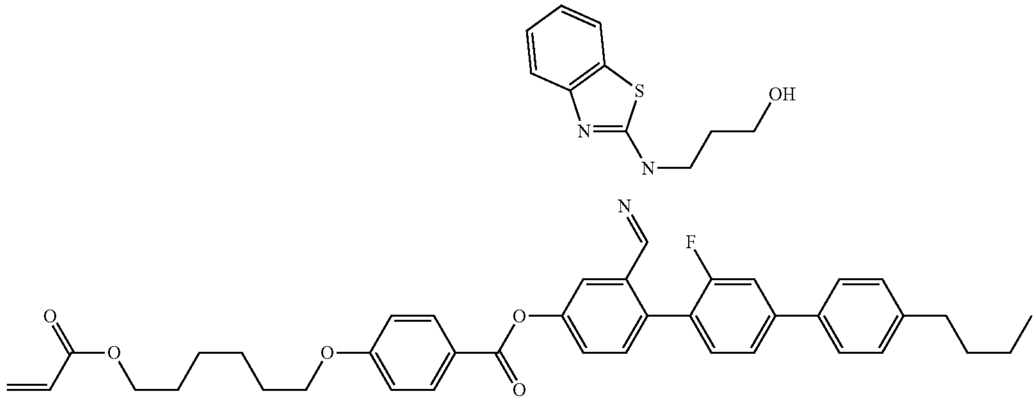
[Chem. 44]
(1-a-55)
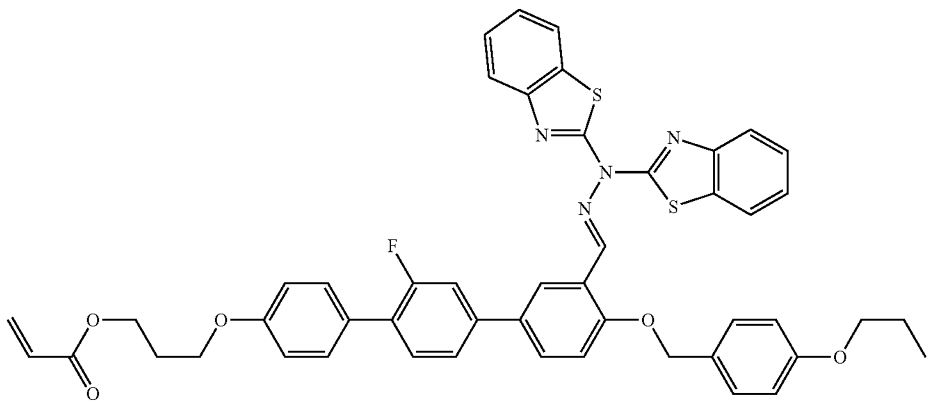
(1-a-56)
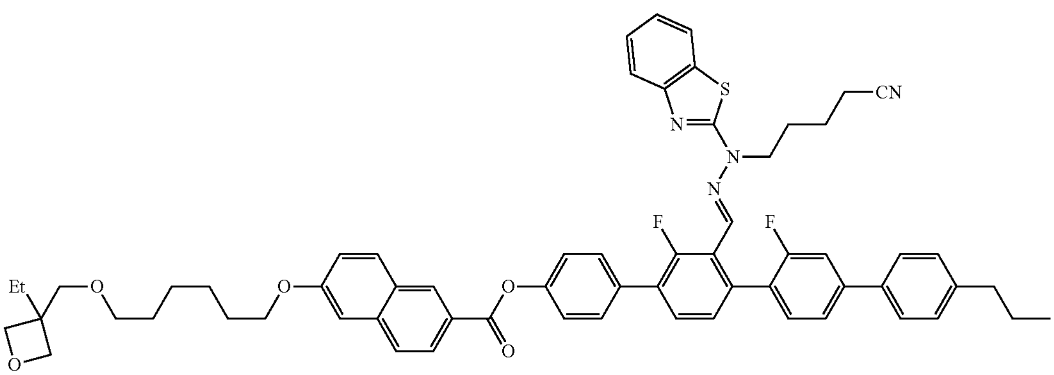
(1-a-57)
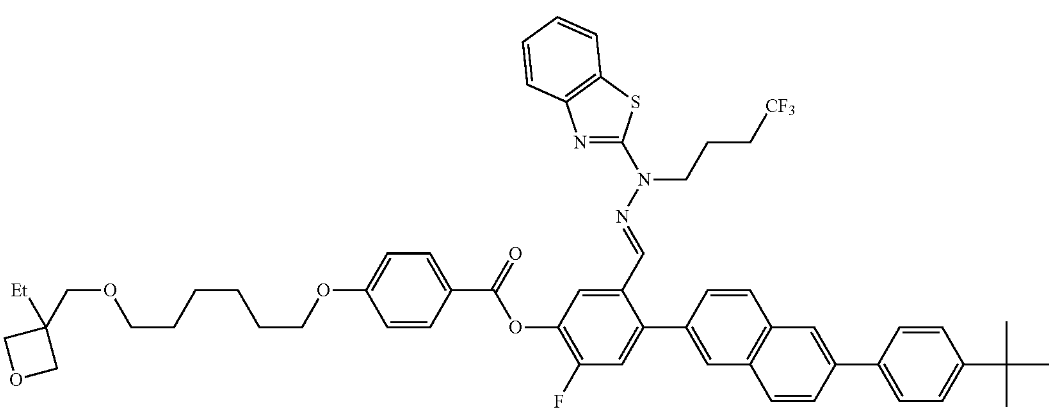

-continued
(1-a-58)
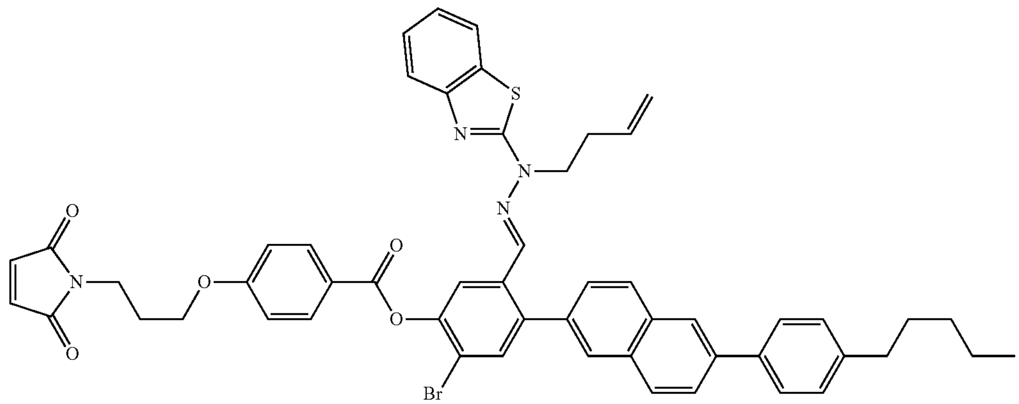
(1-a-59)
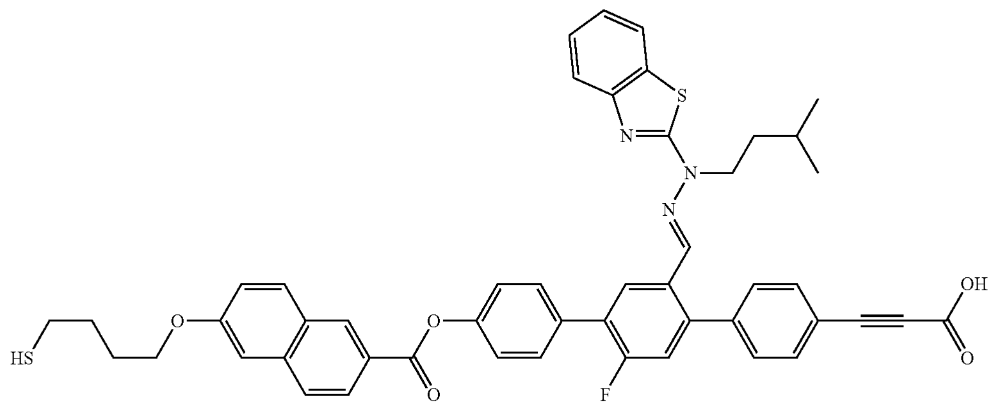
[Chem. 45]
(1-a-60)
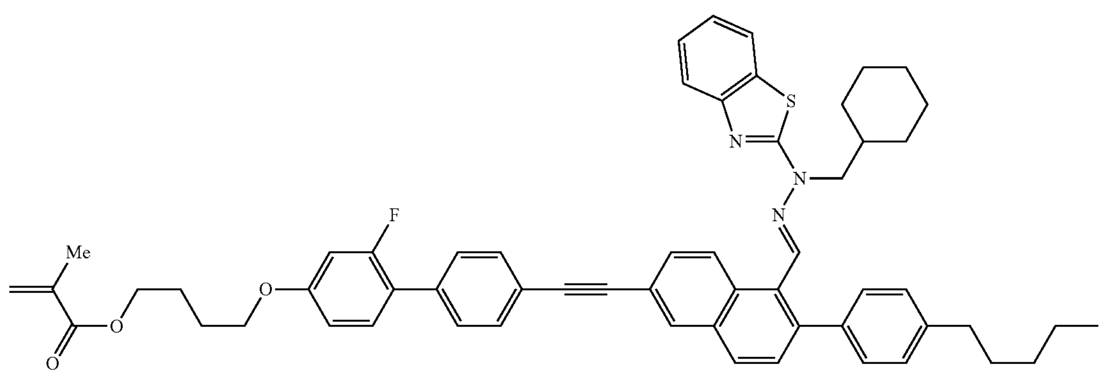
(1-a-61)
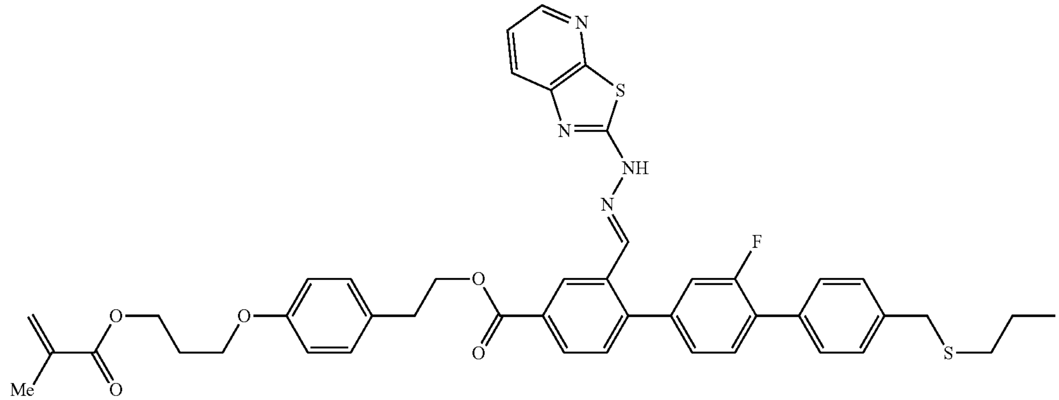

-continued
(1-a-62)
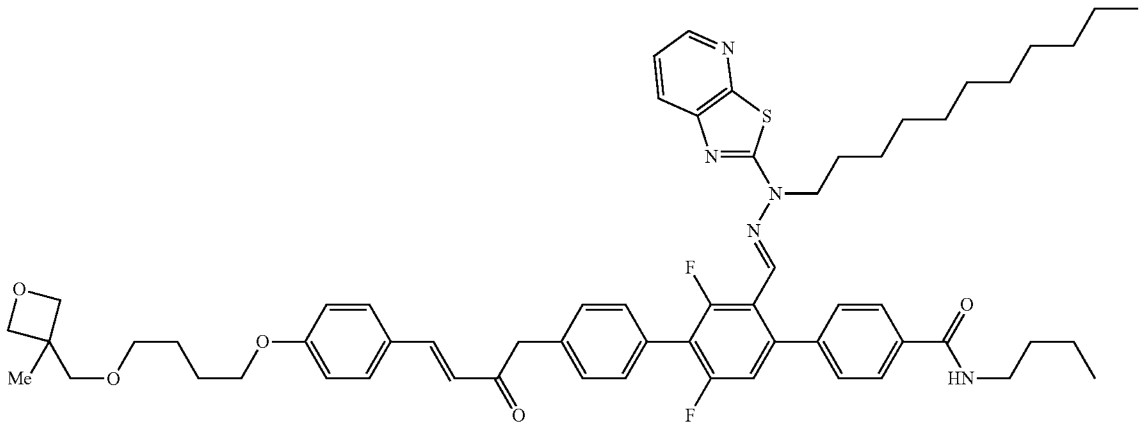
(1-a-63)
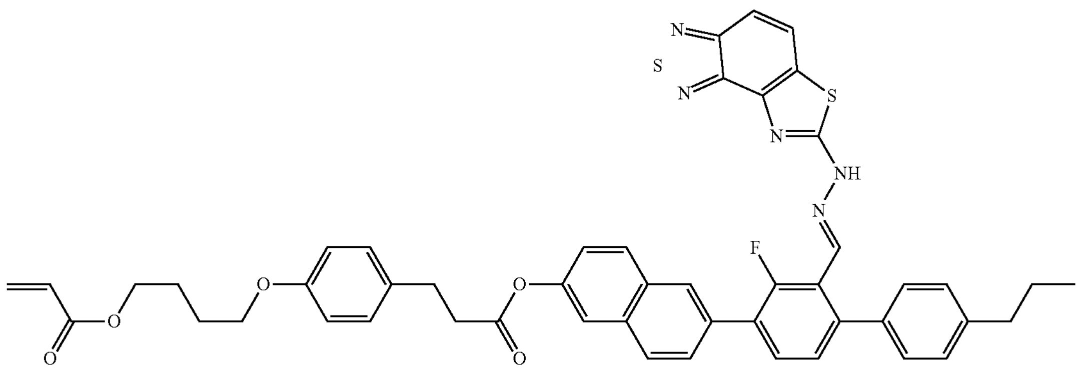
(1-a-64)
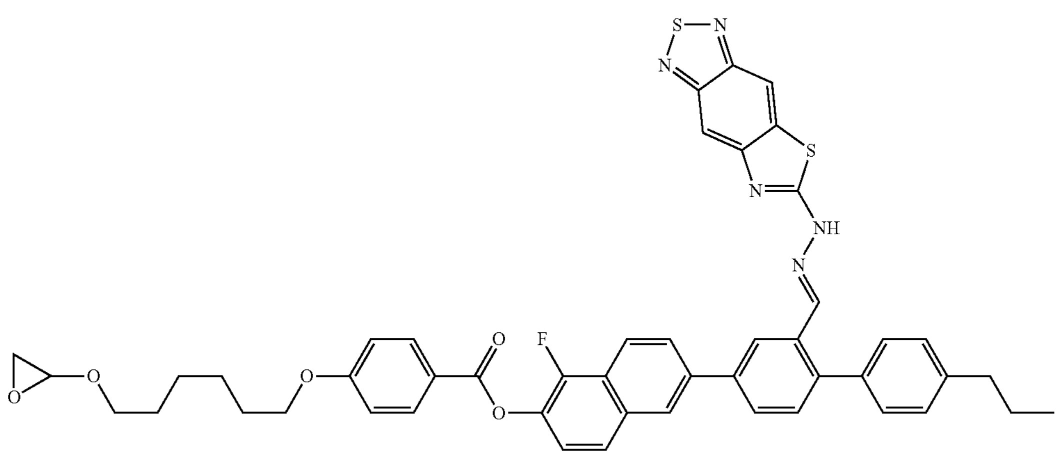

-continued
[Chem. 46]
(1-a-65)
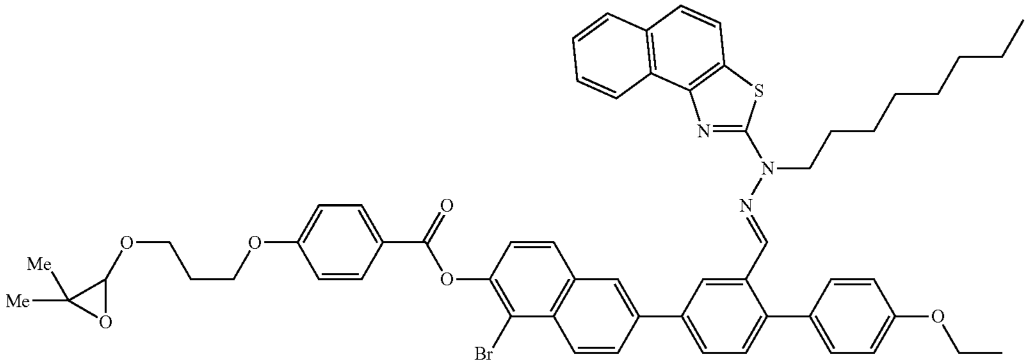
(1-a-66)
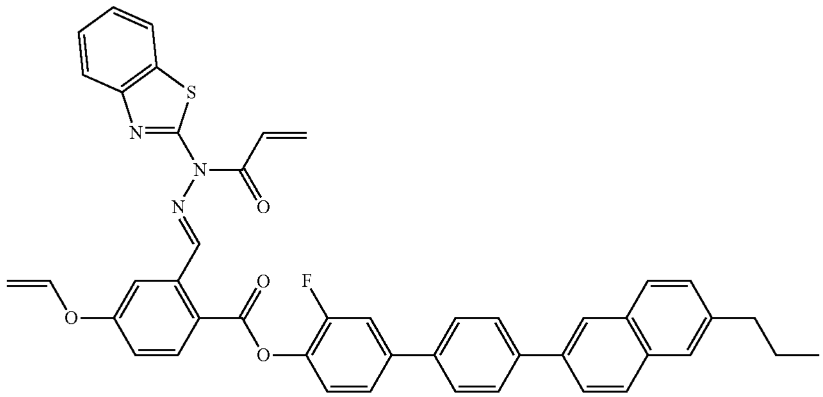
(1-a-67)
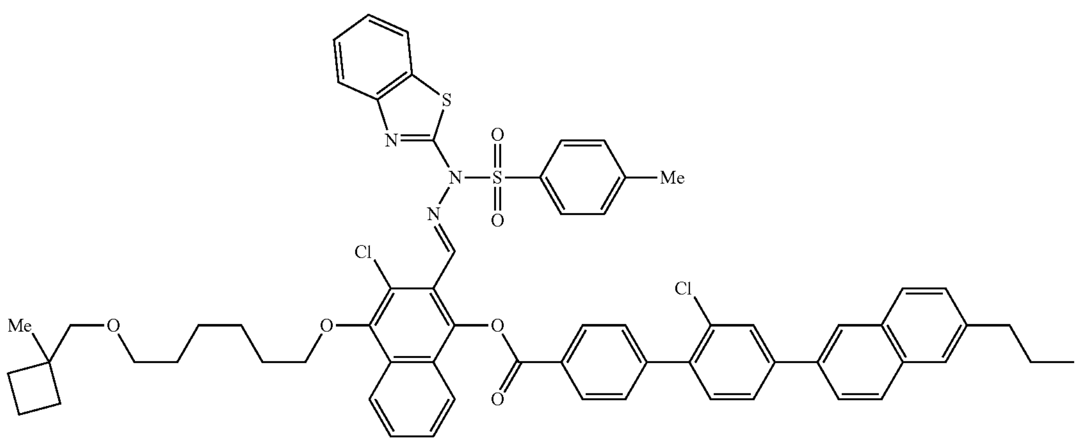
(1-a-68)
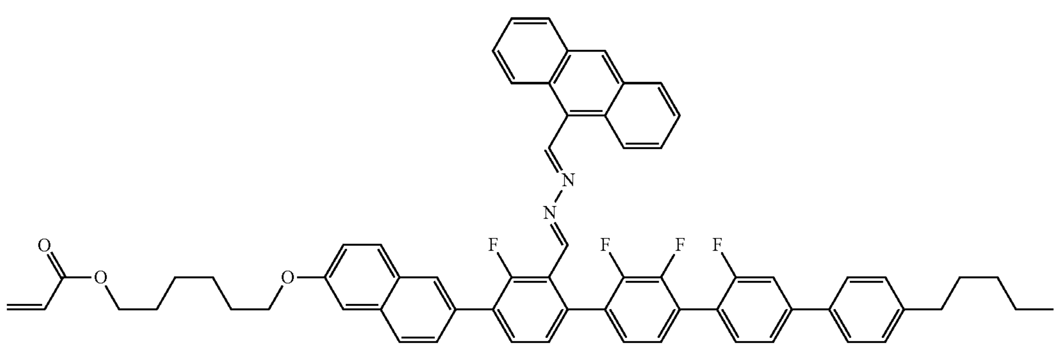

-continued
(1-a-69)
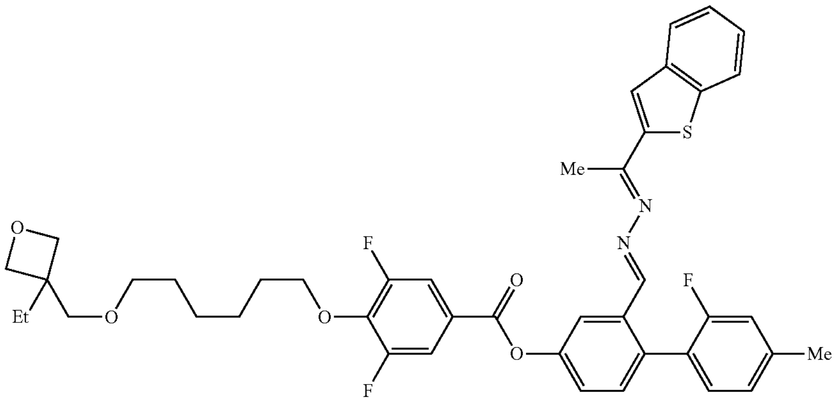
(1-a-70)
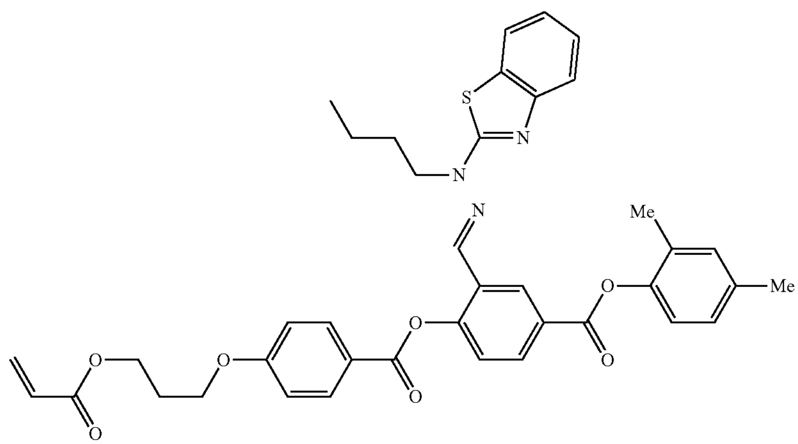
[Chem. 47]
(1-a-71)
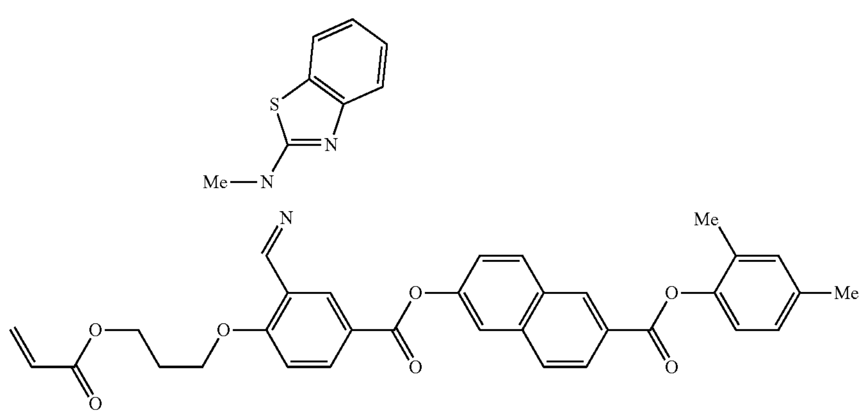

-continued
(1-a-72)
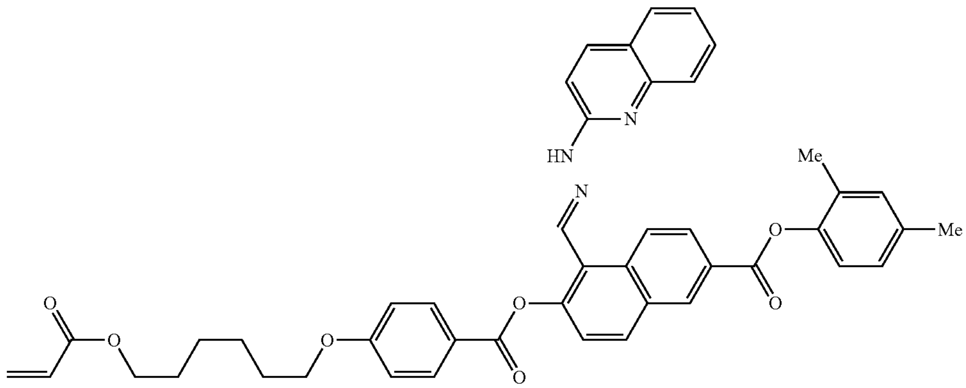
(1-a-73)
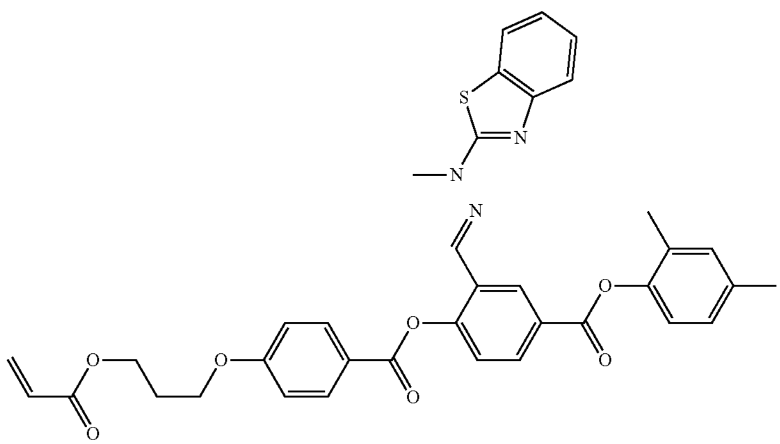
(1-a-75)
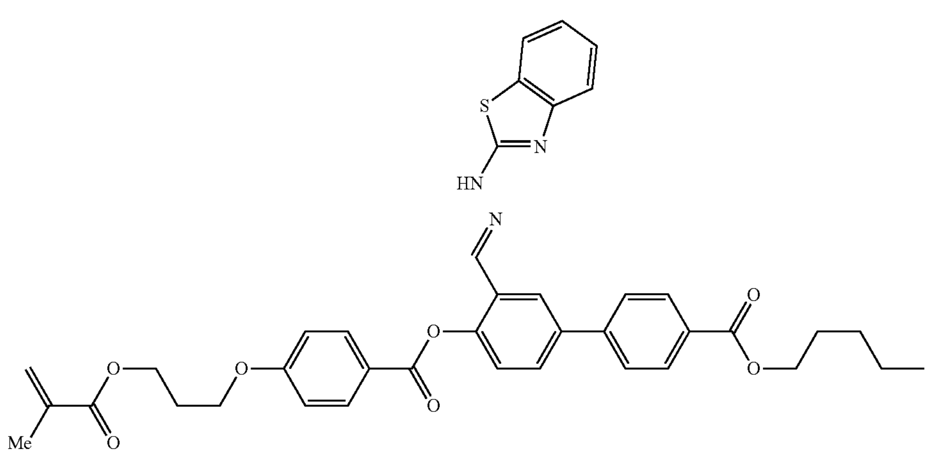

-continued
(1-a-76)
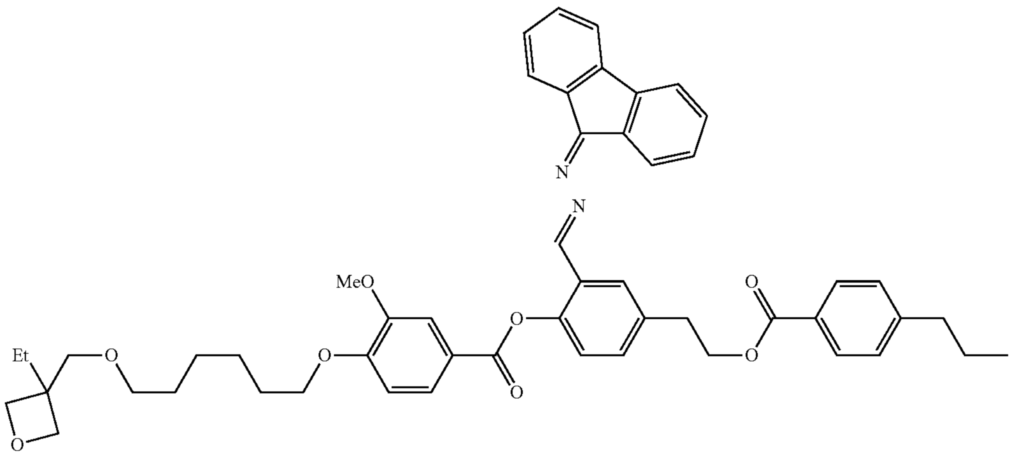
[Chem. 48]
(1-a-77)
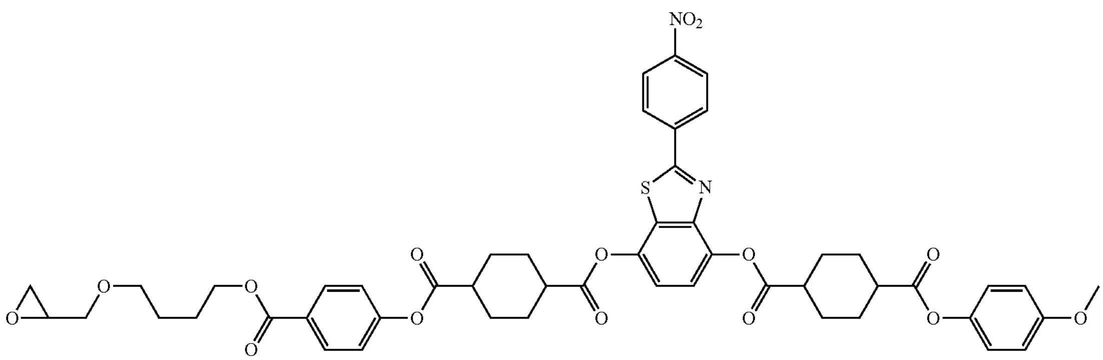
(1-a-78)
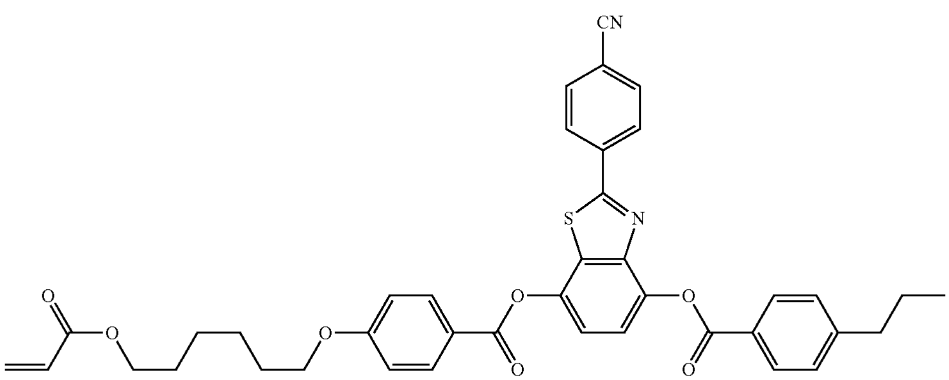
(1-a-79)
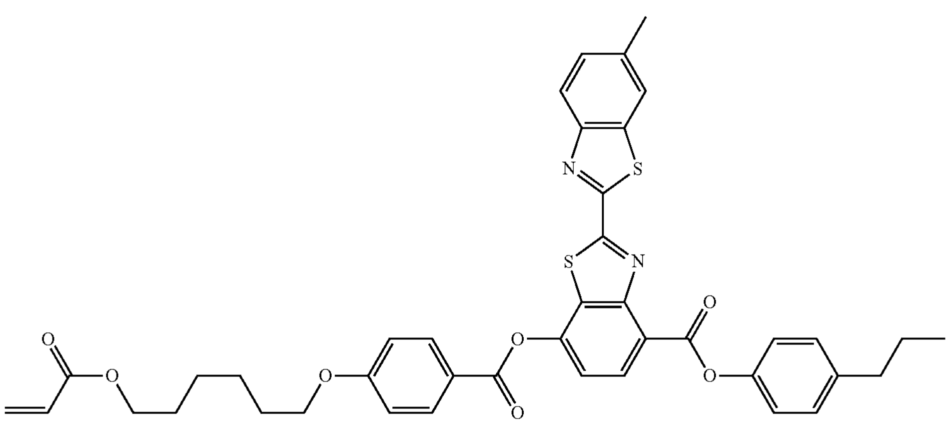

-continued
(1-a-80)
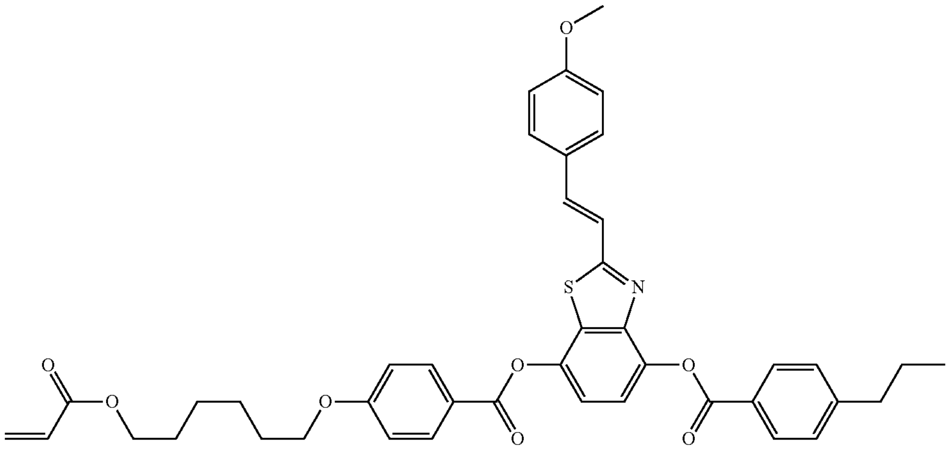
(1-a-81)
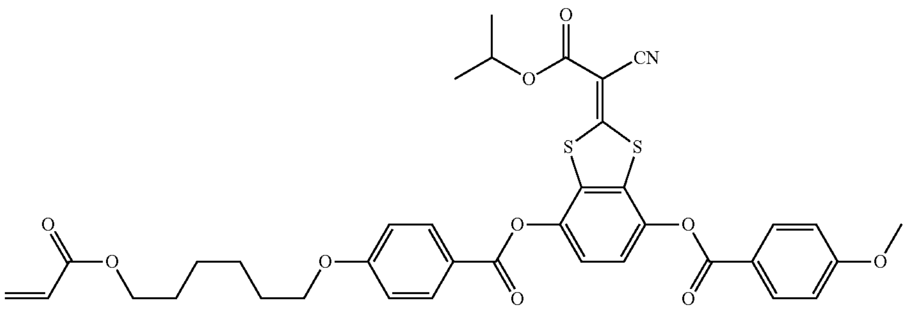
[Chem. 49]
(1-a-82)
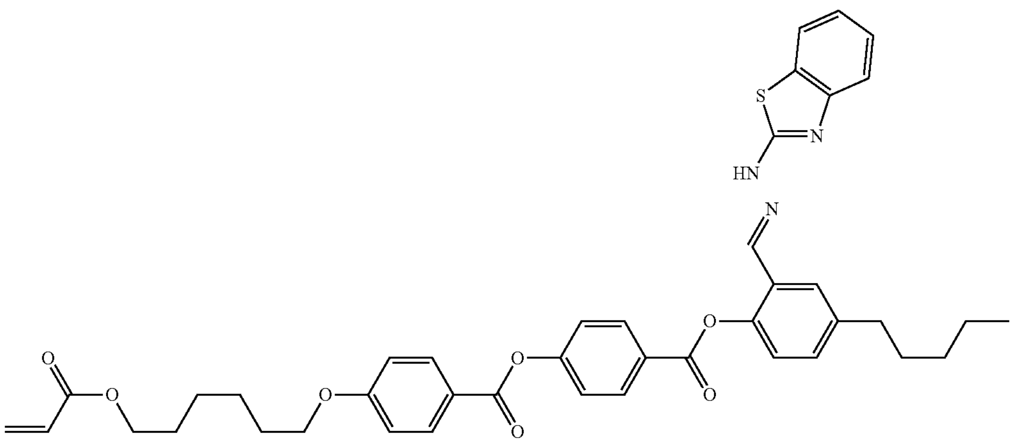
(1-a-83)
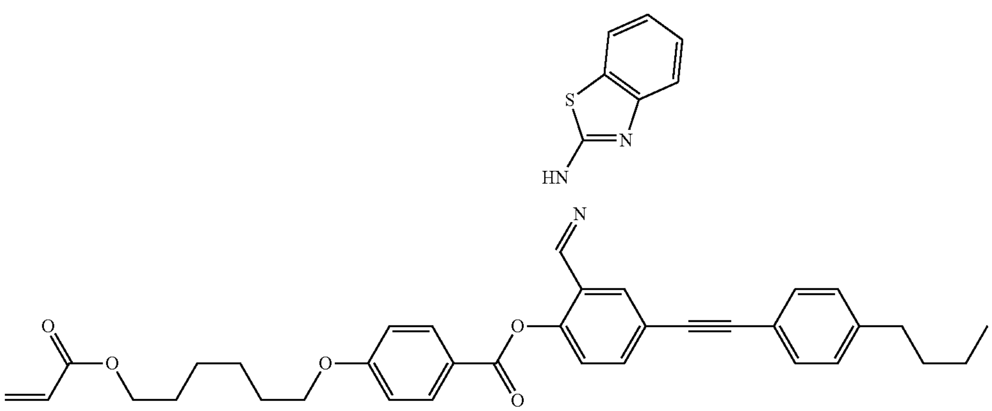

-continued
(1-a-84)
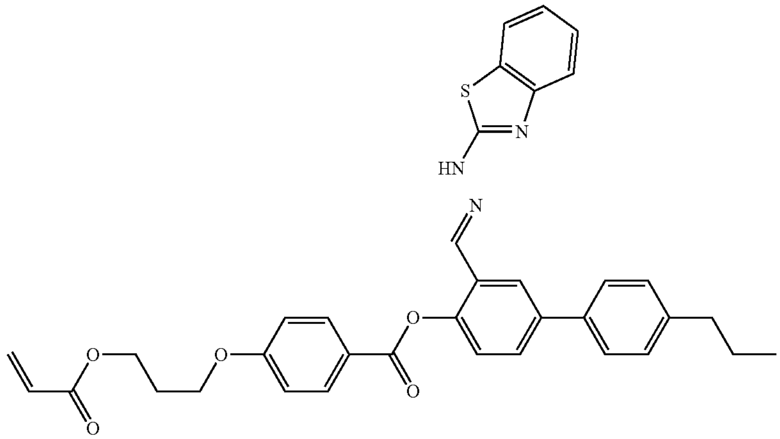
[Chem. 50]
(1-a-85)
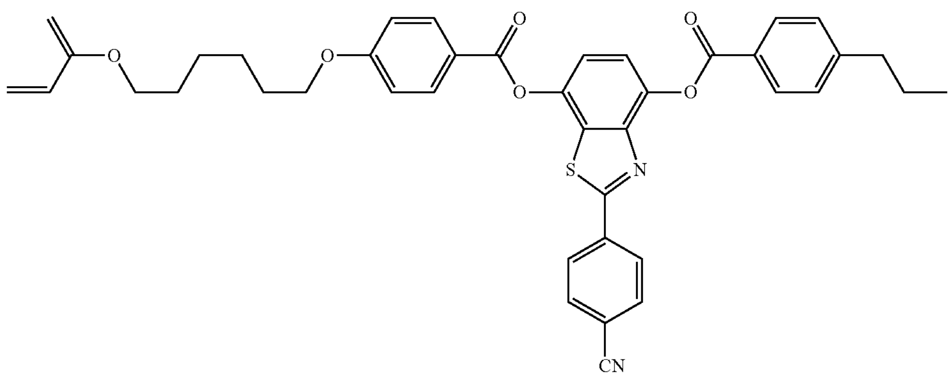
(1-a-86)
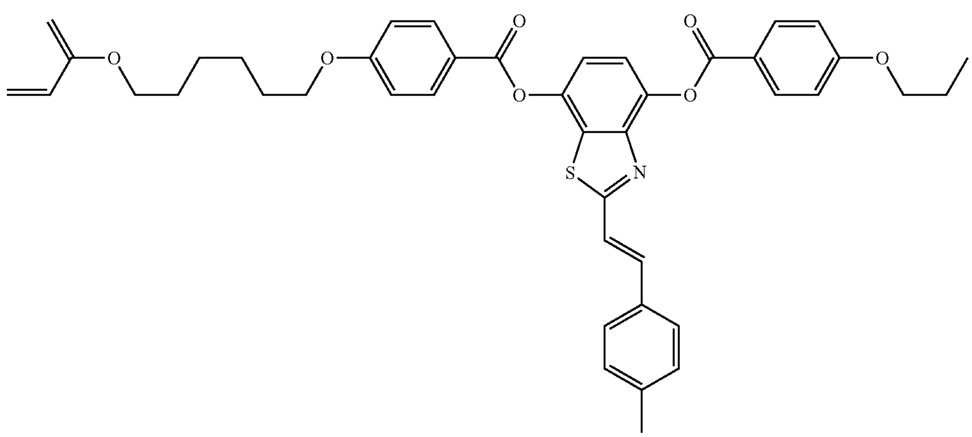
[Chem. 51]
(1-a-87)
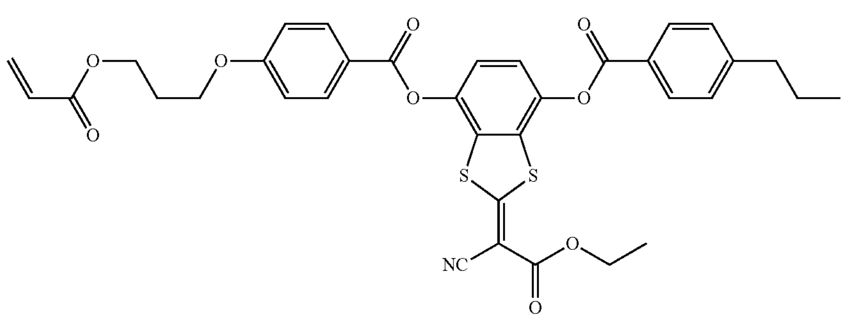

-continued
(1-a-88)
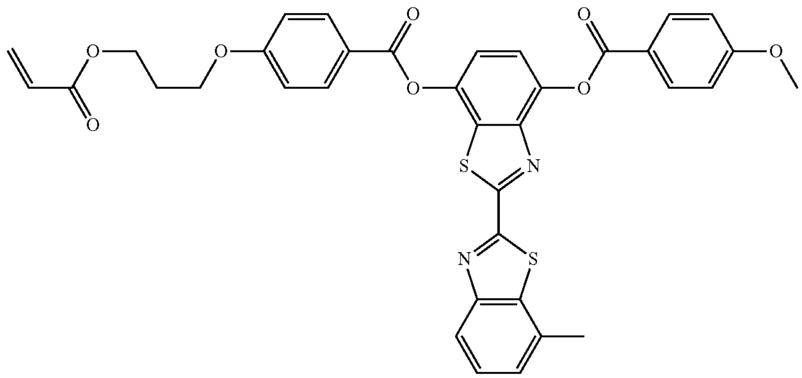
[Chem. 52]
(1-a-89)
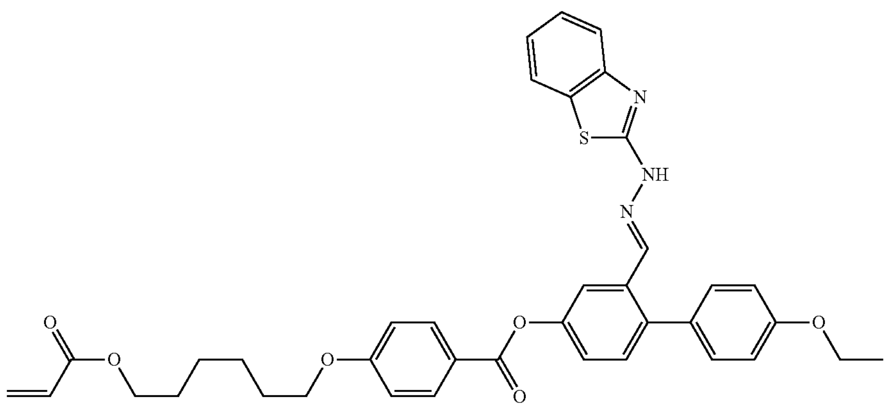
(1-a-90)
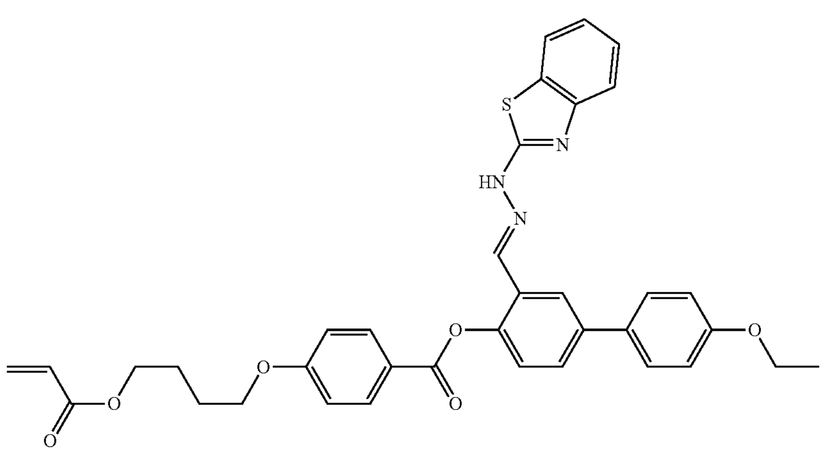

-continued
(1-a-91)
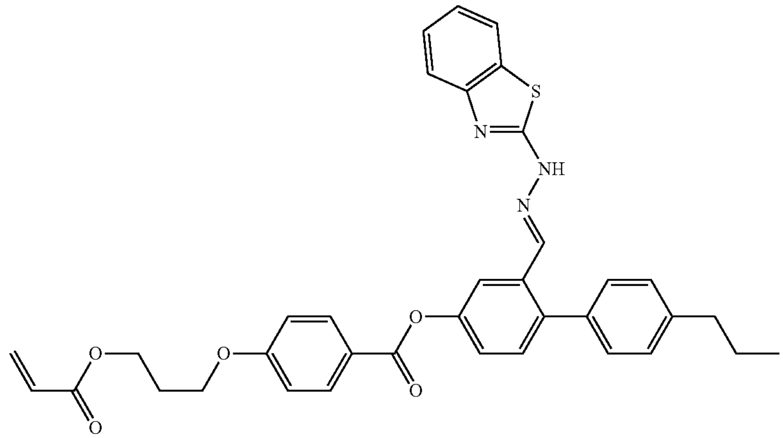
(1-a-92)
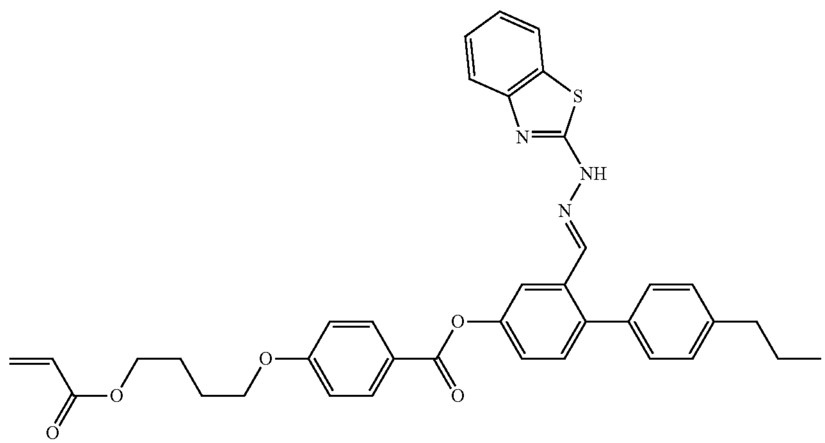
[Chem. 53]
(1-a-93)
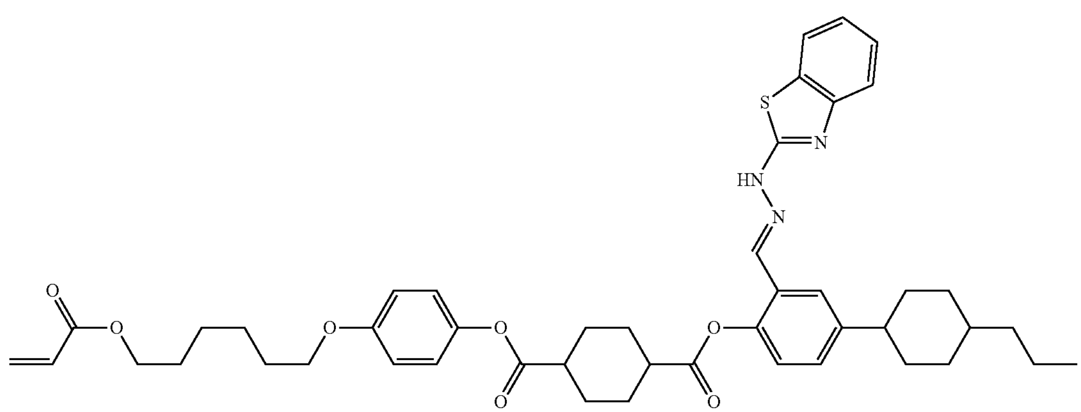

-continued
(1-a-94)
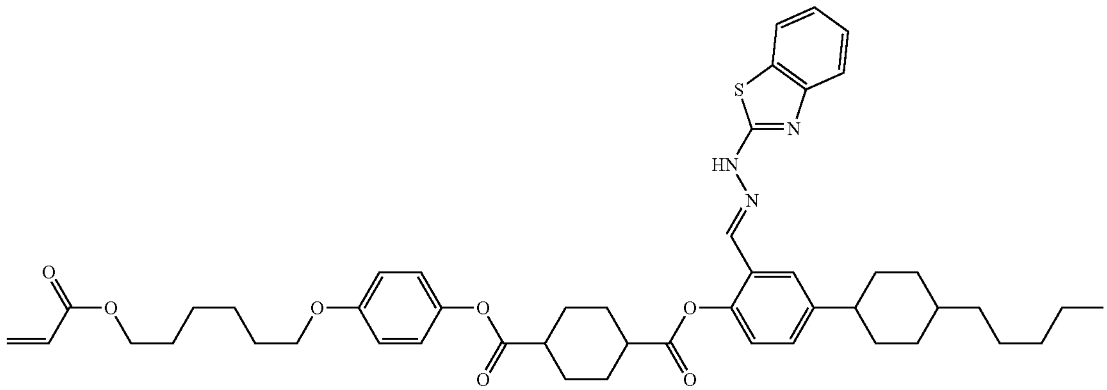
(1-a-95)
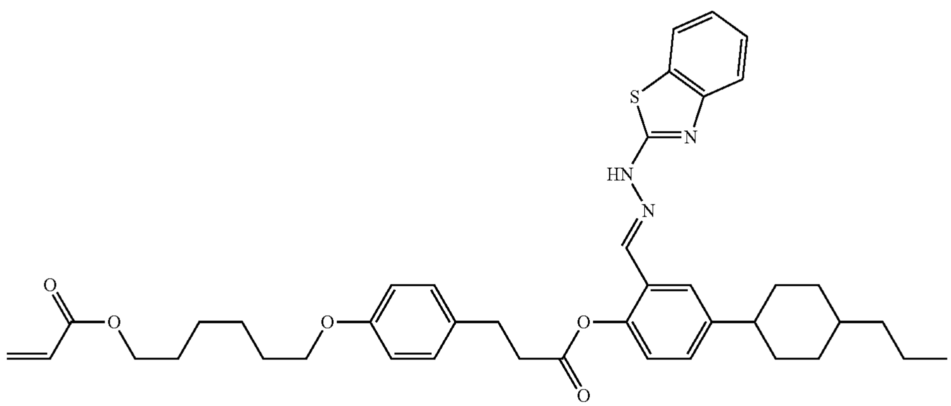
[Chem. 54]
(1-a-96)
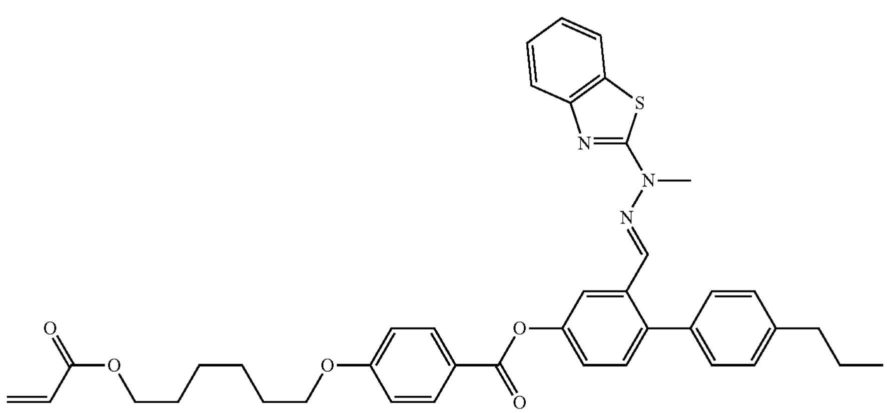

-continued
(1-a-97)
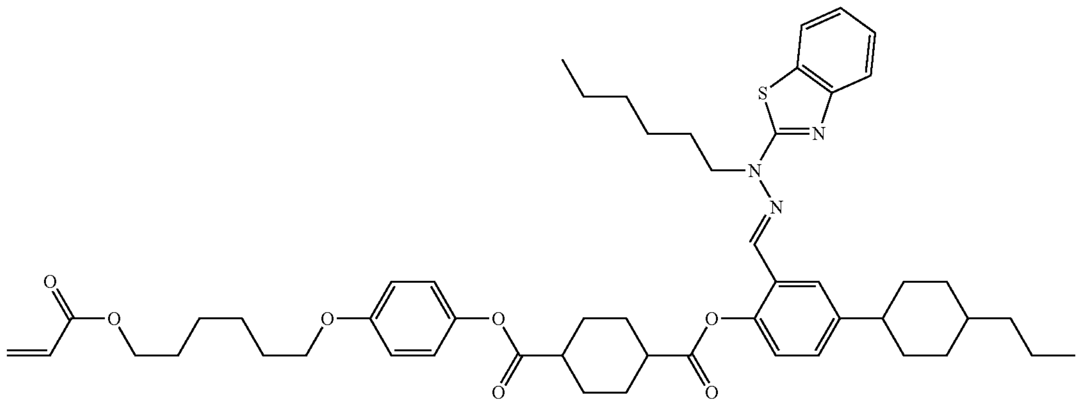
[Chem. 55]
(1-a-98)
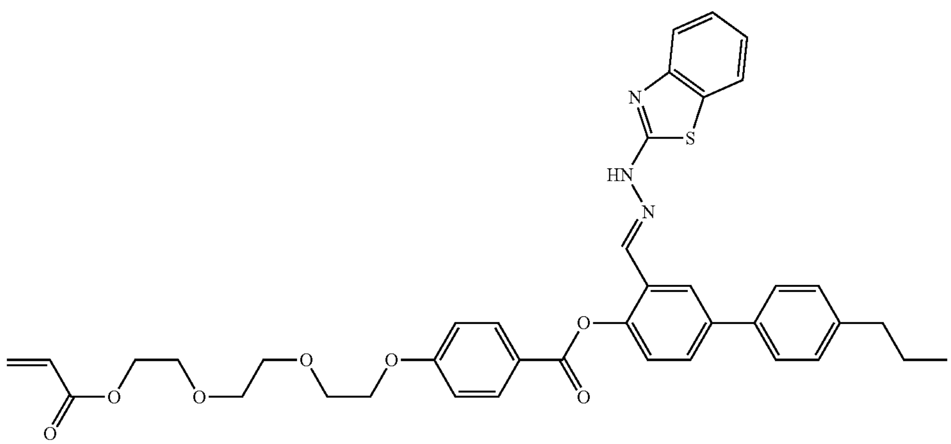
(1-a-99)
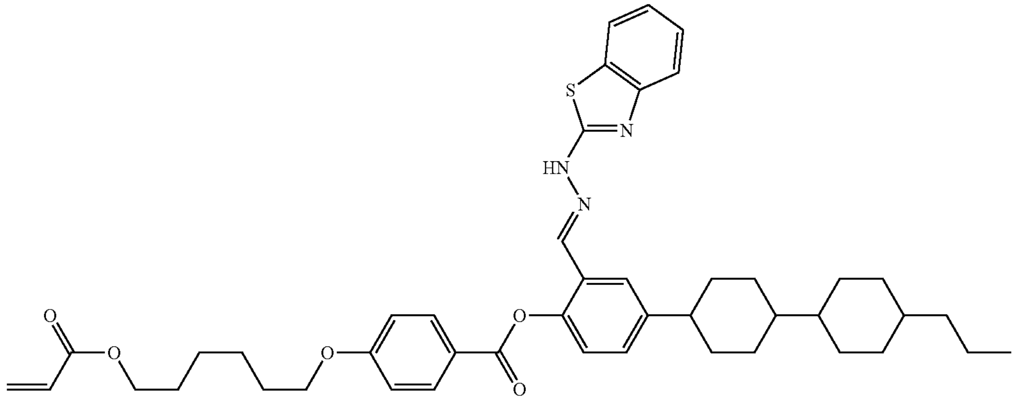

-continued
(1-a-100)
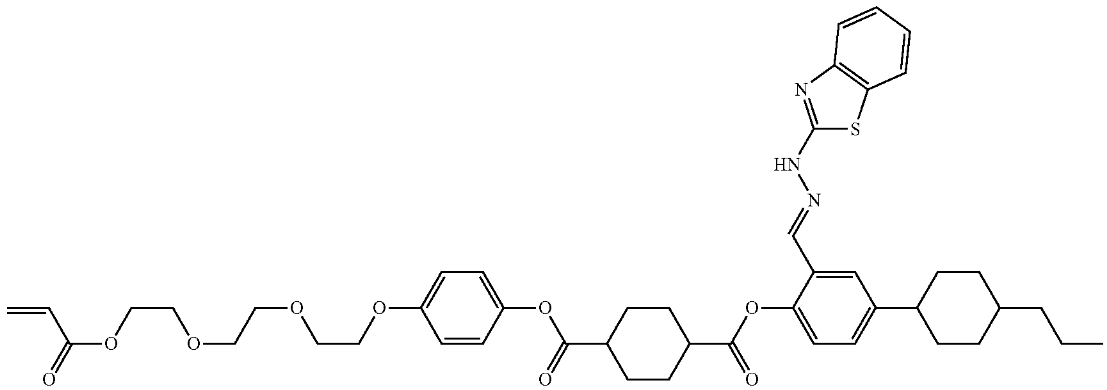
[Chem. 56]
(1-a-101)
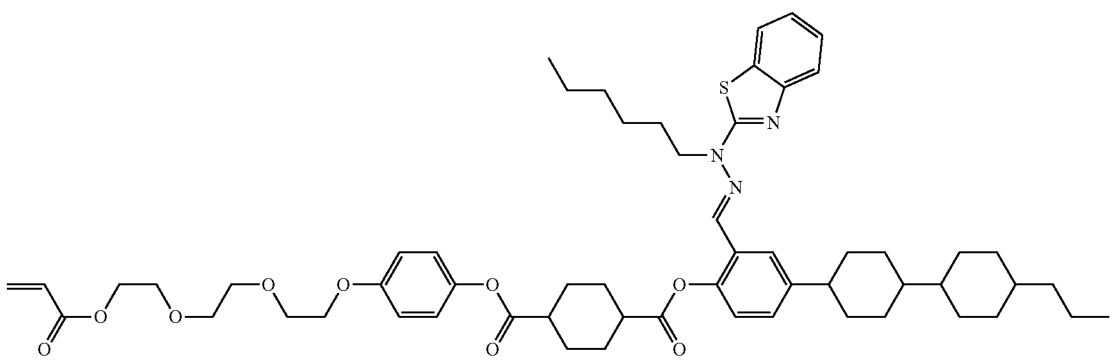
(1-a-102)
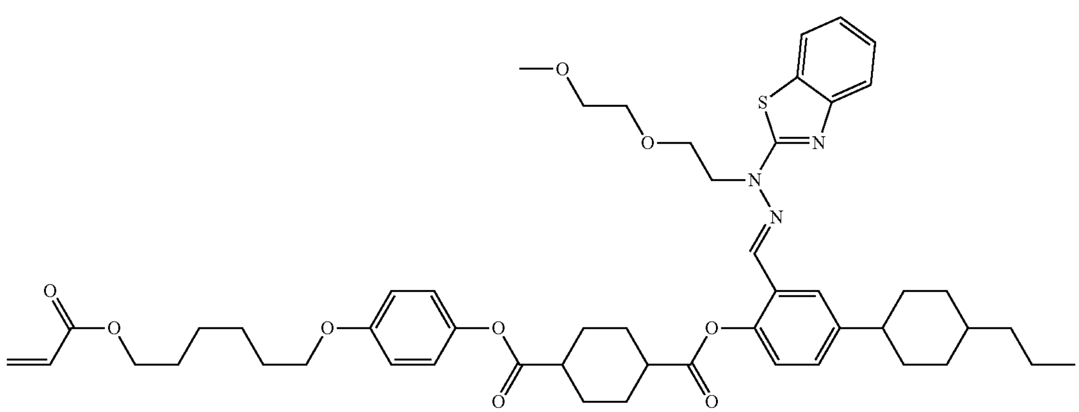

-continued
[Chem. 57]
(1-a-103)
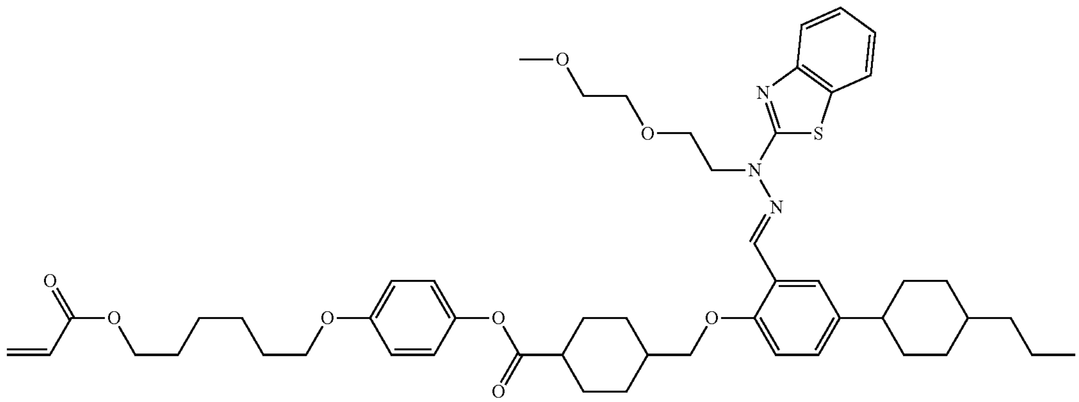
(1-a-104)
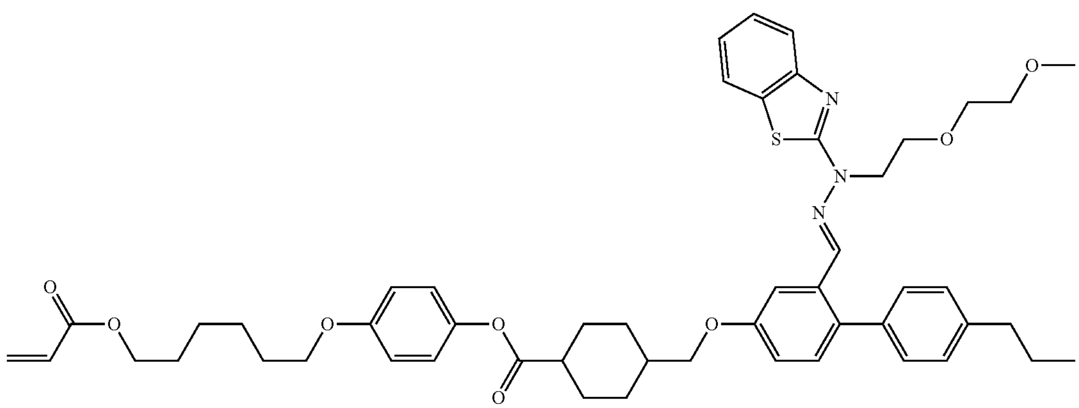
(1-a-105)
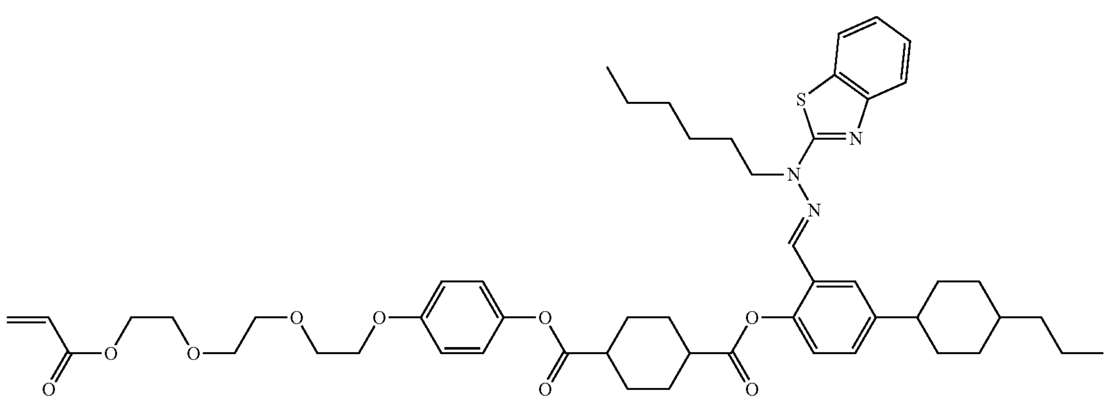
These liquid crystalline compounds may be used alone or in combination of two or more kinds thereof.

Preferred specific examples of the compound represented by Formula (2) include compounds represented by Formulae (2-a-1) to (2-a-61).
[Chem. 58]
(2-a-1)
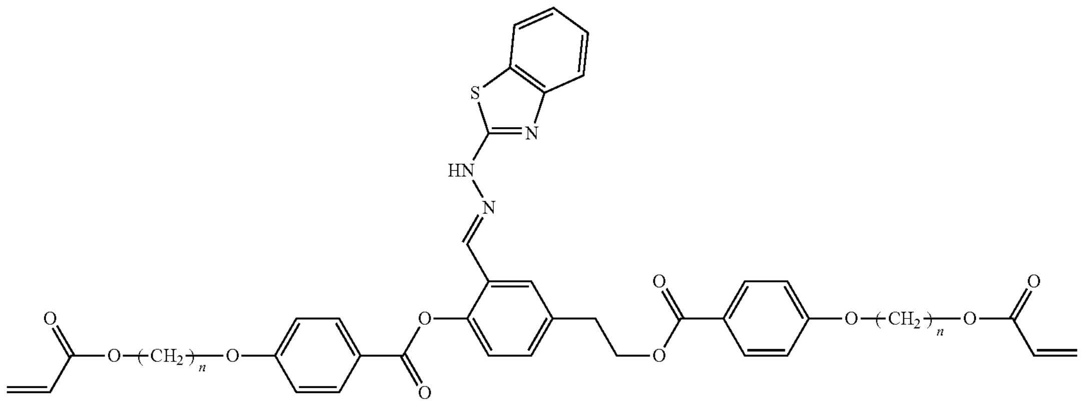
(2-a-2)
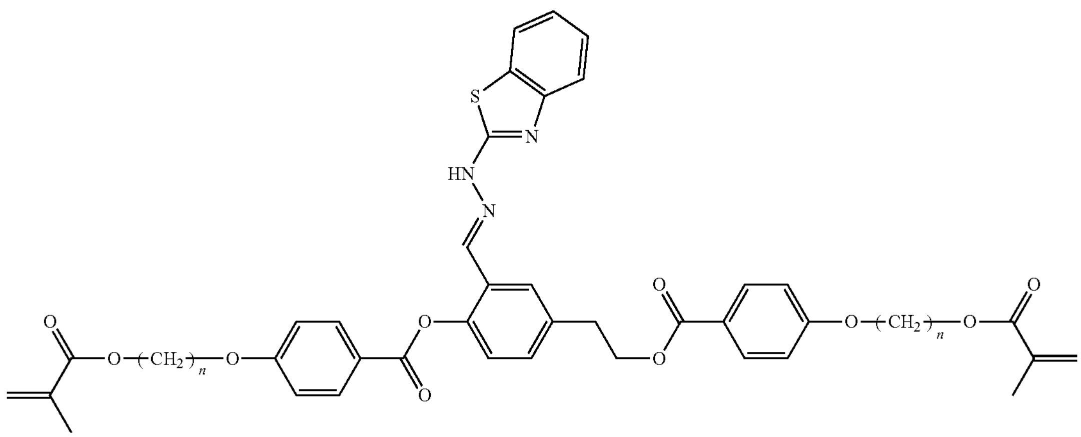
(2-a-3)
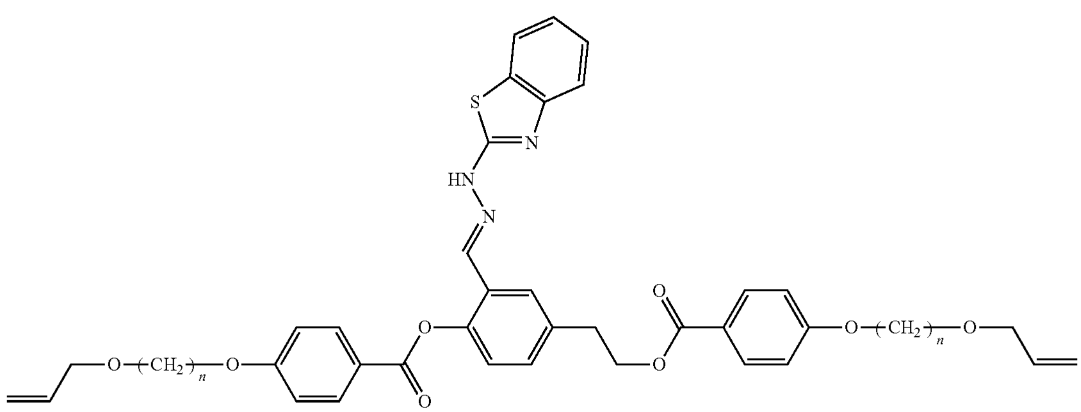

-continued
(2-a-4)
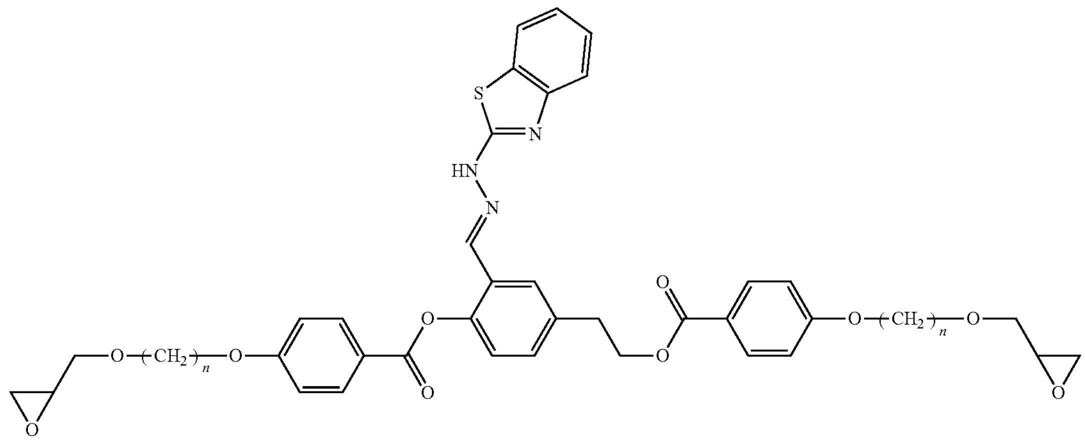
(2-a-5)
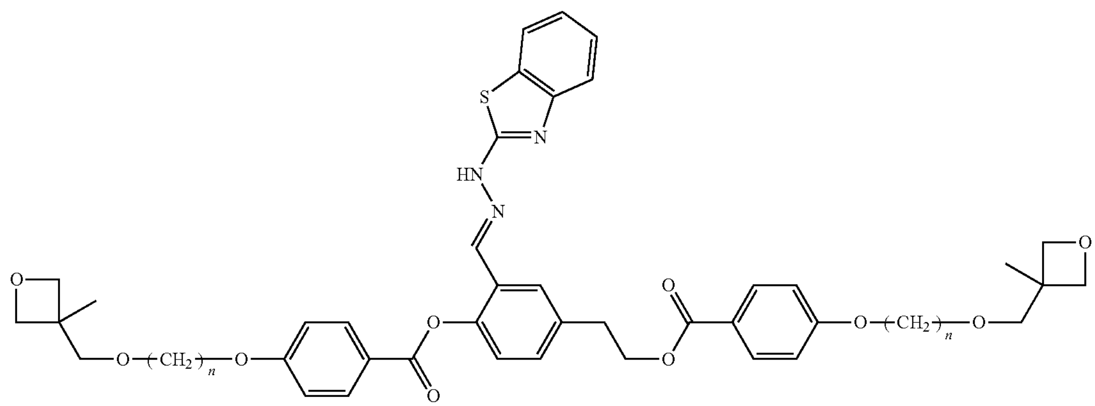
[Chem. 59]
(2-a-6)
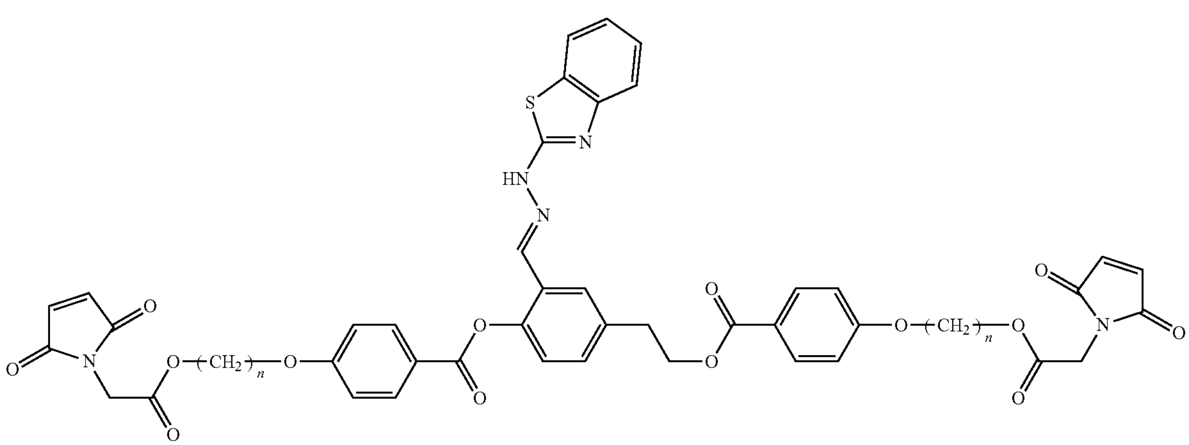

-continued
(2-a-7)
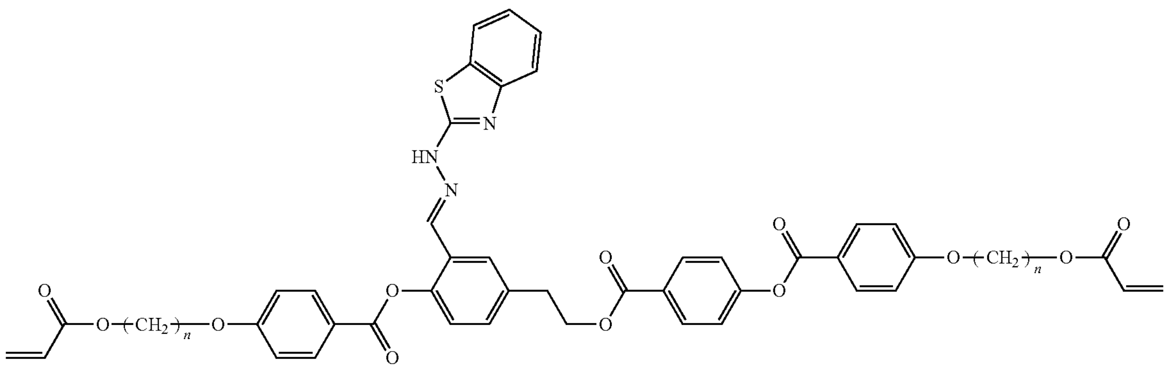
(2-a-8)
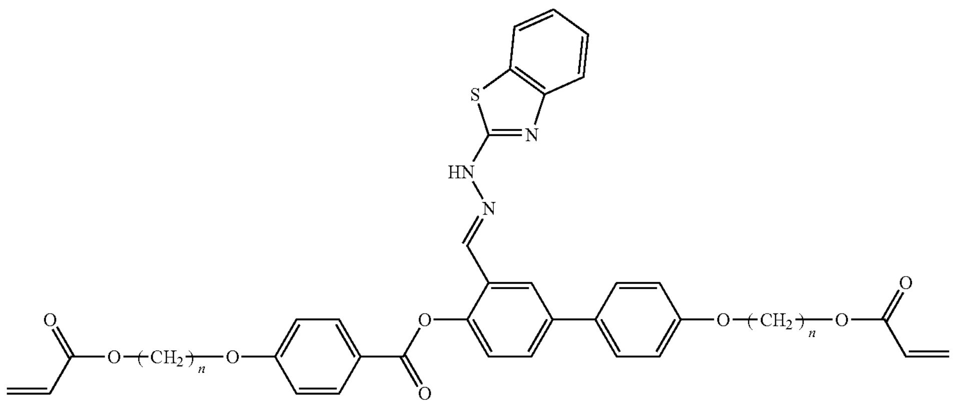
(2-a-9)
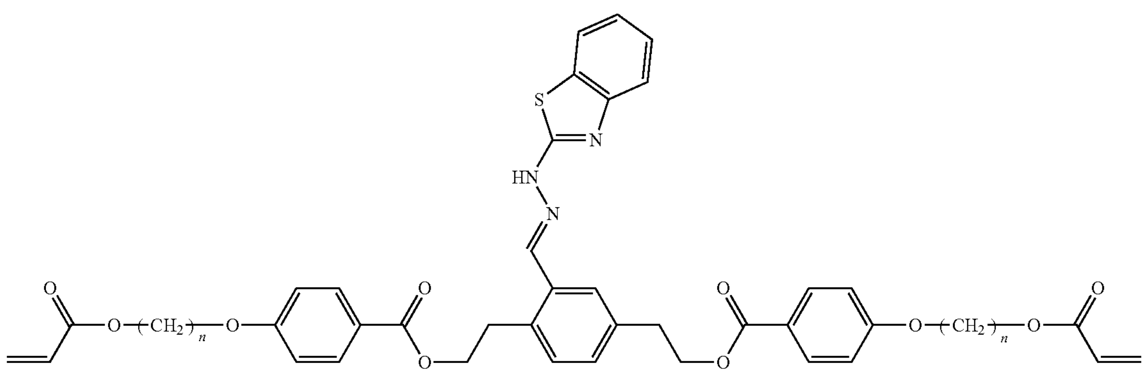
(2-a-10)
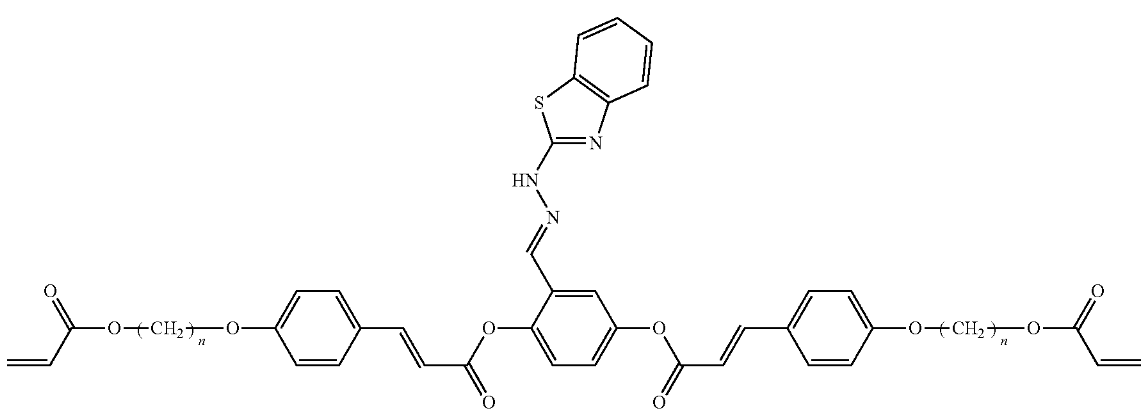

-continued
[Chem. 60]
(2-a-11)
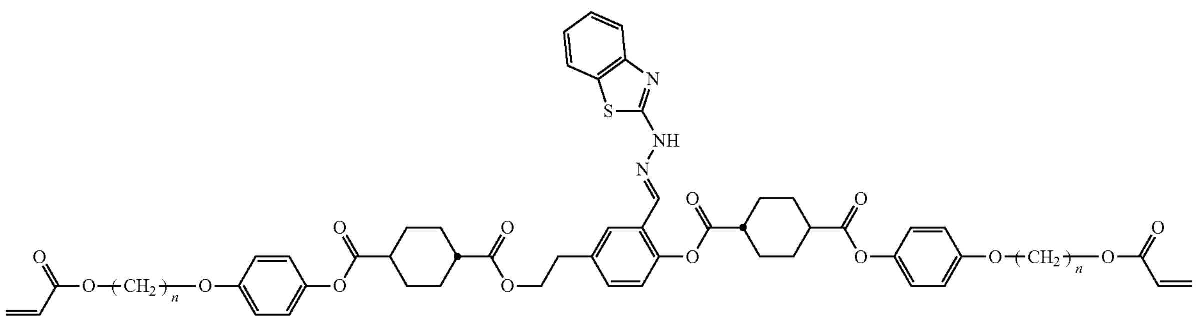
(2-a-12)
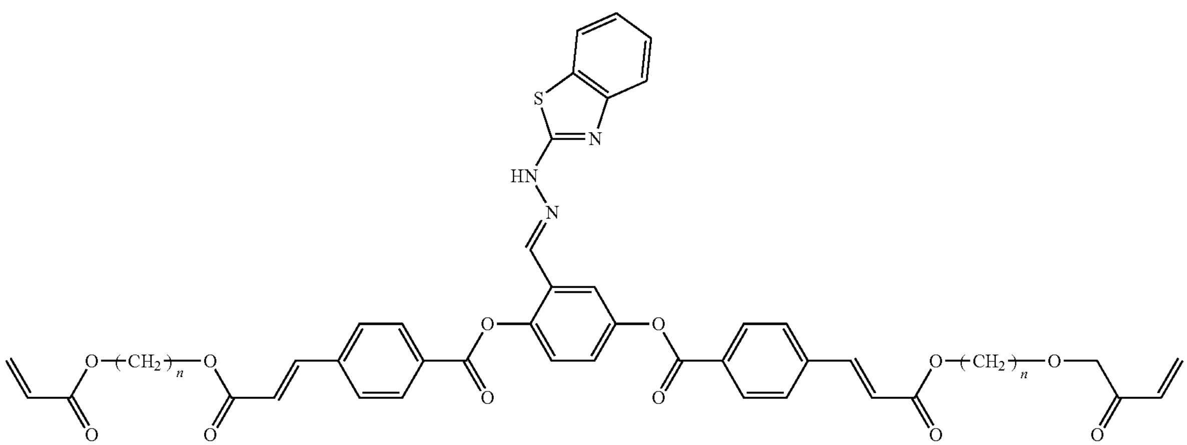
(2-a-13)
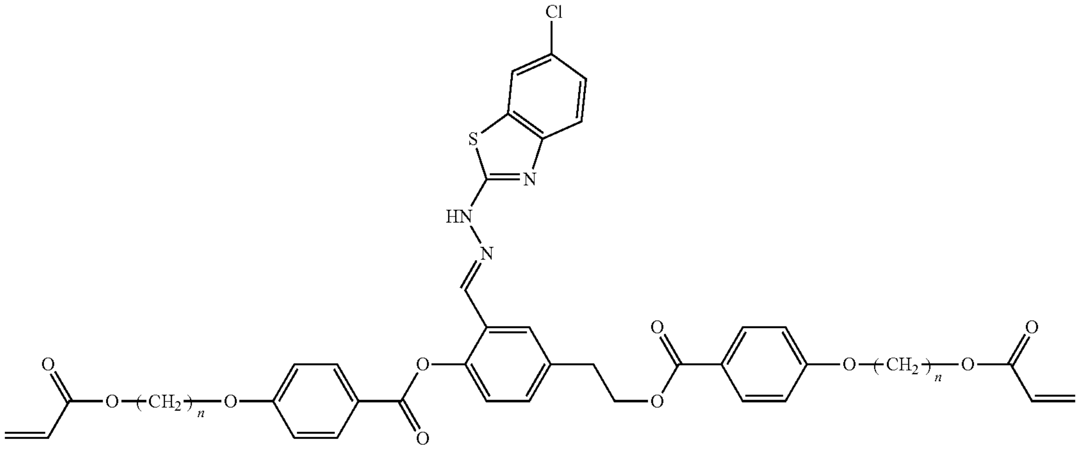

-continued
(2-a-14)
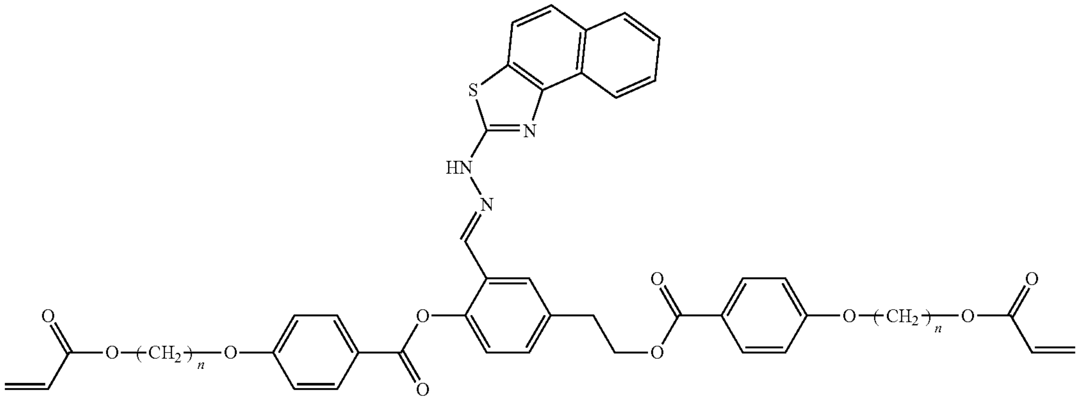
(2-a-15)
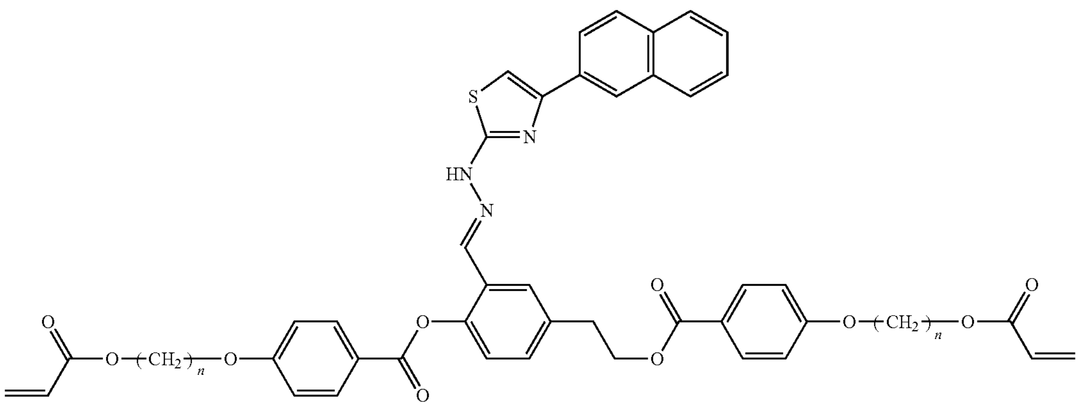
[Chem. 61]
(2-a-16)
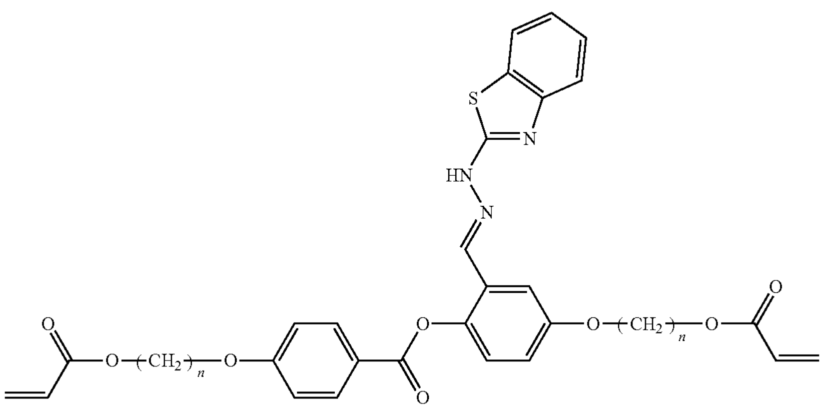
(2-a-17)
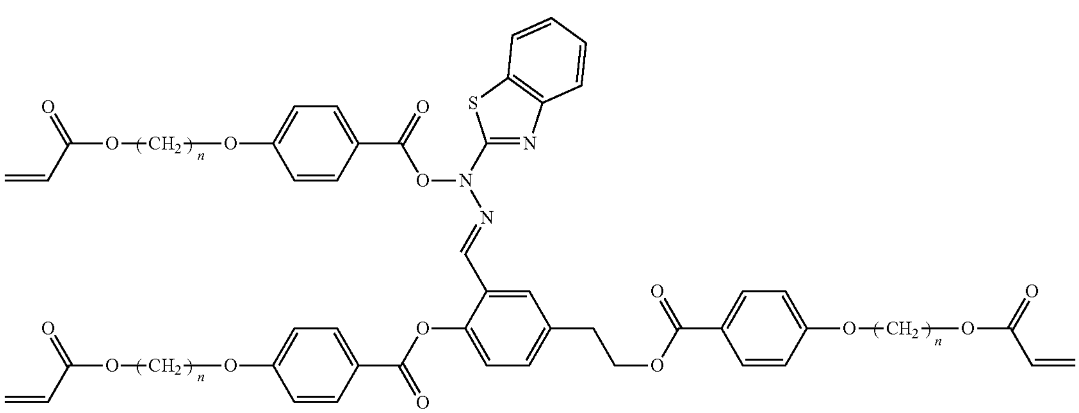

-continued
(2-a-18)
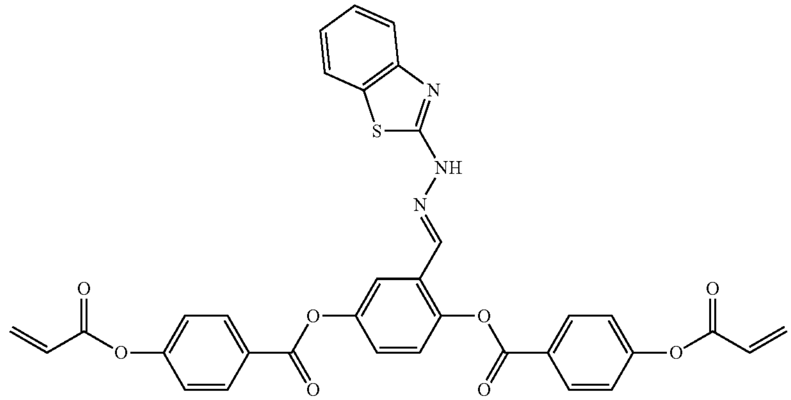
(2-a-19)
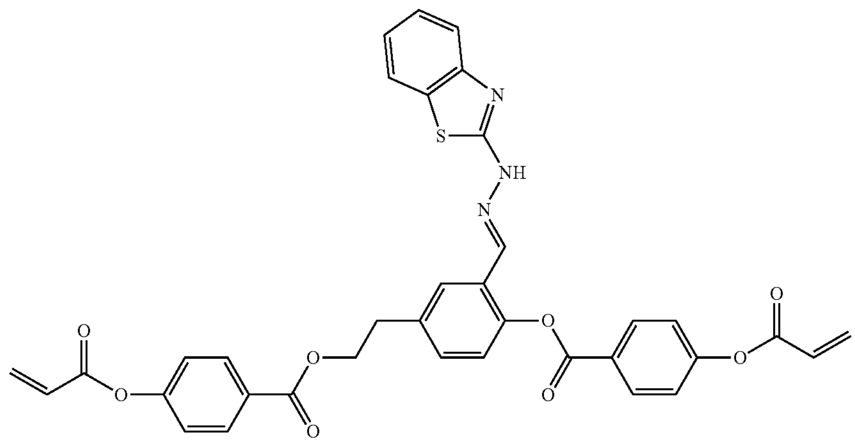
(2-a-20)
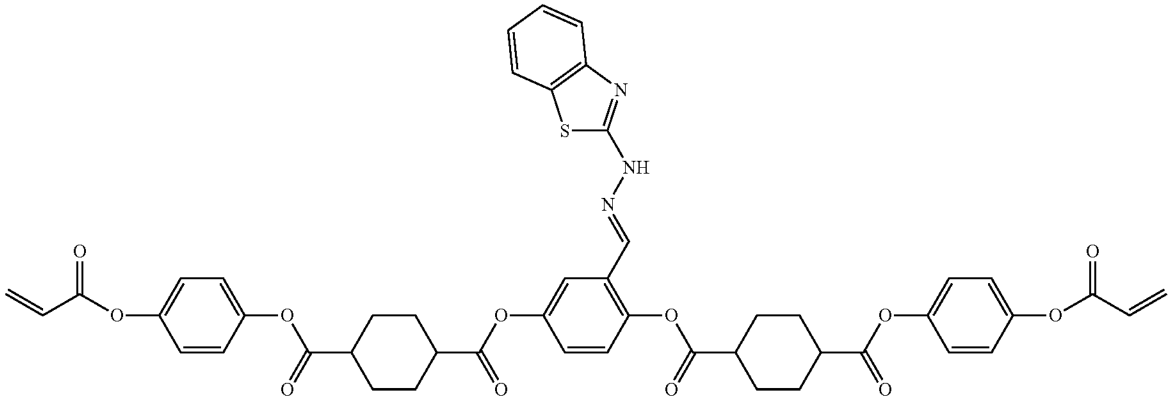

-continued
[Chem. 62]
(2-a-21)
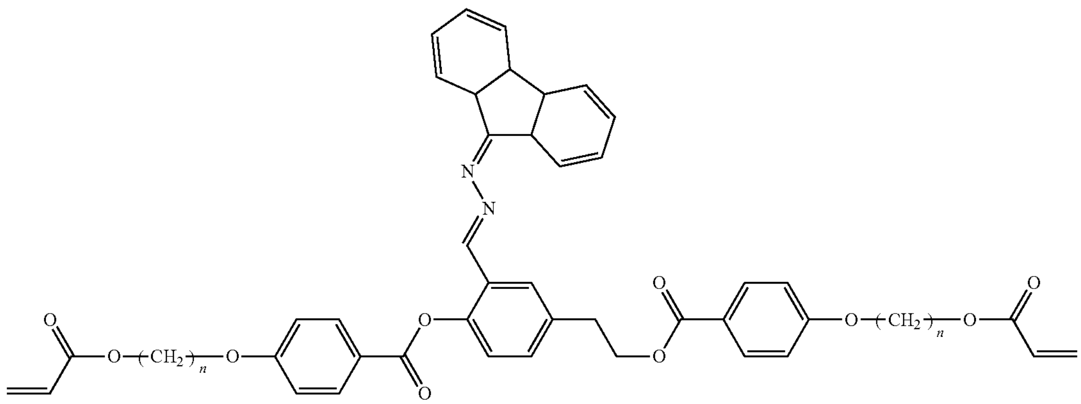
(2-a-22)
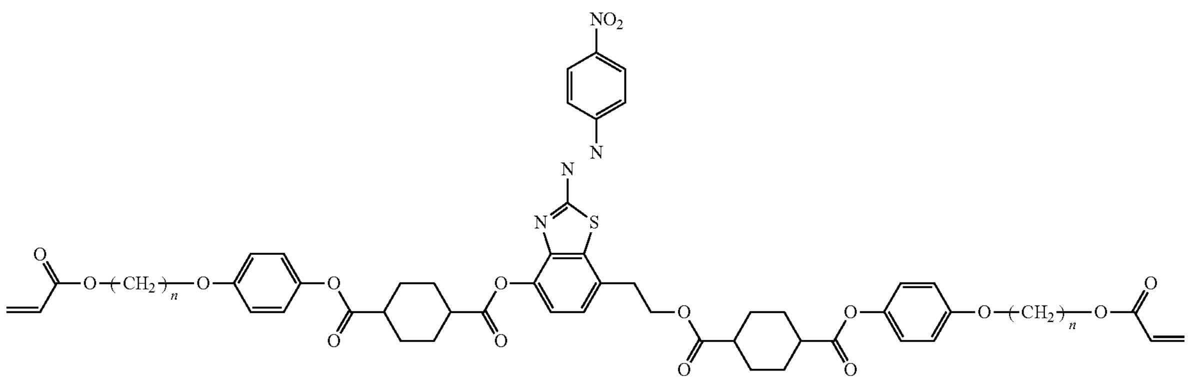
(2-a-23)
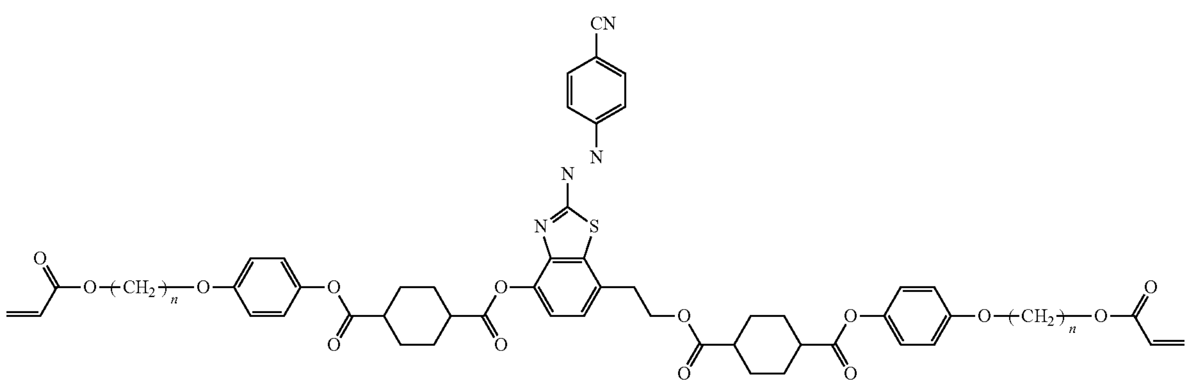
(2-a-24)
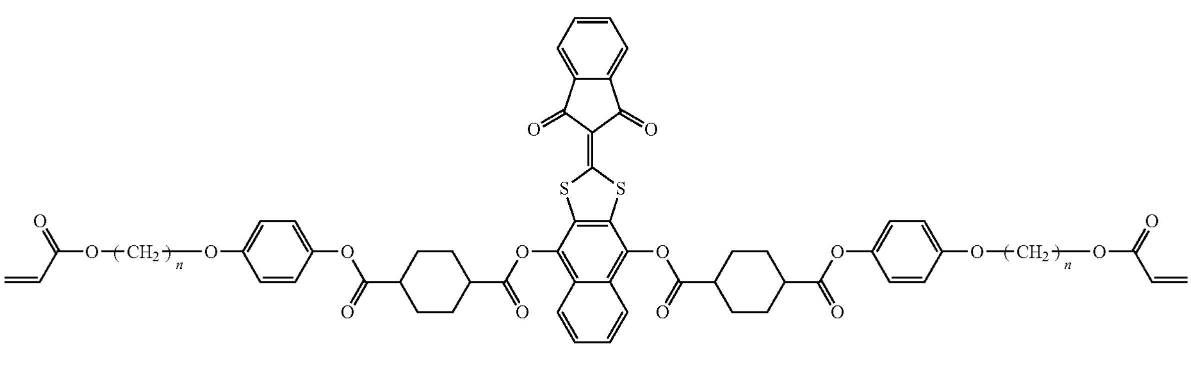

-continued
(2-a-25)
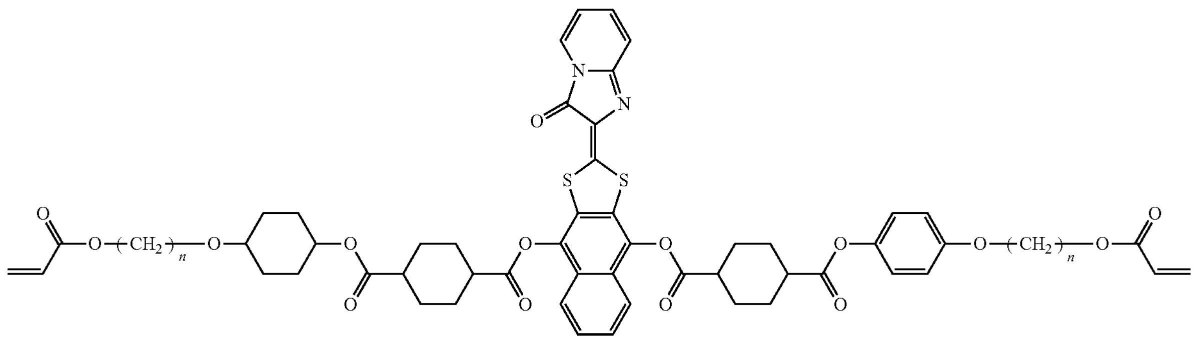
[Chem. 63]
(2-a-26)
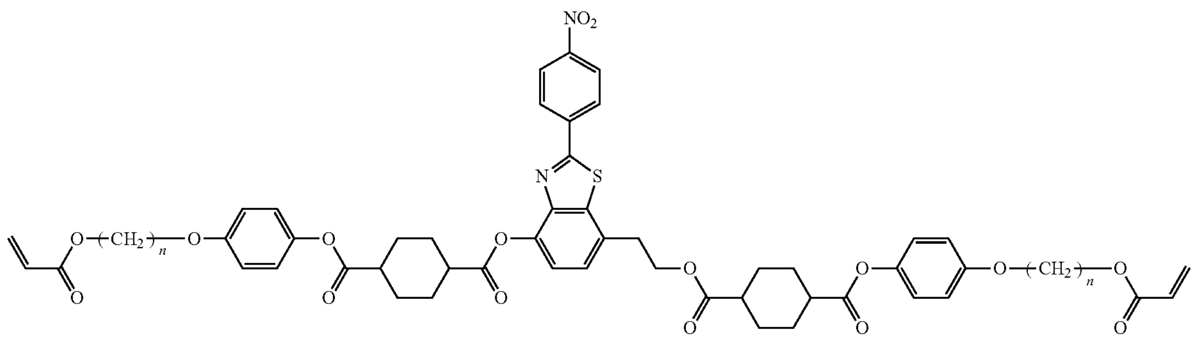
(2-a-27)
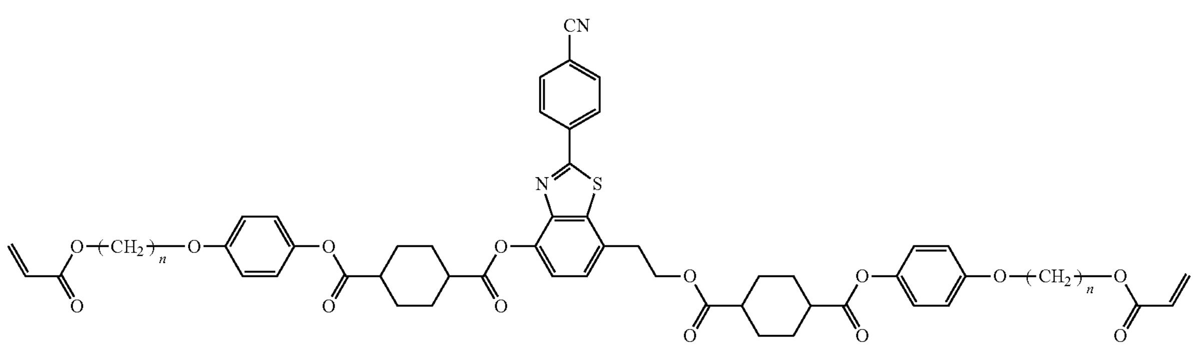
(2-a-28)
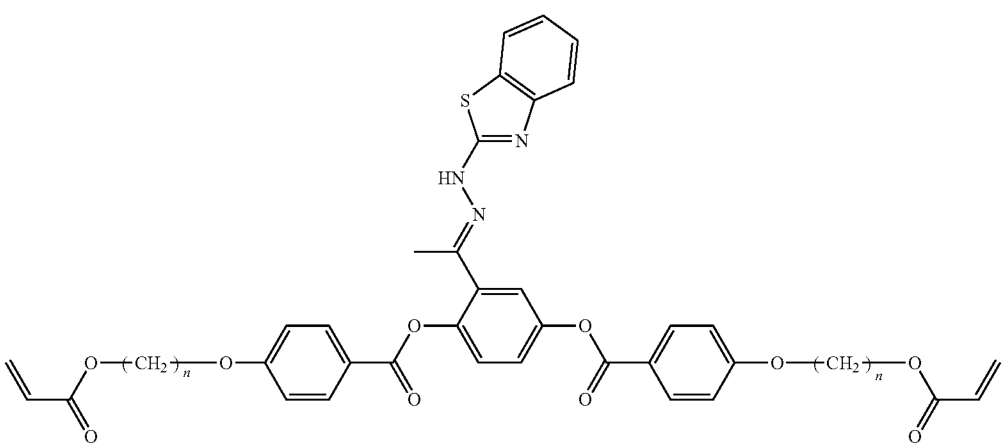

-continued
(2-a-29)
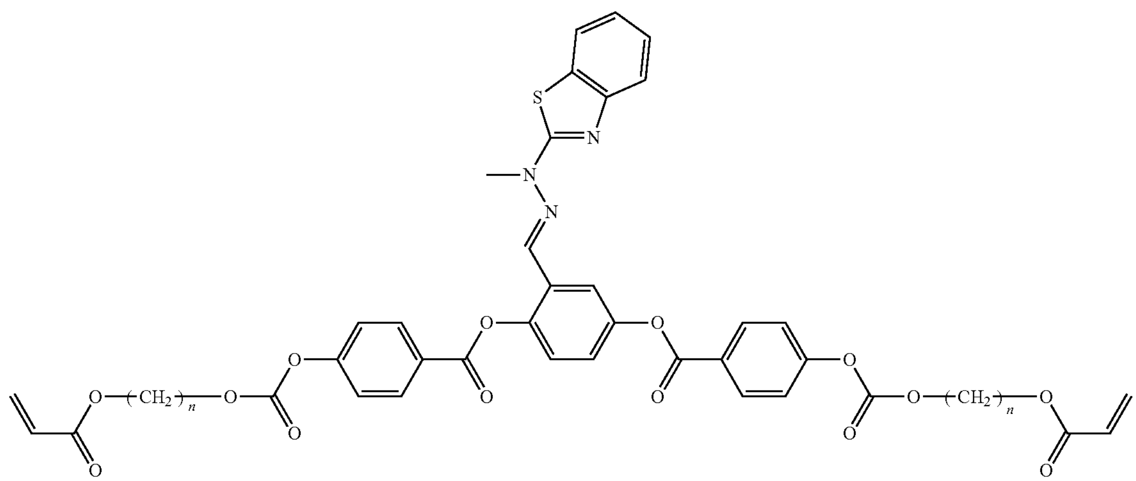
[Chem. 64]
(2-a-30)
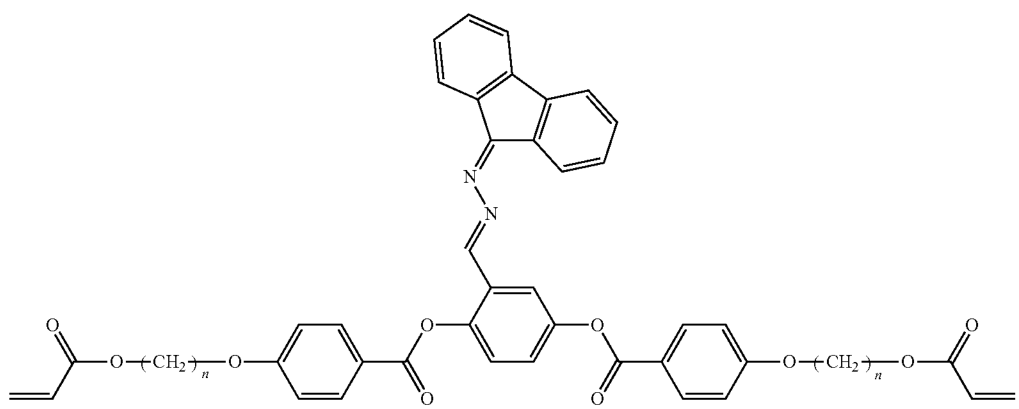
(2-a-31)
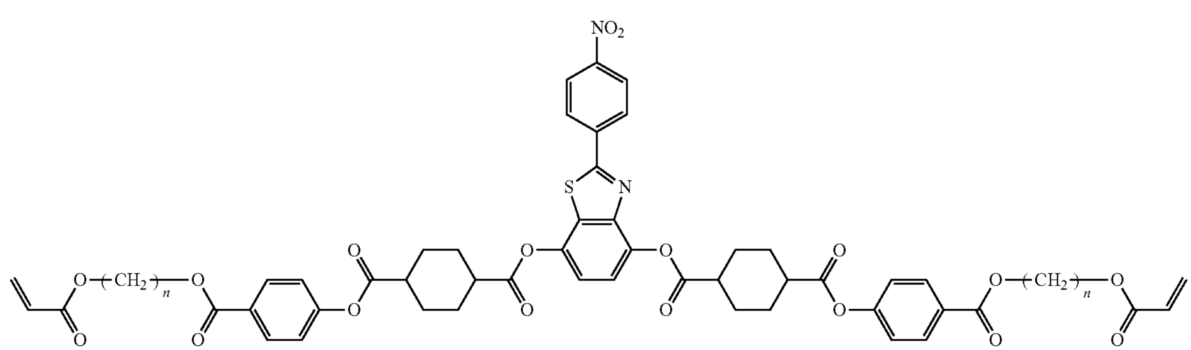

-continued
(2-a-32)
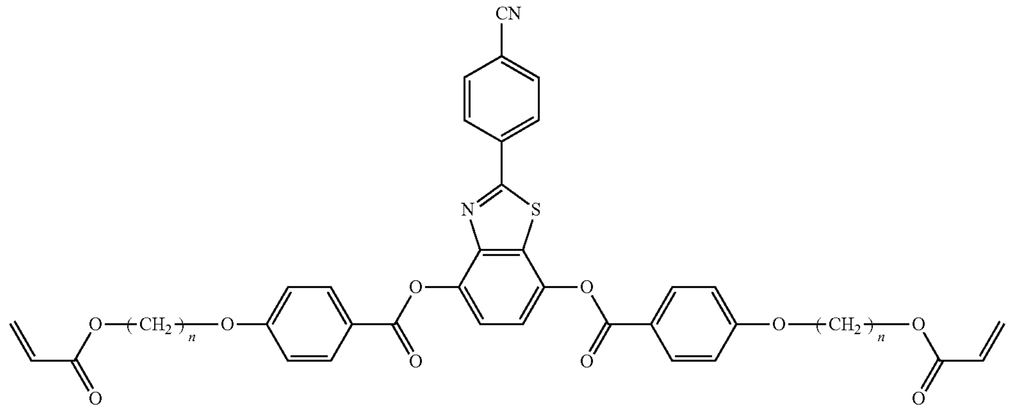
[Chem. 65]
(2-a-33)
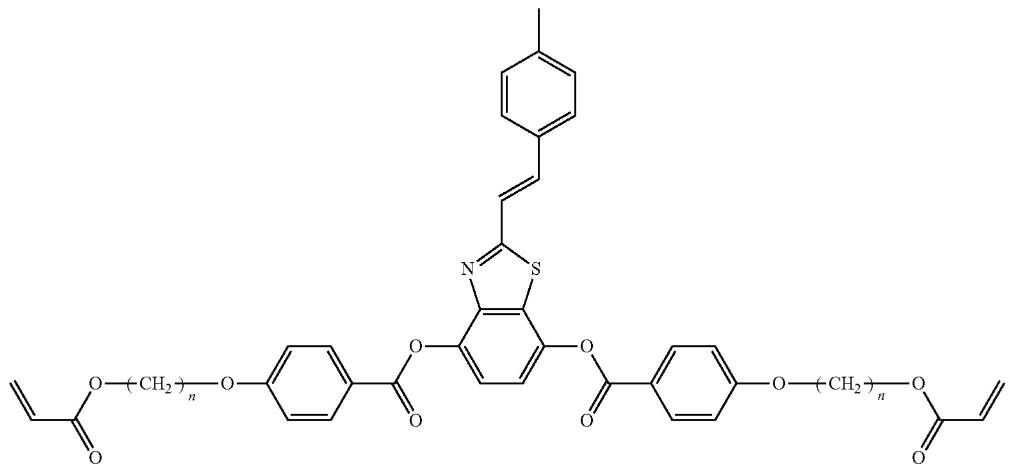
(2-a-34)
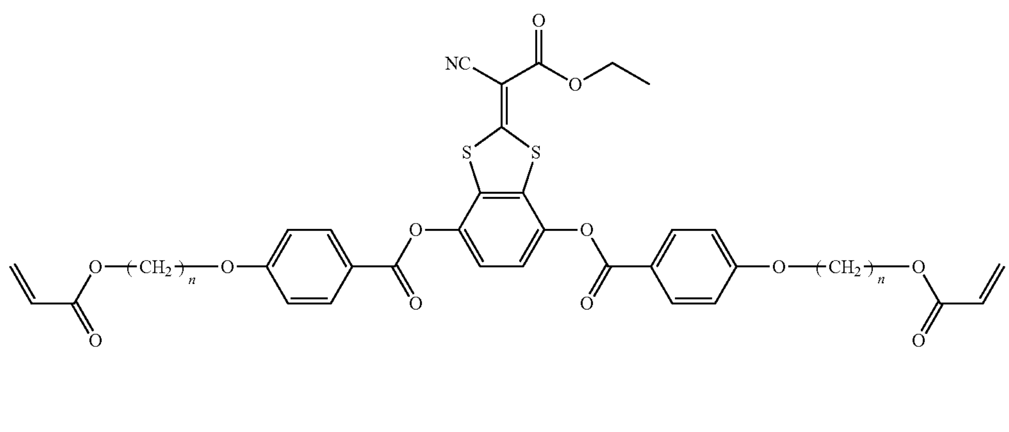

-continued
(2-a-35)
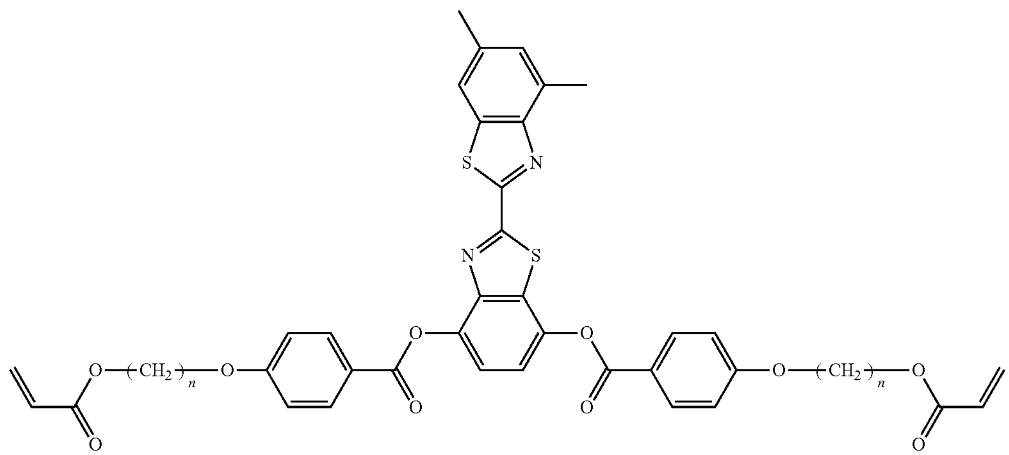
(2-a-36)
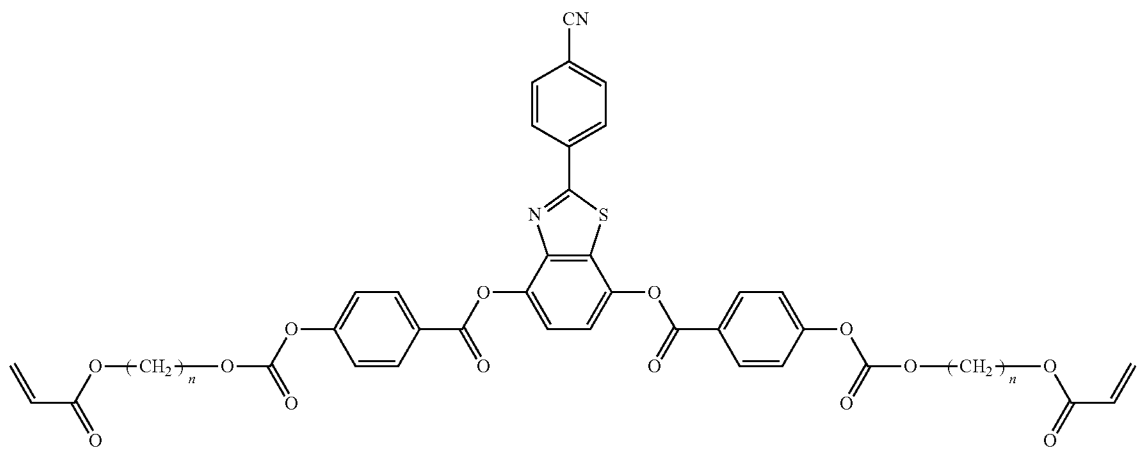
[Chem. 66]
(2-a-37)
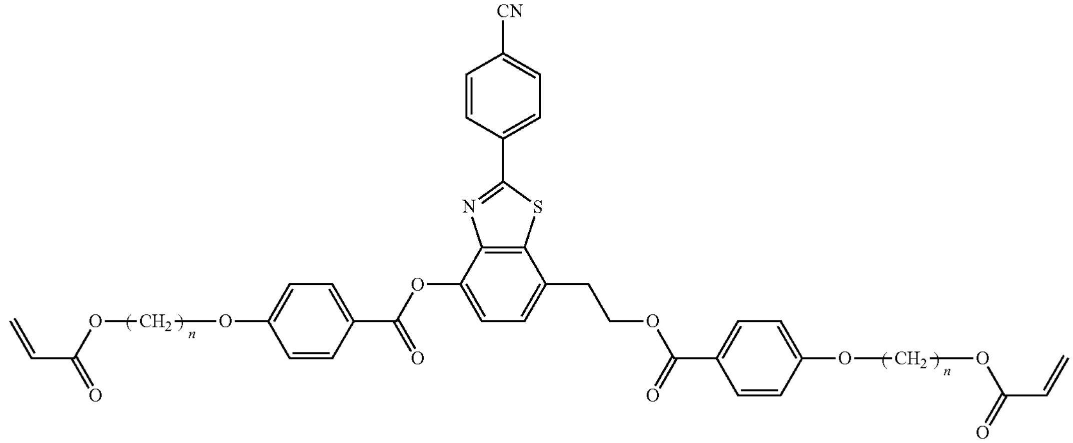

-continued
(2-a-38)
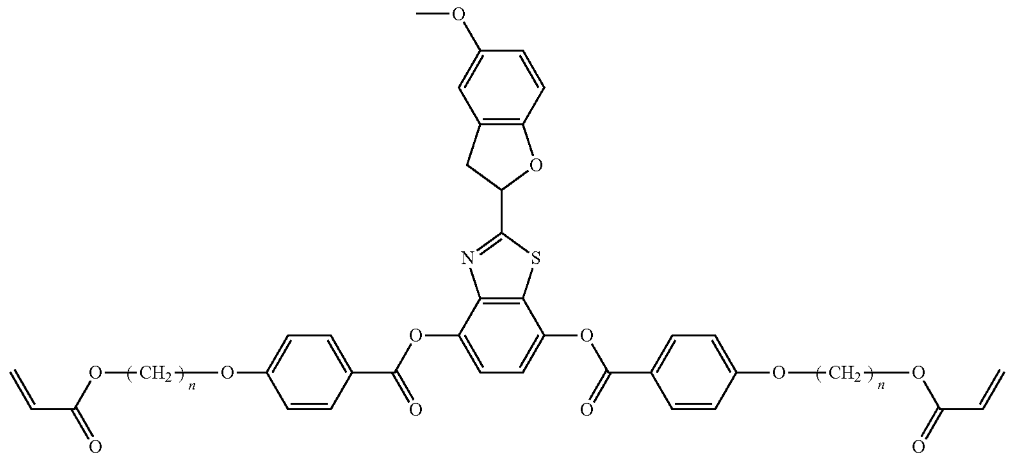
(2-a-39)
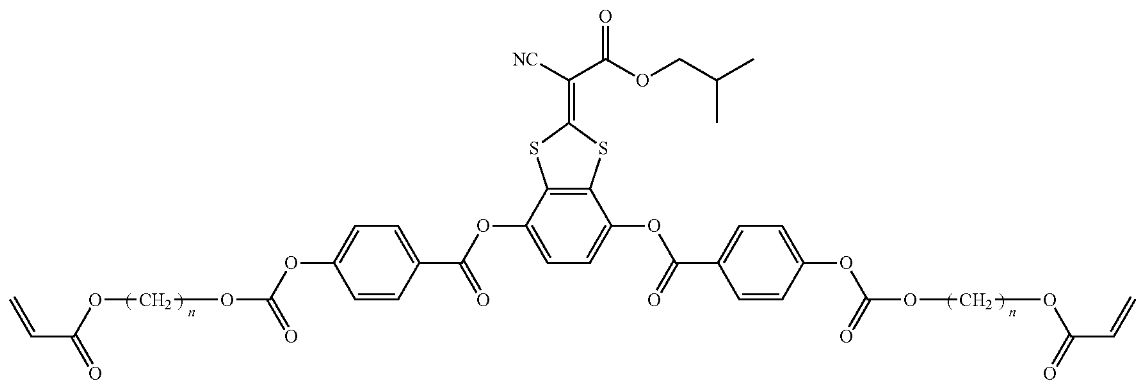
(2-a-40)
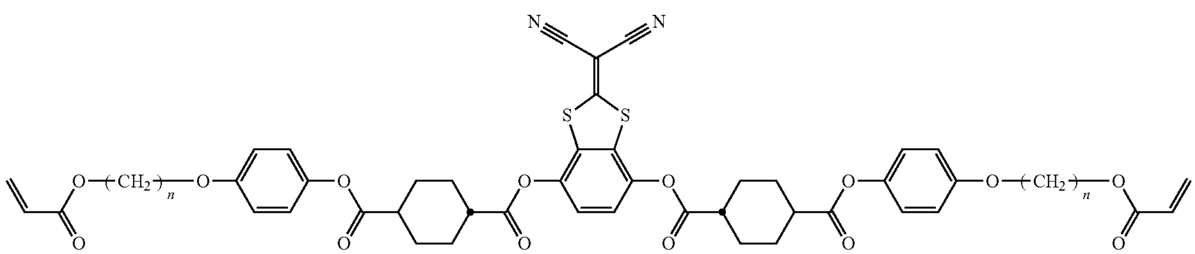
[Chem. 67]
(2-a-41)
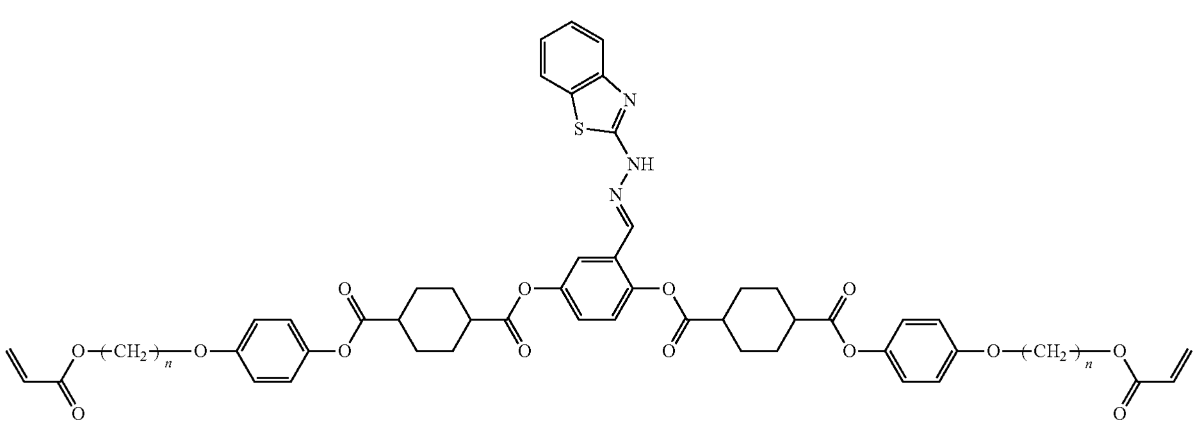

-continued
(2-a-42)
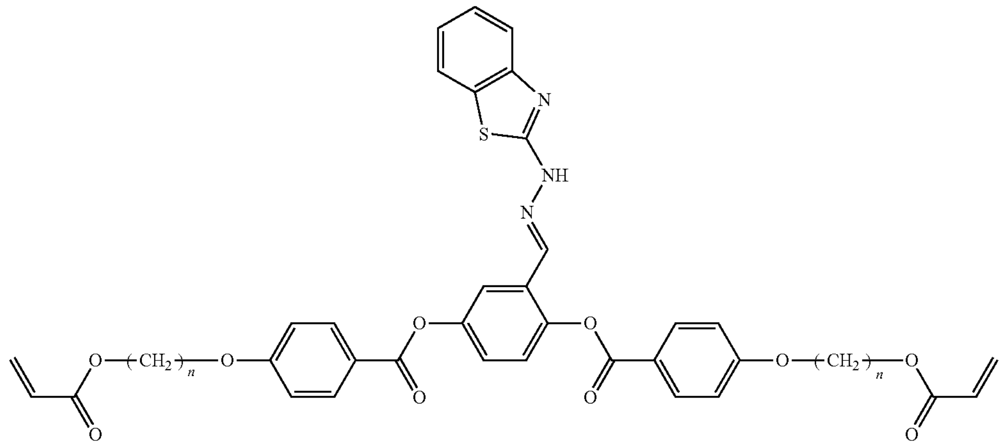
(2-a-43)
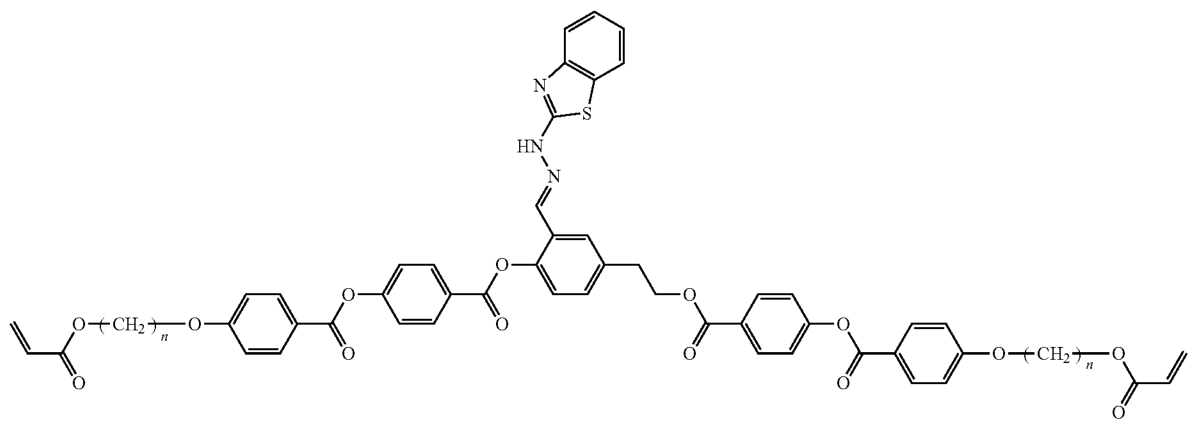
(2-a-44)
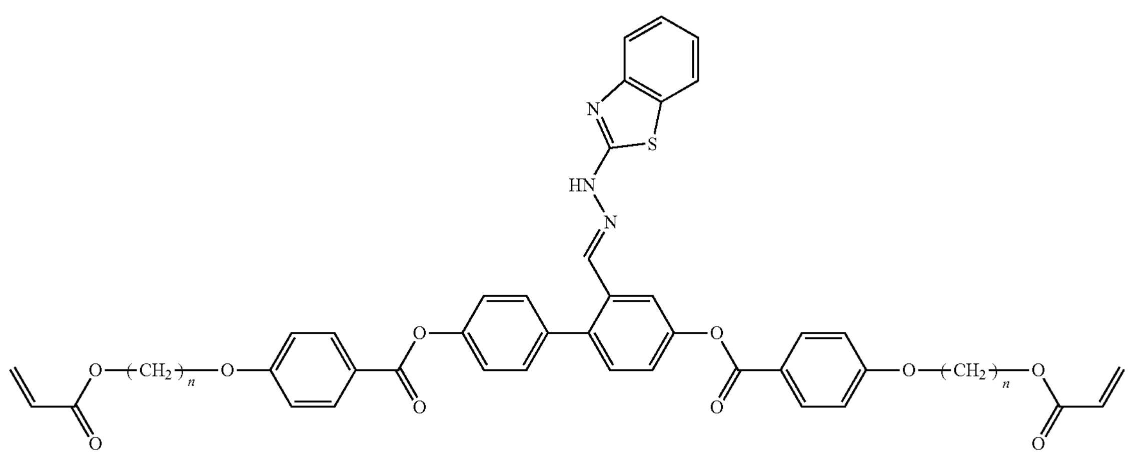

-continued
[Chem. 68]
(2-a-45)
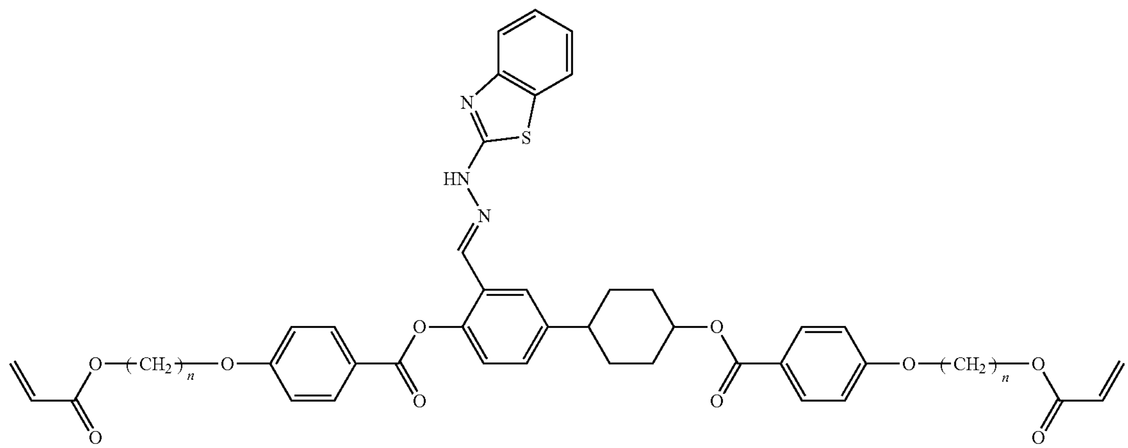
(2-a-46)
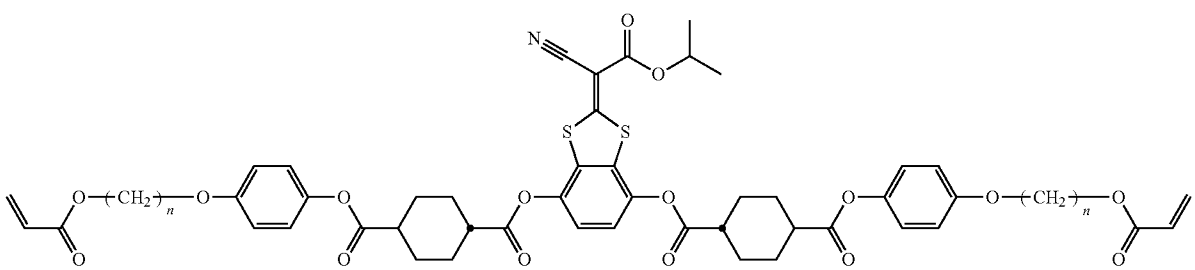
[Chem. 69]
(2-a-47)
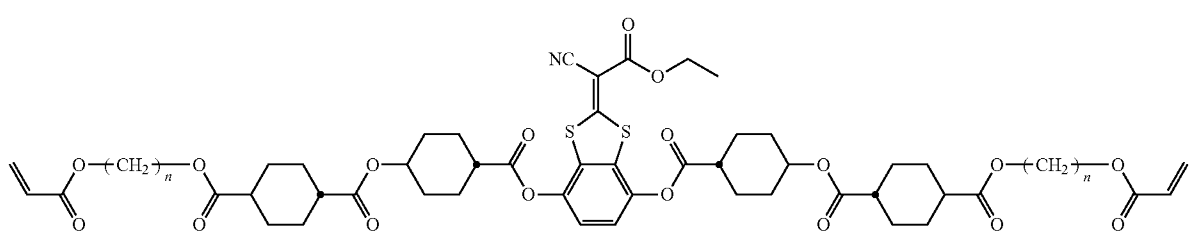
(2-a-48)
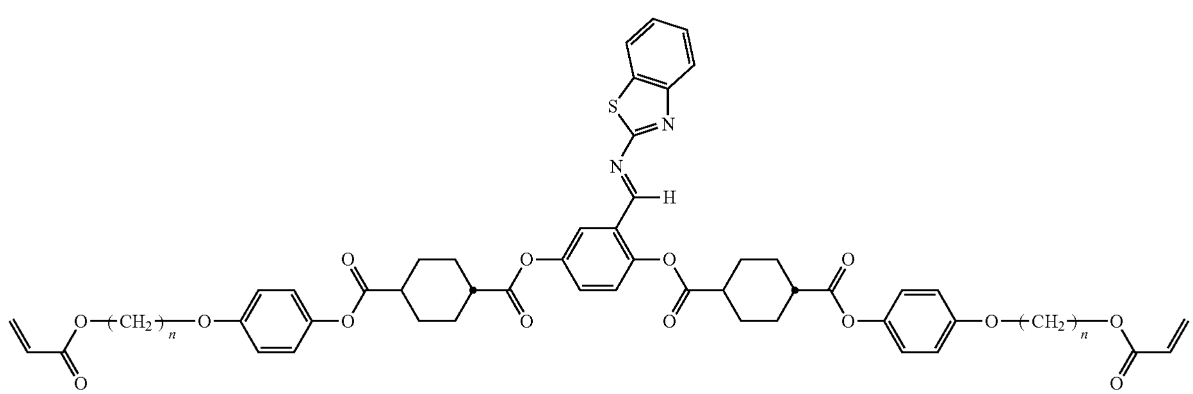

-continued
(2-a-49)
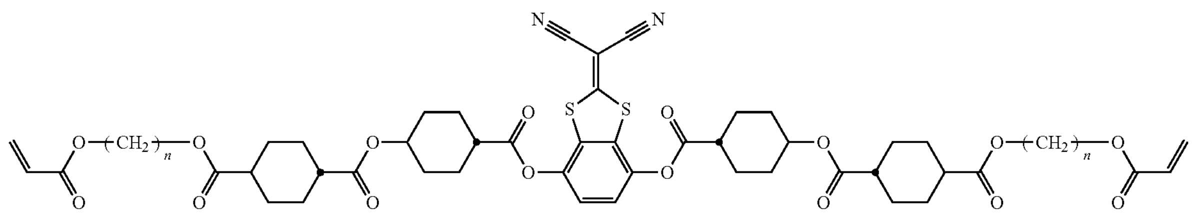
[Chem. 70]
(2-a-50)
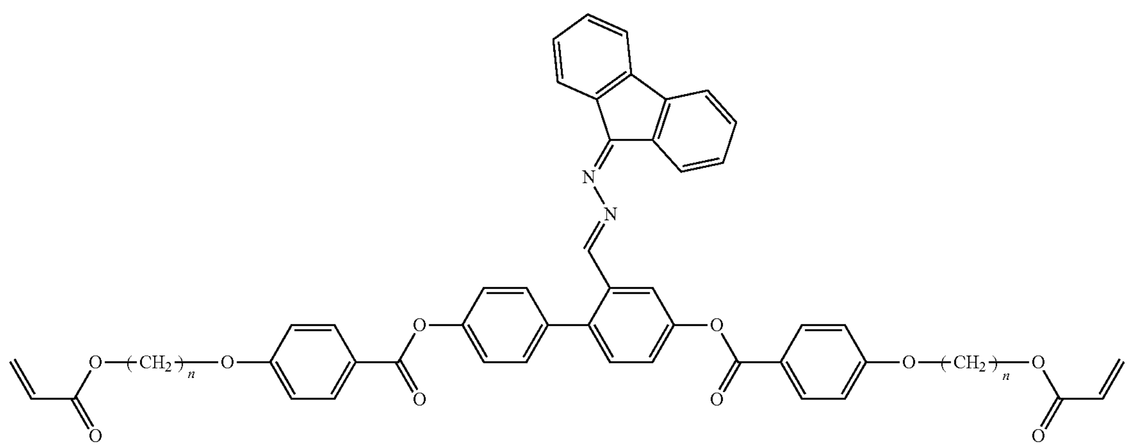
(2-a-51)
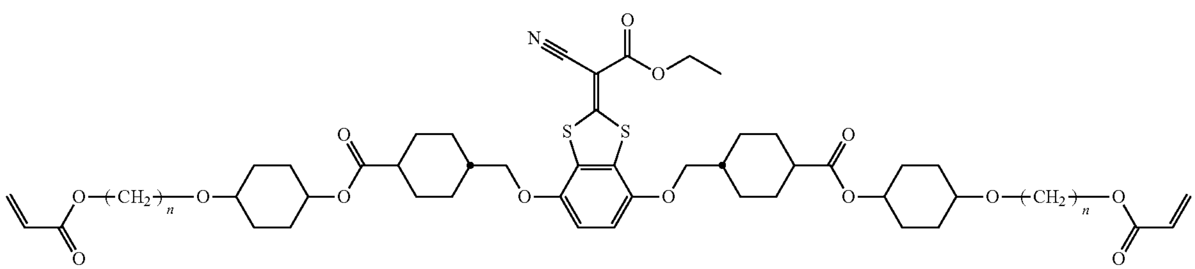
(2-a-52)
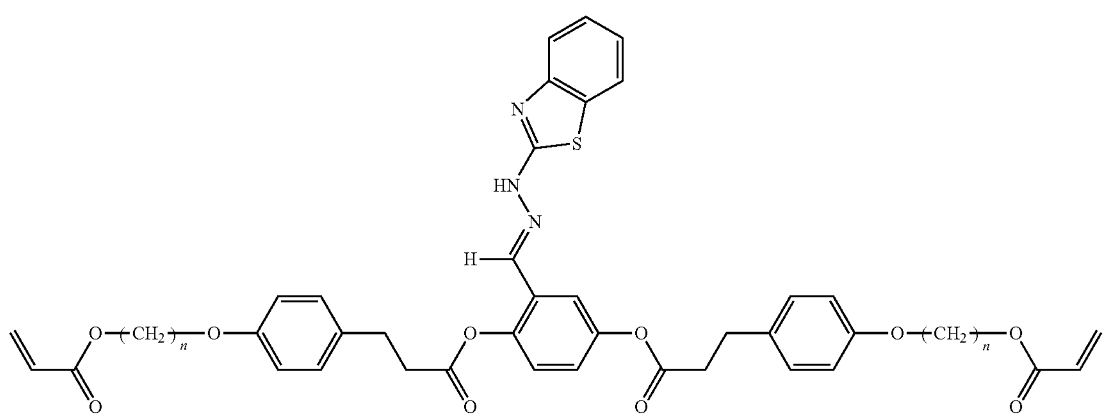

-continued
[Chem. 71]
(2-a-53)
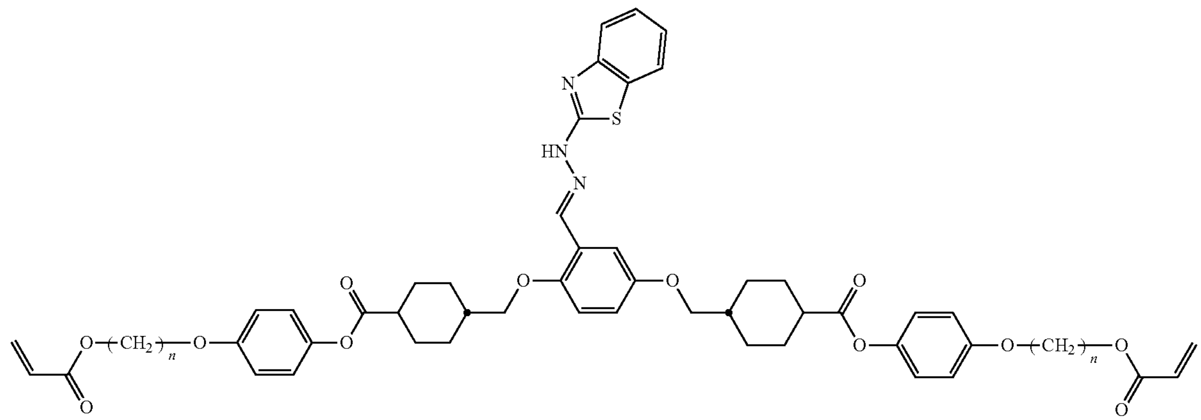
(2-a-54)
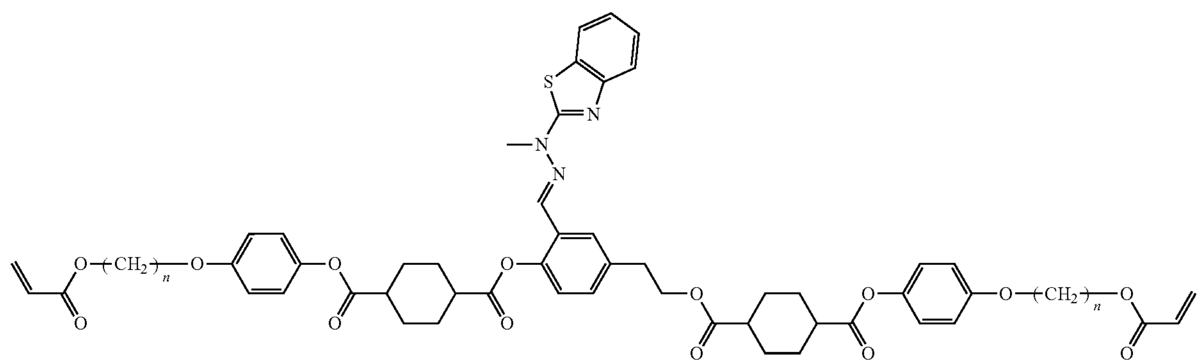
(2-a-55)
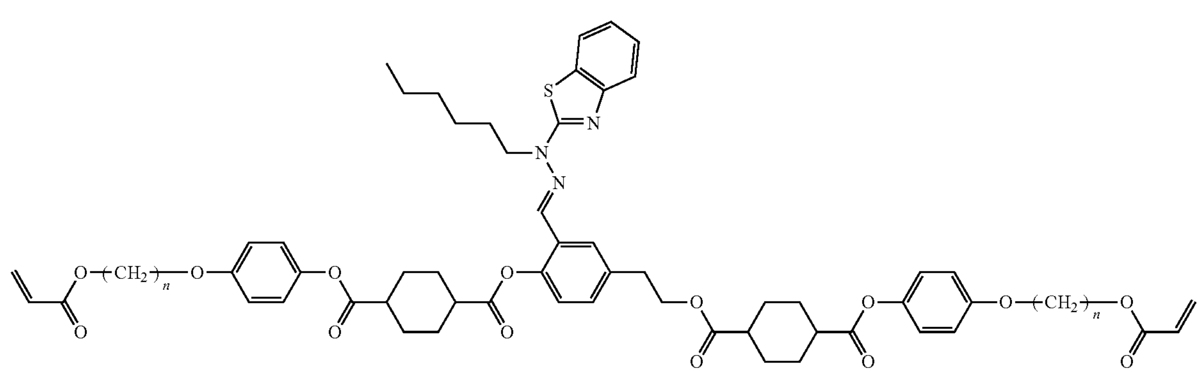

-continued
[Chem. 72]
(2-a-56)
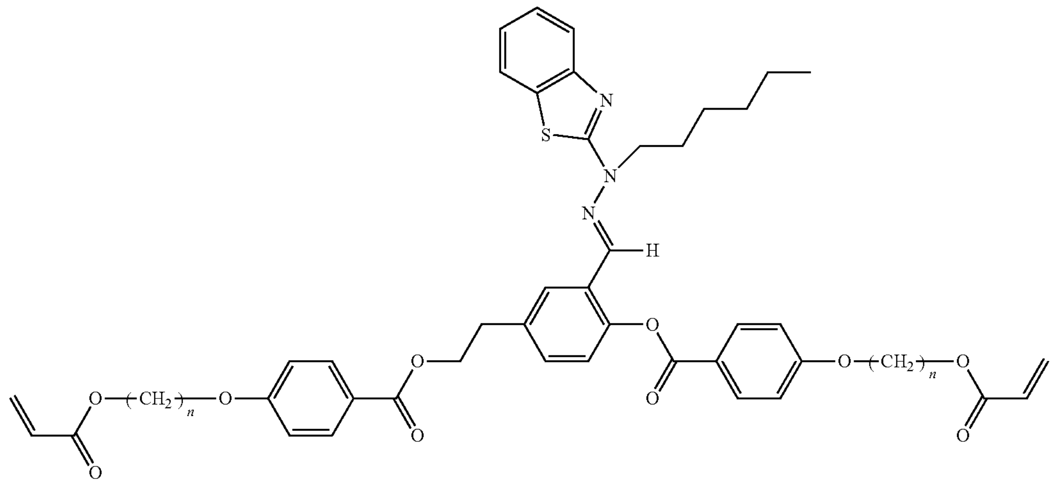
(2-a-57)
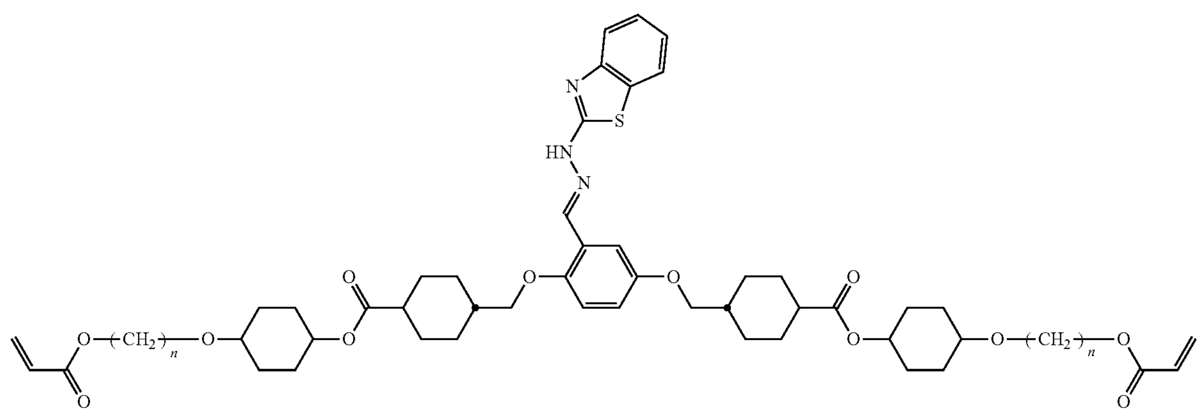
(2-a-58)
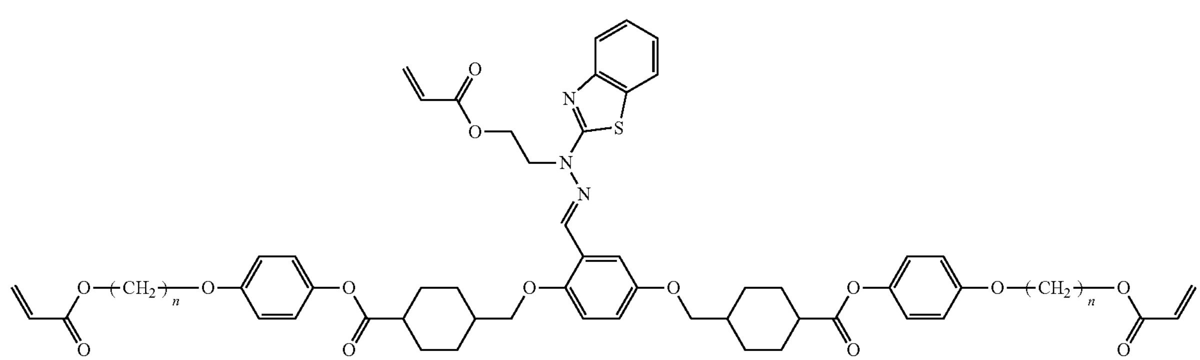

-continued
[Chem. 73]
(2-a-59)
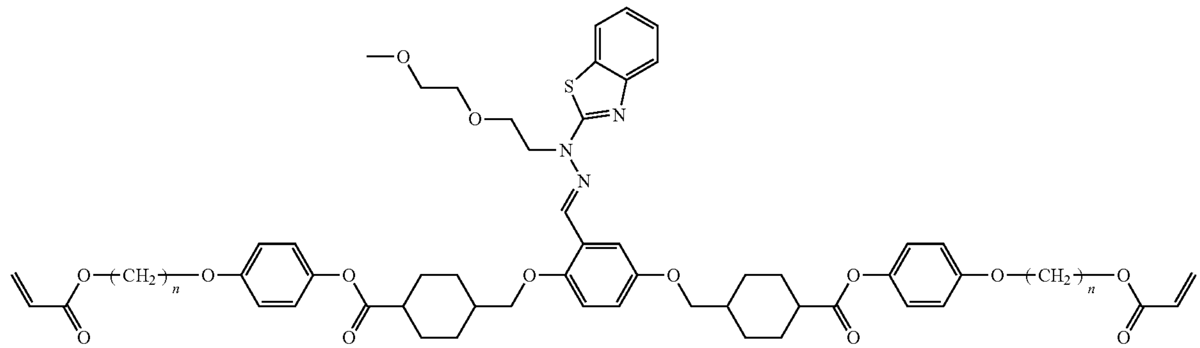
(2-a-60)
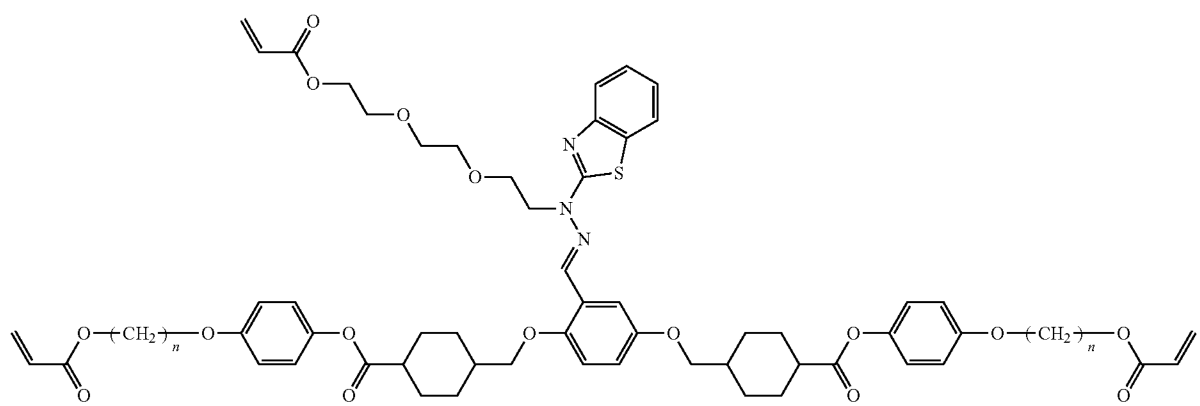
(2-a-61)
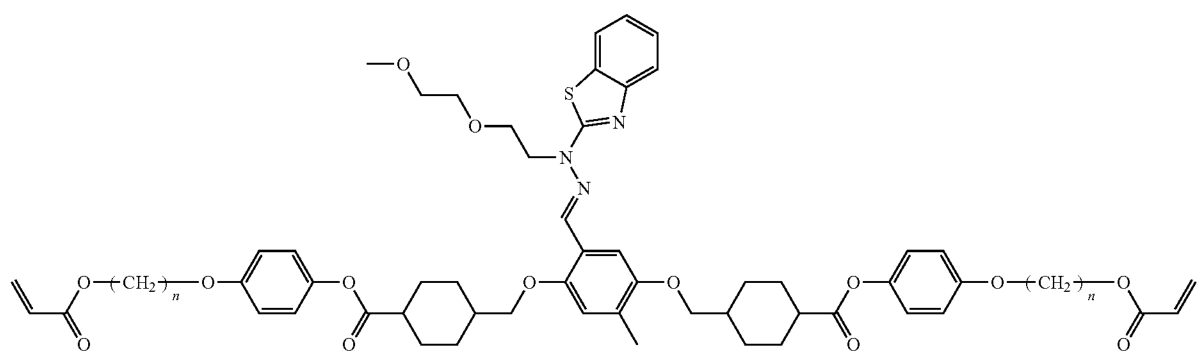
(In the formulae, n represents an integer of 1 to 10.)
These liquid crystalline compounds may be used alone or in combination of two or more kinds thereof.

Preferred specific examples of the compound represented by Formula (3) include compounds represented by Formulae (3-a-1) to (3-a-17).
[Chem. 74]
(3-a-1)
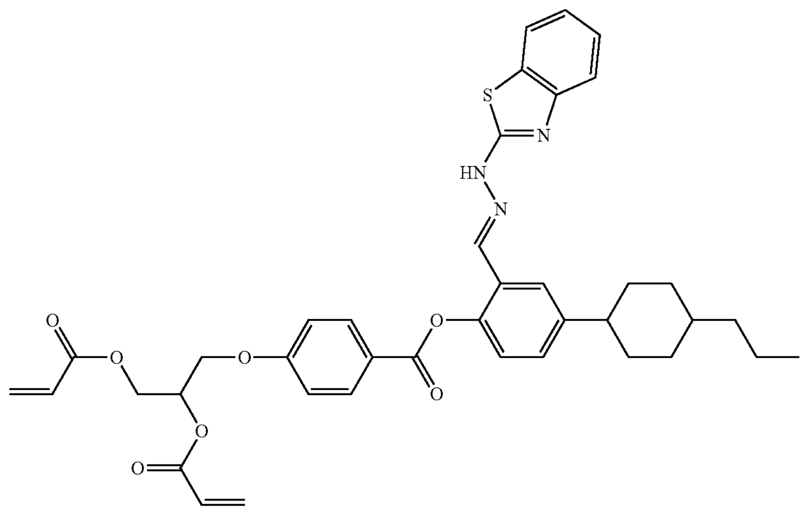
(3-a-2)
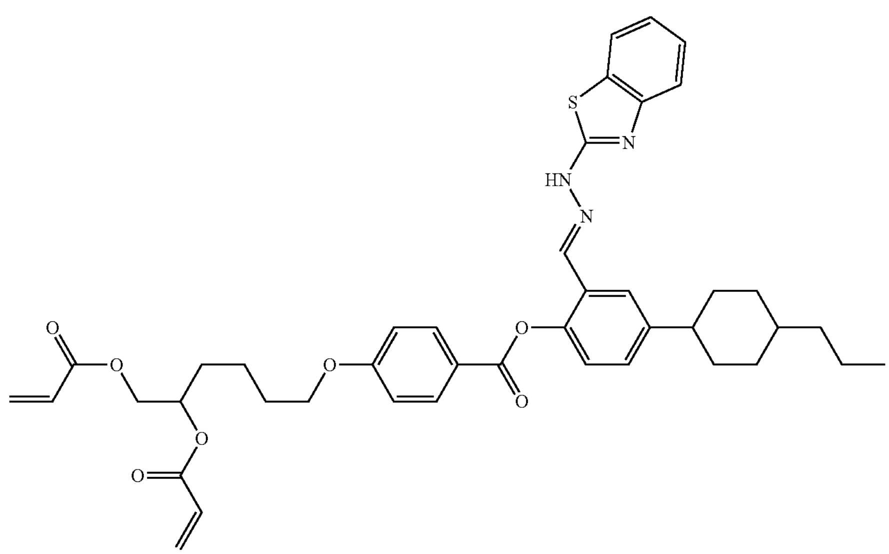

-continued
(3-a-3)
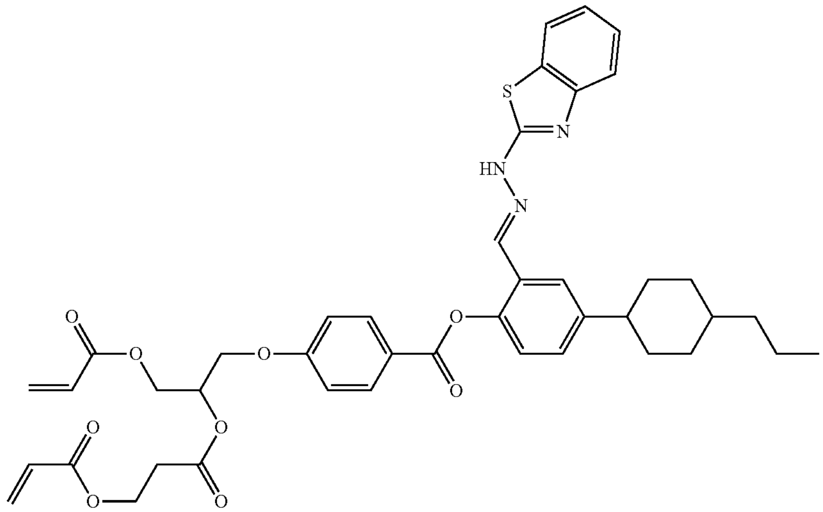
(3-a-4)
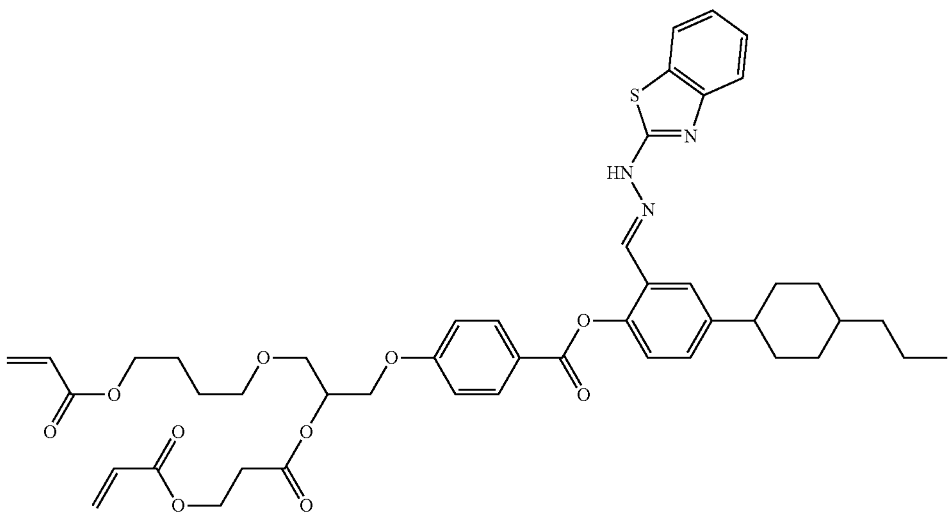
[Chem. 75]
(3-a-5)
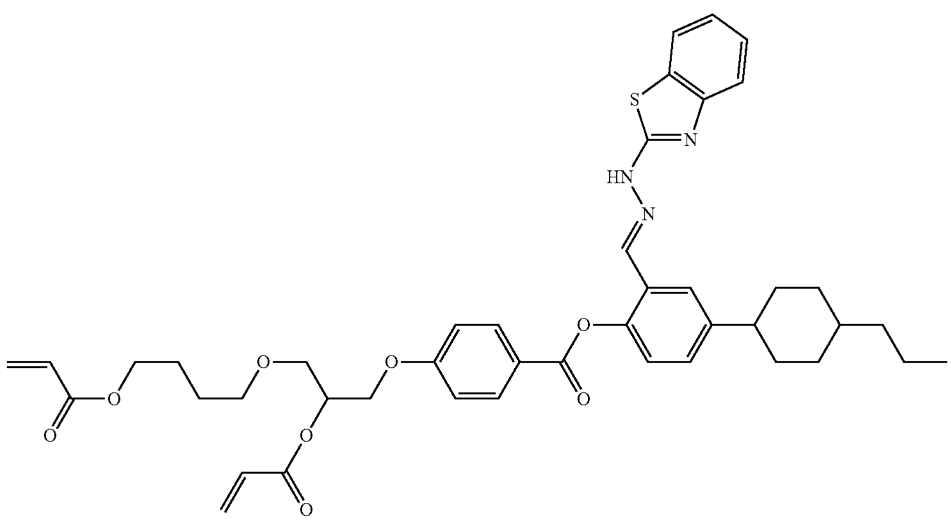

-continued
(3-a-6)
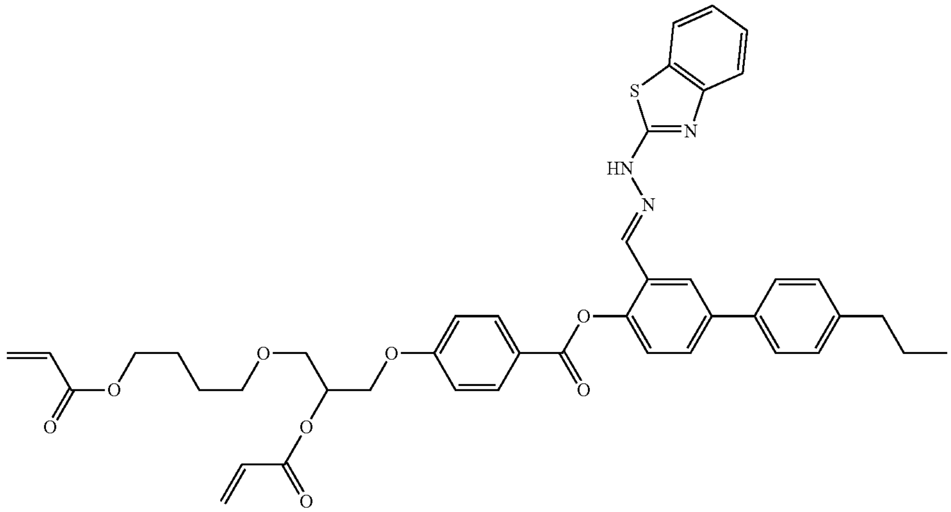
(3-a-7)
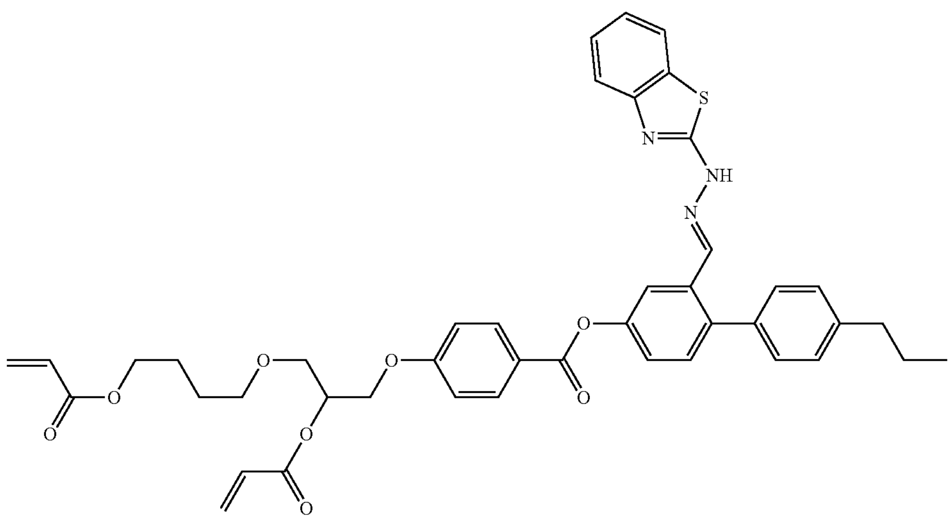
(3-a-8)
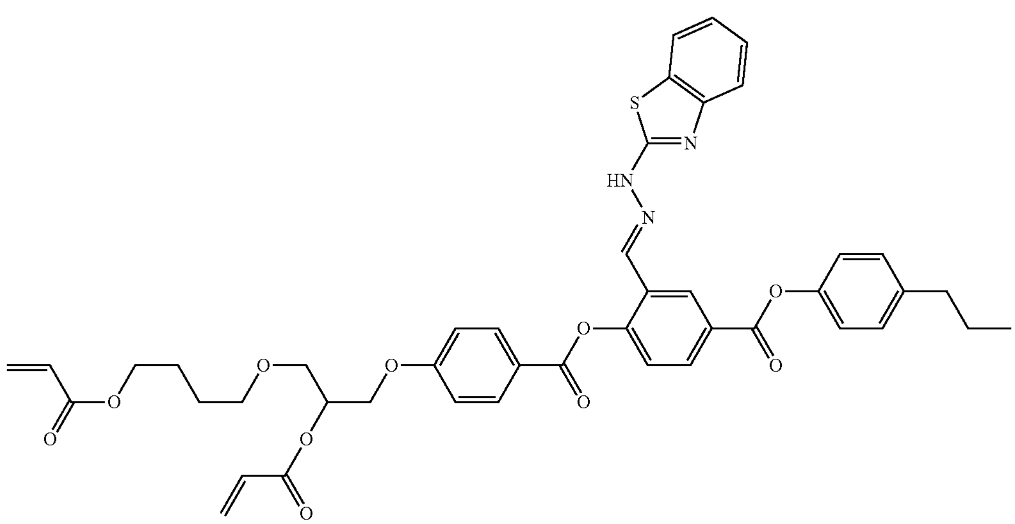

-continued
[Chem. 76]
(3-a-9)
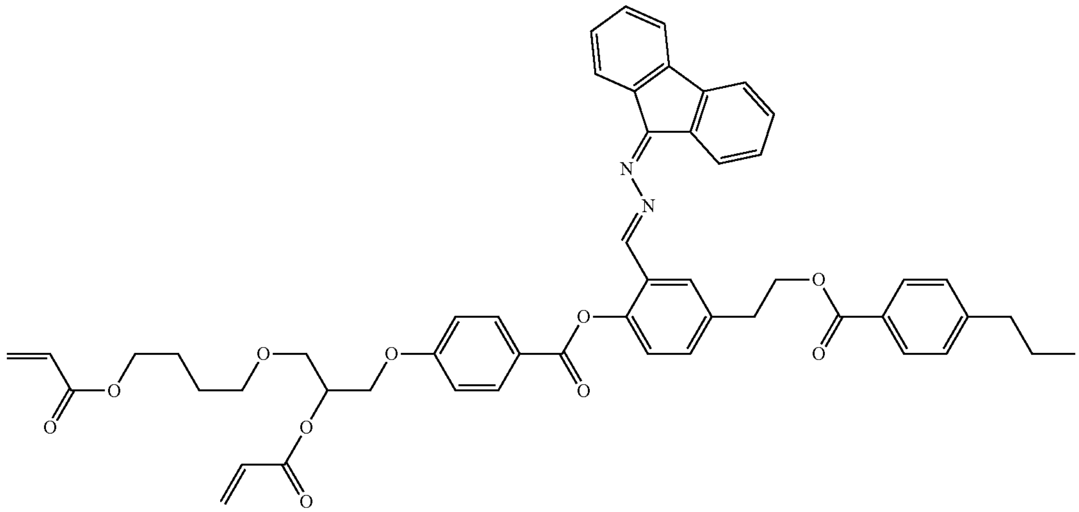
(3-a-10)
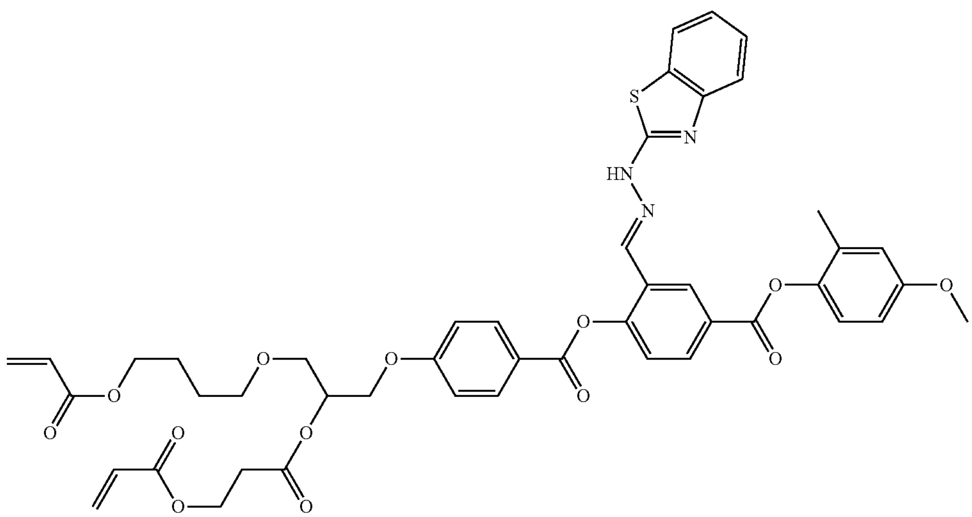
(3-a-11)
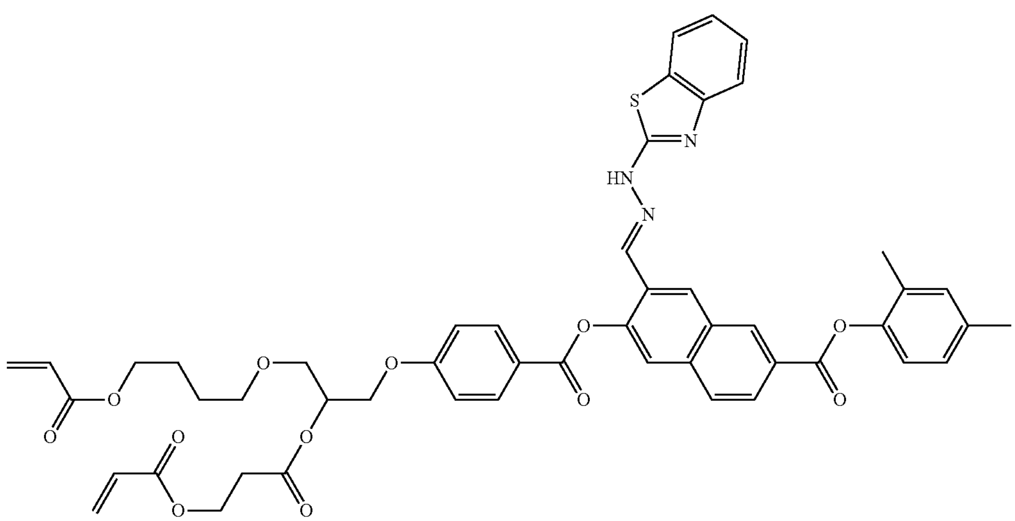

-continued
(3-a-12)
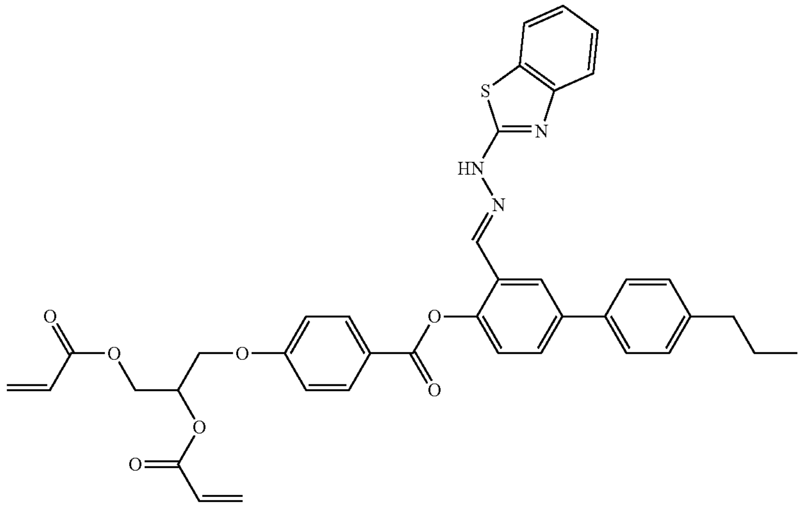
[Chem. 77]
(3-a-13)
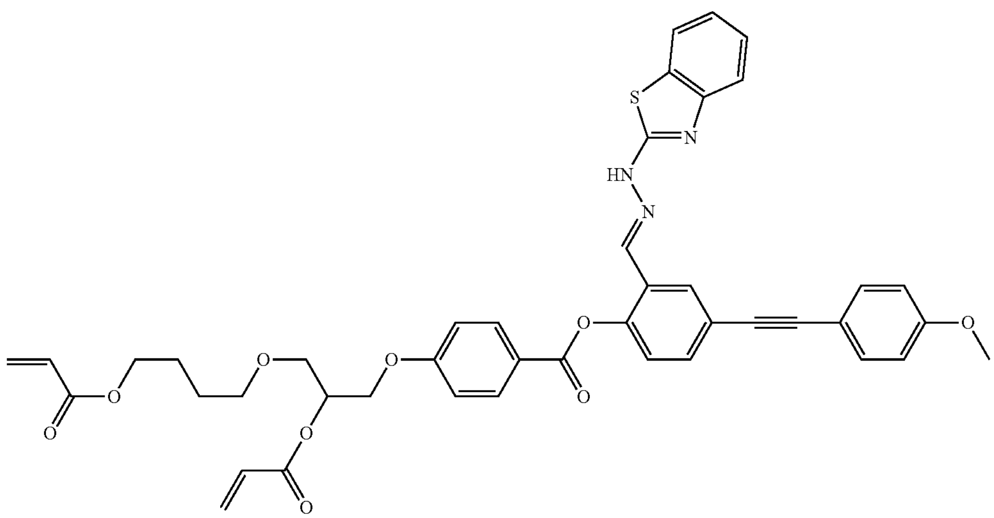
(3-a-14)
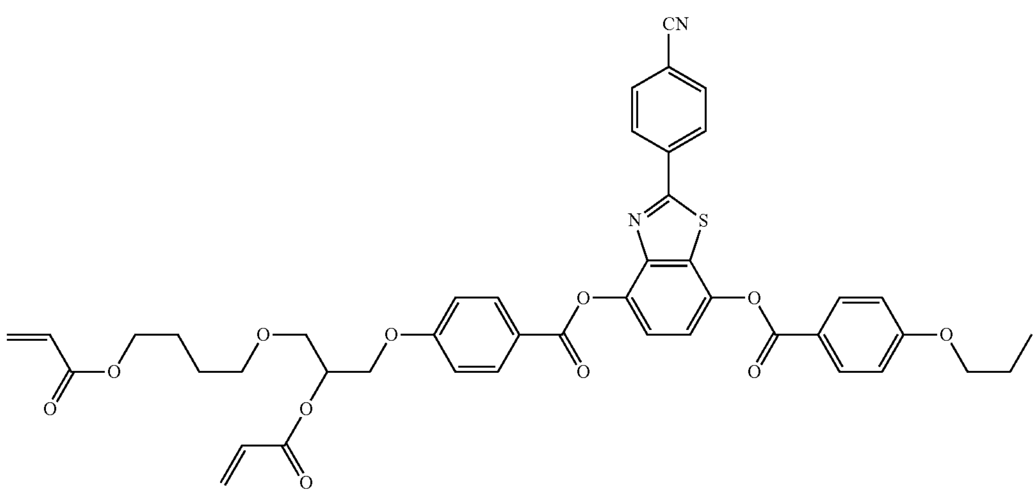

-continued
(3-a-15)
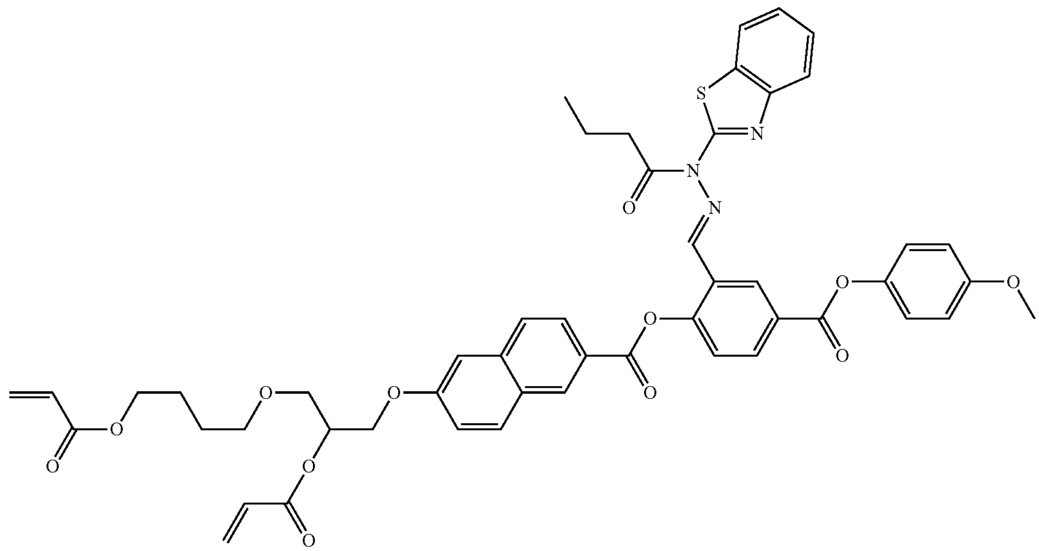
(3-a-16)
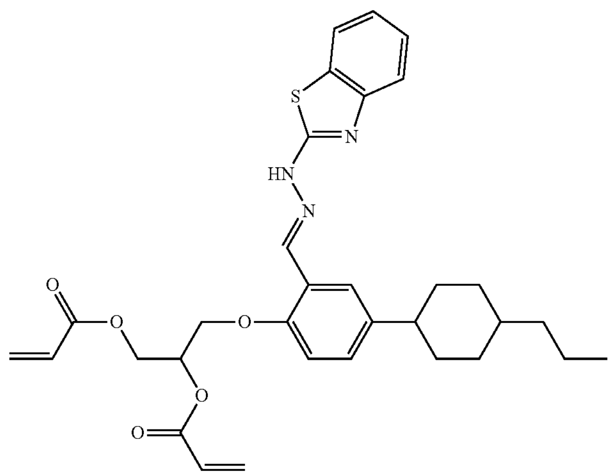
(3-a-17)
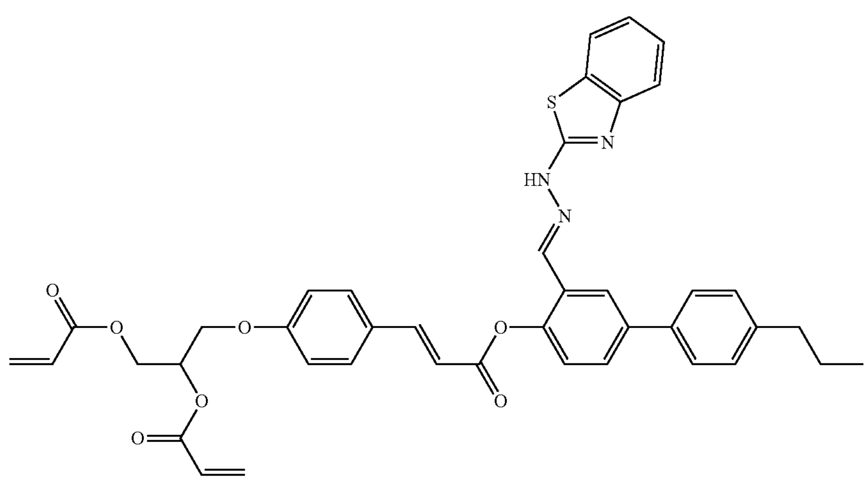
These liquid crystalline compounds may be used alone or in combination of two or more kinds thereof.

In Formula (4), a group represented by $P^{43}$—($S^{43}$—$X^{43})_{14}$— is bonded to $A^{11}$ or $A^{12}$ of Formula (a).
Preferred specific examples of the compound represented by Formula (4) include compounds represented by Formulae (4-a-1) to (4-a-26).
[Chem. 78]
(4-a-1)
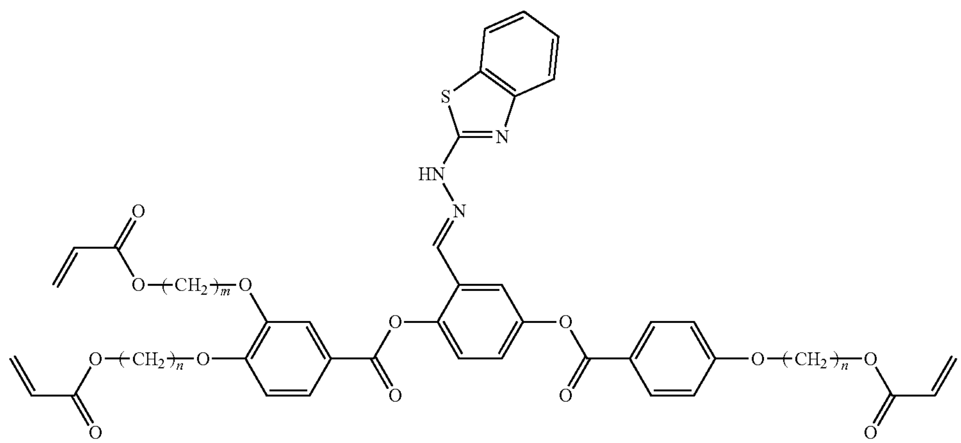
(4-a-2)
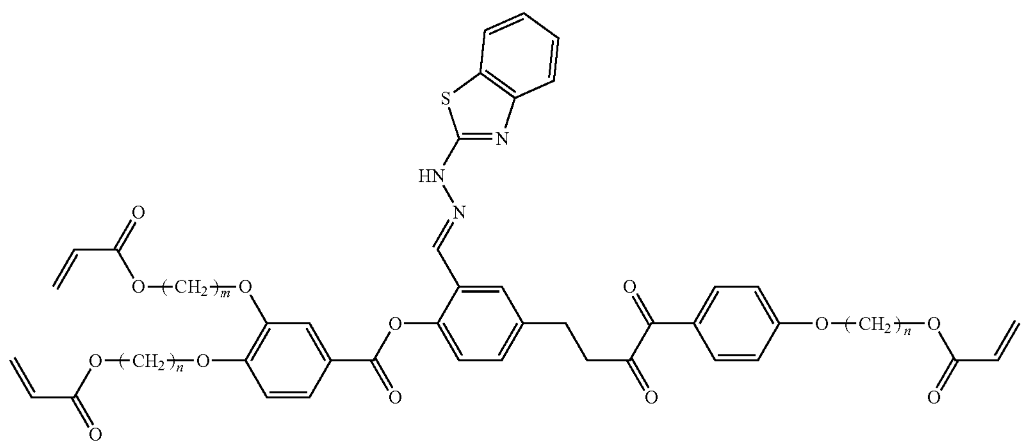
(4-a-3)
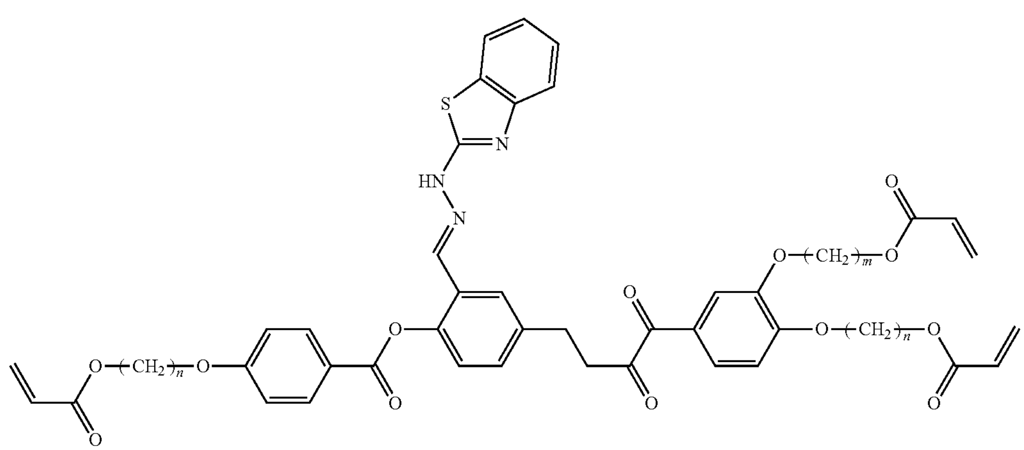

-continued
(4-a-4)
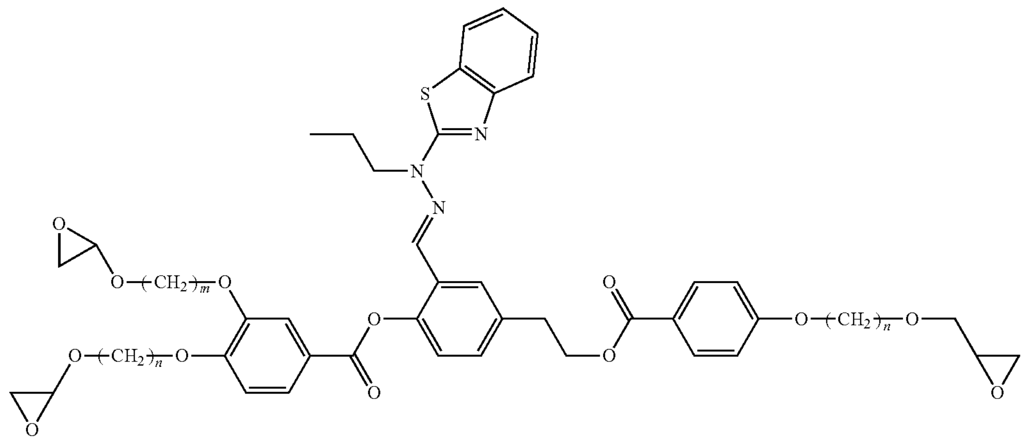
[Chem. 79]
(4-a-5)
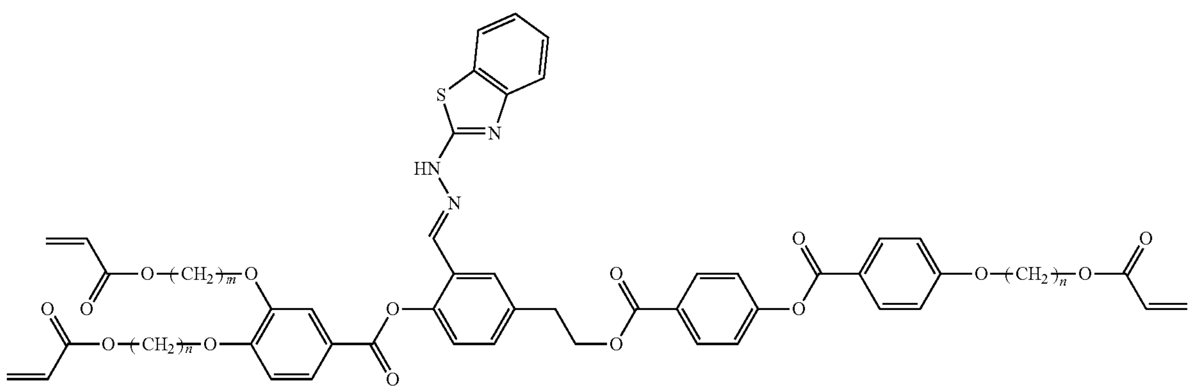
(4-a-6)
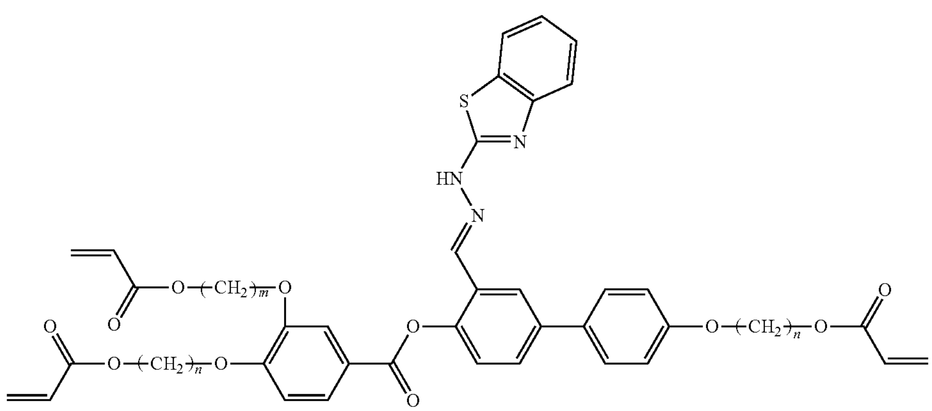

-continued
(4-a-7)
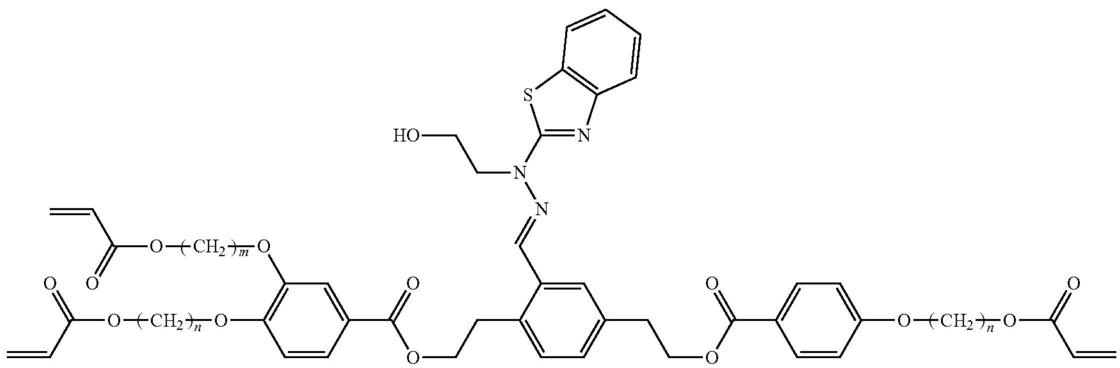
(4-a-8)
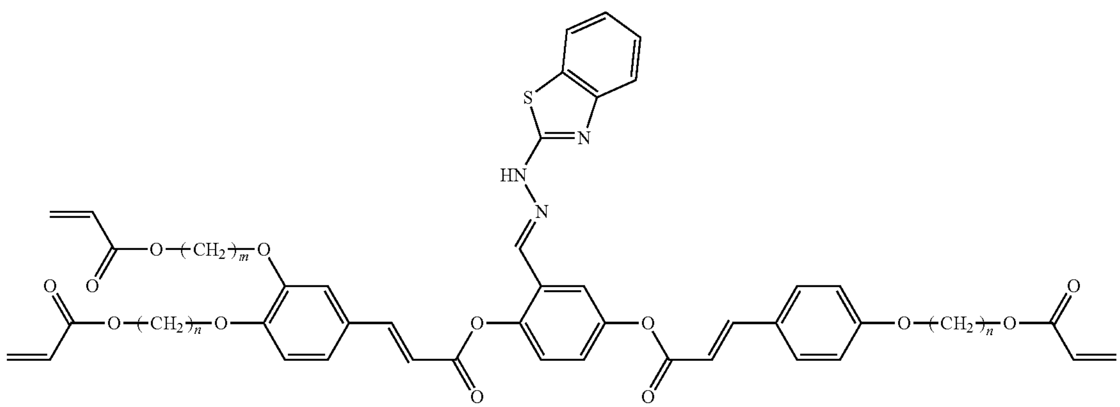
[Chem. 80]
(4-a-9)
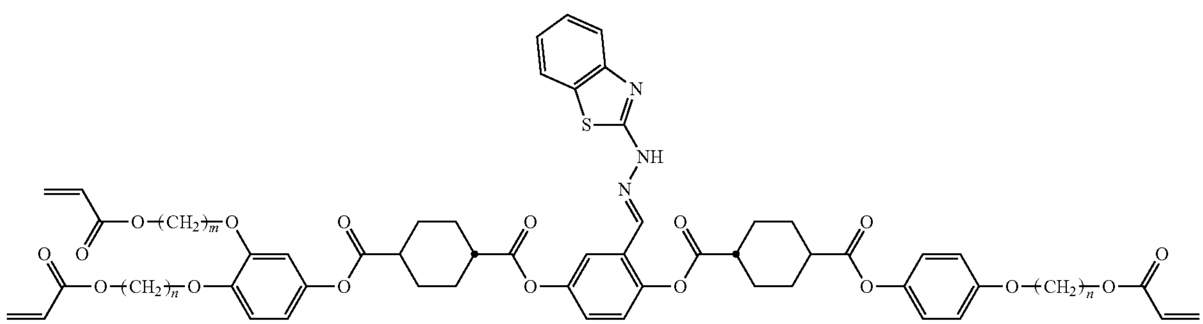
(4-a-10)
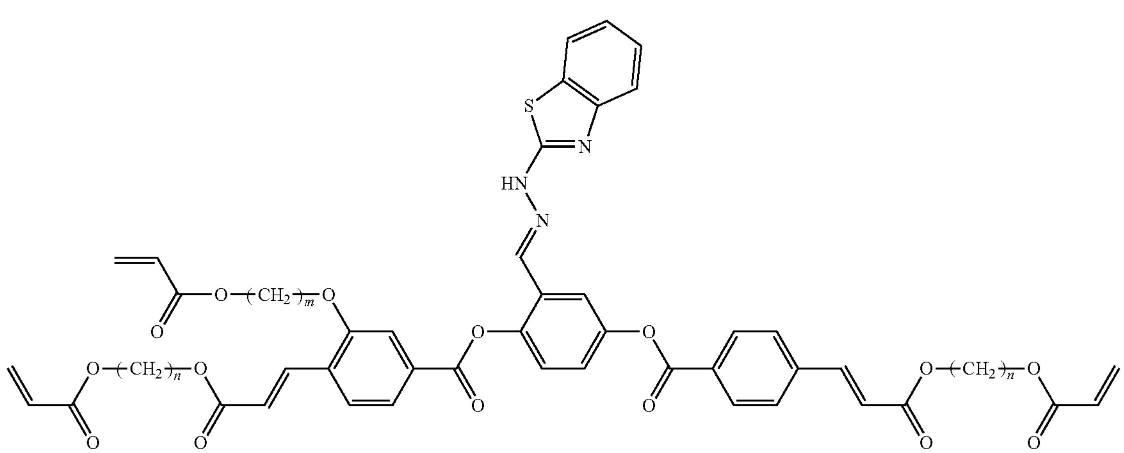

-continued
(4-a-11)
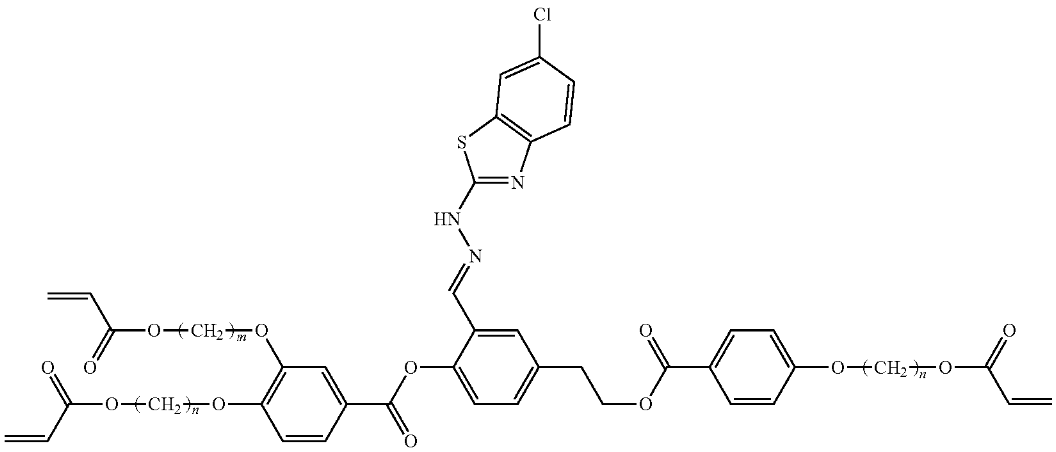
(4-a-12)
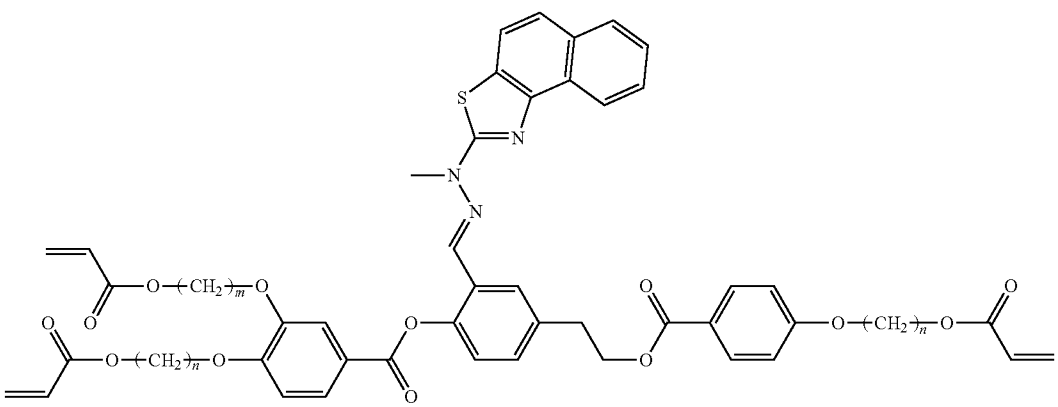
[Chem. 81]
(4-a-13)
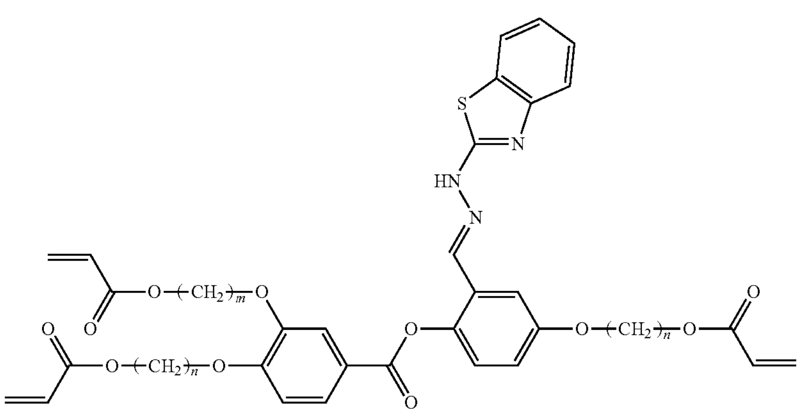

-continued
(4-a-14)
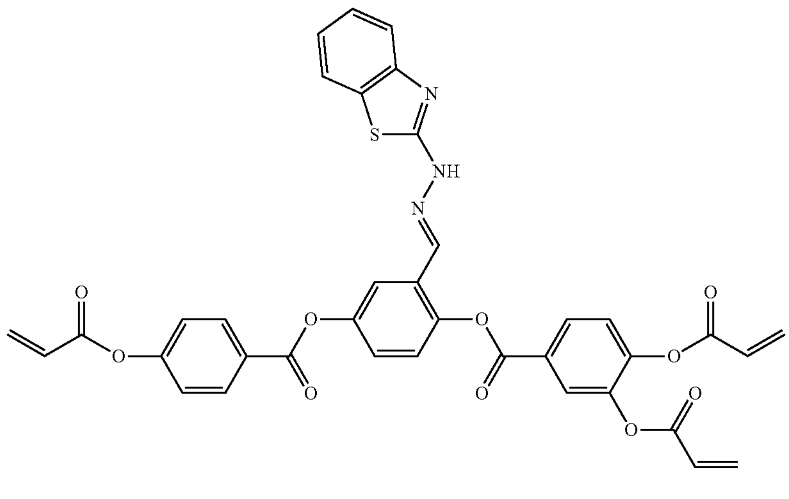
(4-a-15)
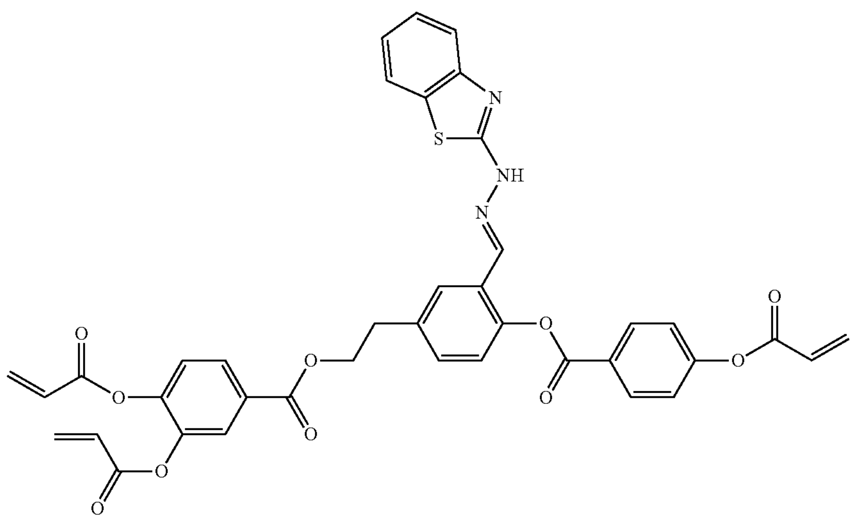
(4-a-16)
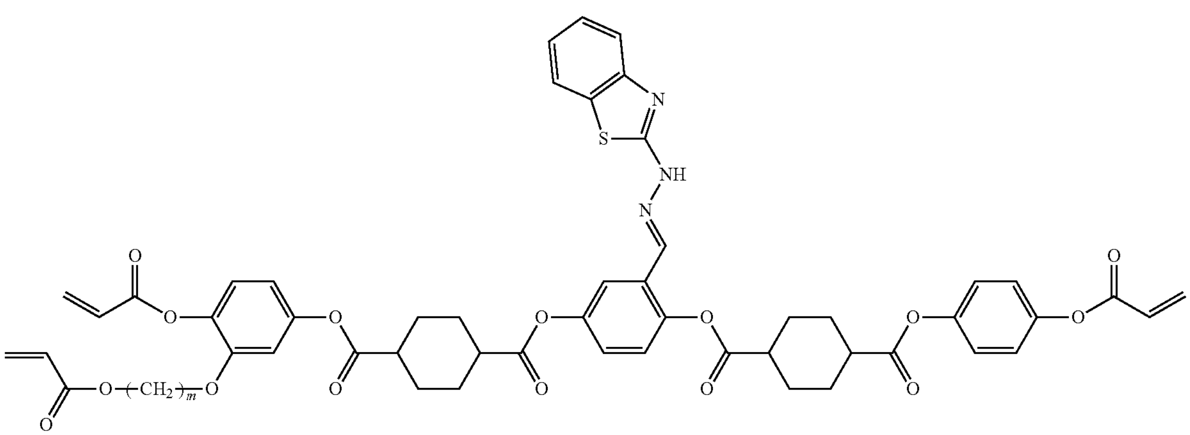

-continued
[Chem. 82]
(4-a-17)
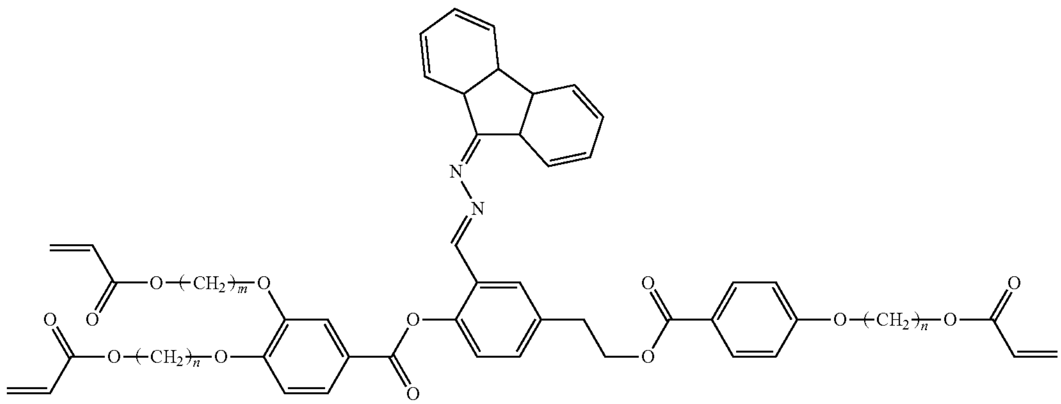
(4-a-18)
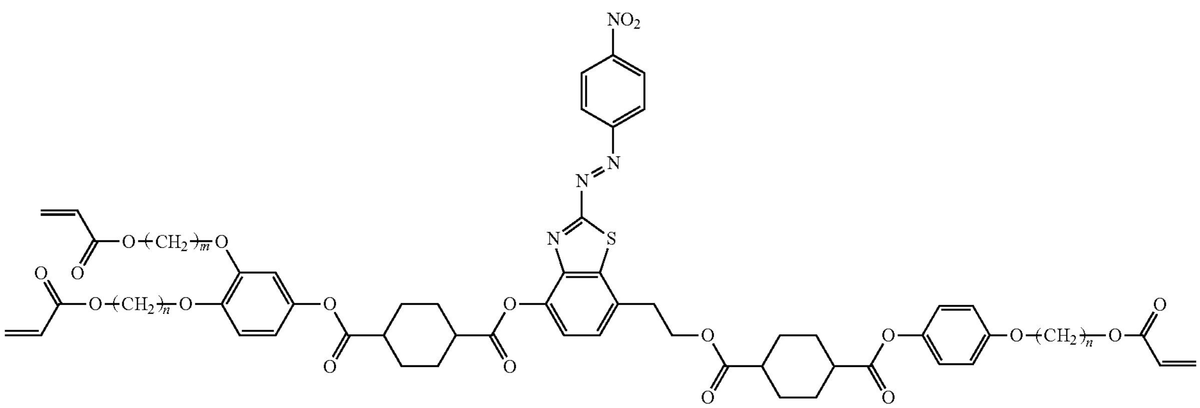
(4-a-19)
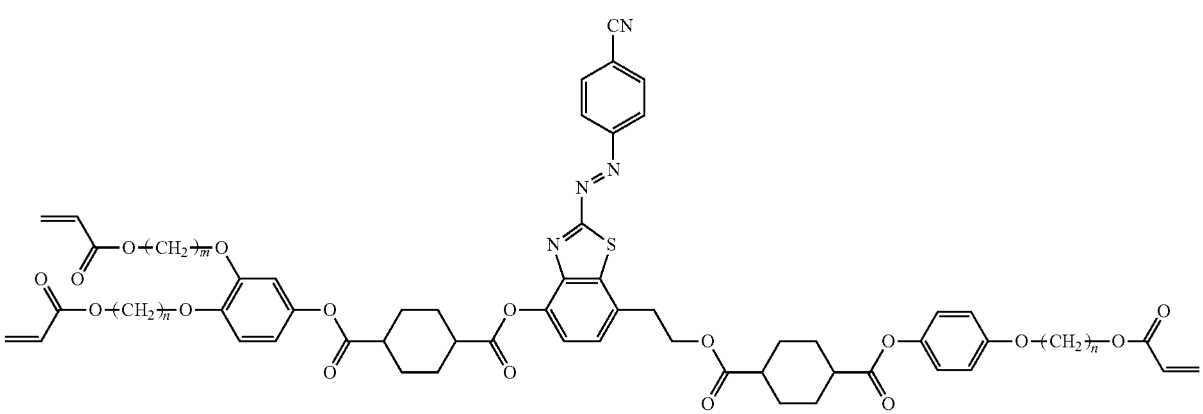

-continued
(4-a-20)
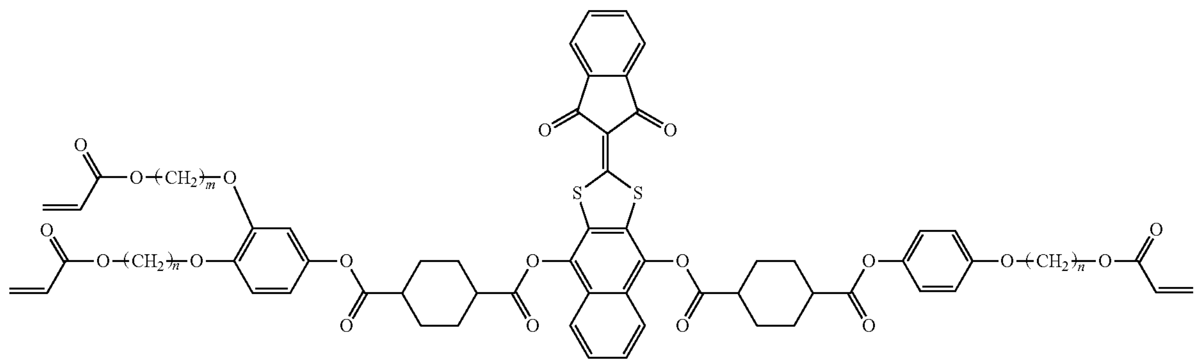
[Chem. 83]
(4-a-21)
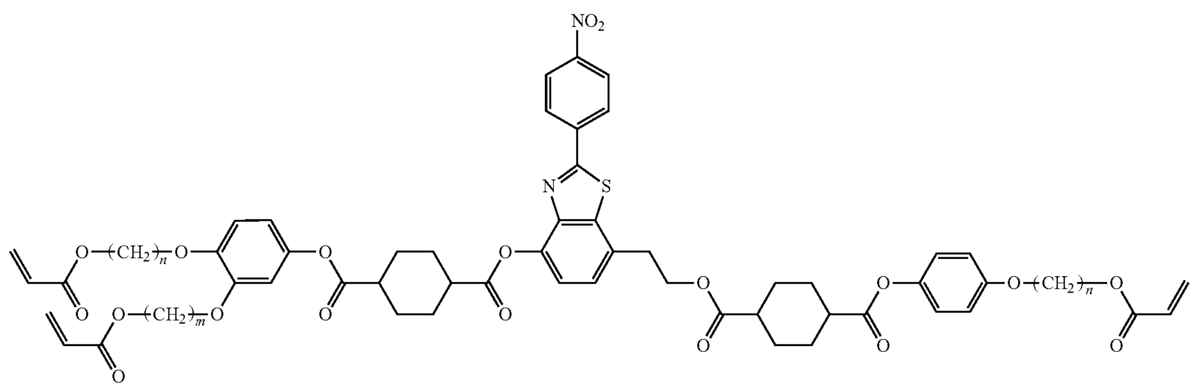
(4-a-22)
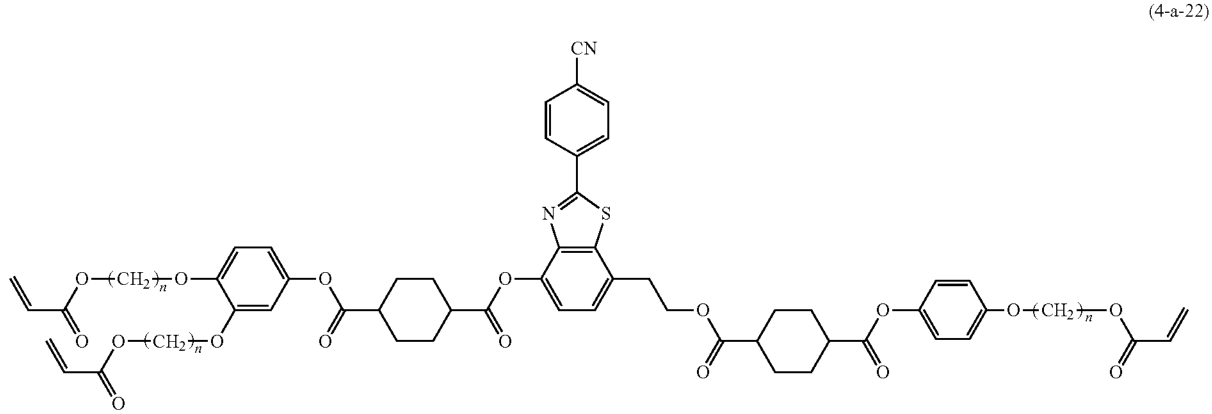

-continued
(4-a-23)
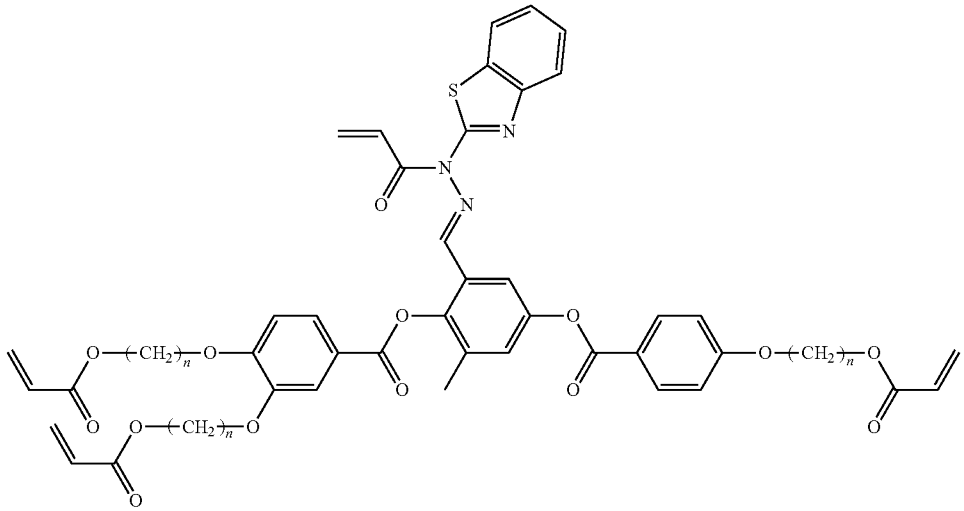
[Chem. 84]
(4-a-24)
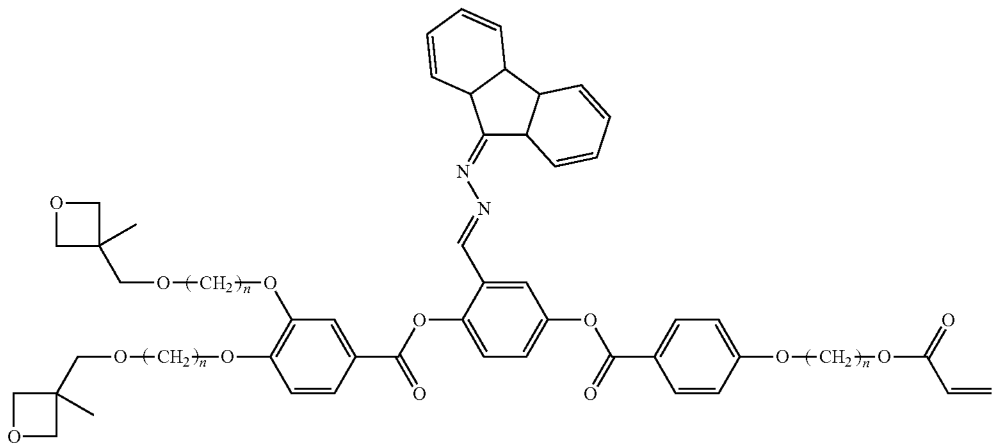
(4-a-25)
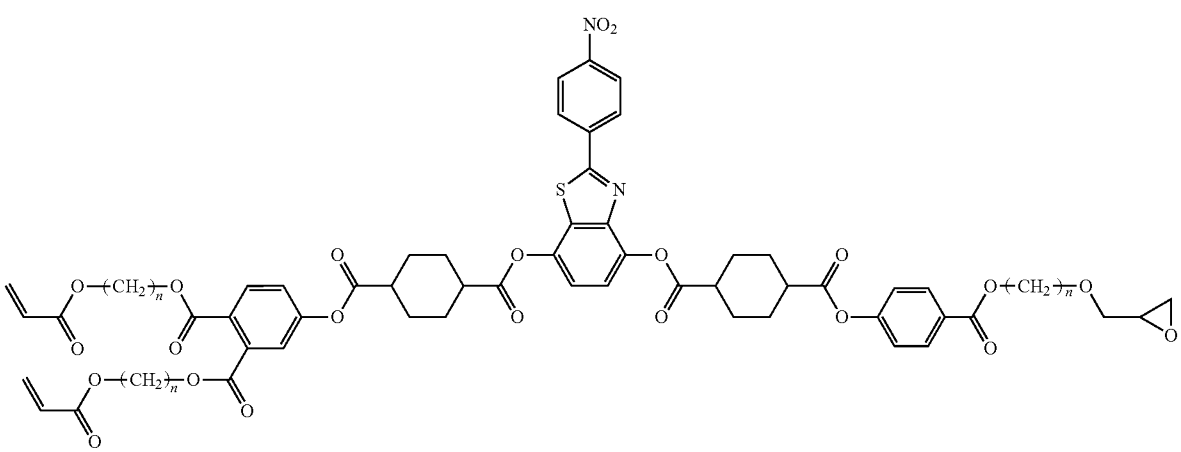

-continued
(4-a-26)
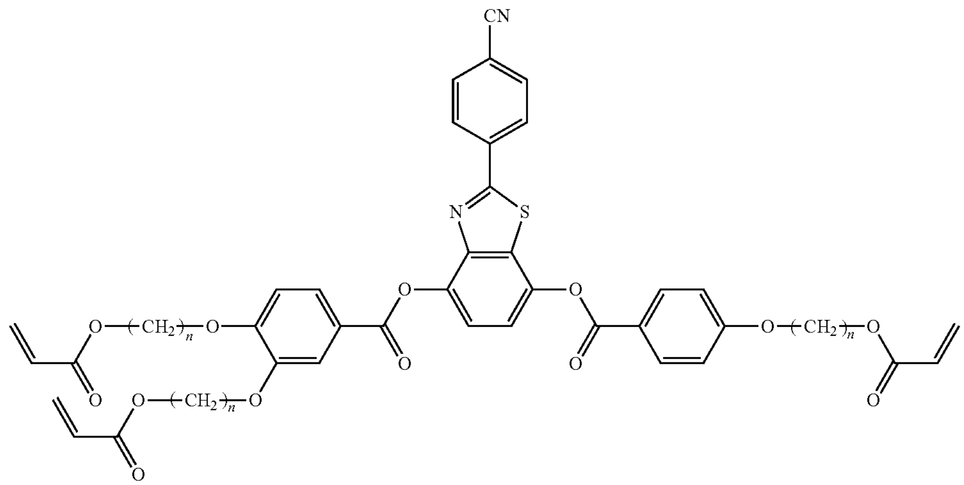
(In the formulae, m and n each independently represent an integer of 1 to 10.)
These liquid crystalline compounds may be used alone or in combination of two or more kinds thereof.
Preferred specific examples of the compound represented by Formula (5) include compounds represented by Formulae (5-a-1) to (5-a-29).
[Chem. 85]
(5-a-1)
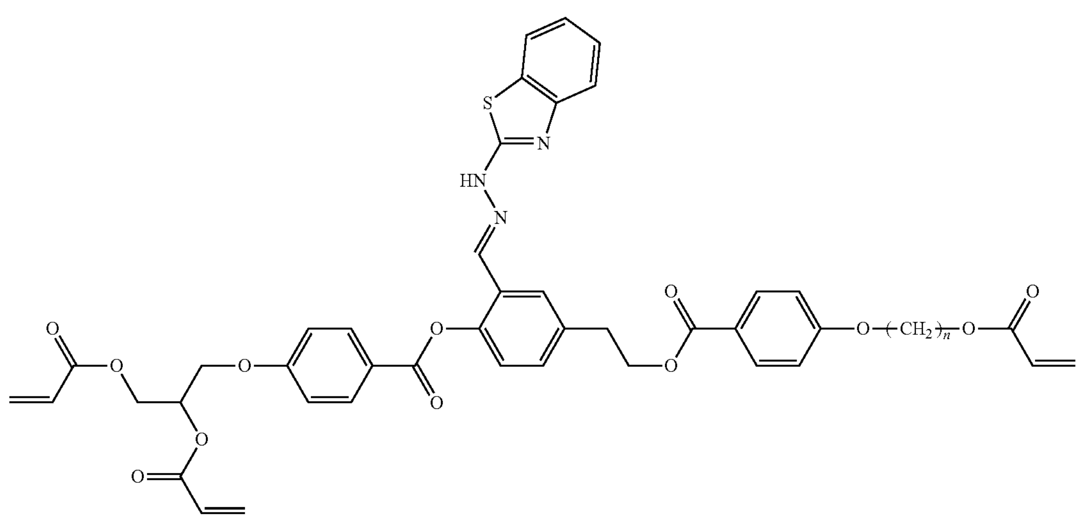

-continued
(5-a-2)
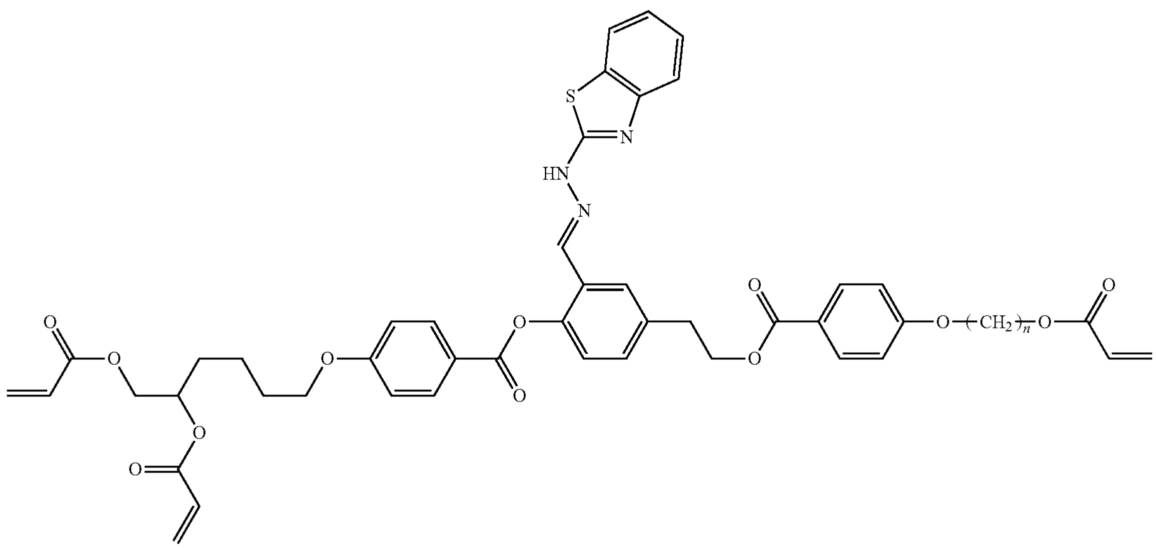
(5-a-3)
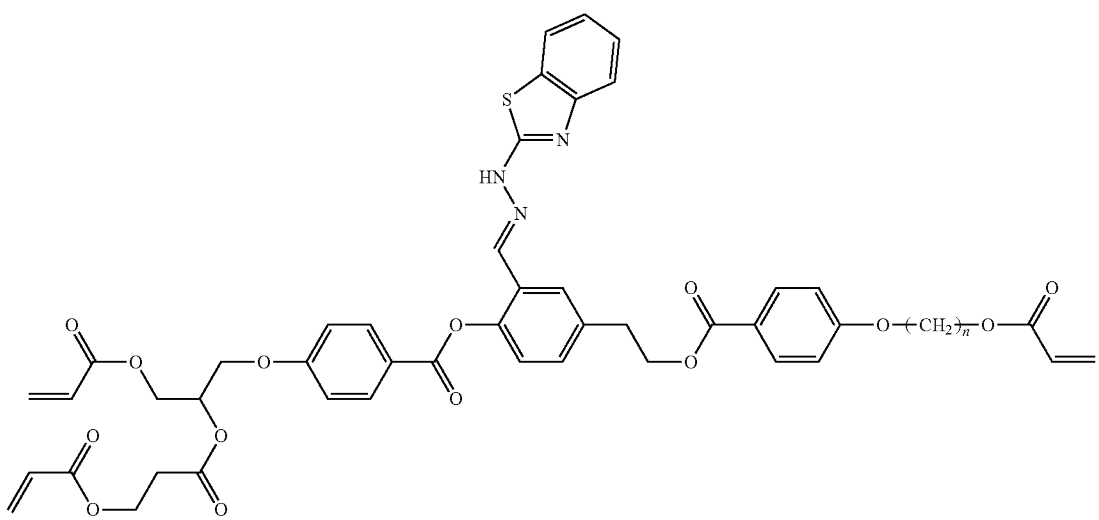
(5-a-4)
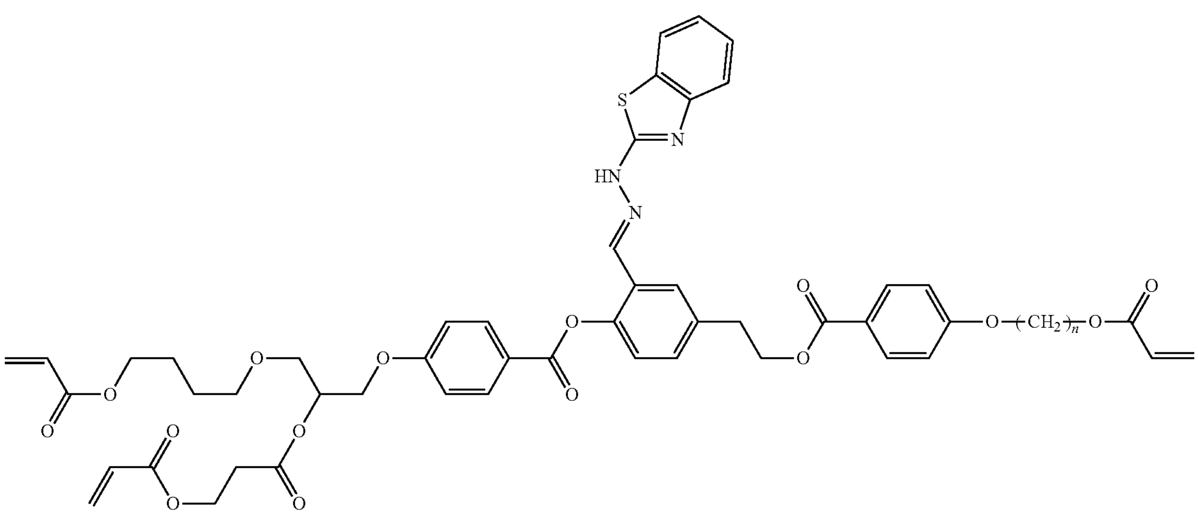

-continued
[Chem. 86]
(5-a-5)
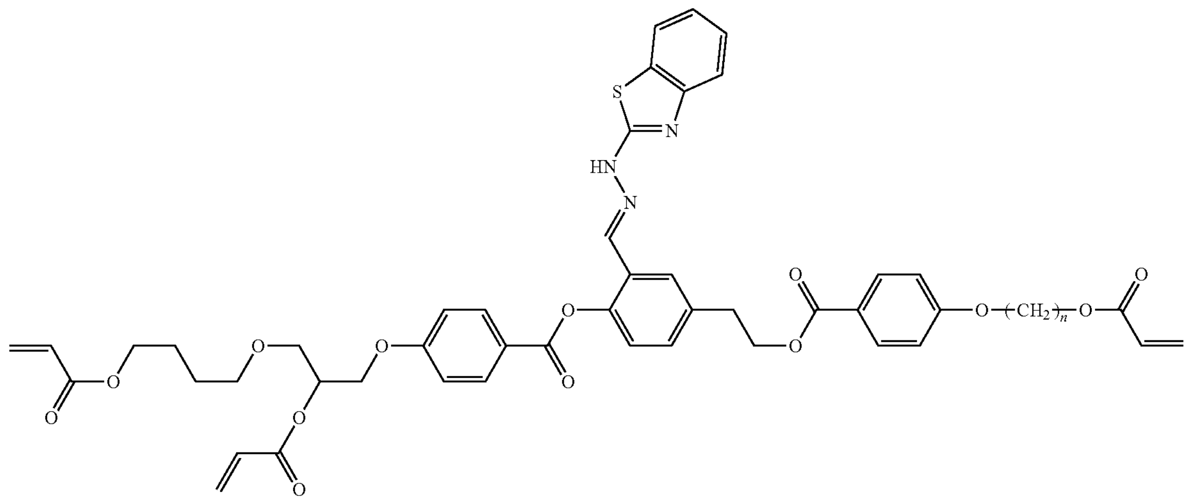
(5-a-6)
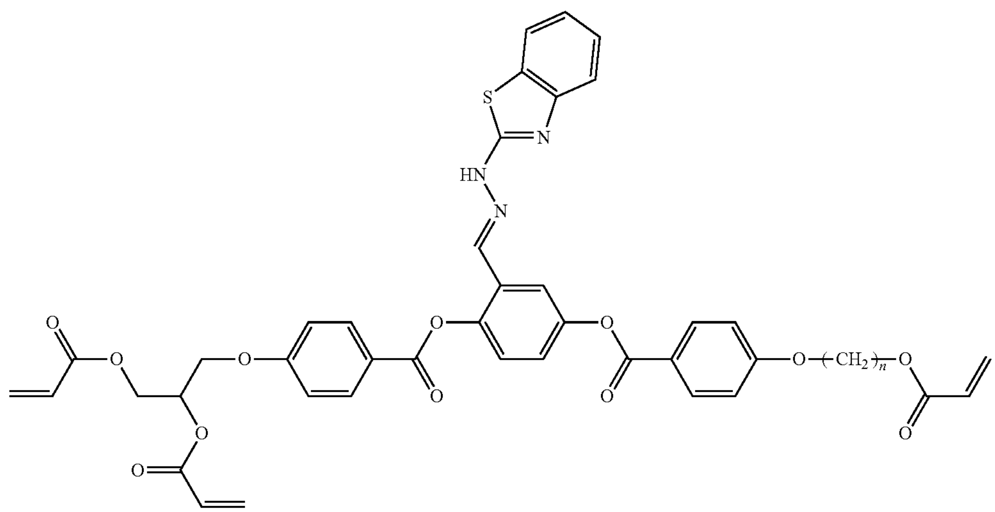
(5-a-7)
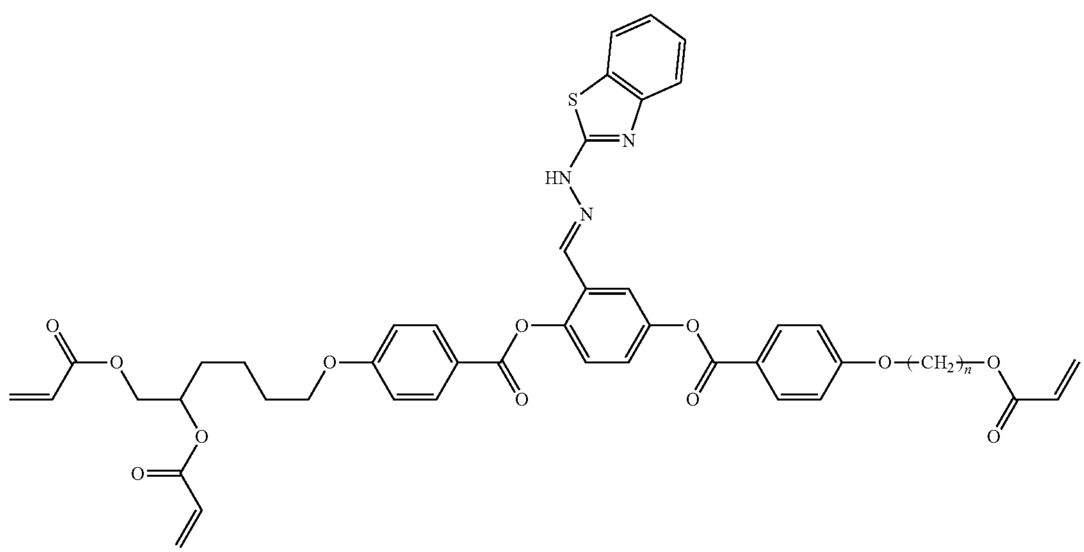

-continued
(5-a-8)
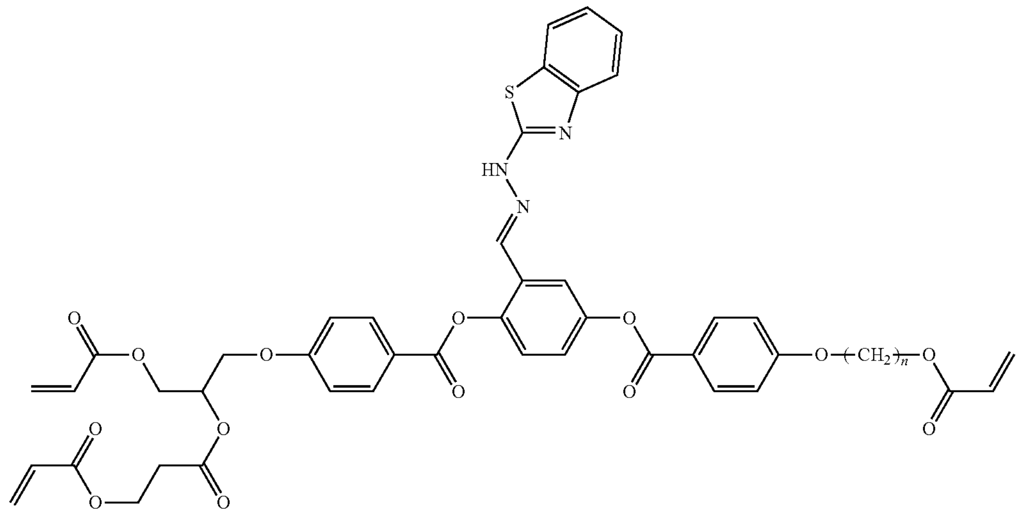
[Chem. 87]
(5-a-9)
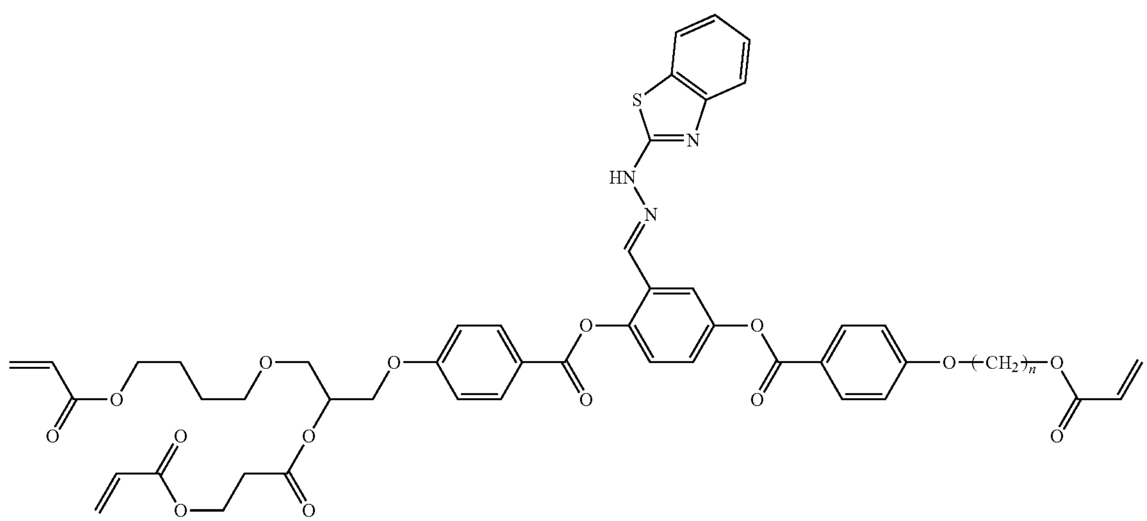
(5-a-10)
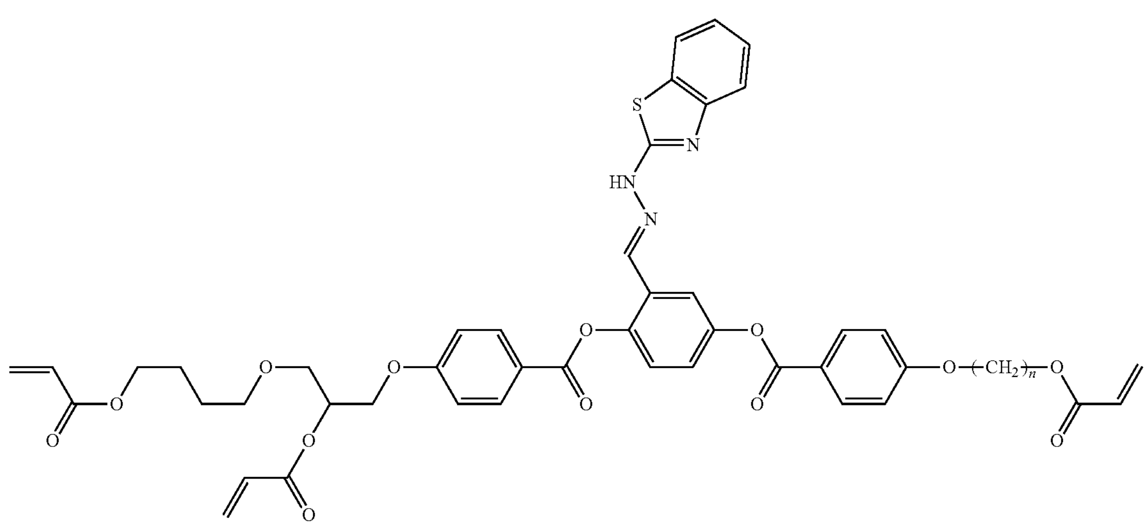

-continued
(5-a-11)
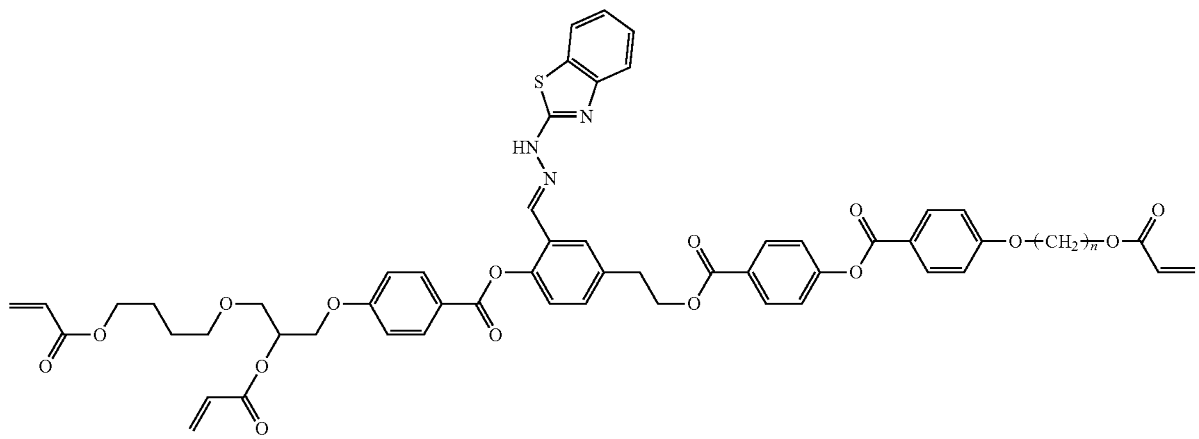
(5-a-12)
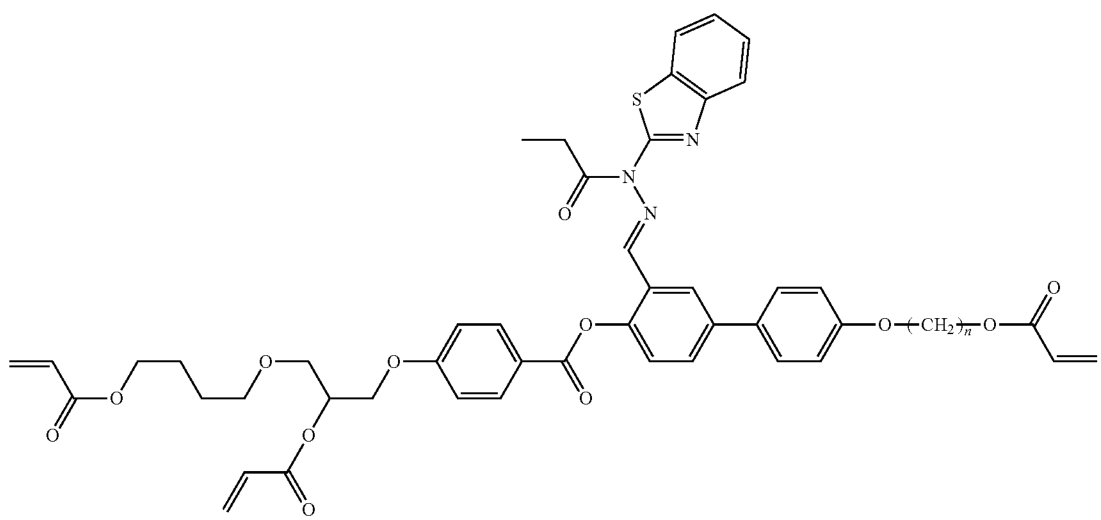
[Chem. 88]
(5-a-13)
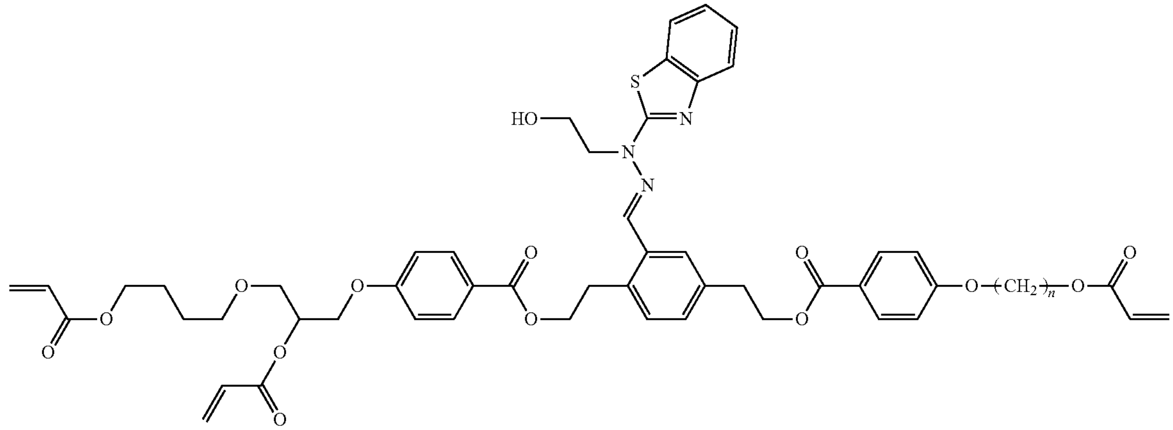

-continued
(5-a-14)
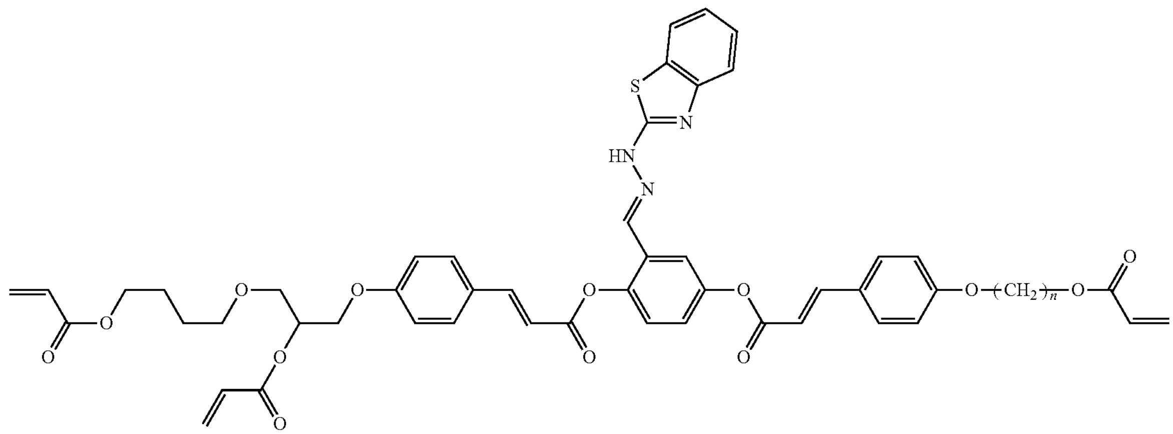
(5-a-15)
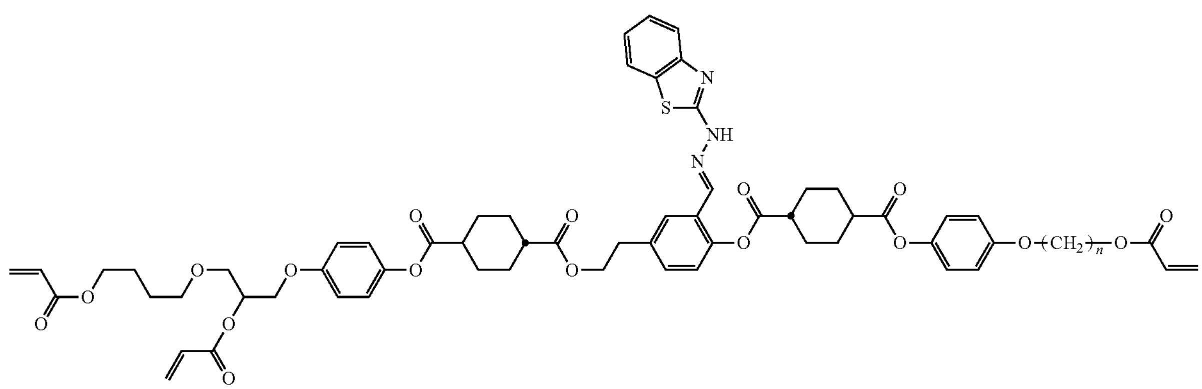
(5-a-16)
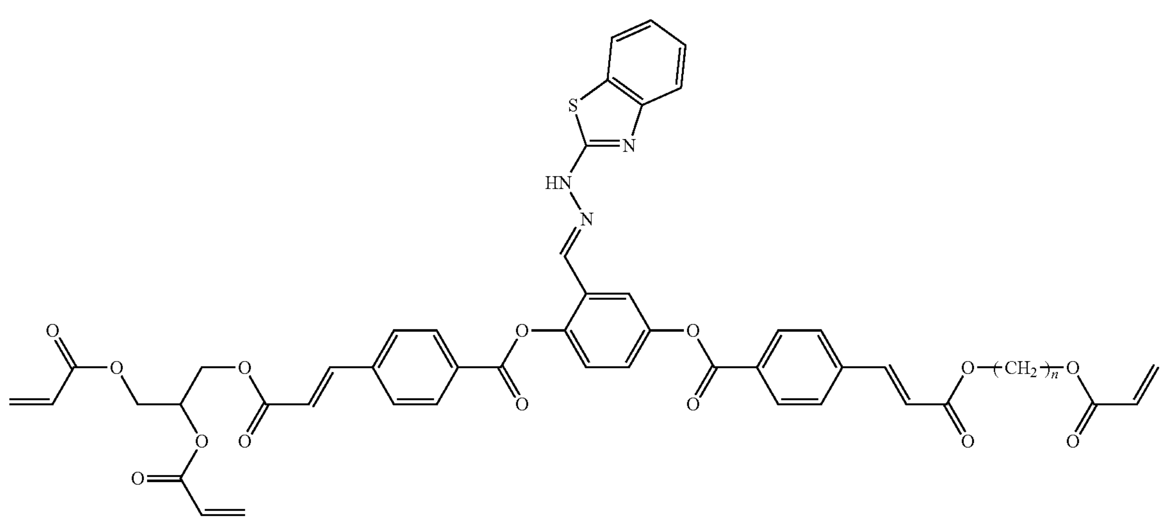

-continued
[Chem. 89]
(5-a-17)
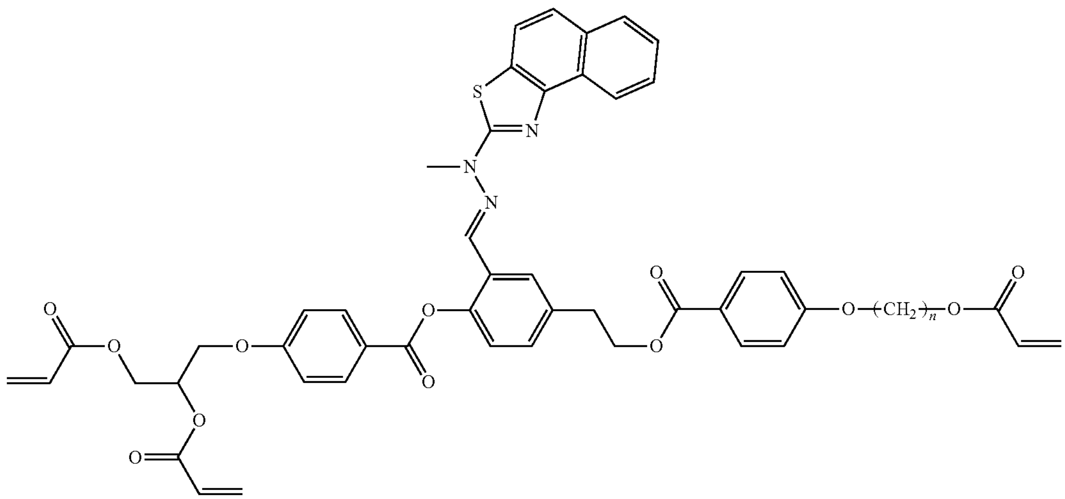
(5-a-18)
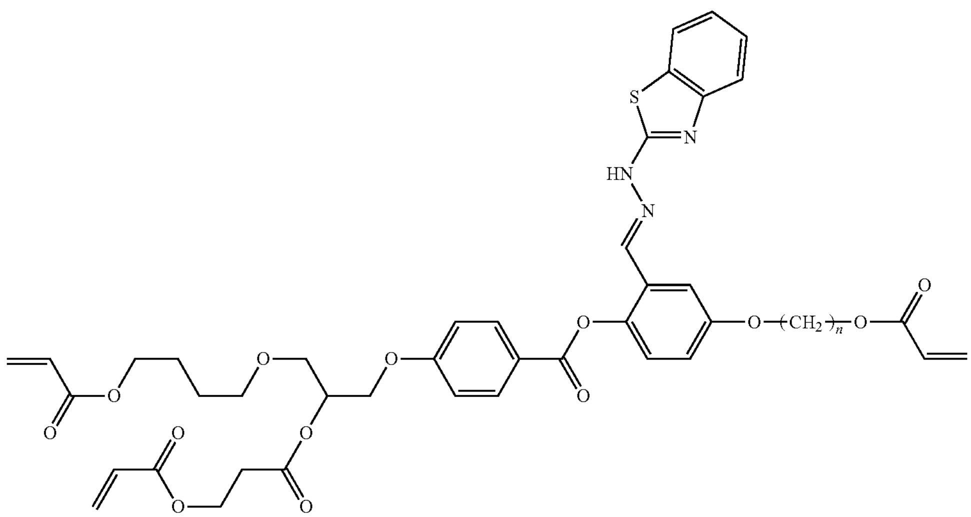
(5-a-19)
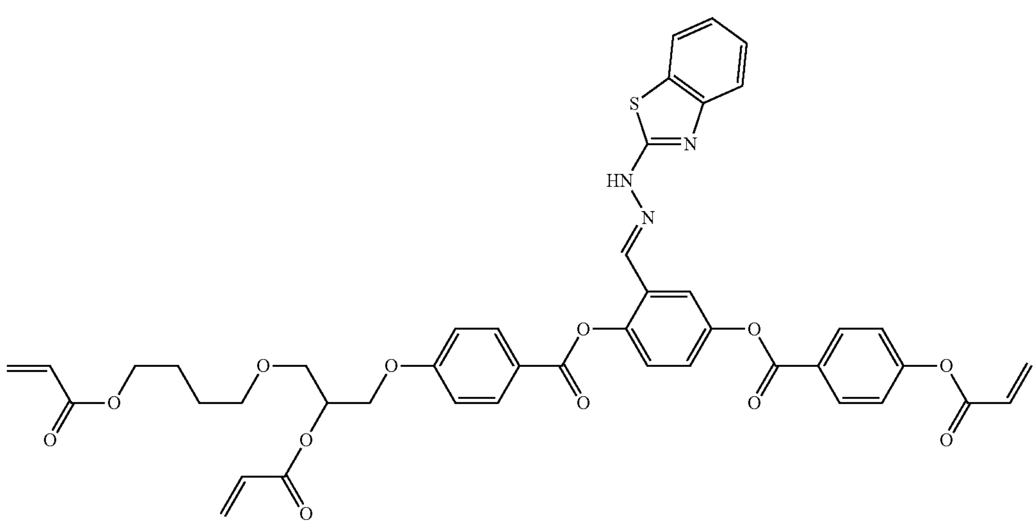

-continued
(5-a-20)
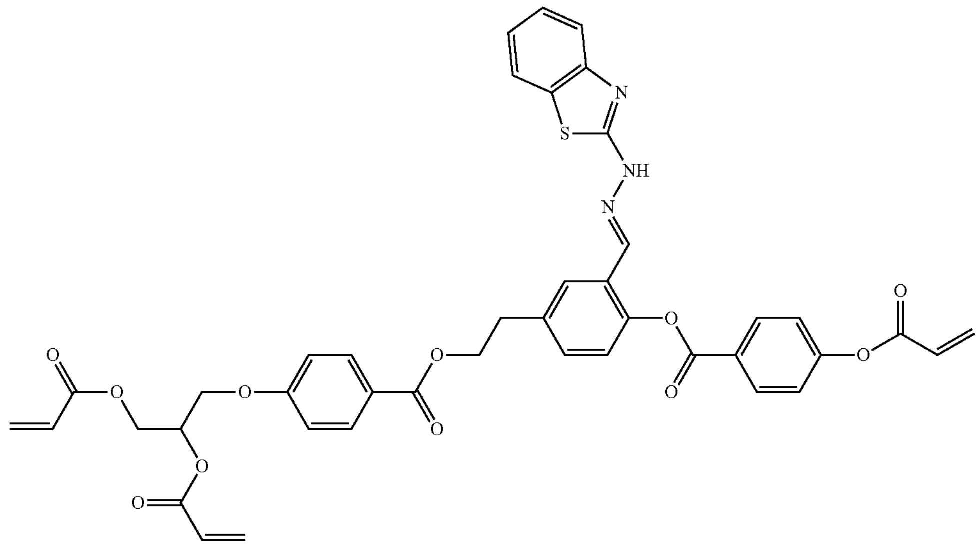
[Chem. 90]
(5-a-21)
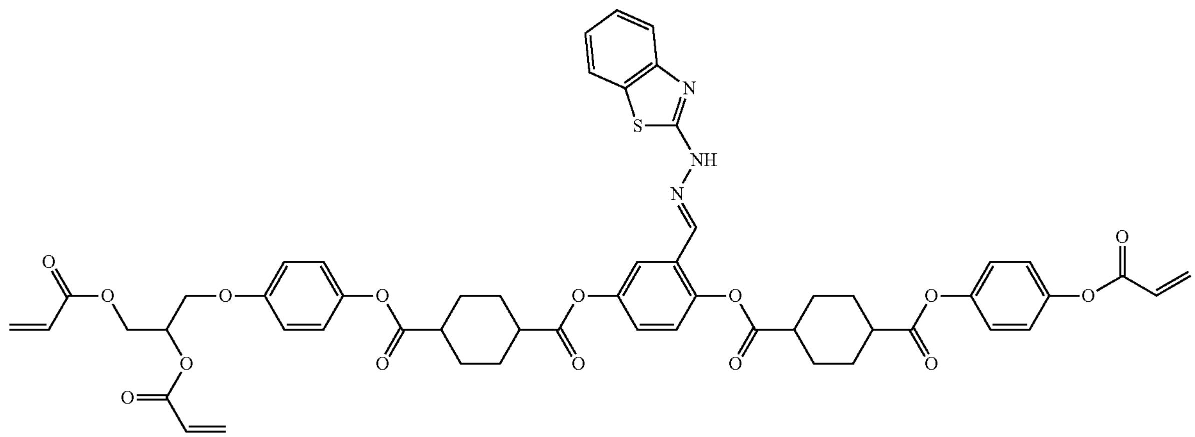
(5-a-22)
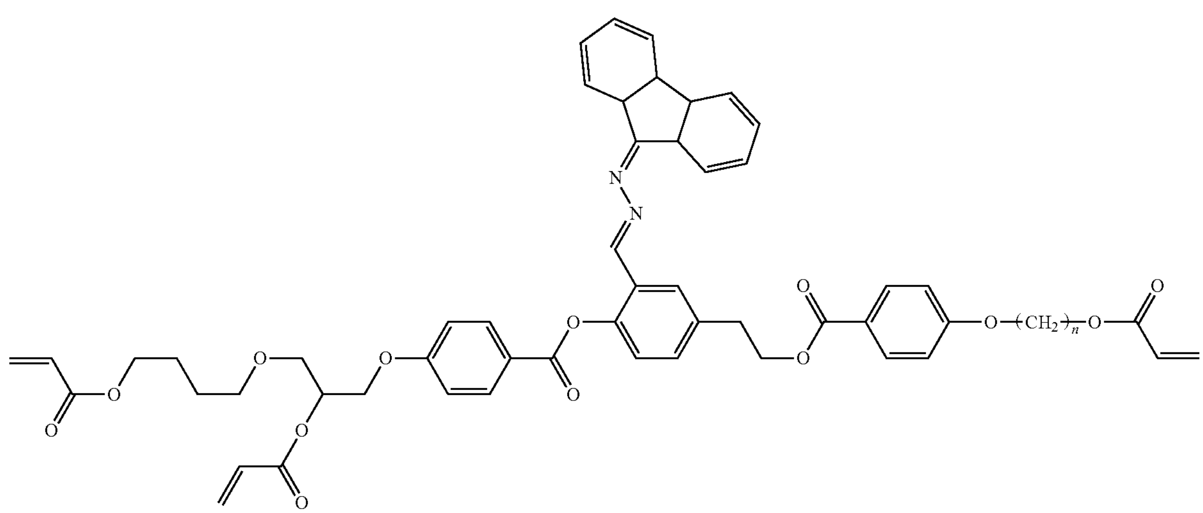

-continued
[Chem. 91]
(5-a-23)
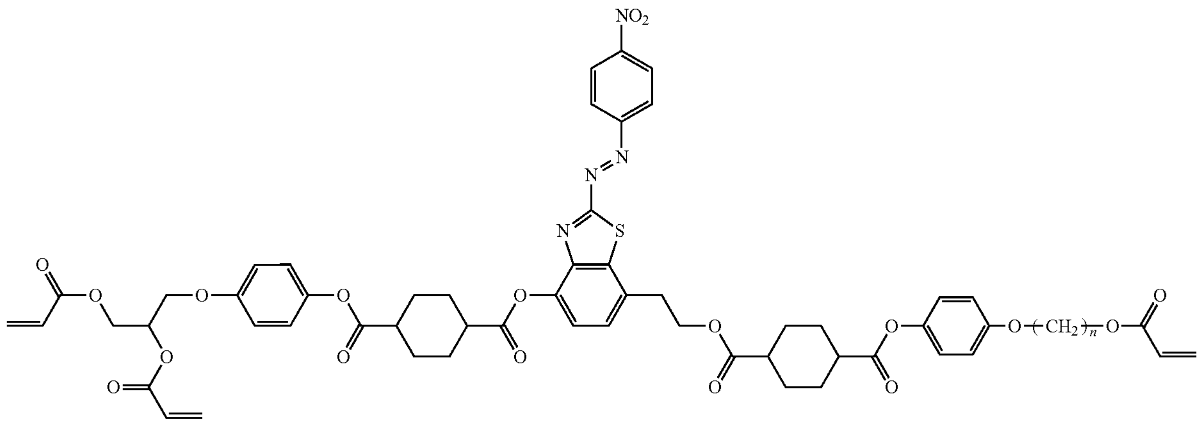
(5-a-24)
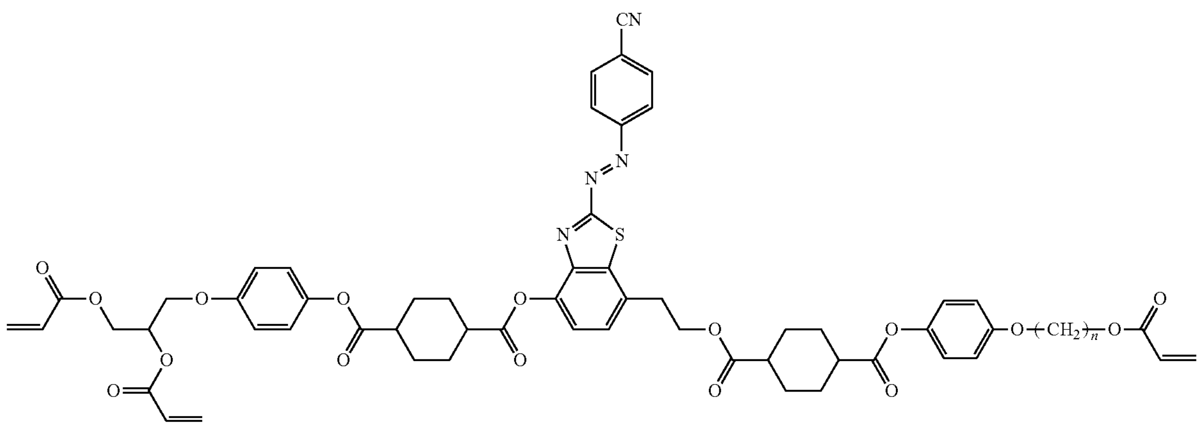
[Chem. 92]
(5-a-25)
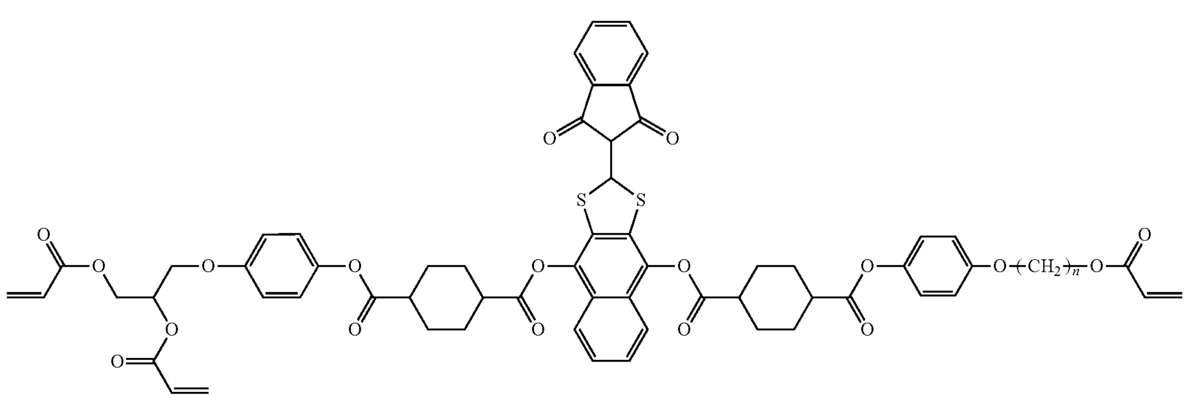

-continued
(5-a-26)
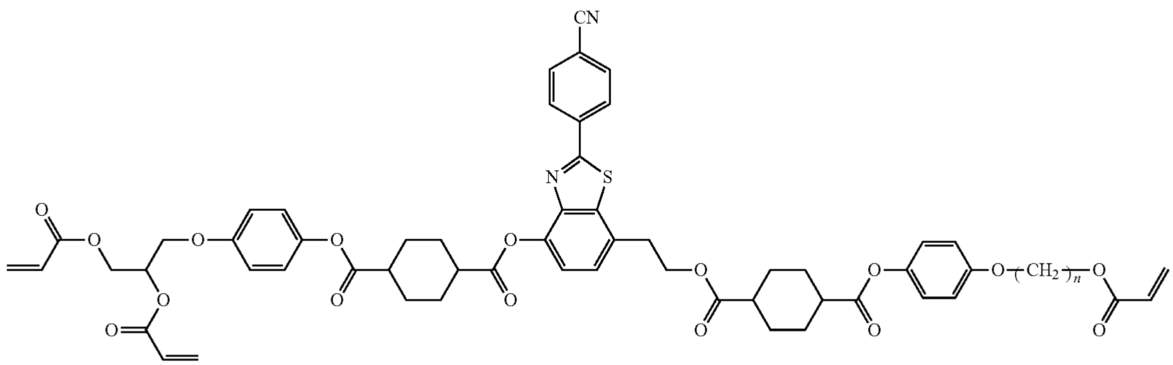
[Chem. 93]
(5-a-27)
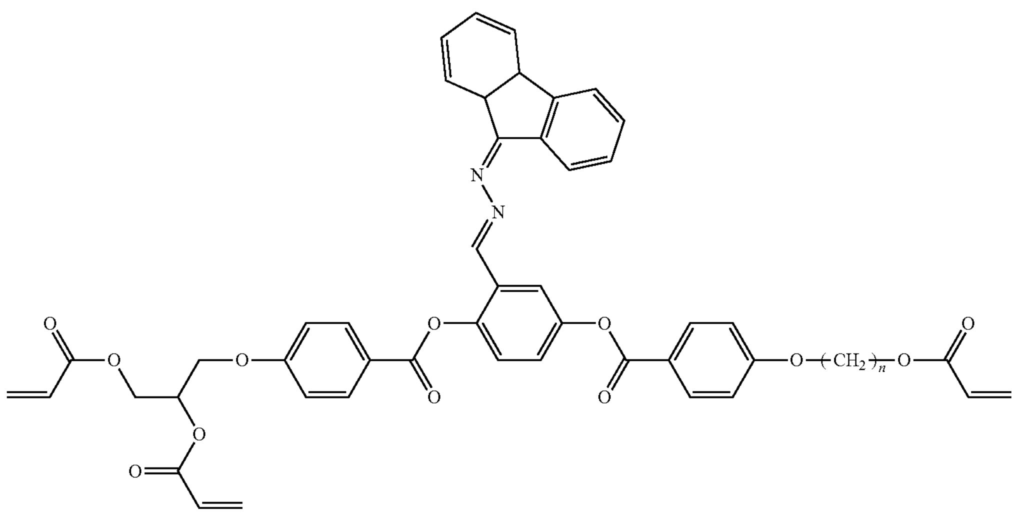
(5-a-28)
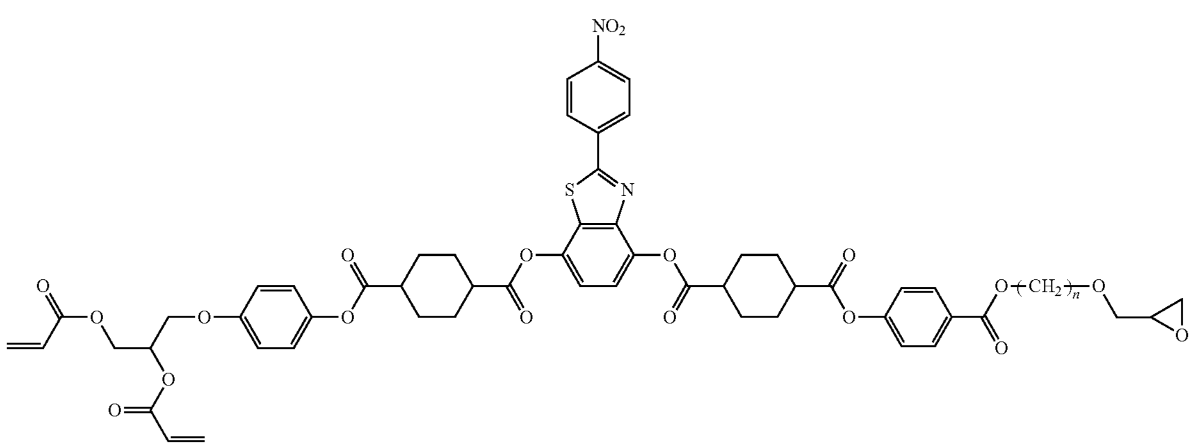

-continued (5-a-29)

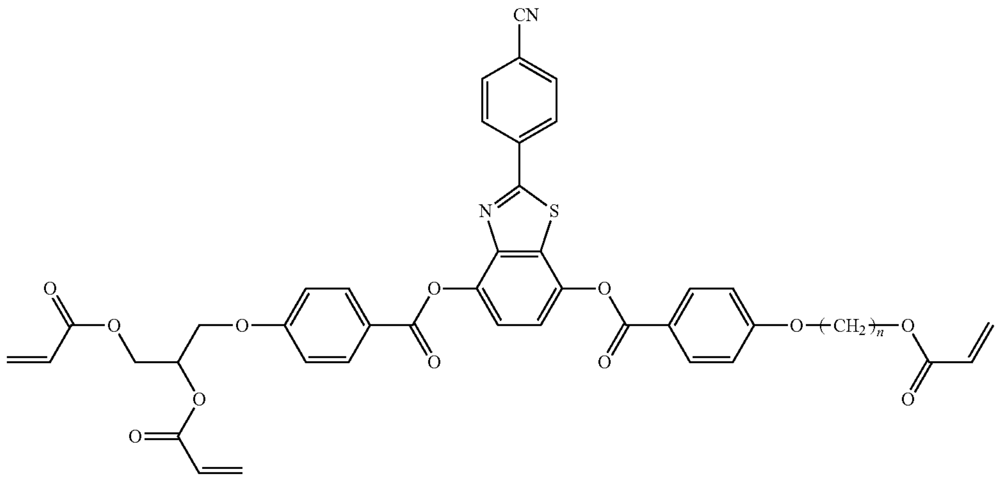

(In the formulae, n represents the number of carbon atoms of 1 to 10.)

These liquid crystalline compounds may be used alone or in combination of two or more kinds thereof.

In Formula (6), a group represented by $P^{63}$—($S^{63}$—$X^{63}$)$_{16}$— or a group represented by $P^{64}$—($S^{64}$—$X^{64}$)$_{k6}$— is bonded to $A^{11}$ or $A^{12}$ of Formula (a).

Preferred specific examples of the compound represented by Formula (6) include compounds represented by Formulae (6-a-1) to (6-a-25).

[Chem. 94]

(6-a-1)

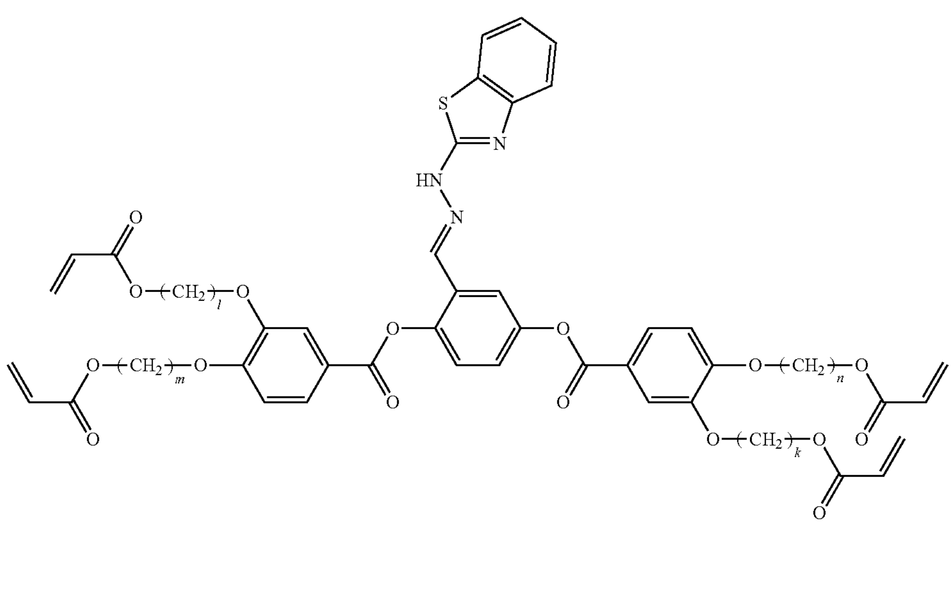

-continued
(6-a-2)
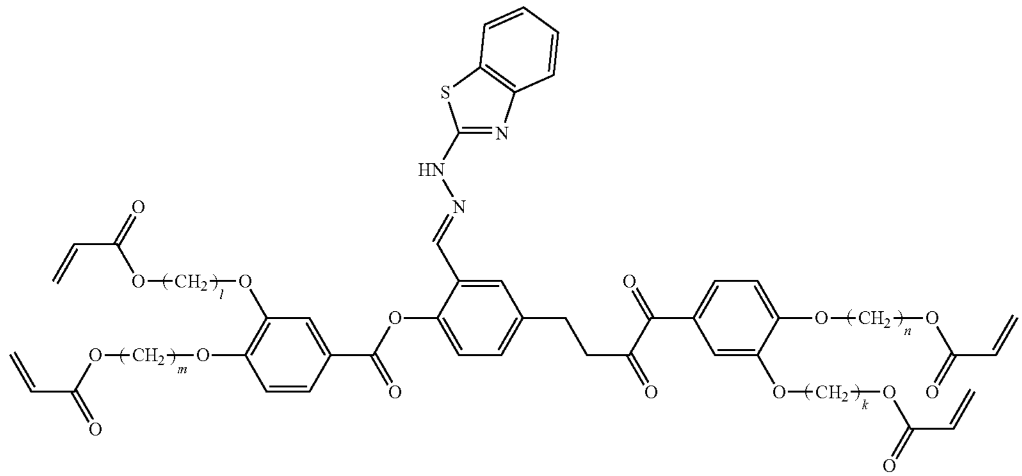
(6-a-3)
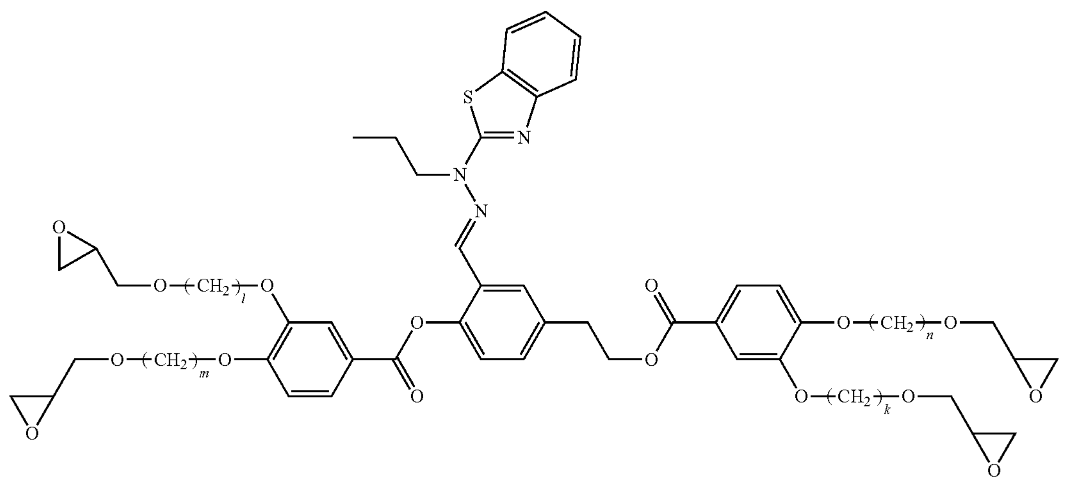
(6-a-4)
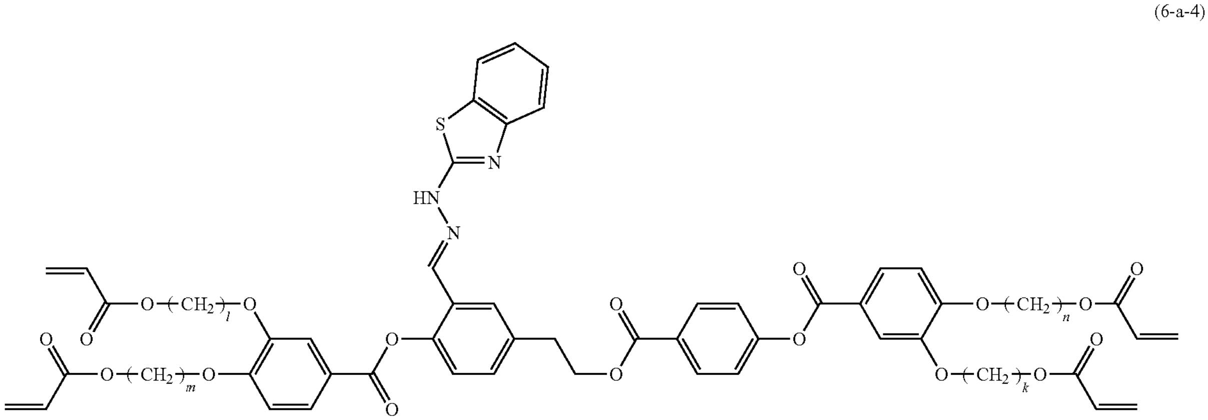

-continued
[Chem. 95]
(6-a-5)
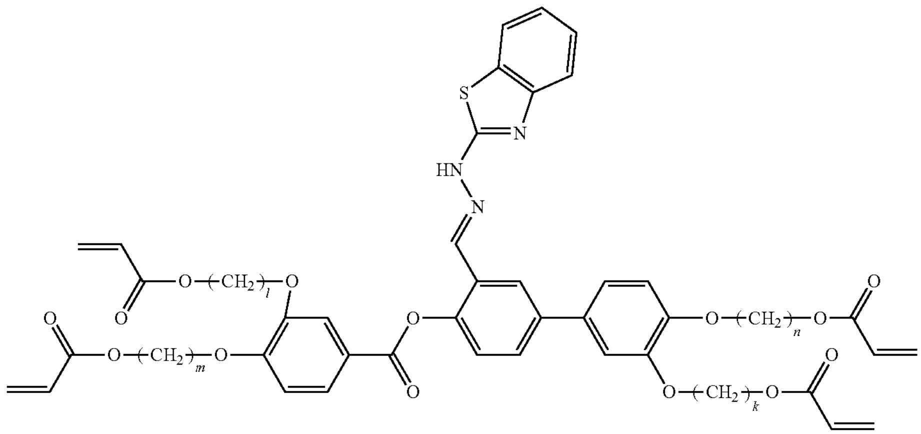
(6-a-6)
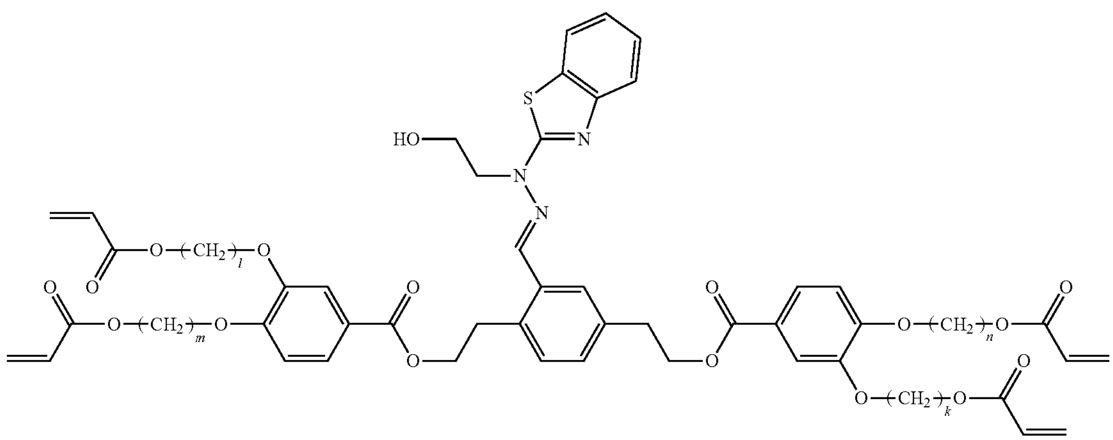
(6-a-7)
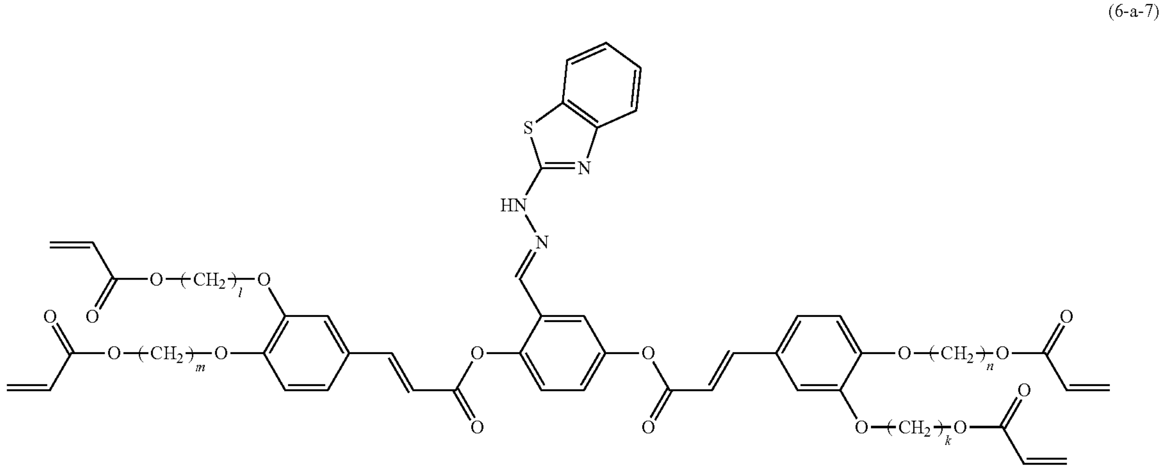

-continued
(6-a-8)
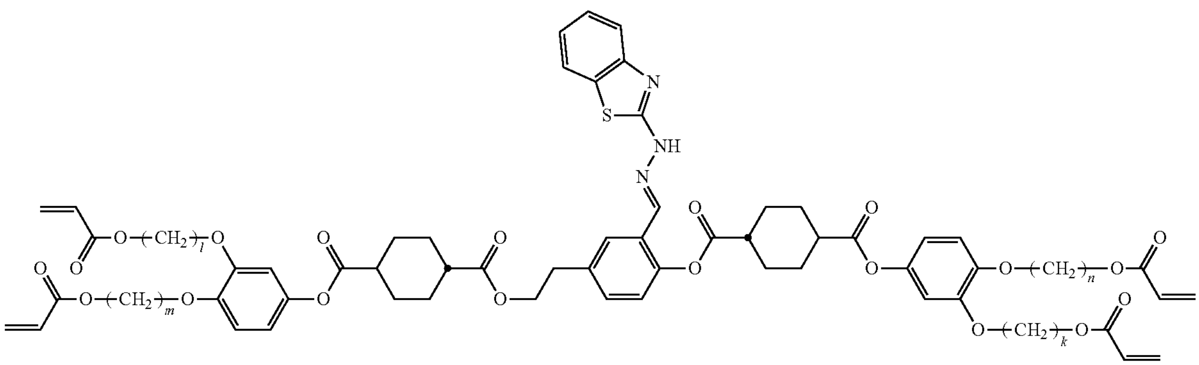
(6-a-9)
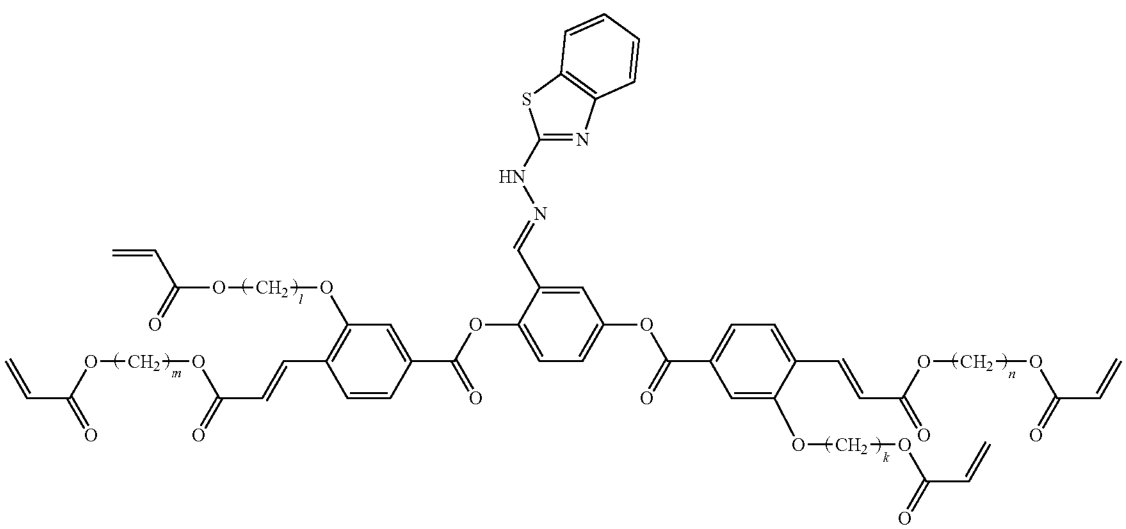
[Chem. 96]
(6-a-10)
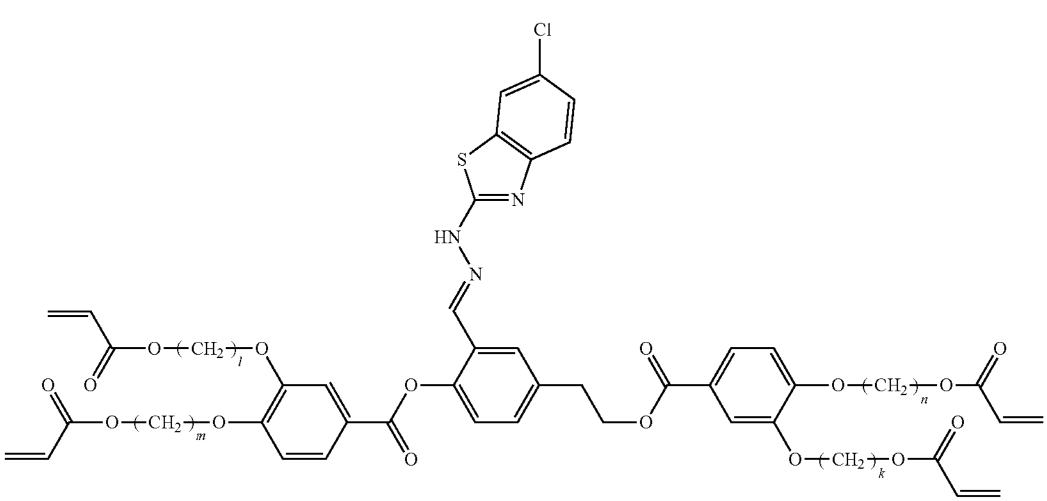

-continued
(6-a-11)
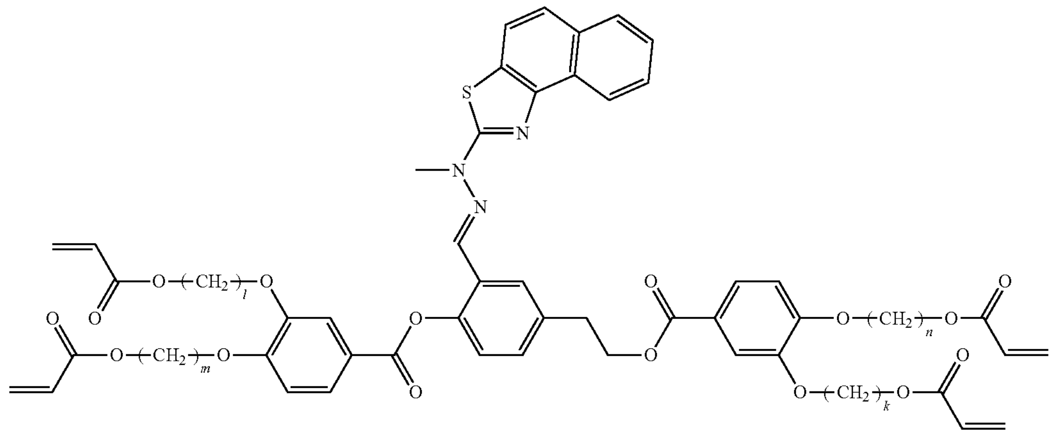
(6-a-12)
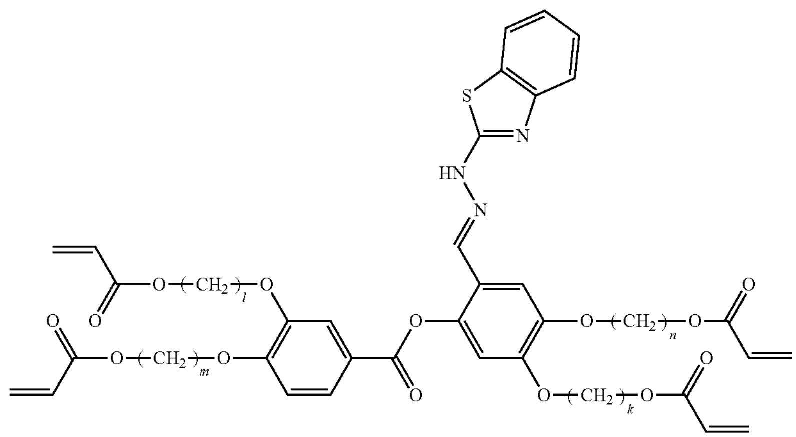
(6-a-13)
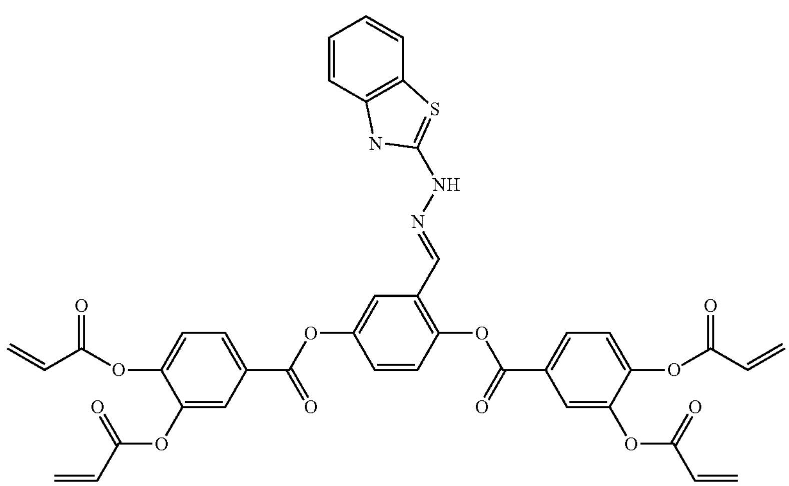

-continued
(6-a-14)
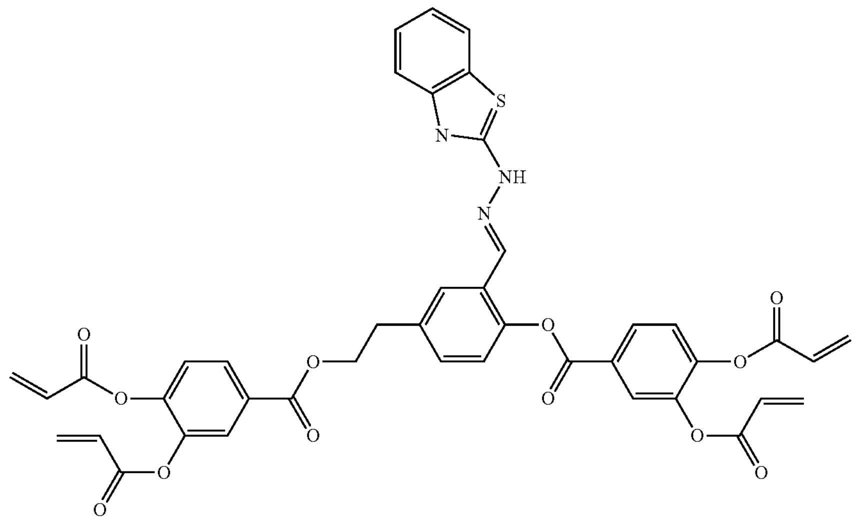
[Chem. 97]
(6-a-15)
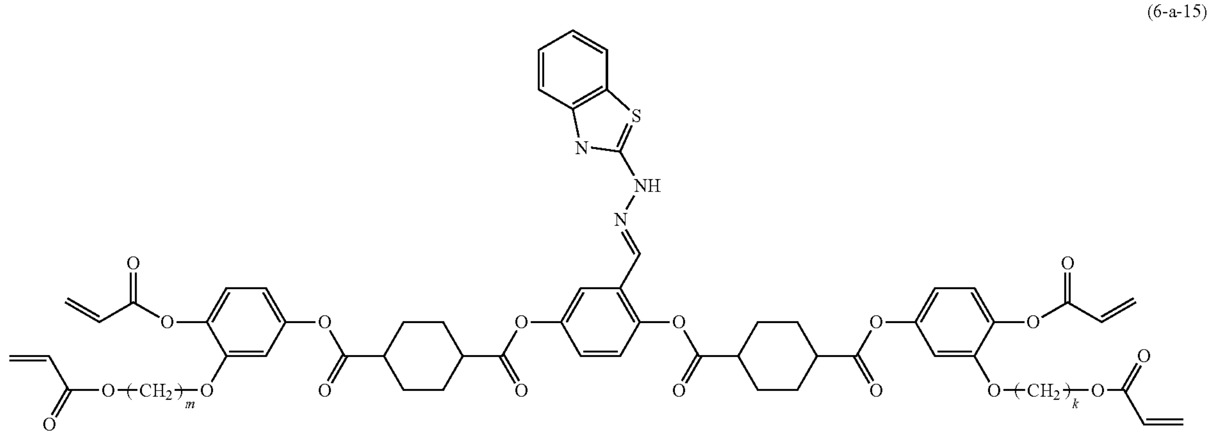
(6-a-16)
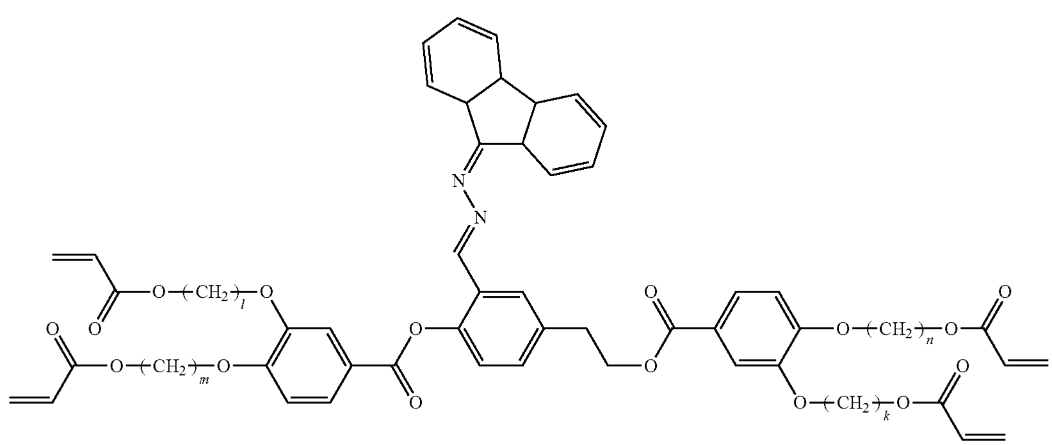

-continued
(6-a-17)
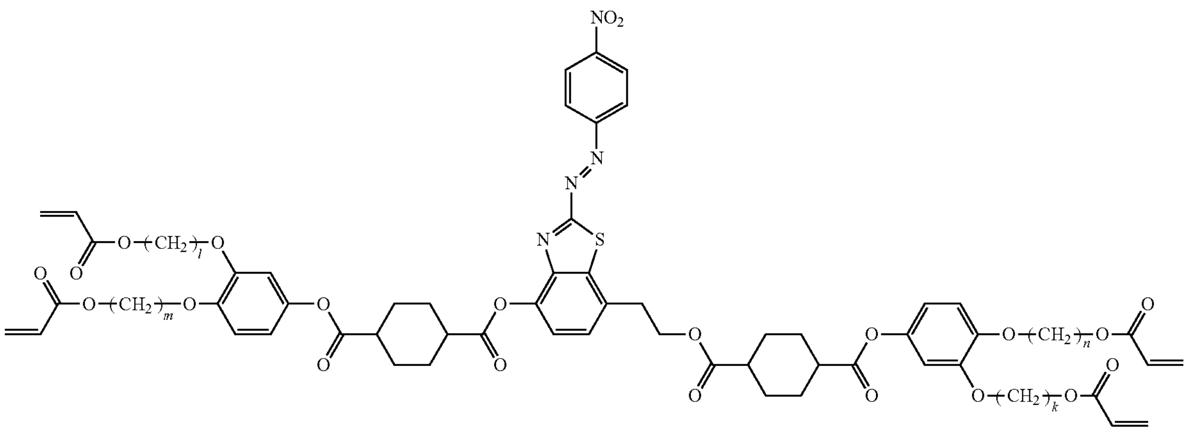
(6-a-18)
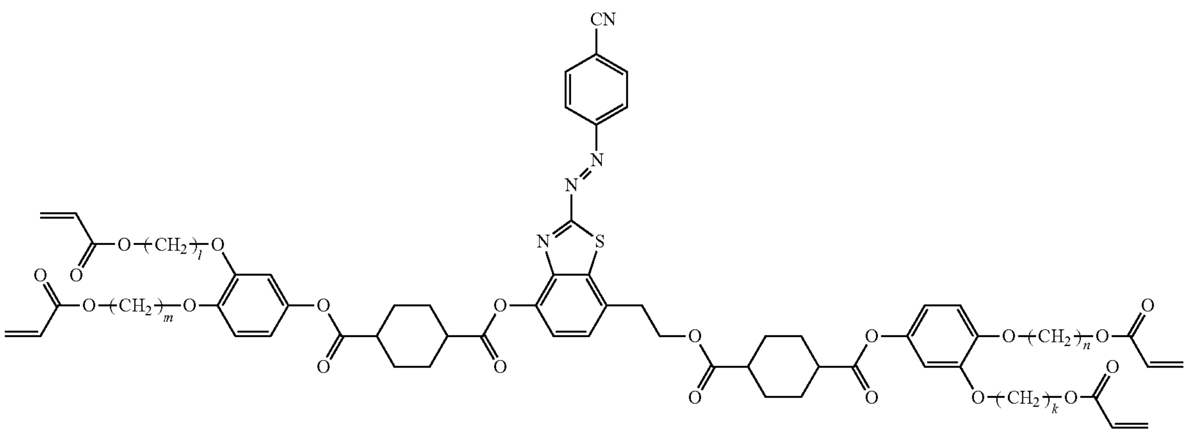
[Chem. 98]
(6-a-19)
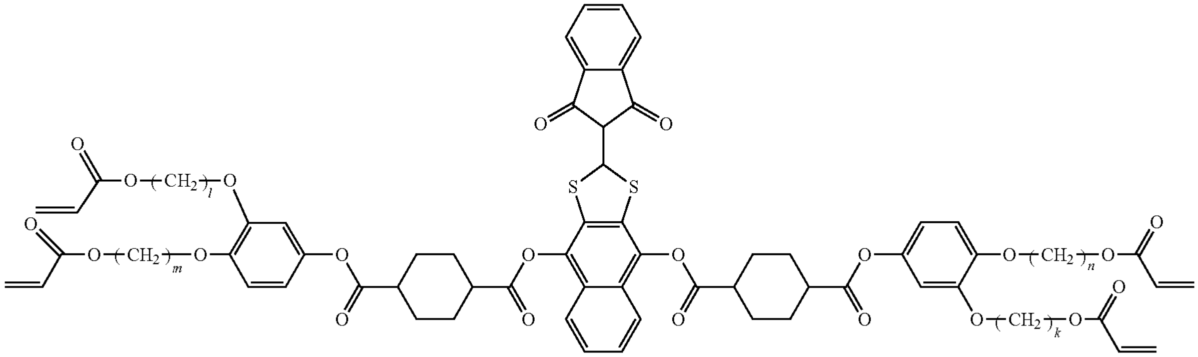

-continued
(6-a-20)
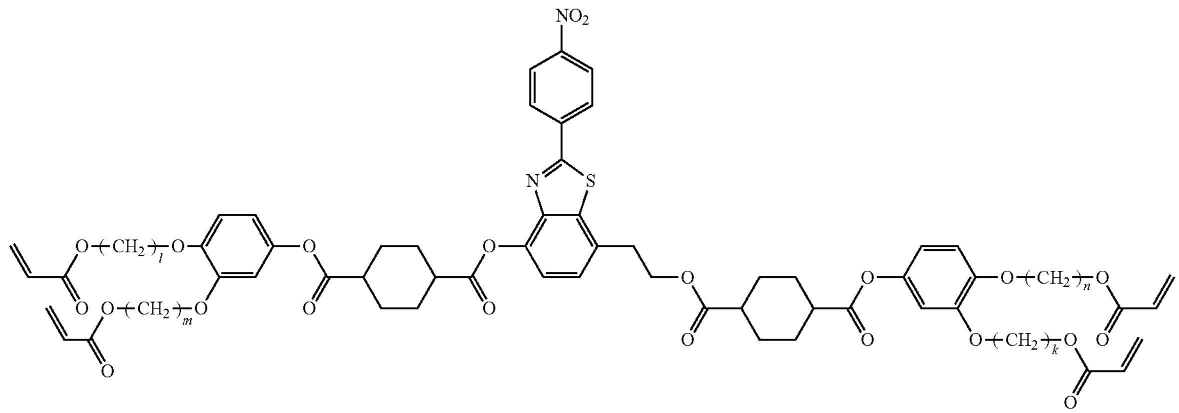
(6-a-21)
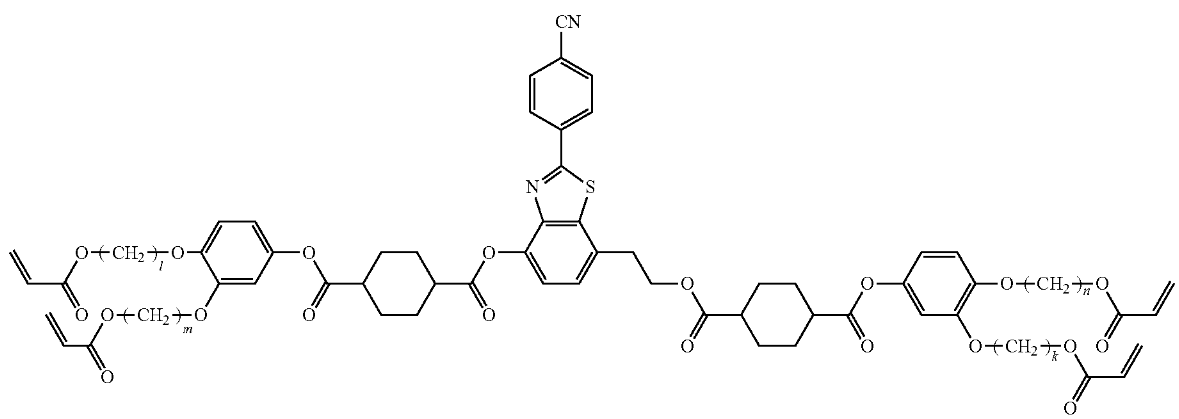
(6-a-22)
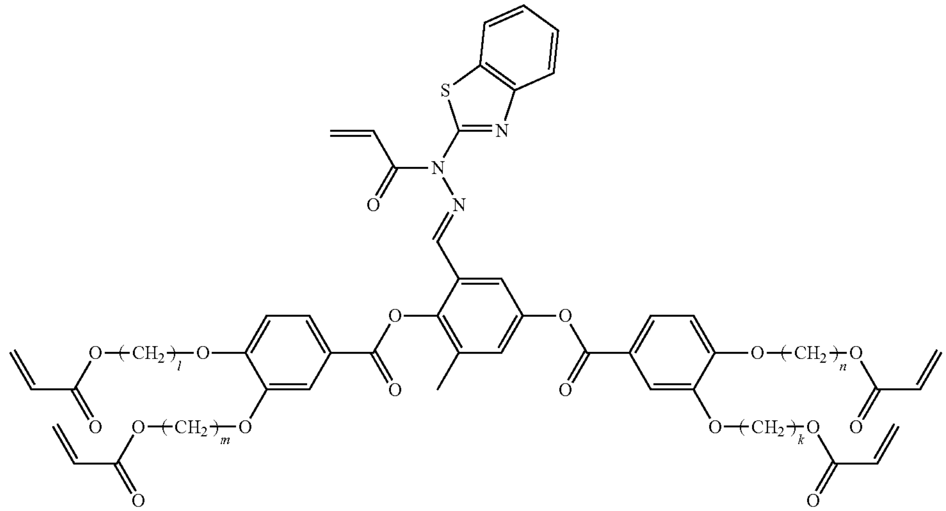

-continued
[Chem. 99]
(6-a-23)
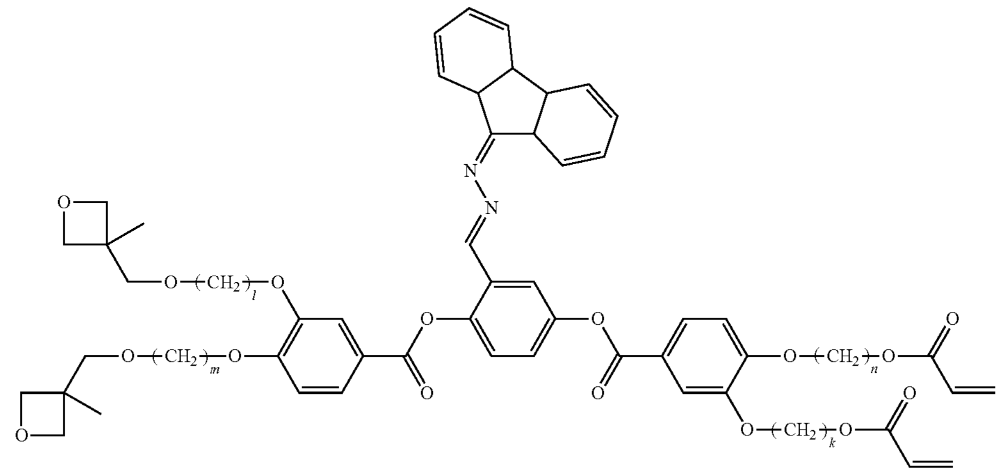
(6-a-24)
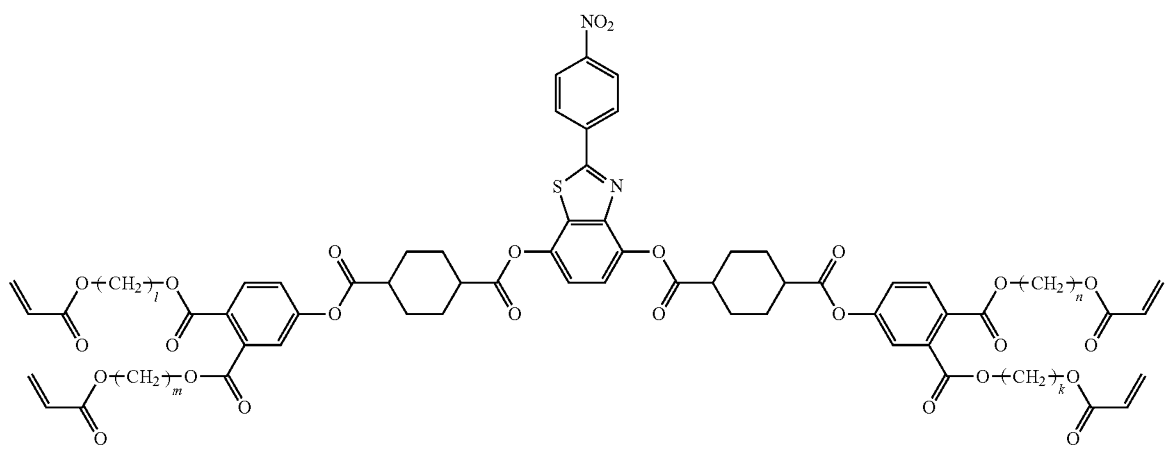
(6-a-25)
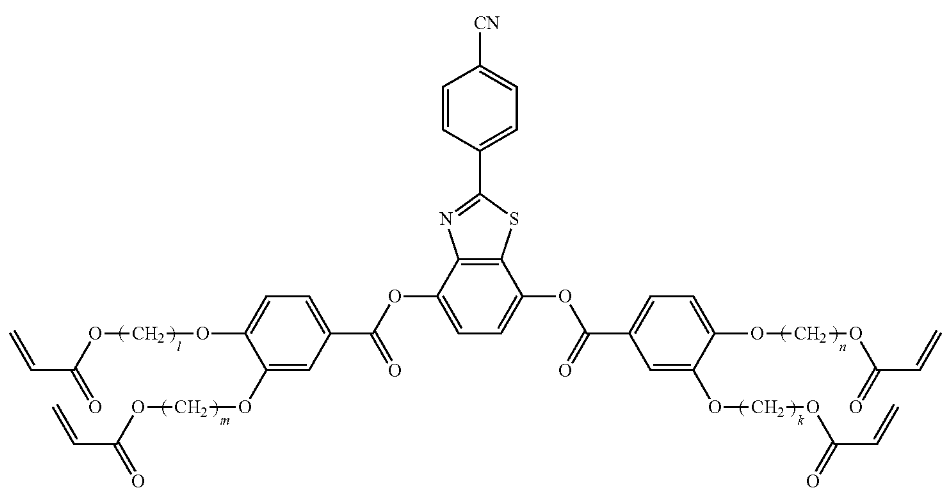
(In the formulae, k, l, m, and n each independently represent the number of carbon atoms of 1 to 10.)
These liquid crystalline compounds may be used alone or in combination of two or more kinds thereof.
Preferred specific examples of the compound represented by Formula (7) include compounds represented by Formulae (7-a-1) to (7-a-26).

[Chem. 100]
(7-a-1)
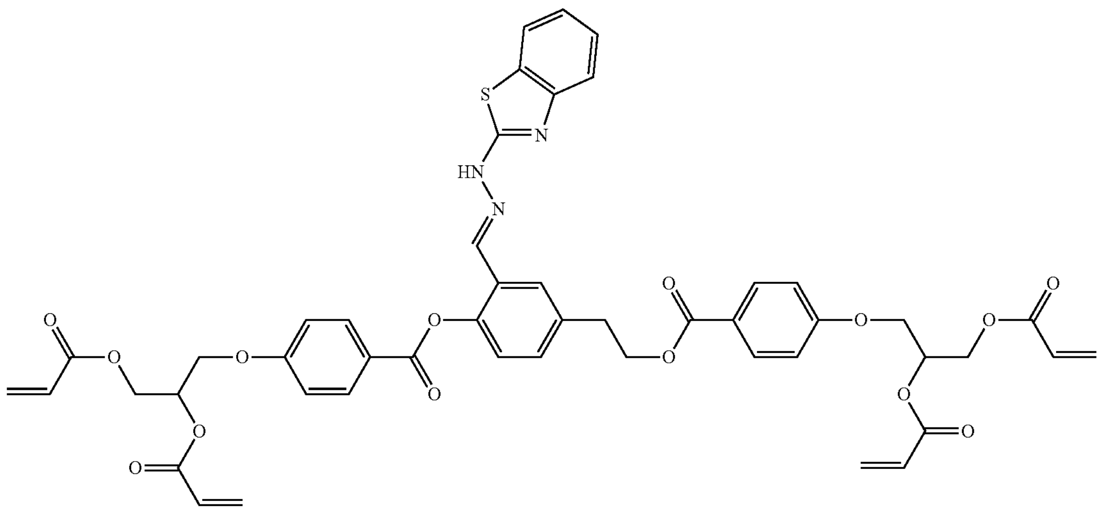
(7-a-2)
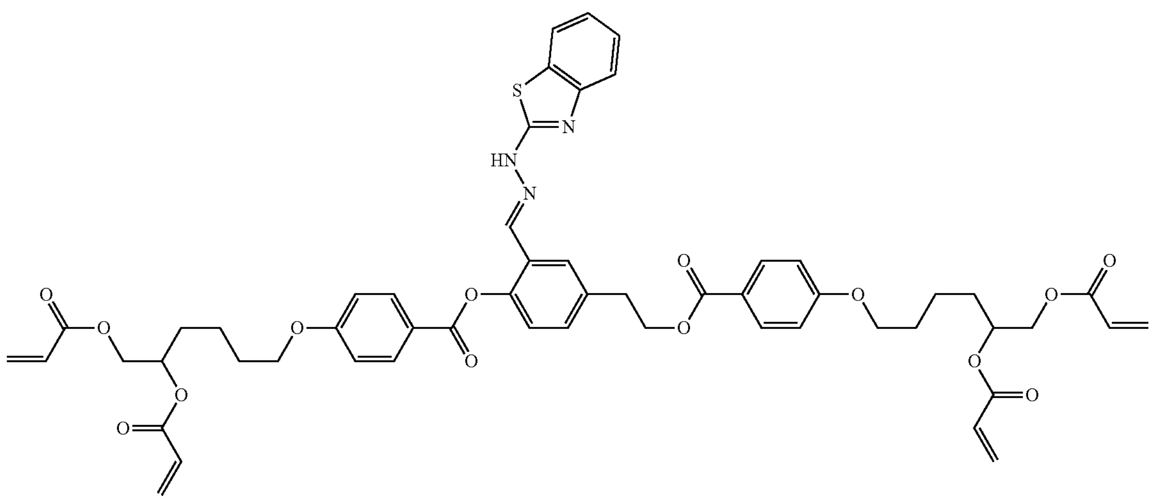
(7-a-3)
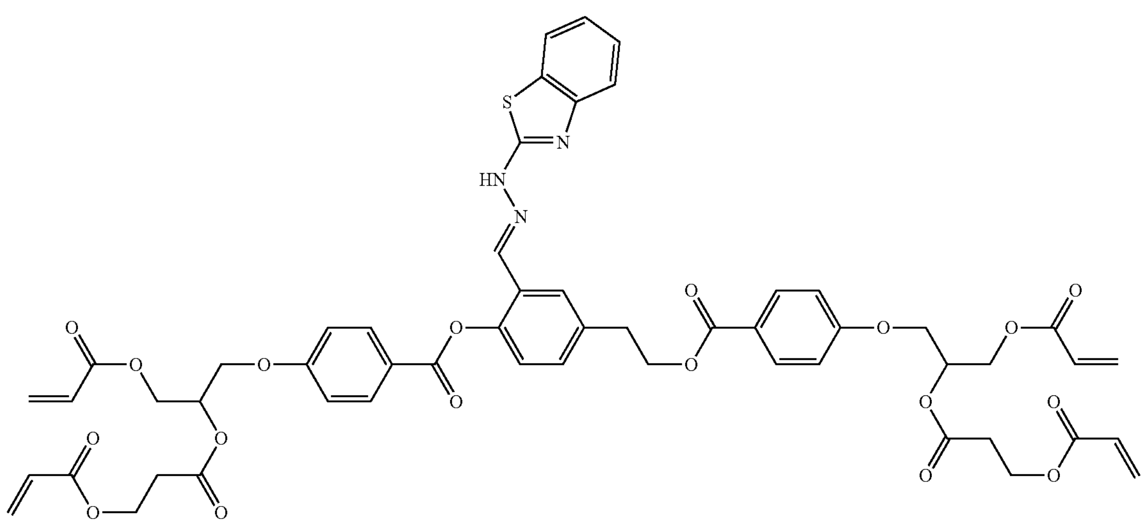

-continued
(7-a-4)
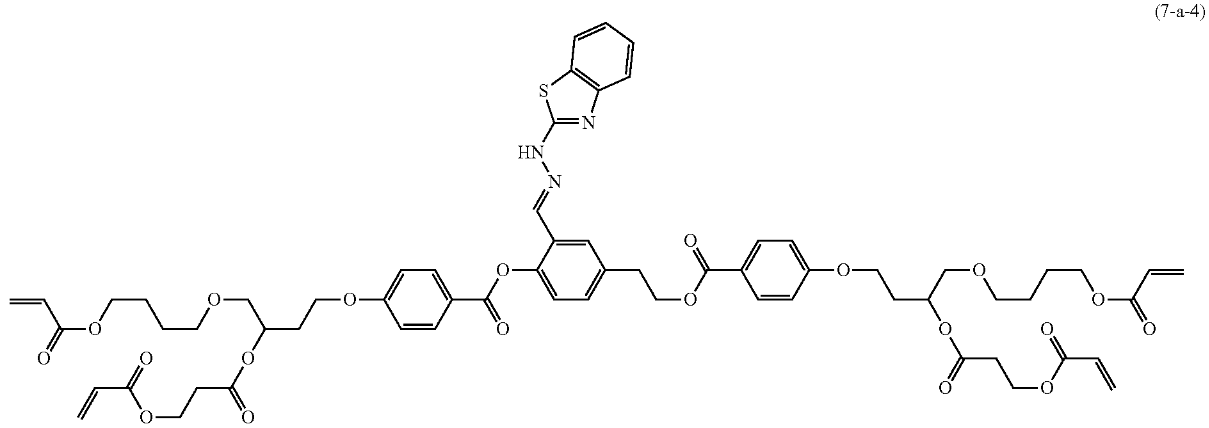
(7-a-5)
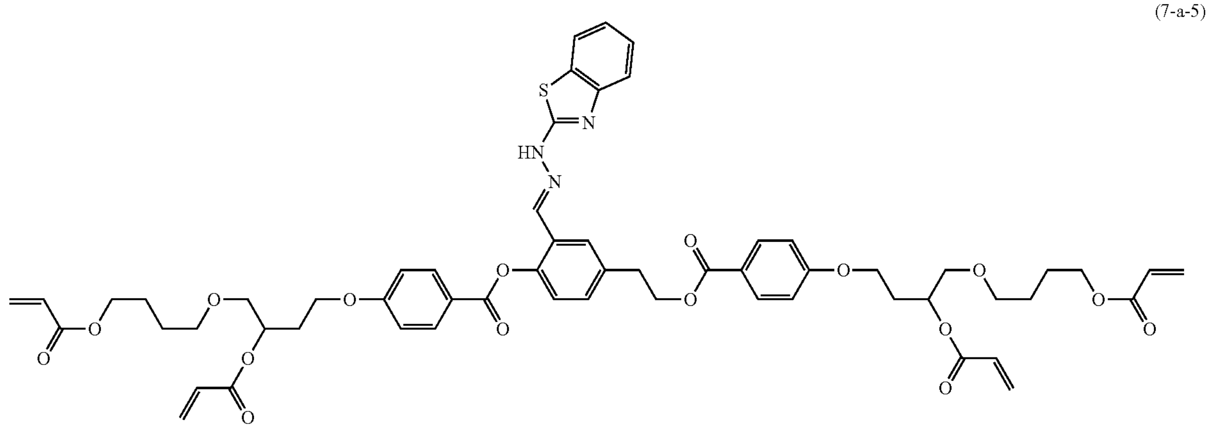
[Chem. 101]
(7-a-6)
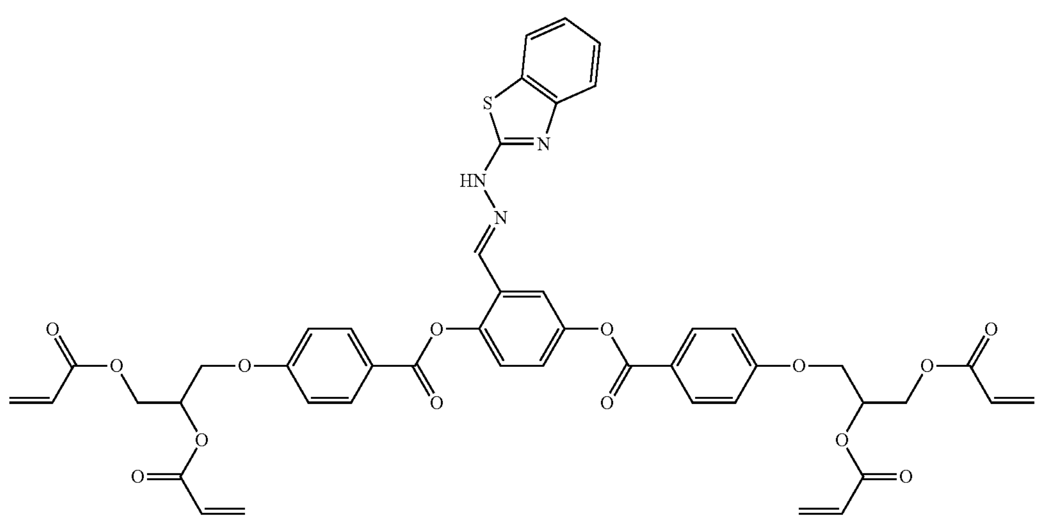

-continued
(7-a-7)
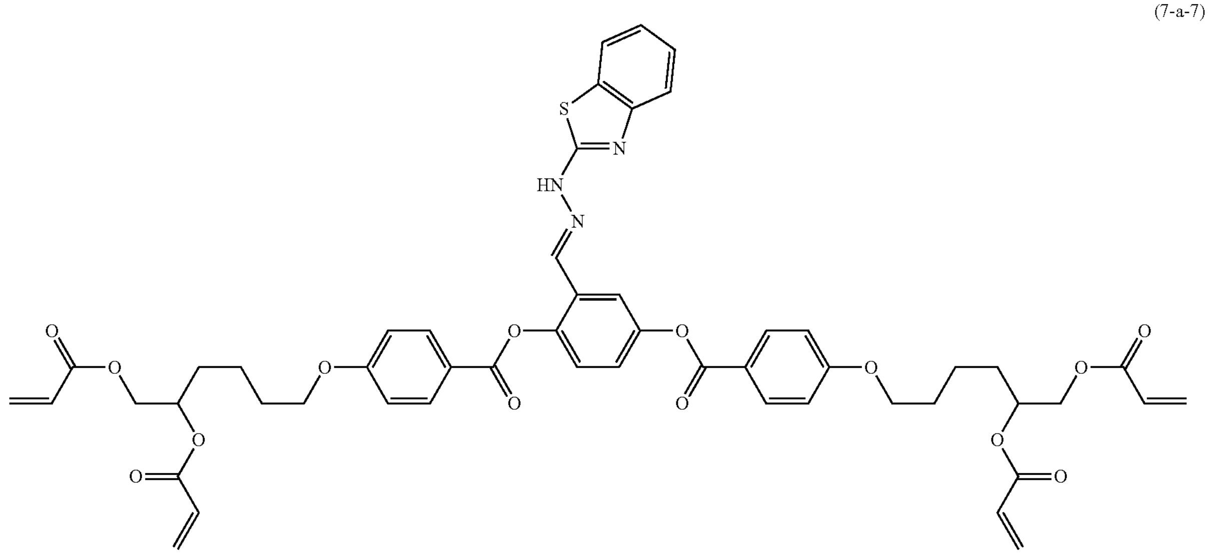
(7-a-8)
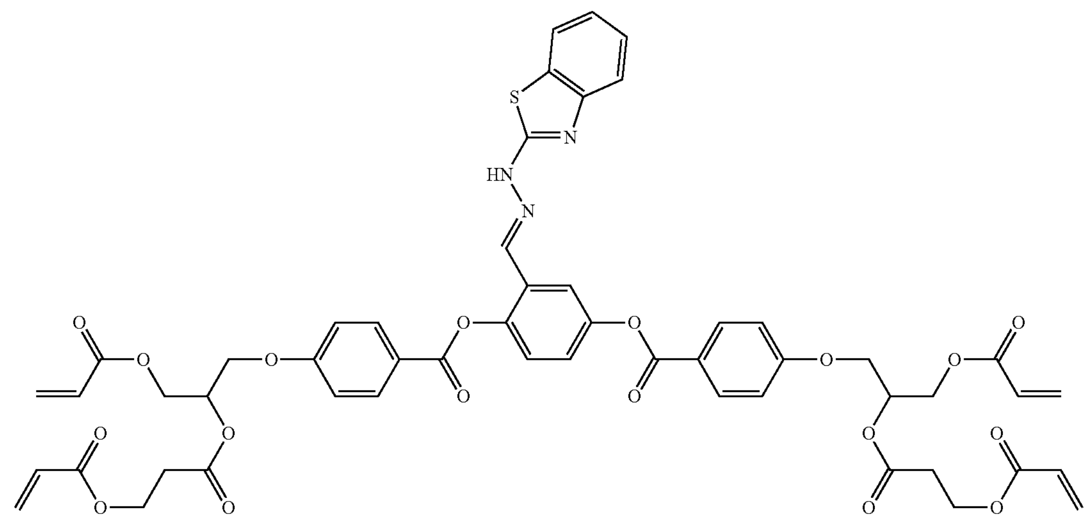
(7-a-9)
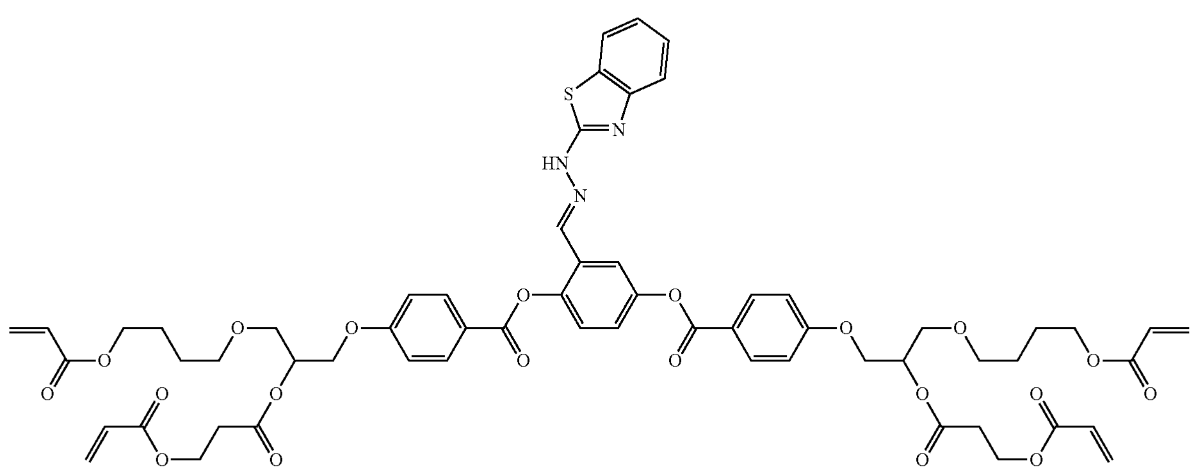

-continued
[Chem. 102]
(7-a-10)
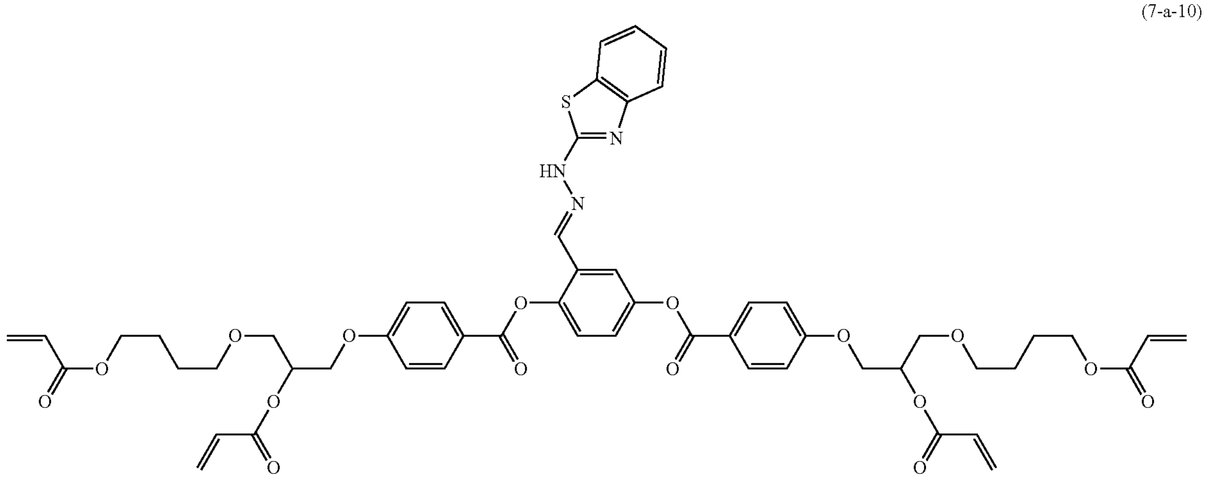
(7-a-11)
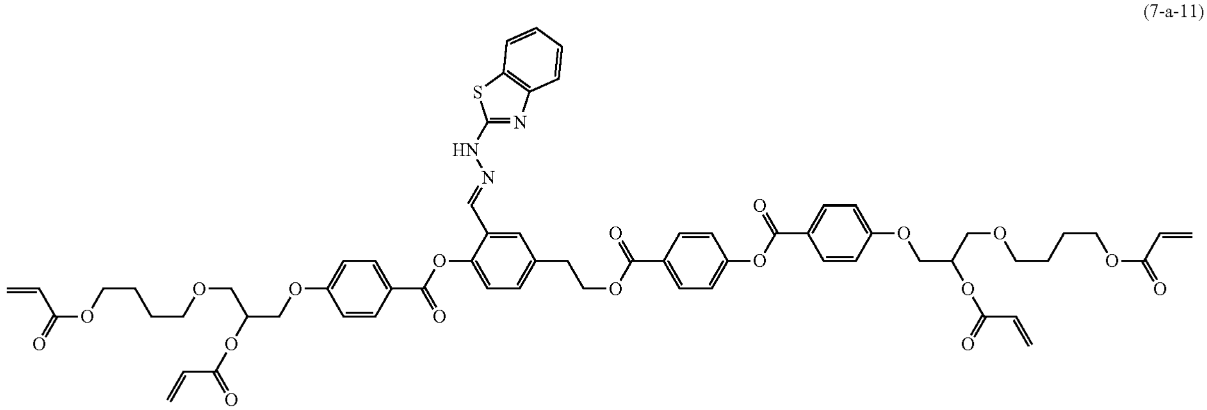
(7-a-12)
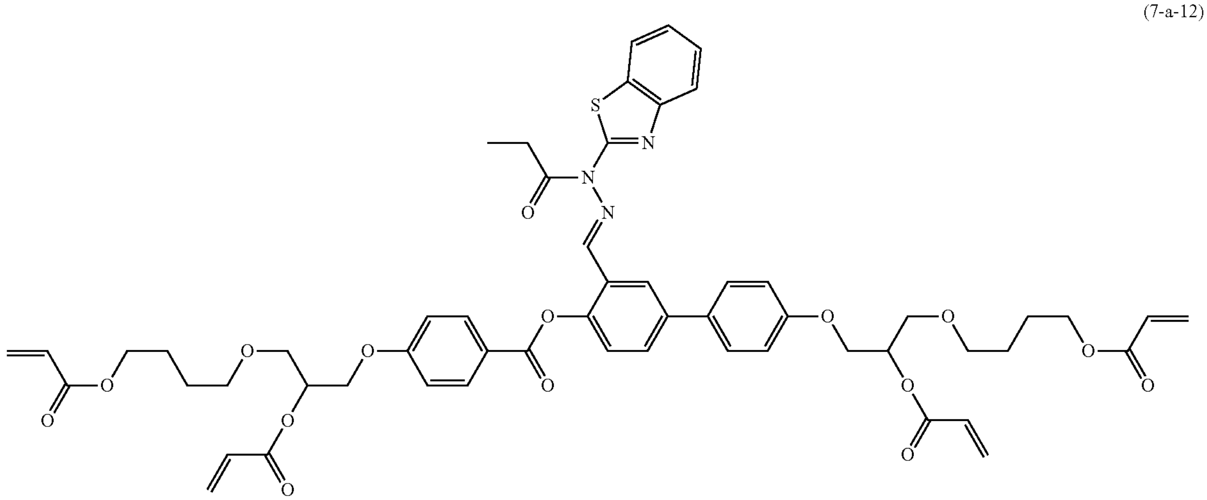

-continued
(7-a-13)
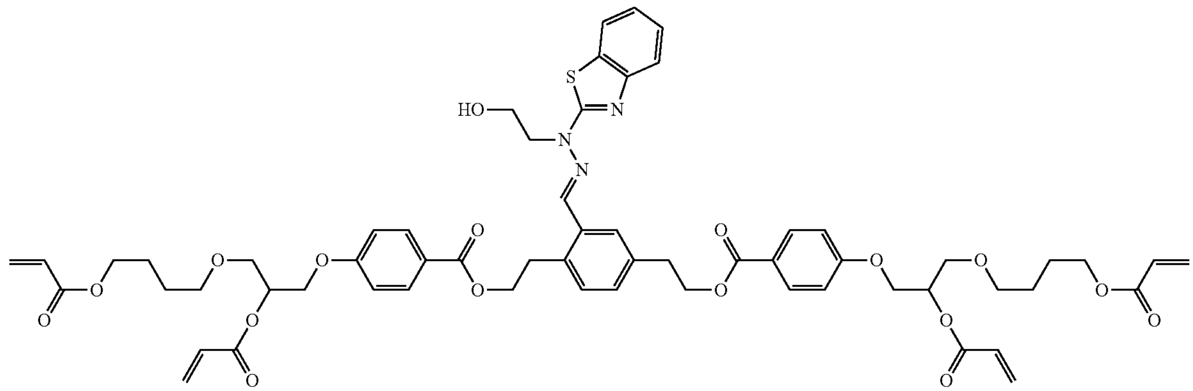
[Chem. 103]
(7-a-14)
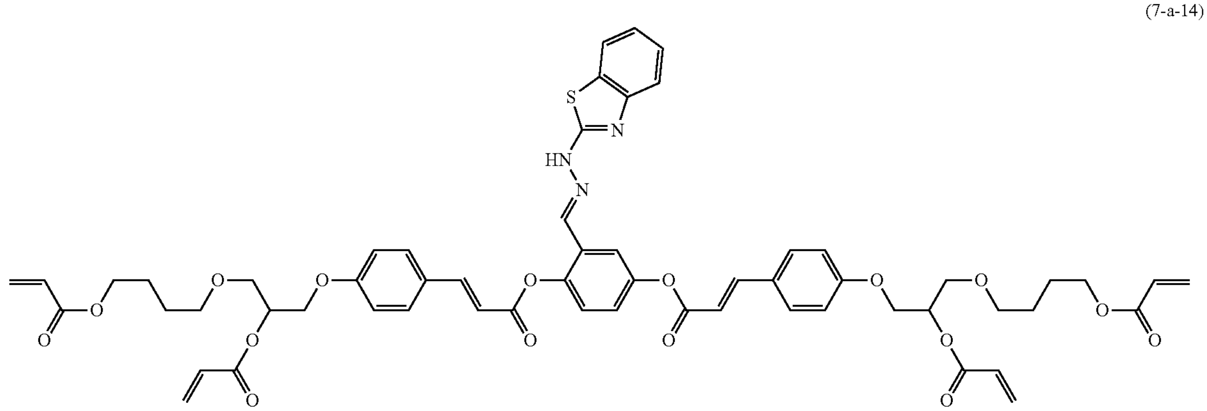
(7-a-15)
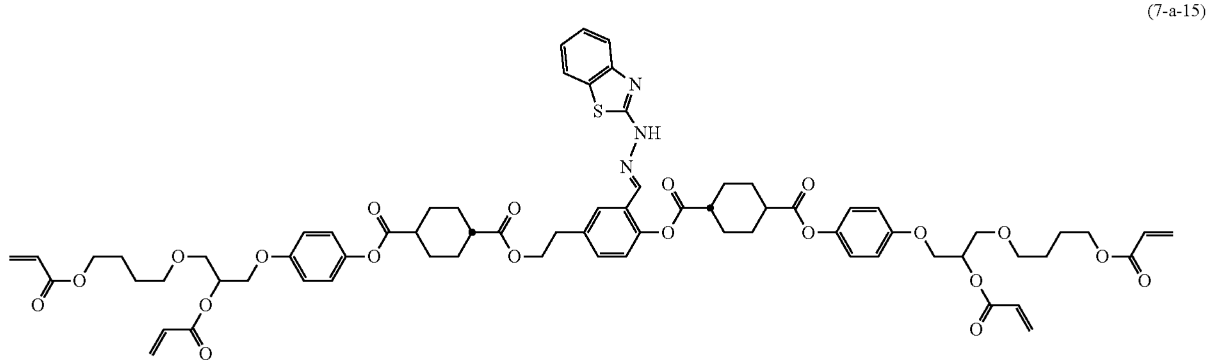

-continued
(7-a-16)
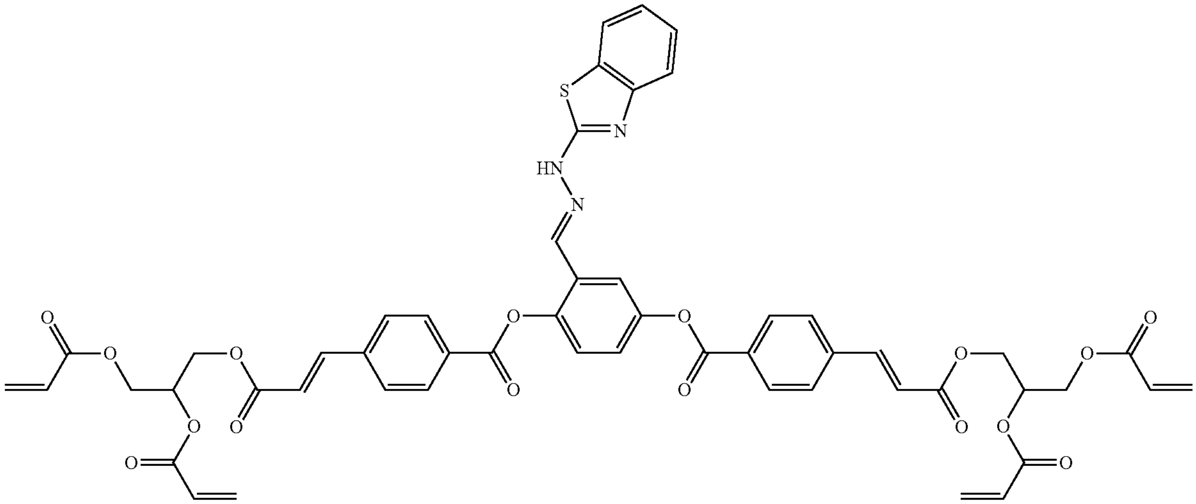
(7-a-17)
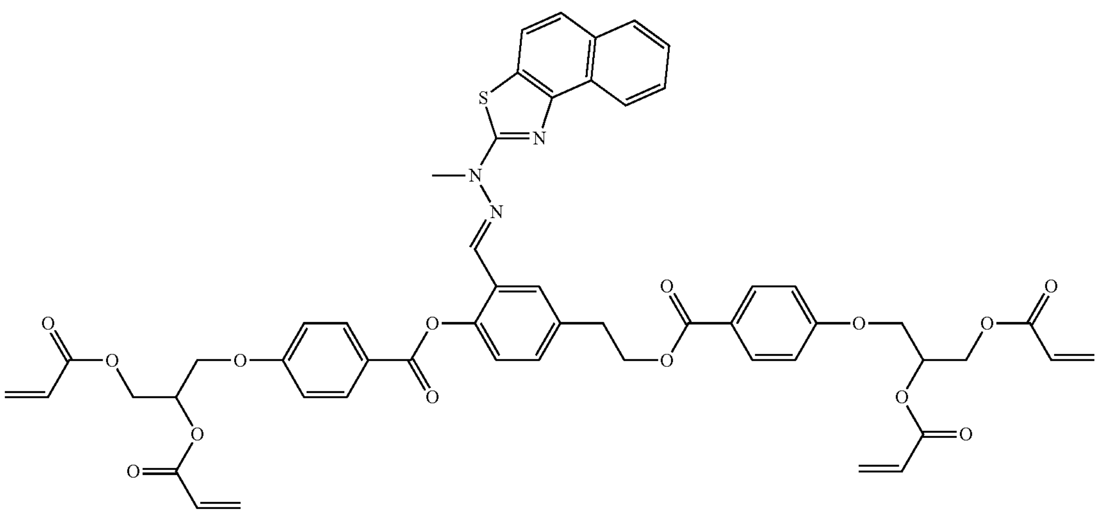
[Chem. 104]
(7-a-18)
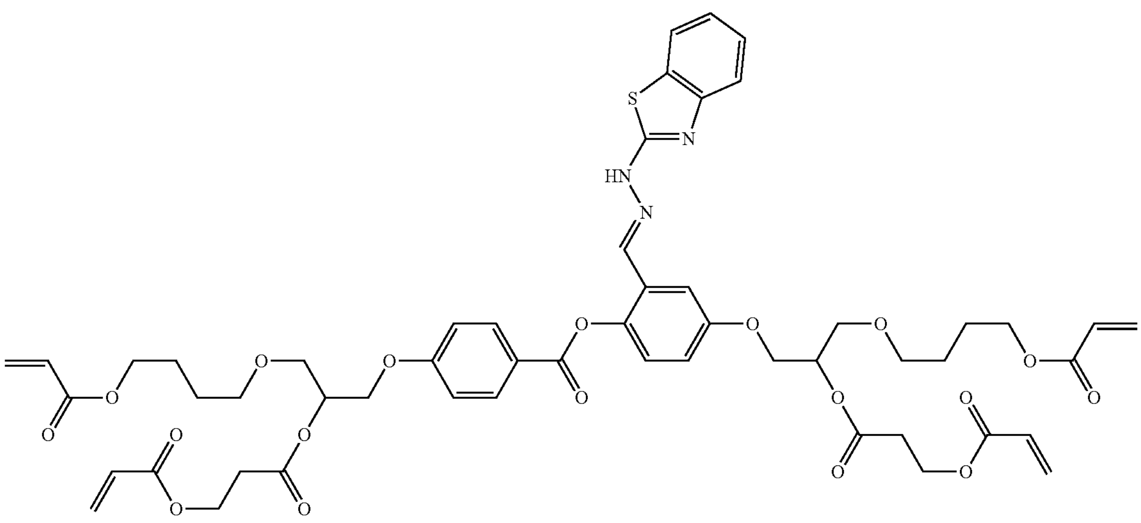

-continued
(7-a-19)
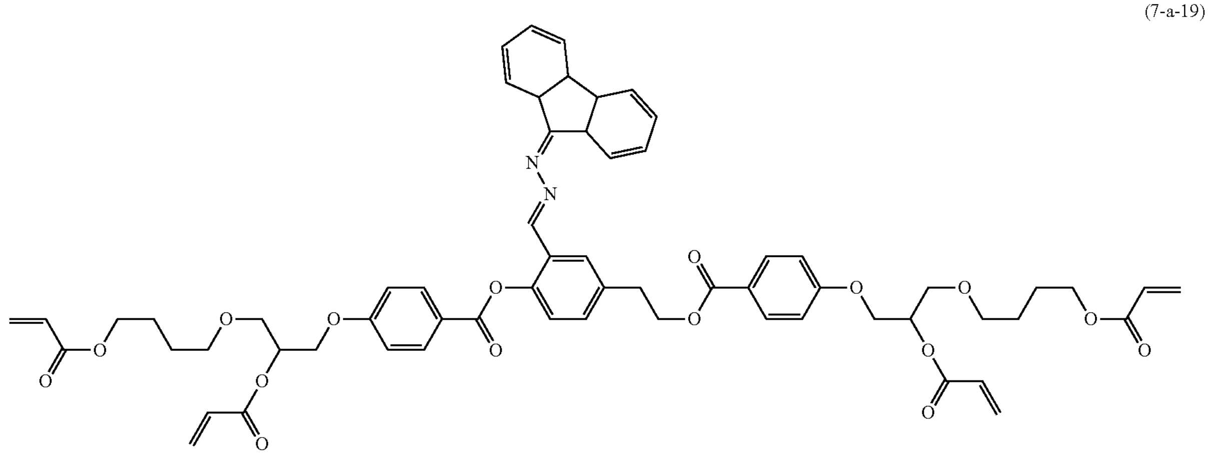
(7-a-20)
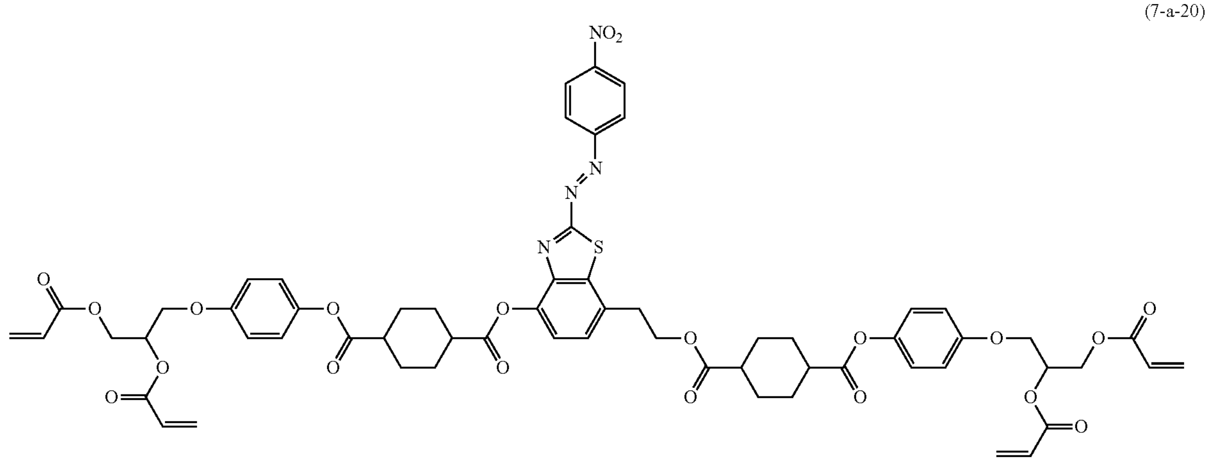
(7-a-21)
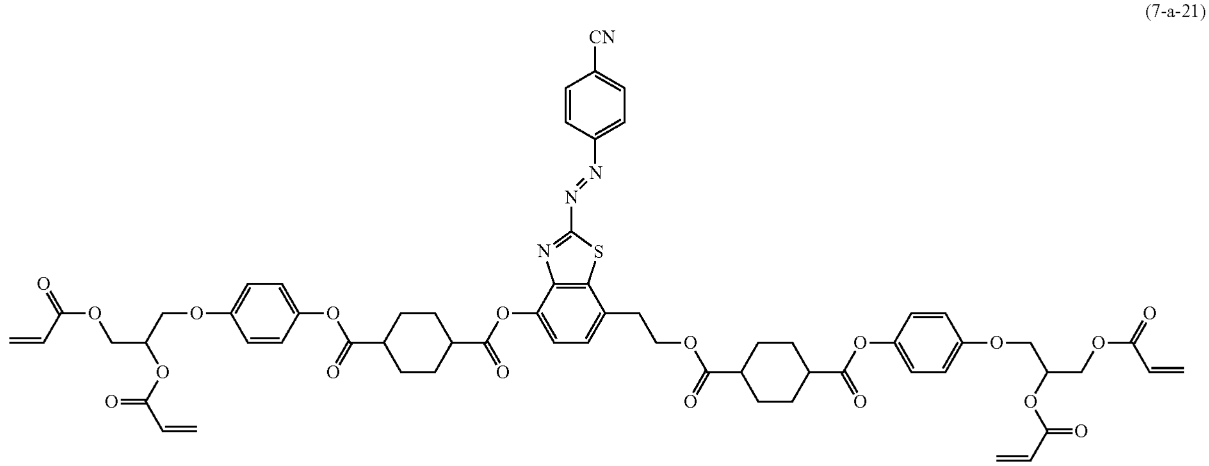

-continued
[Chem. 105]
(7-a-22)
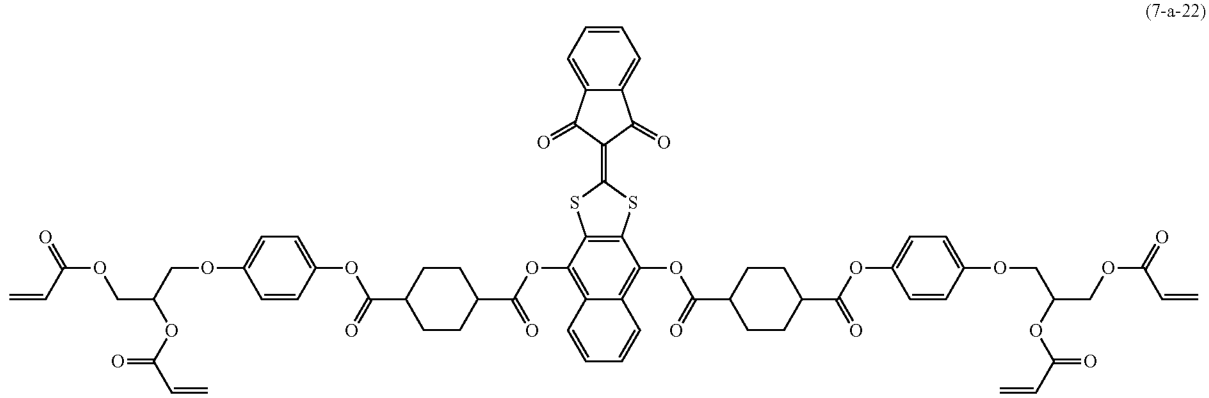
(7-a-23)
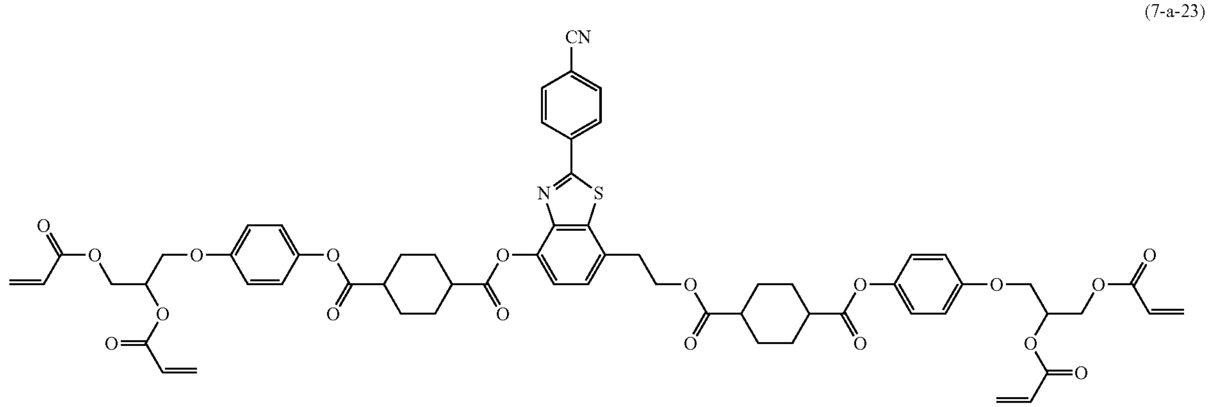
(7-a-24)
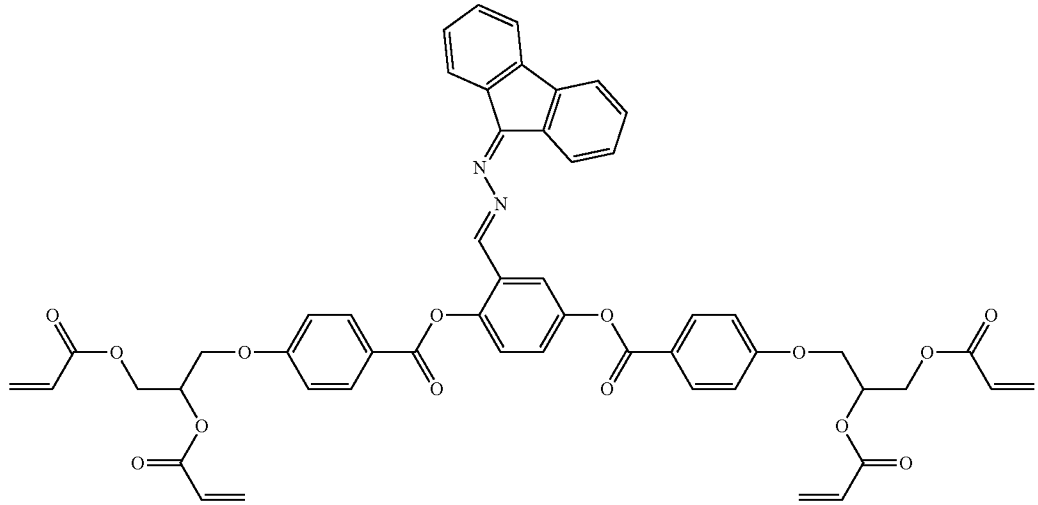

-continued

[Chem. 106]

(7-a-25)

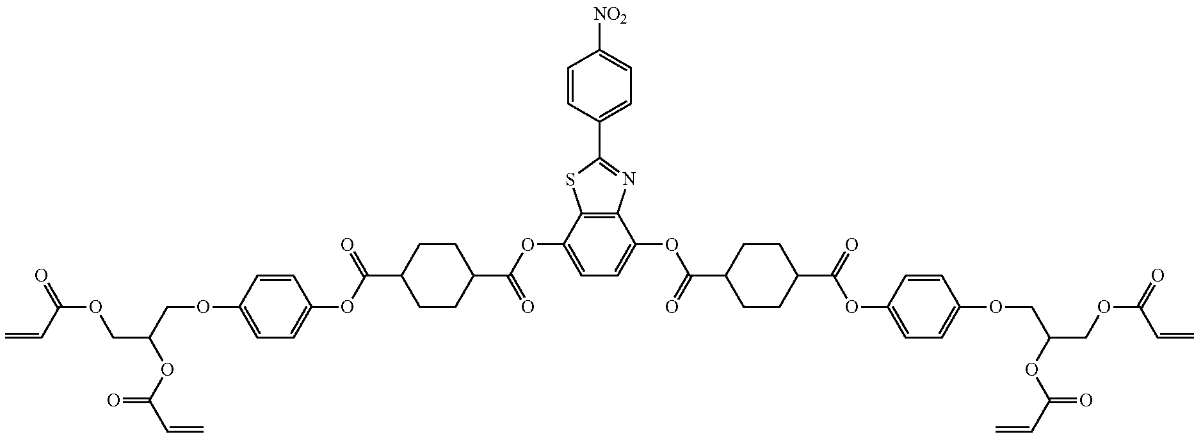

(7-a-26)

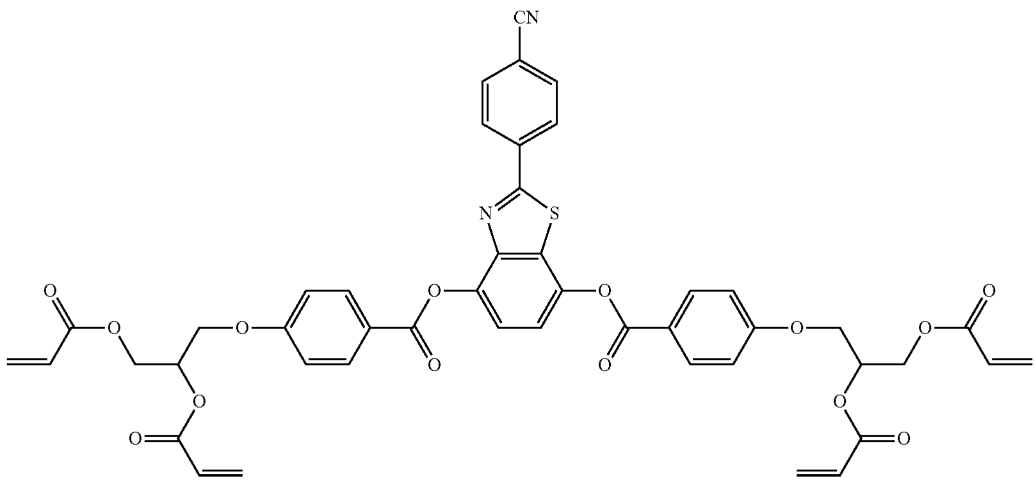

These liquid crystalline compounds may be used alone or in combination of two or more kinds thereof.

The total content of the liquid crystalline compound having one or more polymerizable groups is preferably 60% to 100% by mass, more preferably 65% to 98% by mass, and particularly preferably 70% to 95% by mass with respect to the total amount of the liquid crystalline compound used in the polymerizable liquid crystal composition.

<Initiator>

The polymerizable liquid crystal composition used in the present invention may contain an initiator as necessary. A polymerization initiator used in the polymerizable liquid crystal composition of the present invention is used for polymerizing the polymerizable liquid crystal composition of the present invention. A photopolymerization initiator used in a case where the polymerization is performed by irradiation with light is not particularly limited, but conventionally known initiators can be used to the extent that does not inhibit the alignment state of the liquid crystalline compound represented by any of Formulae (1) to (7).

Examples of the conventionally known initiators include 1-hydroxycyclohexylphenylketone "IRGACURE 184", 1-(4-isopropylphenyl)-2-hydroxy-2-methylpropane-1-one "DAROCURE 1116", 2-methyl-1-[(methylthio)phenyl]-2-morpholinopropane-1 "IRGACURE 907", 2,2-dimethoxy-1,2-diphenylethane-1-one "IRGACURE 651", 2-benzyl-2-dimethylamino-1-(4-morpholinophenyl)-butanone "IRGACURE 369", 2-dimethylamino-2-(4-methylbenzyl)-1-(4-morpholino-phenyl) butane-1-one "IRGACURE 379", 2,2-dimethoxy-1,2-diphenylethane-1-one, bis(2,4,6-trimethylbenzoyl)-diphenylphosphine oxide "LUCIRIN TPO", 2,4,6-trimethylbenzoyl-phenyl-phosphine oxide "IRGACURE 819", 1,2-octanedione, 1-[4-(phenylthio)-, 2-(O-benzoyloxime)], ethanone "IRGACURE OXE01", 1-[9-ethyl-6-(2-methylbenzoyl)-9H-carbazole-3-yl]-, 1-(O-acetyloxime) "IRGACURE OXE02" (all manufactured by BASF SE), a mixture of 2,4-diethylthioxanthone ("KAYACURE DETX", manufactured by Nippon Kayaku Co., Ltd.) and ethyl p-dimethylamino benzoate ("KAYACURE EPA", manufactured by Nippon Kayaku Co., Ltd.), a mixture of isopropylthioxanthone ("QUANTACURE ITX", manufactured by Ward Blenkinsop Co., Ltd.) and ethyl p-dimethylamino benzoate, "ESACURE ONE", "ESACURE KIP150", "ESACURE KIP160", "ESACURE 1001M", "ESACURE A198", "ESACURE KIP IT", "ESACURE KTO46", "ESACURE TZT" (all manufactured by Fratelli-Lamberti SpA"), "SPEEDCURE BMS", "SPEEDCURE PBZ", and "benzophenone" (manufactured by LAMBSON Ltd.). In addition, a photoacid generator can be used as a photocationic initiator. Examples of the photoacid generator include a diazodisulfone-based compound, a triphenylsulfonium-based compound, a phenylsulfone-based compound, a sulfonylpyridine-based compound, a triasine-based compound, and a diphenyliodonium compound.

The content of the photopolymerization initiator is preferably 0.1% to 10% by mass and particularly preferably 1% to 6% by mass with respect to the total amount, of the liquid crystalline compound contained in the polymerizable liquid crystal composition. These may be used alone or in combination two or more kinds thereof.

Further, as a thermal polymerization initiator used for thermal polymerization, conventionally known initiators can be used, and examples thereof include an organic peroxide such as methyl aeetoaeetate peroxide, cumene hydroperoxide, benzoyl peroxide, bins(4-t-butylcyclohexyl)peroxy dicarbonate, t-butylperoxy benzoate, methyl ethyl ketone peroxide, 1,1-bis(t-hexylperoxy) 3,3,5-trimethylcyclohexane, p-pentahydroperoxide, t-butylhydroperoxide, dicumyl peroxide, isobutyl peroxide, di(3-methyl-3-methoxybutyl)peroxy dicarbonate, or 1,1-bis(t-butylperoxy) cyclohexane; an azonitrile compound such as 2,2'-azobisisobutyronitrile or 2,2'-azobis(2,4-dimethylvaleronitrile); an azoamidine compound such as 2,2'-azobis(2-methyl-N-phenylpropion-amidine)dihydrochloride; an azoamide compound such as 2,2' azobis{2-methyl-N-[1,1-bis(hydroxymethyl)-2-hydroxyethyl]propionamide}; and an alkylazo compound such as 2,2' azobis(2,4,4-trimethylpentane). The content of the thermal polymerization initiator is preferably 0.1% to 10% by mass and particularly preferably 1% to 6% by mass. These may be used alone or in combination of two or more kinds thereof.

<Organic Solvent>

The polymerizable liquid crystal composition used in the present invention may contain an organic solvent as necessary. The organic solvent to be used is not particularly limited, but an organic solvent that satisfactorily dissolves the polymerizable liquid crystalline compound is preferable and an organic solvent which can be dried at a temperature of 100° C. or lower is preferable. Examples of such solvents include aromatic hydrocarbon such as toluene, xylene, cumene, or mesitylene, an ester-based solvent such as methyl acetate, ethyl acetate, propyl acetate, butyl acetate, cyclohexyl acetate, 3-butoxymethyl acetate, or ethyl lactate, a ketone-based solvent such as methyl ethyl ketone, methyl isobutyl ketone, cyclohexanone, or cyclopentanone, an ether-based solvent such as tetrahydrofuran, 1,2-dimethoxyethane, or anisole, an amide-based solvent such as N,N-dimethylformamide or N-methyl-2-pyrrolidone, ethylene glycol monomethyl ether acetate, propylene glycol monomethyl ether acetate, propylene glycol monomethyl ether, propylene glycol diacetate, propylene glycol monomethyl propyl ether, diethylene glycol monomethyl ether acetate, γ-butyrolactone, and chlorobenzene. These may be used alone or in combination of two or more kinds thereof. From the viewpoint of solution stability, it is preferable to use one or more solvents selected from a ketone-based solvent, an ether-based solvent, an ester-based solvent, and an aromatic hydrocarbon-based solvent.

Since the polymerizable liquid crystal composition used in the present invention is typically used by application, the content of the organic solvent to be used is not particularly limited as long as the applied state is not significantly impaired, but the content of the organic solvent is adjusted such that the content of the liquid crystalline compound in the polymerizable liquid crystal composition containing the organic solvent is preferably 0.1% to 99% by mass, more preferably 5% to 60% by mass, and particularly preferably 10% to 50% by mass.

Further, it is preferable that the polymerizable liquid crystalline compound is dissolved in the organic solvent by heating and stirring the solution in order for the compound to be uniformly dissolved therein. The heating temperature during the heating and the stirring may be adjusted as appropriate by considering the dissolution of the polymerizable liquid crystal composition in the organic-solvent, but is preferably 15° C. to 130° C., more preferably 30° C. to 110° C., and particularly preferably 50° C. to 100° C. from the viewpoint of productivity.

<Additive>

The polymerizable liquid crystal composition used in the present invention may include general-purpose additives for uniform application or depending on various purposes thereof. For example, additives such as a polymerization inhibitor, an antioxidant, an ultraviolet absorbing agent, a leveling agent, an alignment control agent, a chain transfer agent, an infrared absorbing agent, a thixotropic agent, an antistatic agent, a dye, a filler, a chiral compound, a non-liquid crystalline compound having a polymerizable group, a liquid crystal compound, and an alignment material can be added to the extent that does not significantly degrade alignment properties of liquid crystals.

<Polymerization Inhibitor>

The polymerizable liquid crystal composition used in the present invention may contain a polymerization inhibitor as necessary. The polymerization inhibitor to be used is not particularly limited, and conventionally known polymerization inhibitors can be used.

Examples thereof include a phenol-based compound such as p-methoxyphenol, cresol, t-butyl catechol, 3,5-di-t-butyl-4-hydroxytoluene, 2,2'-methylenebis(4-methyl-6-t-butylphenol), 2,2'-methylenebis(4-ethyl-6-t-butylphenol), 4,4'-thiobis(3-methyl-6-t-butylphenol), 4-methoxy-1-naphthol, or 4,4'-dialkoxy-2,2'-bi-1-naphthol; a quinone-based compound such as hydroquinone, methylhydroquinone, tert-butylhydroquinone, p-benzoquinone, methyl-p-benzoquinone, tert-butyl-p-benzoquinone, 2,5-diphenylbenzoquinone, 2-hydroxy-1,4-naphthoquinone, 1,4-naphthoquinone, 2,3-dichloro-1,4-naphthoquinone, anthraquinone, or diphenoquinone; an amine-based compound such as p-phenylenediamine, 4-aminodiphenylamine, N,N'-diphenyl-p-phenylenediamine, N-i-propyl-N'-phenyl-p-phenylenediamine, N-(1,3-dimethylbutyl)-N'-phenyl-p-phenylenediamine, N,N'-di-2-naphthyl-p-phenylenediamine, diphenylamine, N-phenyl-p-naphthylamine, 4,4'-dicumyl-diphenylamine, or 4,4'-dioctyl-diphenylamine; a thioether-based compound such as phenothiazine or distearyl thiodipropionate; and a nitroso compound such as N-nitrosodiphenylamine, N-nitrosophenylnaphthylamine, N-nitrosodinaphthylamine, p-nitrosophenol, nitrosobenzene, p-nitrosodiphenylamine, α-nitroso-β-naphthol, N,N-dimethyl p-nitrosoaniline, p-nitrosodiphenylamine, p-nitrosodimethylamine, p-nitroso-N,N-diethylamine, N-nitrosoethanolamine, N-nitrosodi-n-butylamine, N-nitroso-N-n-butyl-4-butanolamine, N-nitroso-diisopropanolamine, N-nitroso-N-ethyl-4-butanolamine, 5-nitroso-8-hydroxyquinoline, N-nitrosomorpholine, N-nitroso-N-phenylhydroxyamine ammonium salt, nitrosobenzene, 2,4,6-tri-tert-butylnitrobenzene, N-nitroso-N-methyl-p-toluenesulfonamide, N-nitroso-N-ethylurethane, N-nitroso-N-n-propylurethane, 1-nitroso-2-naphthol, 2-nitroso-1-naphthol, sodium 1-nitroso-2-naphthol-3,6-sulfonate, sodium 2-nitroso-1-naphthol-4-sulfonate, 2-nitroso-5-methylaminophenol hydrochloride, or 2-nitroso-5-methyl aminophenol hydrochloride.

The amount of the polymerization inhibitor to be added is preferably 0.01% to 1.0% by mass and more preferably 0.05% to 0.5% by mass with respect to the total amount of the liquid crystalline compound contained in the polymerizable liquid crystal composition.

<Antioxidant>

The polymerizable liquid crystal composition used in the present invention may contain an antioxidant as necessary. Examples of such a compound include a hydroquinone derivative, a nitrosoamine-based polymerization inhibitor, and a hindered phenol-based antioxidant, and more specific examples thereof include tert-butylhydroquinone, "Q-1300" and "Q-1301" (both manufactured by Wako Pure Chemical Industries, Ltd.), pentaerythritol tetrakis[3-(3,5-di-tert-butyl-4-hydroxyphenyl)propionate "IRGANOX 1010", thiodiethylene bis[3-(3,5-di-tert-butyl-4-hydroxyphenyl)propionate "IRGANOX 1035", octadecyl-3-(3,5-di-tert-butyl-4-hydroxyphenyl)propionate "IRGANOX 1076", "IRGANOX 1135", "IRGANOX 1330", 4,6-bis(octylthiomethyl)-o-cresol "IRGANOX 1520L", "IRGANOX 1726", "IRGANOX 245", "XRGANOX 259", "IRGANOX 3114", "IRGANOX 3790", "IRGANOX 5057", "IRGANOX 565" (all manufactured by BASF SE), ADEKA STAB AO-20, AO-30, AO-40, AO-50, AO-60, AO-80 (all manufactured by ADEKA CORPORATION), SUMILIZER BHT, SUMILIZER BBM-S, and SUMILIZER GA-80 (manufactured by Sumitomo Chemical Industries Co., Ltd.).

The amount of the antioxidant to be added is preferably 0.01% to 2.0% by mass and more preferably 0.05% to 1.0% by mass with respect to the total amount of the liquid crystalline compound contained in the polymerizable liquid crystal composition.

<Ultraviolet Absorbing Agent>

The polymerizable liquid crystal composition used in the present invention may contain an ultraviolet absorbing agent and a light stabilizer as necessary. The ultraviolet absorbing agent, or the light stabilizer to be used is not particularly limited, but it is preferable to use an optically anisotropic material or an optical film in order to improve light resistance.

Examples of the ultraviolet absorbing agent include 2-(2-hydroxy-5-t-butylphenyl)-2H-benzotriazole "TINUVIN PS", "TINUVIN 99-2", "TINUVIN 109", "TINUVIN 213", "TINUVIN 234", "TINUVIN 326", "TINUVIN 328", "TINUVIN 329", "TINUVIN 384-2", "TINUVIN 571", 2-(2H-benzotriazole-2-yl)-4,6-bis(1-methyl-1-phenylethyl)phenol "TINUVIN 900", 2-(2H-benzotriazole-2-yl)-6-(1-methyl-1-phenylethyl)-4-(1,1,3,3-tetramethylbutyl)phenol "TINUVIN 928", "TINUVIN 1130", "TINUVIN 400", "TINUVIN 405", 2,4-bis[2-hydroxy-4-butoxyphenyl]-6-(2,4-dibutoxyphenyl)-1,3,5-triazine "TINUVIN 460", "TINUVIN 479", "TINUVIN 5236" (all manufactured by BASF SE), "ADEKA STAB LA-32", "ADEKA STAB LA-34", "ADEKA STAB LA 36", "ADEKA STAB LA-31", "ADEKA STAB 1413", and "ADEKA STAB LA-51" (all manufactured by ADEKA CORPORATION).

Examples of the light stabilizer include "TINUVIN 111FDL", "TINUVIN 123", "TINUVIN 144", "TINUVIN 152", "TINUVIN 292", "TINUVIN 622", "TINUVIN 770", "TINUVIN 765", "TINUVIN 780", "TINUVIN 905", "TINUVIN 5100", "TINUVIN 5050", "TINUVIN 5060", "TINUVIN 5151", "CHIMASSORB 119FL", "CHIMASSORB 944FL", "CHIMASSORB 944LD" (all manufactured by BASF SE), "ADEKA STAB LA-52", "ADEKA STAB LA-57", "ADEKA STAB LA-62", "ADEKA STAB LA-67", "ADEKA STAB LA-63P", "ADEKA STAB LA-68LD", "ADEKA STAB LA-77", "ADEKA STAB LA-82", and "ADEKA STAB LA-87" (all manufactured by ADEKA CORPORATION).

<Leveling Agent>

The polymerizable liquid crystal composition used in the present invention may contain a leveling agent, as necessary. The leveling agent to be used is not particularly limited, but an agent which can reduce film thickness unevenness in a case where a thin film such as an optically anisotropic material or an optical film is formed is preferable. Examples of the leveling agent include alkyl carboxylate, alkyl phosphate, alkyl sulfonate, fluoroalkyl carboxylate, fluoroalkyl phosphate, fluoroalkyl sulfonate, a polyoxyethylene derivative, a fluoroalkyl ethylene oxide derivative, a polyethylene glycol derivative, alkyl ammonium salts, and fluoroalkyl ammonium salts.

Specific examples thereof include "MEGAFACE F-114", "MEGAFACE F-251", "MEGAFACE F-281", "MEGAFACE F-410", "MEGAFACE F-430", "MEGAFACE F-444", "MEGAFACE F-472SF", "MEGAFACE F-477", "MEGAFACE F-510", "MEGAFACE F-511", "MEGAFACE F-552", "MEGAFACE F-553", "MEGAFACE F-554", "MEGAFACE F-555", "MEGAFACE F-556", "MEGAFACE F-557", "MEGAFACE F-558", "MEGAFACE F-559", "MEGAFACE F-560", "MEGAFACE F-561", "MEGAFACE F-562", "MEGAFACE F-563", "MEGAFACE F-565", "MEGAFACE F-567", "MEGAFACE F-568", "MEGAFACE F-569", "MEGAFACE F-570", "MEGAFACE F-571", "MEGAFACE R-40", "MEGAFACE R-41", "MEGAFACE R-43", "MEGAFACE R-94", "MEGAFACE RS-72-K", "MEGAFACE RS-75", "MEGAFACE RS-76-E", "MEGAFACE RS-76-NS", "MEGAFACE RS-90", "MEGAFACE EXP. TF-1367", "MEGAFACE EXP. TF1437", "MEGAFACE EXP. TF1537", "MEGAFACE EXP. TF-2066" (all manufactured by DIC Corporation), "FTERGENT 100", "FTERGENT 100C", "FTERGENT 110", "FTERGENT 150", "FTERGENT 150CH", "FTERGENT 100A-K", "FTERGENT 300", "FTERGENT 310", "FTERGENT 320", "FTERGENT 400SW", "FTERGENT 251", "FTERGENT 215M", "FTERGENT 212M", "FTERGENT 215M", "FTERGENT 250", "FTERGENT 222F", "FTERGENT 212D", "FTX-21S", "FTERGENT 209F", "FTERGENT 245F", "FTERGENT 208G", "FTERGENT 240G", "FTERGENT 212P", "FTERGENT 220P", "FTERGENT 228F", "DFX-18", "FTERGENT 601AD", "FTERGENT 602A", "FTERGENT 650A", "FTERGENT 750FM", "FTX-730FM", "FTERGENT 730FL", "FTERGENT 710FS", "FTERGENT 710FM", "FTERGENT 710FL", "FTERGENT 750LL", "FTX-730LS", and "FTERGENT 730LM" (all manufactured by NEOS COMPANY LIMITED), "BYK-300", "BYK-302", "BYK-306", "BYK-307", "BYK-310", "BYK-315", "BYK-320", "BYK-322", "BYK-323", "BYK-325", "BYK-330", "BYK-331", "BYK-333", "BYK-337", "BYK-340", "BYK-344", "BYK-370", "BYK-375", "BYK-377", "BYK-350", "BYK-352", "BYK-354", "BYK-355", "BYK-356", "BYK-358N", "BYK-361N", "BYK-357", "BYK-390", "BYK-392", "BYK-UV3500", "BYK-UV3510", "BYK-UV3570", and "BYK-Silclean3700" (all manufactured by BYK Additives and Instruments), "TEGO Rad 2100", "TEGO Rad 2011", "TEGO Rad 2200N", "TEGO Rad 2250", "TEGO Rad 2300", "TEGO Rad 2500", "TEGO Rad 2600", "TEGO Rad 2650", "TEGO Rad 2700", "TEGO Flow 300", "TEGO Flow 370", "TEGO Flow 425", "TEGO Flow ATF2", "TEGO Flow ZFS460", "TEGO Glide 100", "TEGO Glide 110", "TEGO Glide 130", "TEGO Glide 410", "TEGO Glide 411", "TEGO Glide 415", "TEGO Glide 432", "TEGO Glide 440", "TEGO Glide 450", "TEGO Glide 482", "TEGO Glide A115", "TEGO Glide B1484", "TEGO Glide ZG400", "TEGO Twin 4000", "TEGO Twin 4100", "TEGO Twin 4200", "TEGO Wet 240", "TEGO Wet 250", "TEGO Wet 260", "TEGO Wet 265", "TEGO Wet 270", "TEGO Wet 280", "TEGO Wet 500", "TEGO Wet 505", "TEGO Wet 510", "TEGO Wet 520", and "TEGO Wet KL245" (all manufactured by Evonik Industries AG), "FC-4430", "FC-4432" (both manufactured by 3M Japan Limited), "UNIDYNE NS" (manufactured by DAIKIN INDUSTRIES, LTD.), "SURFLON S-241", "SURFLON S-242", "SURFLON S-243", "SURFLON S-420", "SURFLON S-611", "SURFLON S-651", and "SURFLON S-386" (all manufactured by AGC SEIMI CHEMICAL CO., LTD.), "DISPARLON OX-880EF", "DISPARLON OX-881", "DISPARLON OX-883", "DISPARLON OX-77EF", "DISPARLON OX-710", "DISPARLON 1922", "DISPARLON 1927", "DISPARLON 1958", "DISPARLON P-410EF", "DISPARLON P-420", "DISPARLON P-425", "DISPARLON PD-7", "DISPARLON 1970", "DISPARLON 230", "DISPARLON LF-1980", "DISPARLON LF-1982", "DISPARLON LF-1983", "DISPARLON LF-1084", "DISPARLON LF-1985", "DISPARLON LHP-90", "DISPARLON LHP-91", "DISPARLON LHP-95", "DISPARLON LHP-96", "DISPARLON OX-715", "DISPARLON 1930N", "DISPARLON 1931", "DISPARLON 1933", "DISPARLON 1934", "DISPARLON 1711EF", "DISPARLON 1751N", "DISPARLON 1761", "DISPARLON LS-009", "DISPARLON LS-001", and "DISPARLON LS-050" (all manufactured by Kusumoto Chemicals, Ltd.), "PF-151N", "PF-636", "PF-6320", "PF-656", "PF-6520", "PF-652-NF", and "PF-3320" (all manufactured by OMNOVA SOLUTION Inc.), "POLYFLOW NO. 7", "POLYFLOW NO. 50E", "POLYFLOW NO. 50EHF", "POLYFLOW NO. 54N", "POLYFLOW NO. 75", "POLYFLOW NO. 77", "POLYFLOW NO. 85", "POLYFLOW NO. 85HF", "POLYFLOW NO. 90", "POLYFLOW NO. 90D-50", "POLYFLOW NO. 95", "POLYFLOW NO. 99C", "POLYFLOW KL-400K", "POLYFLOW KL-400HF", "POLYFLOW KL-401", "POLYFLOW KL-402", "POLYFLOW KL-403", "POLYFLOW KL-404", "POLYFLOW KL-100", "POLYFLOW LE-604", "POLYFLOW KL-700", "FLOWLEN AC-300", "FLOWLEN AC-303", "FLOWLEN AC-324", "FLOWLEN AC-326F", "FLOWLEN AC-530", "FLOWLEN AC-903", "FLOWLEN AC-903HF", "FLOWLEN AC-1160", "FLOWLEN AC-1190", "FLOWLEN AC-200G", "FLOWLEN AC-2300C", "FLOWLEN AO-82", "FLOWLEN AO-98", and "FLOWLEN AO-108" (all manufactured by KYOEISHA CHEMICAL CO., LTD.), "L-7001", "L-7002", "8032ADDITIVE", "57ADDITIVE", "L-7064", "FZ-2110", "FZ-2105", "67ADDTIVE", and "8616ADDTIVE" (all manufactured by Dow Corning Toray Co., Ltd.).

The amount of the leveling agent to be added is preferably 0.01% to 2% by mass and more preferably 0.05% to 0.5% by mass with respect to the total amount of the liquid crystalline compound contained in the polymerizable liquid crystal composition.

Further, in a case where an optically anisotropic material is used as the polymerizable liquid crystal composition used in the present invention, the tilt angle between the interface of the air and the optically anisotropic material can be effectively reduced by using the leveling agent.

<Alignment Controlling Agent>

The polymerizable liquid crystal composition used in the present invention may contain an alignment controlling agent in order to control the alignment state of the liquid crystalline compound. As the alignment controlling agent to be used, agents used for substantial horizontal alignment, substantial vertical alignment, or substantial hybrid alignment of the liquid crystalline compound with respect to the base material may be exemplified. Further, in a case where a chiral compound is added, agents used for substantial plane alignment of the liquid crystalline compound with respect to the base material may be exemplified. As described above, horizontal alignment or plane alignment may be induced by a surfactant in some cases, the alignment controlling agent is not particularly limited as long as the alignment state of each liquid crystalline compound is induced, and conventionally known ones can be used.

As such an alignment controlling agent, a compound which has an effect of effectively reducing the tilt angle between the interface of the air and an optically anisotropic material in a case where an optically anisotropic material is used as the polymerizable liquid crystal composition, has a repeating unit represented by Formula (8), and has a weight-average molecular weight of 100 to 1000000 may be exemplified.

[Chem. 107]

$$-\!\!\left(CR^{11}R^{12}-CR^{13}R^{14}\right)\!\!- \qquad (8)$$

(In the formula, $R^{11}$, $R^{12}$, $R^{13}$, and $R^{14}$ each independently represent a hydrogen atom, a halogen atom, or a hydrocarbon group having 1 to 20 carbon atoms, and the hydrogen atoms in the hydrocarbon group may be substituted with one or more halogen atoms.)

In addition, examples of the compound include a rod-like liquid crystalline compound modified with a fluoroalkyl group, a discotic liquid crystalline compound, and a polymerizable compound containing a long-chain aliphatic alkyl group which may have a branched structure.

Examples of the compound which has an effect of effectively increasing the tilt angle between the interface of the air and an optically anisotropic material in a case where an optically anisotropic material is used as the polymerizable liquid crystal composition include cellulose nitrate, cellulose acetate, cellulose propionate, cellulose butyrate, a rod-like liquid crystalline compound modified with a heteroaromatic ring salt, a cyano group, and a rod-like liquid crystalline compound modified with a cyanoalkyl group.

<Chain Transfer Agent>

The polymerizable liquid crystal composition used in the present invention may contain a chain transfer agent in order to further improve adhesiveness among the polymer, the optically anisotropic material, and the base material. Examples of the chain transfer agent include aromatic hydrocarbons, halogenated hydrocarbons such as chloroform, carbon tetrachloride, carbon tetrabromide, and bromotrichloromethane, a mercaptan compound such as octyl mercaptan, n-butyl mercaptan, n-pentyl mercaptan, n-hexadecyl mercaptan, n-tetradecyl mercaptan, n-dodecyl mercaptan, t-tetradecyl mercaptan, or t-dodecyl mercaptan, a thiol compound such as hexanedithiol, decanedithiol, 1,4-butanediol bisthiopropionate, 1,4-butanediol bisthioglycolate, ethylene glycol bisthioglycolate, ethylene glycol bisthiopropionate, trimethylolpropane tristhioglycolate, trimethylolpropane tristhiopropionate, trimethylolpropane tris(3-mercaptobutyrate), pentaerythritol tetrakisthioglycolate, pentaerythritol tetrakisthiopropionate, trimercaptopropionic acid tris(2-hydroxyethyl)isocyanurate, 1,4-dimethyl mercaptobenzene, 2,4,6-trimercapto-s-triazine, or 2-(N,N-dibutylamino)-4,6-dimercapto-s-triazine, a sulfide compound such as dimethyl xanthogen disulfide, diethyl xanthogen disulfide, diisopropyl xanthogen disulfide, tetramethyl thiuram disulfide, tetraethyl thiuram disulfide, or tetrabutyl thiuram disulfide, N,N-dimethylaniline, N,N-divinylaniline, pentaphenylethane, an α-methylstyrene dimer, acrolein, allyl alcohol, terpineol, α-terpinene, γ-terpinene, and dipentene. Among these, 2,4-diphenyl-4-methyl-1-pentene and a thiol compound are more preferable.

Specifically, compounds represented by Formulae (9-1) to (9-12) are preferable.

In the formulae, $R^{95}$ represents an alkyl group having 2 to 18 carbon atoms, the alkyl group may be linear or branched, one or more of methylene groups in the alkyl group may be substituted with an oxygen atom, a sulfur atom, —CO—, —OCO—, —COO—, or —CH═CH— as long as an oxygen atom and a sulfur atom each are not directly bonded to the same atom, $R^{96}$ represents an alkylene group having 2 to 18 carbon atoms, and one or more of methylene groups in the alkylene group may be substituted with an oxygen atom, a sulfur atom, —CO—, —OCO—, —COO—, or —CH═CH— as long as an oxygen atom and a sulfur atom each are not directly bonded to the same atom.

It is preferable that the chain transfer agent is added during a step of preparing a polymerizable solution by mixing the polymerizable liquid crystal compound in an

[Chem. 108]

(9-1)

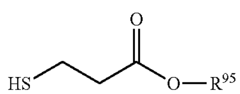

(9-2)

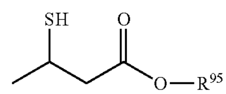

(9-3)

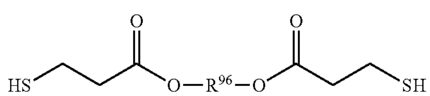

(9-4)

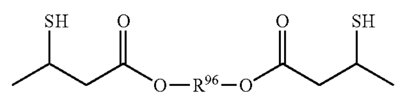

(9-5)

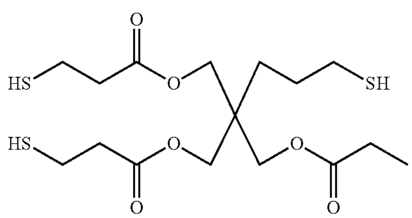

(9-6)

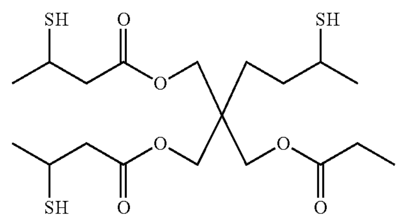

(9-7)

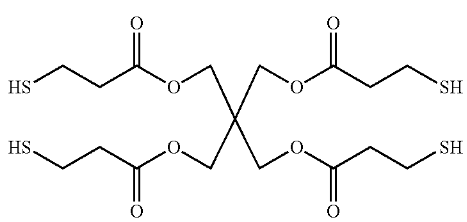

(9-8)

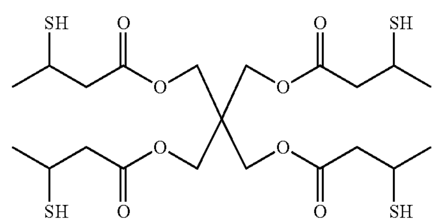

[Chem. 109]

(9-9)

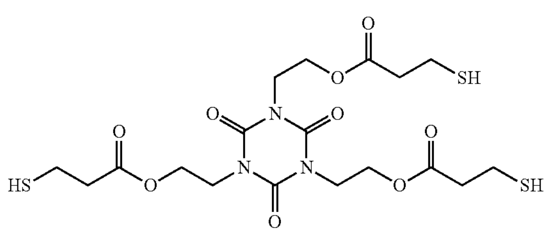

(9-10)

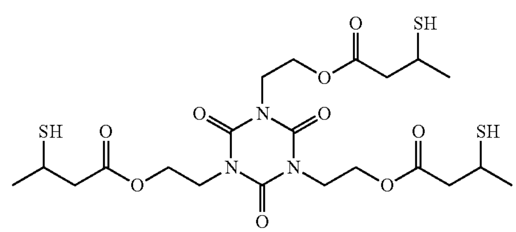

(9-11)

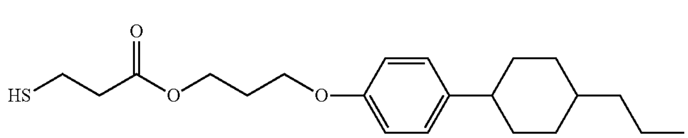

(9-12)

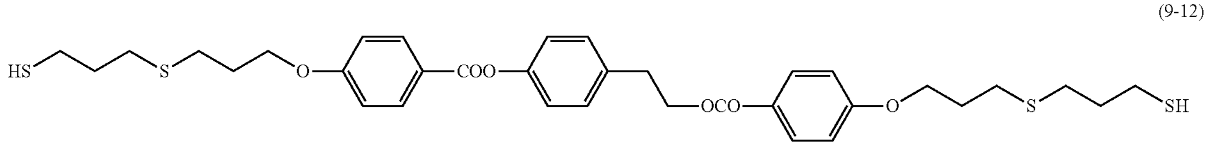

organic solvent and heating and stirring the solution, but the chain transfer agent may be added during the subsequent step of mixing a polymerization initiator into the polymerizable solution or may be added during both steps.

The amount of the chain transfer agent to be added is preferably 0.5% to 10% by mass and more preferably 1.0% to 5.0% by mass with respect to the total amount of the liquid crystalline compound contained in the polymerizable liquid crystal composition.

Further, a liquid crystalline compound which does not contain a polymerizable group and a polymerizable compound which does not have liquid crystallinity can be added as necessary for the purpose of adjusting physical properties. It is preferable that the polymerizable compound which does not have liquid crystallinity is added during a step of preparing a polymerizable solution by mixing the polymerizable compound in an organic solvent and heating and stirring the solution, but the liquid crystalline compound which does not have polymerization properties may be added during the subsequent step of mixing a polymerization initiator into the polymerizable solution or may be added during both steps. The amount of these compounds to be added is preferably 20% by mass or less, more preferably 10% by mass or less, and still more preferably 5% by mass or less with respect to the content of the polymerizable liquid crystal composition.

<Infrared Absorbing Agent>

The polymerizable liquid crystal composition used in the present invention may contain an infrared absorbing agent as necessary. The infrared absorbing agent to be used is not particularly limited and the polymerizable liquid crystal composition may contain conventionally known ones within the range that does not impair the alignment properties.

Examples of the infrared absorbing agent include a cyanine compound, a phthalocyanine compound, a naphthoquinone compound, a dithiol compound, a diimmonium compound, an azo compound, and an ammonium salt.

Specific examples thereof include diimmonium salt type "NIR-IM1", ammonium salt type "NIR-AM1" (both manufactured by Nagase ChemteX Corporation), "KARENZ IR-T", "KARENZ IR-13F" (both manufactured by SHOWA DENKO K.K.), "YKR-2200", "YKR-2100" (both manufactured by Yamamoto Chemicals Inc.), "IRA908", "IRA931", "IRA955", and "IRA1034" (all manufactured by INDECO Co., Ltd.).

<Antistatic Agent>

The polymerizable liquid crystal composition used in the present invention may contain an antistatic agent as necessary. The antistatic agent to be used is not particularly limited and the polymerizable liquid crystal composition may contain conventionally known ones within the range that does not impair the alignment properties.

Examples of such an antistatic agent include a polymer compound containing at least one or more sulfonate groups or phosphate groups in a molecule, a compound containing a quaternary ammonium salt, and a surfactant containing a polymerizable group.

Among these, a surfactant containing a polymerizable group is preferable, and examples of an anionic surfactant-containing a polymerizable group include alkyl ether-based surfactants such as "ANTOX SAD", "ANTOX MS-2N" (both manufactured by Nippon Nyukazai Co., Ltd.), "AQUALON KH-05", "AQUALON KH-10", "AQUALON KH-20", "AQUALON KH-0530", "AQUALON KH-1025" (all manufactured by Dai-ichi Kogyo Seiyaku Co., Ltd.), "ADEKA REASOAP SR-10N", "ADEKA REASOAP SR-20N" (both manufactured by ADEKA CORPORATION), and "LATEMUL PD-104" (manufactured by Kao Corporation), sulfosuccinic acid ester-based surfactants such as "LATEMUL S-120", "LATEMUL S-120A", "LATEMUL S-180P", "LATEMUL S-180A" (manufactured by Kao Corporation), and "ELEMINOL JS-2" (manufactured by Sanyo Chemical industries, Ltd.), alkylphenylether-based or alkylphenylester-based surfactants such as "AQUALON H-2855A", "AQUALON H-3855B", "AQUALON H-3855C", "AQUALON H-3856", "AQUALON HS-05", "AQUALON HS-10", "AQUALON HS-20", "AQUALON HS-30", "AQUALON HS-1025", "AQUALON BC-OS", "AQUALON BC-10", "AQUALON BC-20", "AQUALON BC-1025", and "AQUALON BC-2020" (all manufactured by Dai-ichi Kogyo Seiyaku Co., Ltd.), "ADEKA REASOAP SDX-222", "ADEKA REASOAP SDX-223", "ADEKA REASOAP SDX-232", "ADEKA REASOAP SDX-233", "ADEKA REASOAP SDX-259", "ADEKA REASOAP SE-10N", and "ADEKA REASOAP SE-20N" (all manufactured by ADEKA CORPORATION), (meth)acrylate sulfuric acid ester-based surfactants such as "ANTOX MS-60", "ANTOX MS-2N" (both manufactured by Nippon Nyukazai Co., Ltd.), "ELEMINOLRS-30" (manufactured by Sanyo Chemical Industries, Ltd.), and phosphoric acid ester-based surfactants such as "H-3330P" (manufactured by Dai-ichi Kogyo Seiyaku Co., Ltd.) and "ADEKA REASOAP PP-70" (manufactured by ADEKA CORPORATION).

Among the surfactants containing a polymerizable group, examples of a non-ionic surfactant include alkyl ether-based surfactants such as "ANTOX LMA-20", "ANTOX LMA-27", "ANTOX EMH-20", "ANTOX LMH-20", "ANTOX SMH-20" (all manufactured by Nippon Nyukazai Co., Ltd.), "ADEKA REASOAP ER-10", "ADEKA REASOAP ER-20", "ADEKA REASOAP ER-30", "ADEKA REASOAP ER-40" (all manufactured by ADEKA CORPORATION), "LATEMUL FD-420", "LATEMUL PD-430", and "LATEMUL PD-450" (all manufactured by Kao Corporation), alkyl phenyl ether-based or alkyl phenyl ester-based surfactants such as "AQUALON RN-10", "AQUALON RN-20", "AQUALON RN-30", "AQUALON RN-50", "AQUALON RN-2025" (all manufactured by Dai-ichi Kogyo Seiyaku Co., Ltd.), "ADEKA REASOAP NK 10", "ADEKA REASOAP NK 20", "ADEKA REASOAP NE-30", and "ADEKA REASOAP NE-40" (all manufactured by ADEKA CORPORATION), and (meth)acrylate sulfuric acid ester-based surfactants such as "RMA-564", "RMA-568", and "RMA-1114" (all manufactured by Nippon Nyukasai Co., Ltd.), Other examples of antistatic agents include polyethylene glycol (meth)acrylate, methoxy polyethylene glycol (meth) acrylate, ethoxy polyethylene glycol (meth)acrylate, propoxy polyethylene glycol (meth)acrylate, n-botoxy polyethylene glycol (meth)acrylate, n-pentaxy polyethylene glycol (meth)acrylate, phenoxy polyethylene glycol (meth) acrylate, polypropylene glycol (meth)acrylate, methoxy polypropylene glycol (meth)acrylate, ethoxy polypropylene glycol (meth)acrylate, propoxy polypropylene glycol (meth) acrylate, n-botoxy polypropylene glycol (meth)acrylate, n-pentaxy polypropylene glycol (meth)acrylate, phenoxy polypropylene glycol (meth)acrylate, polytetramethylene glycol (meth)acrylate, methoxy polytetramethylene glycol (meth)acrylate, phenoxy tetraethylene glycol (meth)acrylate, hexaethylene glycol (meth)acrylate, and methoxy hexaethylene glycol (meth)acrylate.

The antistatic agent can be used alone or in combination of two or more kinds thereof. The amount of the antistatic agent to be added is preferably 0.001% to 10% by weight and more preferably 0.01% to 5% by weight with respect to the total amount of the liquid crystalline compound contained in the polymerizable liquid crystal composition.

<Dye>

The polymerizable liquid crystal composition used in the present invention may contain a dye as necessary. The dye to be used is not particularly limited and the polymerizable liquid crystal composition may contain conventionally known ones within the range that does not impair the alignment properties.

Examples of the dye include dichroic dyes and fluorescent, dyes. Examples of such dyes include a polyazo dye, an anthraquinone dye, a cyanine dye, a phthalocyanine dye, a perylene dye, a perinone dye, and a squarylium dye. From the viewpoint of addition, a dye exhibiting liquid crystallinity is preferable as the dye.

For example, dyes described in U.S. Pat. No. 2,400,877, Dreyer J. F., Phys. and Colloid Chem., 1948, 52, 808., "The Fixing of Molecular Orientation", Dreyer J. F., Journal de Physique, 1969, 4, 114., "Light Polarization from Films of Lyotropic Nematic Liquid Crystals", J. Lydon, "Chromonics" in "Handbook of Liquid Crystals Vol. 2B: Low Molecular Weight Liquid Crystals II", D. Demus, J. Goodby, G. W. Gray, H. W. Spiessm, V. Vill ed, Willey-VCH, pp. 981-1007 (1998), Dichroic Dyes for Liquid Crystal Display A. V. lvashchenko CRC Press, 1994, and "New Development of Functional Dye Market", Chapter 1, pp. 1, 1994, published by CMC Corporation can be used.

Examples of the dichroic dyes include dyes represented by Formulae (d-1) to (d-8).

[Chem. 110]

(d-1)

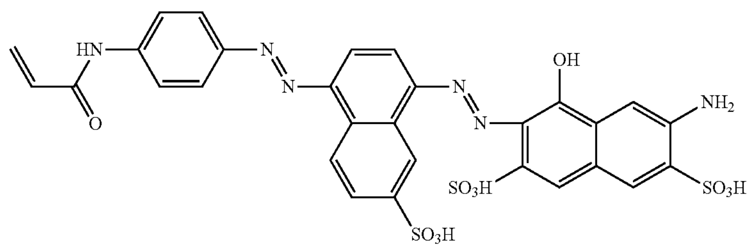

(d-2)

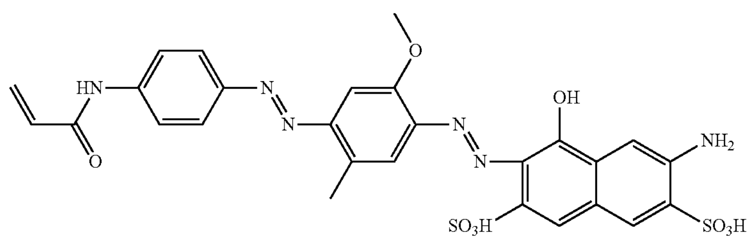

(d-3)

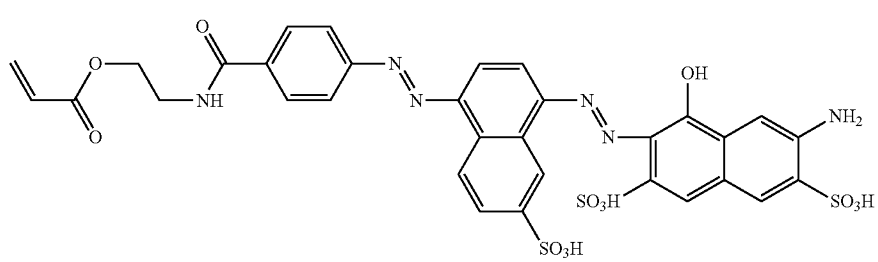

(d-4)

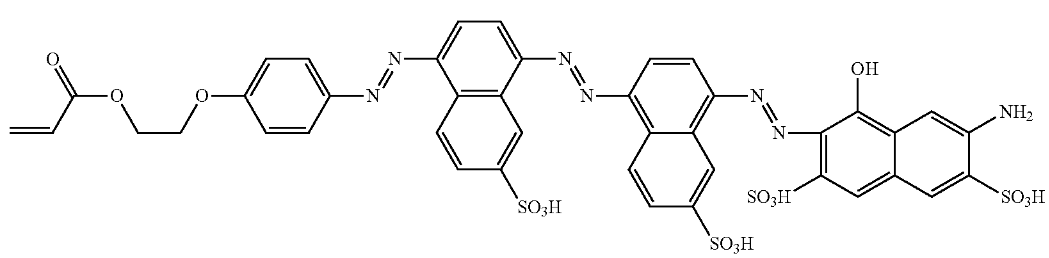

-continued

[Chem. 111]

(d-5)

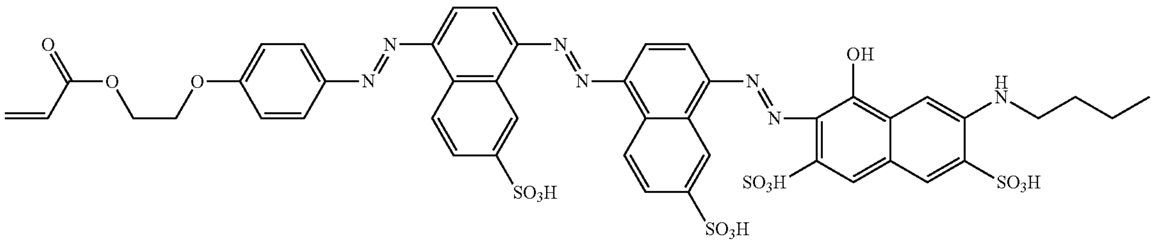

(d-6)

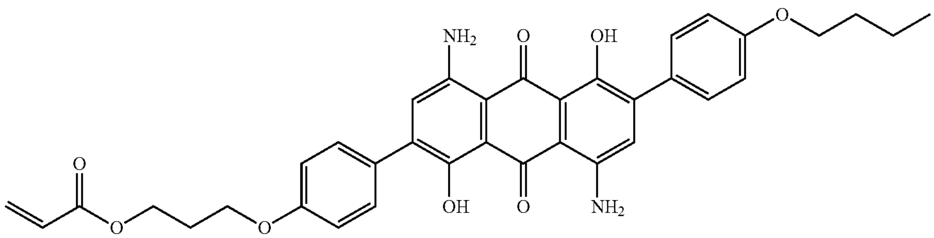

(d-7)

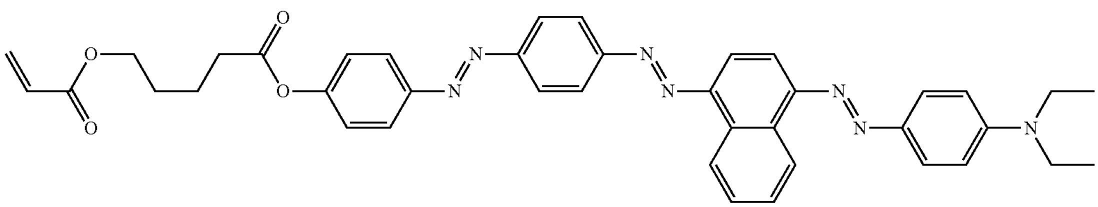

(d-8)

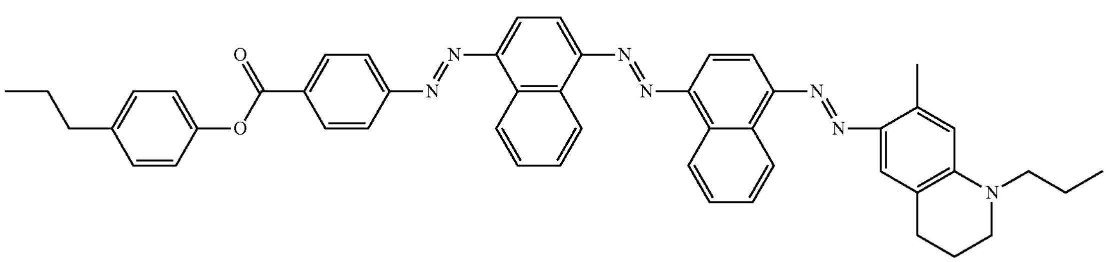

The amount of the dichroic dye to be added is preferably 0.001% to 10% by weight and more preferably 0.01% to 5% by weight with respect to the total amount of the liquid crystalline compound contained in the polymerizable liquid crystal composition.

<Filler>

The polymerizable liquid crystal composition used in the present invention may contain a filler as necessary. The filler to be used is not particularly limited, and the polymerizable liquid crystal composition may contain conventionally known ones within the range that does not degrade the thermal conductivity of the obtained polymer.

Examples of the filler include inorganic fillers such as alumina, titanium white, aluminum hydroxide, talc, clay, mica, barium titanate, zinc oxide, and glass fibers, thermally conductive fillers such as metal powder, for example, silver powder or copper powder, aluminum nitride, boron nitride, silicon nitride, gallium nitride, silicon carbide, magnesia (aluminum oxide), alumina (aluminum oxide), crystalline silica (silicon oxide), and fused silica (silicon oxide), and silver nanoparticles.

Other Liquid Crystalline Compounds>

The polymerizable liquid crystal composition used in the present invention may contain a liquid crystalline compound containing one or more polymerizable groups in addition to the liquid crystalline compound represented by any of Formulae (1) to (7). However, when the amount of the liquid crystalline compounds to be added is extremely large, there is a concern that the phase difference ratio in a case where the polymerizable liquid crystal composition is used for a retardation plate is increased. Therefore, in a case where the liquid crystalline compounds are added, the content thereof is preferably 30% by mass or less, more preferably 10% by mass or less, and particularly preferably 5% by mass or less with respect to the total amount of the polymerizable liquid crystalline compound represented by any of Formula (1) to (7).

Examples of such liquid crystalline compounds include compounds represented by Formulae (1-b) to (7-b).

[Chem. 112]

$$P^{11}\text{—}(S^{11}\text{—}X^{11})_{m11}\text{—}MG^{11}\text{—}R^{11} \quad (1\text{-b})$$

$$P^{21}\text{—}(S^{21}\text{—}X^{21})_{m2}\text{—}MG^{21}\text{—}(X^{22}\text{—}S^{22})_{n2}\text{—}P^{22} \quad (2\text{-b})$$

-continued (3-b)

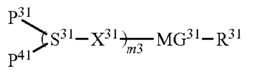

(4-b)

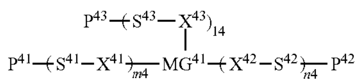

(5-b)

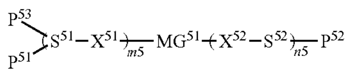

(6-b)

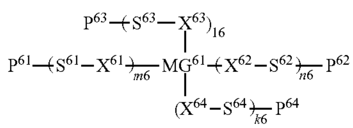

(7-b)

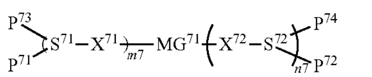

(In Formulae, $P^{11}$ to $P^{74}$ represent a polymerizable group, $S^{11}$ to $S^{72}$ represent a spacer group or a single bond, and in a case where a plurality of each of $S^{11}$ to $S^{72}$ is present, these may be the same as or different from each other, $X^{11}$ to $X^{72}$ represent —O—, —S—, —OCH$_2$—, —CH$_2$O—, —CO—, —COO—, —OCO—, —CO—S—, —S—CO—, —O—CO—O—, —CO—NH—, —NH—CO—, —SCH$_2$—, —CH$_2$S—, —CF$_2$O—, —OCF$_2$—, —CF$_2$S—, —SCF$_2$—, —CH═CH—COO—, —CH═CH—OCO—, —COO—CH═CH—, —OCO—CH═CH—, —COO—CH$_2$CH$_2$—, —OCO—CH$_2$CH$_2$—, —CH$_2$CH$_2$—COO—, —CH$_2$CH$_2$—OCO—, —COO—CH$_2$—, —OCO—CH$_2$—, —CH$_2$—COO—, —CH$_2$—OCO—, —CH═CH—, —N═N—, —CH═N—N═CH—, —CF═CF—, —C≡C—, or a single bond, and in a case where a plurality of each of $X^{11}$ to $X^{72}$ is present, these may be the same as or different from each other (where, each P—(S—X)— bond does not have —O—O—), $MG^{11}$ to $MG^{71}$ each independently represent Formula (b),

[Chem. 113]

(b)

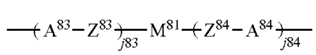

(In the formula, $A^{83}$ and $A^{84}$ each independently represent a 1,4-phenylene group, a 1,4-cyclohexylene group, a pyridine-2,5-diyl group, a pyrimidine-2,5-diyl group, a naphthalene-2,6-diyl group, a naphthalene-1,4-diyl group, a tetrahydronaphthalene-2,6-diyl group, a decahydronaphthalene-2,6-diyl group, or a 1,3-dioxane-2,5-diyl group, these groups may be unsubstituted or substituted with one or more of $L^2$'s, and in a case where a plurality of each of $A^{83}$ and $A^{84}$ is present, these may be the same as or different from each other, $Z^{83}$ and $Z^{84}$ each independently represent —O—, —S—, —OCH$_2$—, —CH$_2$O—, —CH$_2$CH$_2$—, —CO—, —COO—, —OCO—, —CO—S—, —S—CO—, —O—CO—O—, —CO—NH—, —NH—CO—, —SCH$_2$—, —CH$_2$S—, —CF$_2$O—, —OCF$_2$—, —CF$_2$S—, —SCF$_2$—, —CH═CH—COO—, —CH═CH—OCO—, —COO—CH═CH—, —OCO—CH═CH—, —COO—CH$_2$CH$_2$—, —OCO—CH$_2$CH$_2$—, —CH$_2$CH$_2$—COO—, —CH$_2$CH$_2$—OCO—, —COO-CH$_2$—, —OCO—CH$_2$—, —CH$_2$—COO—, —CH$_2$—OCO—, —CH═CH—, —N═N—, —CH═N—, —N═CH—, —CH═N—N═CH—, —CF═CF—, —C≡C—, or a single bond, and in a case where a plurality of each of $Z^{83}$ and $Z^{84}$ is present, these may be the same as or different from each other, $M^{81}$ represents a group selected from a 1,4-phenylene group, a 1,4-cyclohexylene group, a 1,4-cyclohexenyl group, a tetrahydropyran-2,5-diyl group, a 1,3-dioxane-2,5-diyl group, a tetrahydrothiopyran-2,5-diyl group, a 1,4-bicyclo(2,2,2)octylene group, a decahydronaphthalene-2,6-diyl group, a pyridine-2,5-diyl group, a pyrimidine-2,5-diyl group, a pyrazine-2,5-diyl group, a thiphene-2,5-diyl group, a 1,2,3,4-tetrahydronaphthalene-2,6-diyl group, a naphthylene-1,4-diyl group, a naphthylene-1,5-diyl group, a naphthylene-1,6-diyl group, a naphthylene-2,6-diyl group, a phenanthrene-2,7-diyl group, a 9,10-dihydrophenanthrene-2,7-diyl group, a 1,2,3,4,4a,9,10a-octahydrophenanthrene-2,7-diyl group, a benzo[1,2-b:4,5-b']dithiophene-2,6-diyl group, a benzo[1,2-b:4,5-b']diselenophene-2,6-diyl group, a [1]benzothieno[3,2-b]thiophene-2,7-diyl group, a [1]benzoselenopheno[3,2-b]selenophene-2,7-diyl group, and a fluorene-2,7-diyl group, and these groups may be unsubstituted or substituted with one or more of $L^2$'s, $L^2$ represents a fluorine atom, a chlorine atom, a bromine atom, an iodine atom, a pentafluorosulfuranyl group, a nitro group, an isocyano group, an amino group, a hydroxyl group, a mercapto group, a methylamino group, a dimethylamino group, a diethylamino group, a diisopropylamino group, a trimethylsilyl group, a dimethylsilyl group, a thioisocyano group, or an alkyl group having 1 to 20 carbon atoms, and the alkyl group may be linear or branched, one or more of arbitrary hydrogen atoms may be substituted with a fluorine atom, one —CH$_2$— or two or more (—CH$_2$—)'s which are not adjacent to each other in the alkyl group may be each independently substituted with a group selected from —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—, and in a case where a plurality of $L^2$ is present, these may be the same as or different from each other, m represents an integer of 0 to 8, j83 and j84 each independently represent an integer of 0 to 5, and j83+j84 represents an integer of 1 to 5.)

$R^{11}$ and $R^{31}$ represent a hydrogen atom, a fluorine atom, a chlorine atom, a bromine atom, an iodine atom, a pentafluorosulfuranyl group, a cyano group, a nitro group, an isocyano group, a thioisocyano group, or an alkyl group having 1 to 20 carbon atoms, and the alkyl group may be linear or branched, one or more of arbitrary hydrogen atoms in the alkyl group may be substituted with a fluorine atom, one —CH$_2$— or two or more (—CH$_2$—)'s which are not adjacent to each other in the alkyl group may be each independently substituted with —O—, —S—, —CO—, —COO—, —OCO—, —CO—S—, —S—CO—, —O—CO—O—, —CO—NH—, —NH—CO—, or —C≡C—, m11 represents an integer of 0 to 8, m2 to m7, n2 to n7, 14 to 16, and k6 each independently represent an integer of 0 to 5.)

Specific examples of the compound represented by Formula (1-b) include compounds represented by Formulae (1-b-1) to (1-b-39).

[Chem. 114]
(1-b-1)
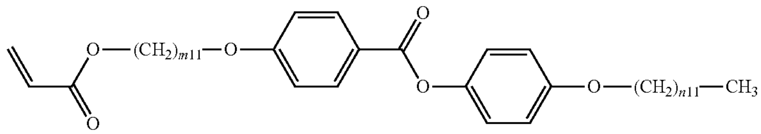
(1-b-2)
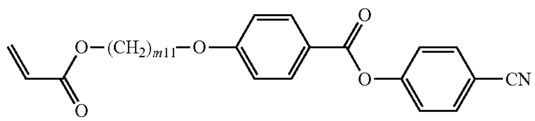
(1-b-3)
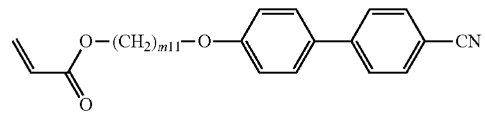
(1-b-4)
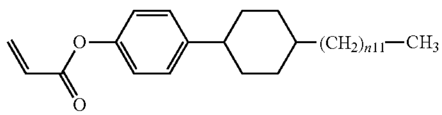
(1-b-5)
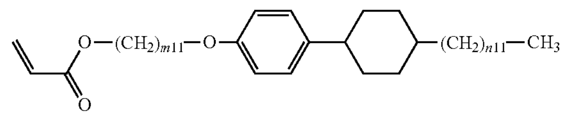
(1-b-6)
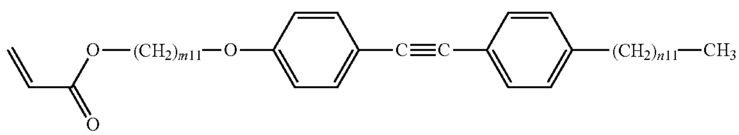
(1-b-7)
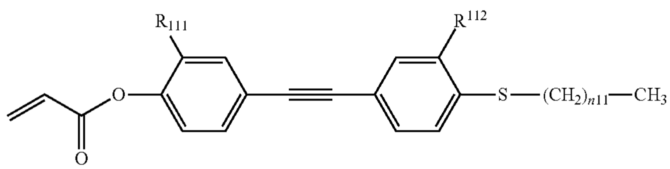
(1-b-8)
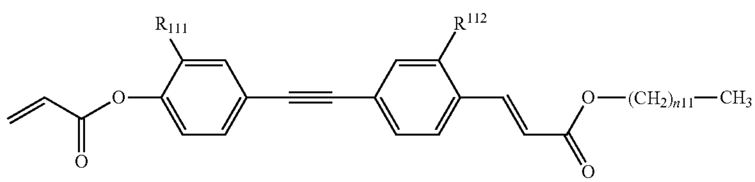
(1-b-9)
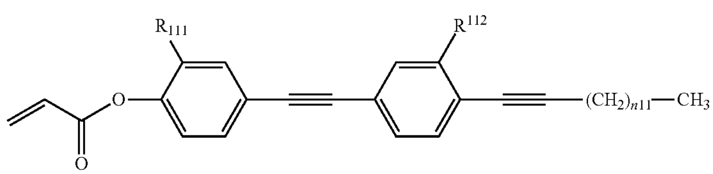
[Chem. 115]
(1-b-10)
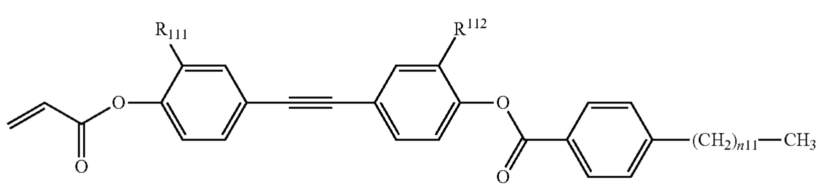
(1-b-11)
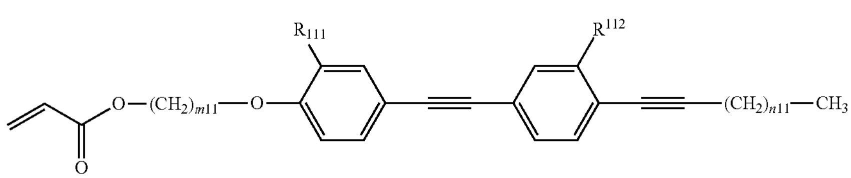

-continued
(1-b-12)
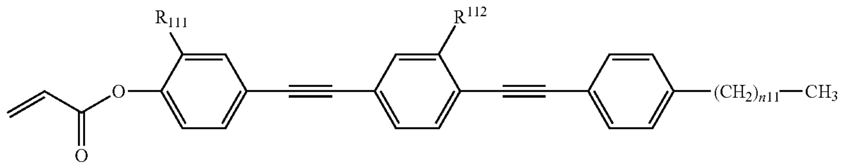
(1-b-13)
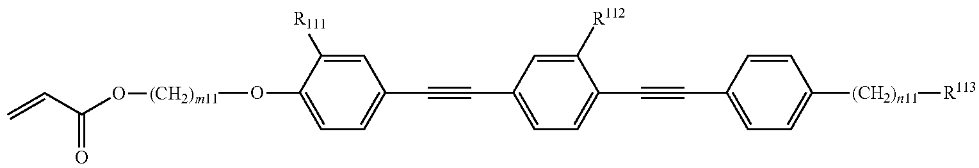
(1-b-14)
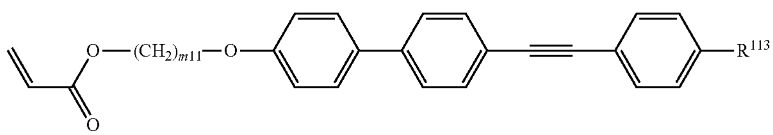
(1-b-15)
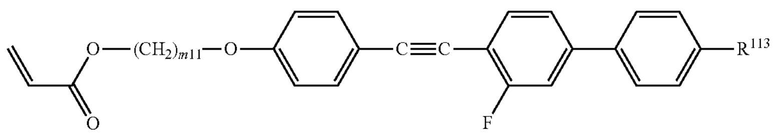
(1-b-16)
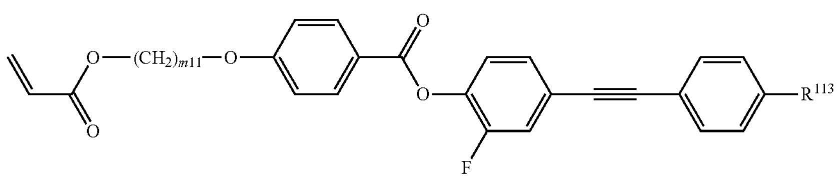
(1-b-17)
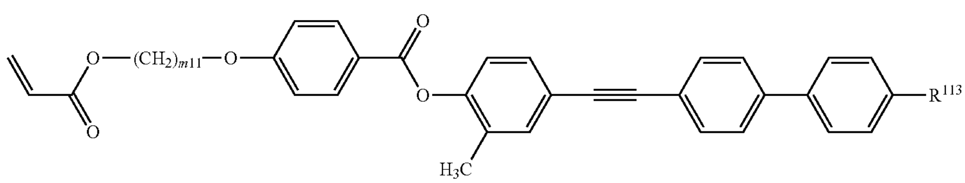
[Chem. 116]
(1-b-18)
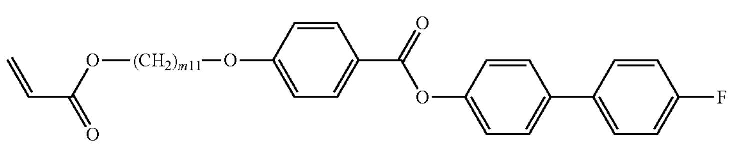
(1-b-19)
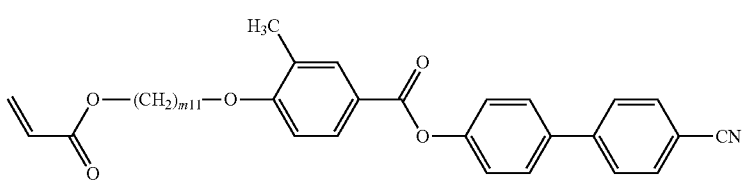
(1-b-20)
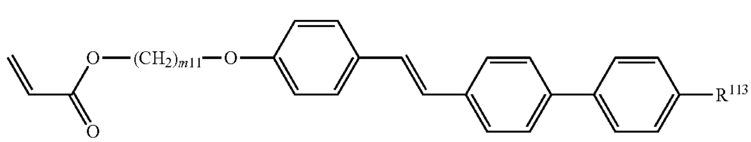
(1-b-21)
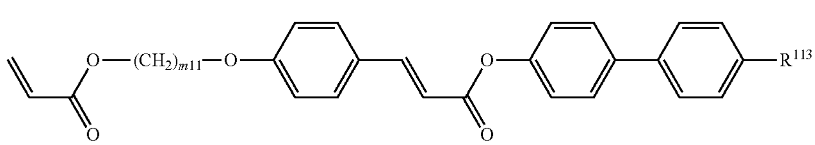

-continued
(1-b-22)
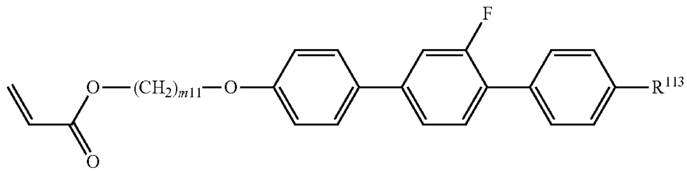
(1-b-23)
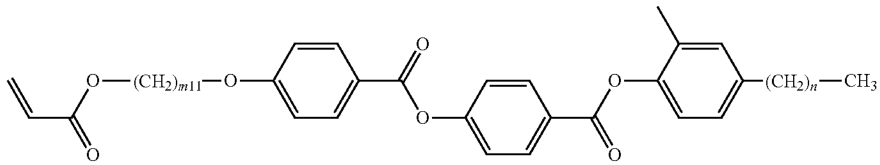
(1-b-24)
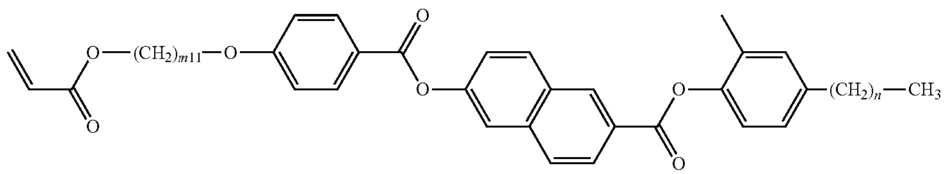
(1-b-25)
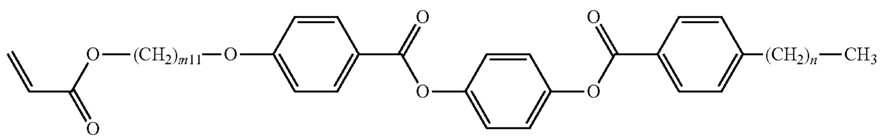
[Chem. 117]
(1-b-26)
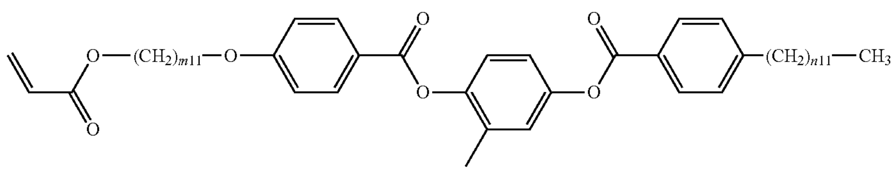
(1-b-27)
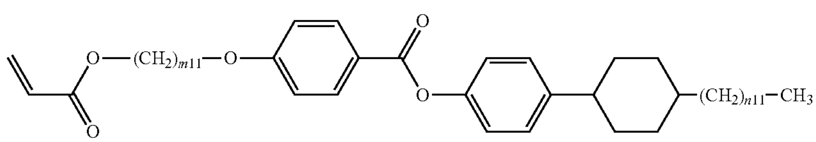
(1-b-28)
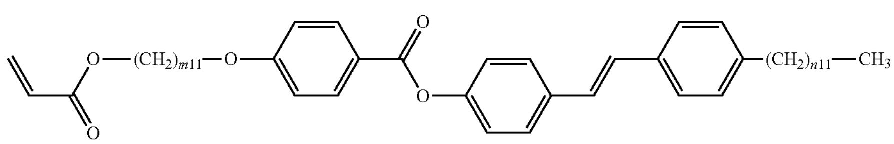
(1-b-29)
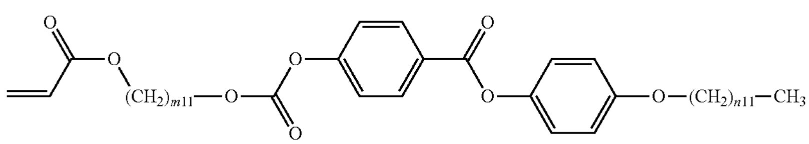
(1-b-30)
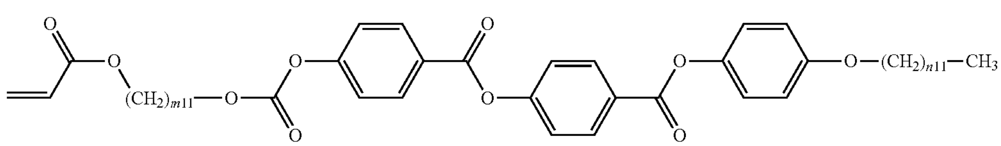
(1-b-31)
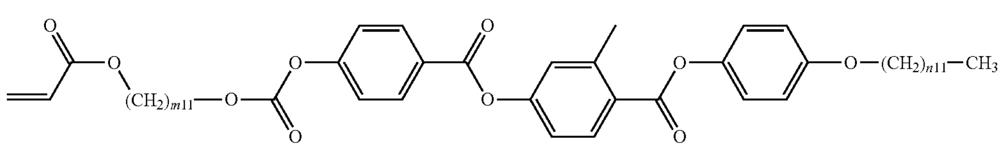

-continued (1-b-32)

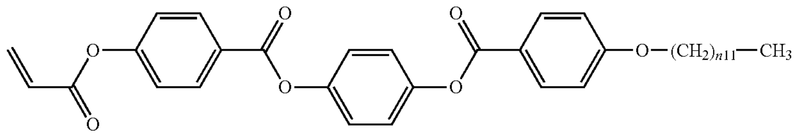

[Chem. 118]

(1-b-33)

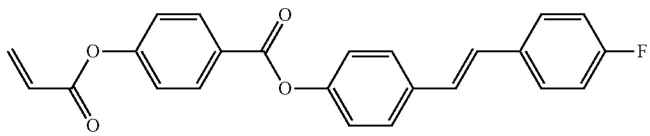

(1-b-34)

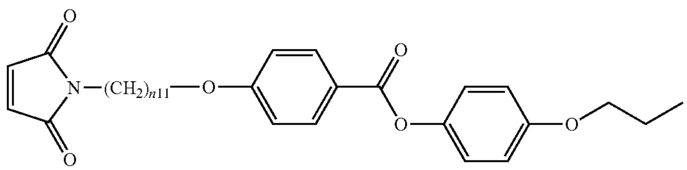

(1-b-35)

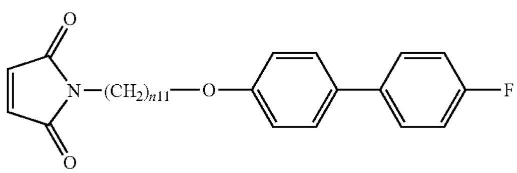

(1-b-36)

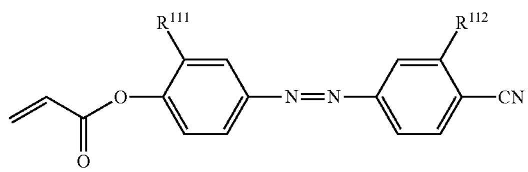

(1-b-37)

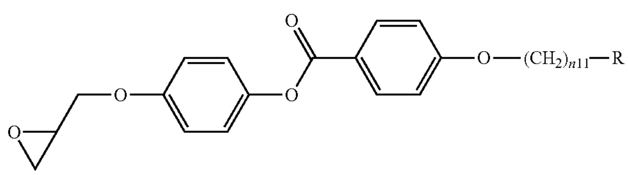

(1-b-38)

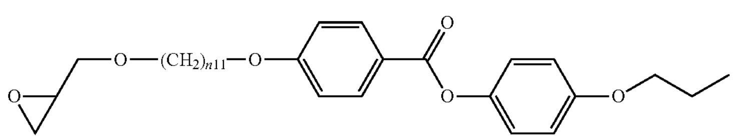

(1-b-39)

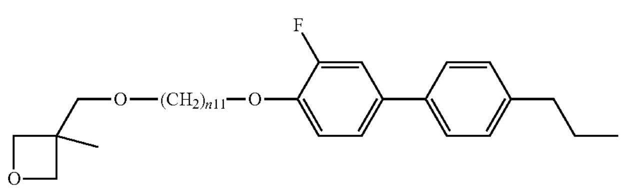

(In the formulae, m11 and n11 each independently represent an integer of 1 to 10, $R^{111}$ and $R^{112}$ each independently represent a hydrogen atom, an alkyl group having 1 to 10 carbon atoms, or a fluorine atom, $R^{113}$ represents a hydrogen atom, a fluorine atom, a chlorine atom, a bromine atom, an iodine atom, a pentafluorosulfuranyl group, a cyano group, a nitro group, an isocyano group, a thioisocyano group, or a linear or branched alkyl group having 1 to 20 carbon atoms in which one —$CH_2$— or two or more of (—$CH_2$—)'s which are not adjacent to each other may be each independently substituted with —O—, —S—, —CO—, —COO—, —OCO—, —CO—S—, —S—CO—, —O—CO—O—, —CO—NH—, —NH—CO—, or —C≡C—, and one or more of arbitrary hydrogen atoms in the alkyl group may be substituted with a fluorine atom.)

These liquid crystal compounds may be used alone or in combination of two or more kinds thereof.

Specific examples of the compound represented by Formula (2-b) include compounds represented by Formulae (2-b-1) to (2-b-33).

[Chem. 119]
(2-b-1)
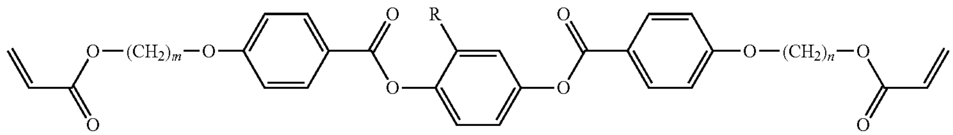
(2-b-2)
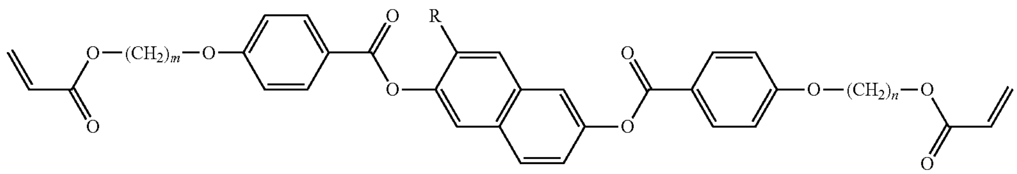
(2-b-3)
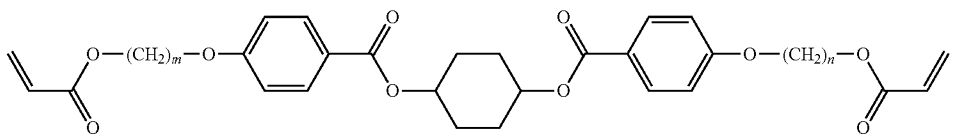
(2-b-4)
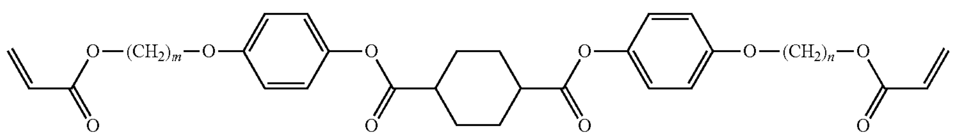
(2-b-5)
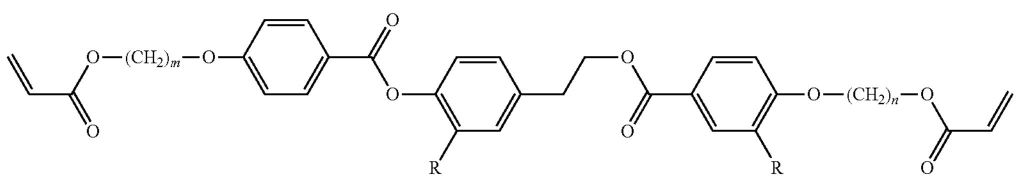
(2-b-6)
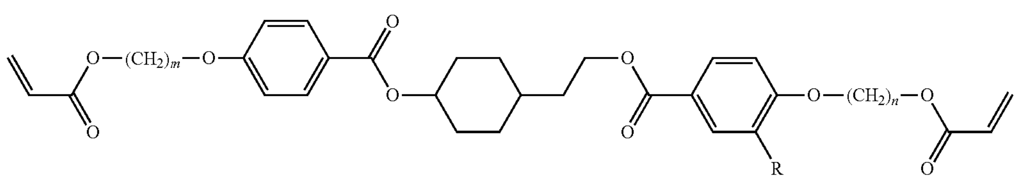
(2-b-7)
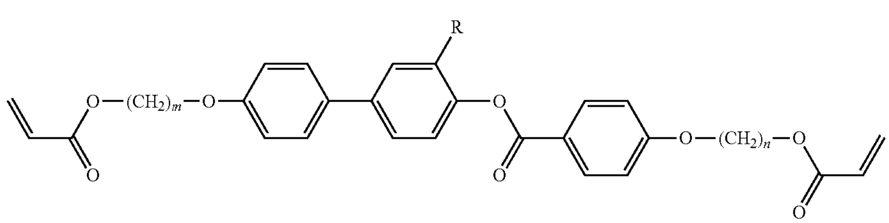
(2-b-8)
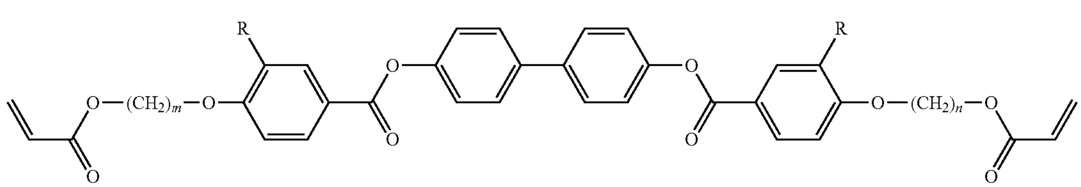

-continued
[Chem. 120]
(2-b-9)
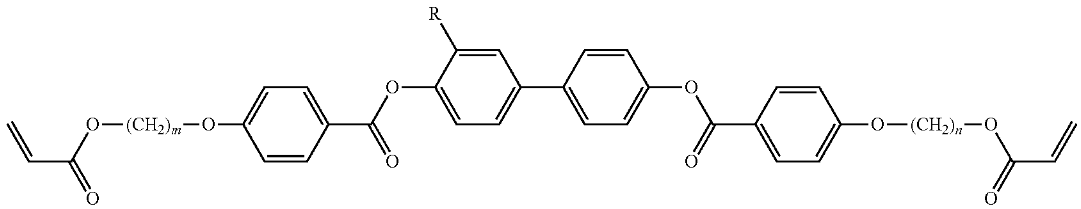
(2-b-10)
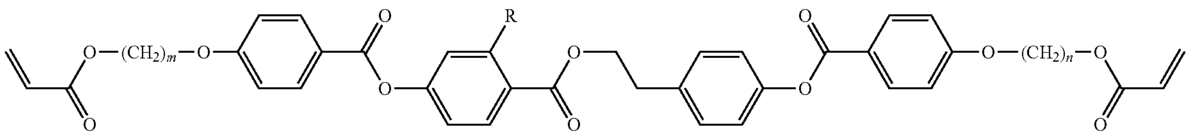
(2-b-11)
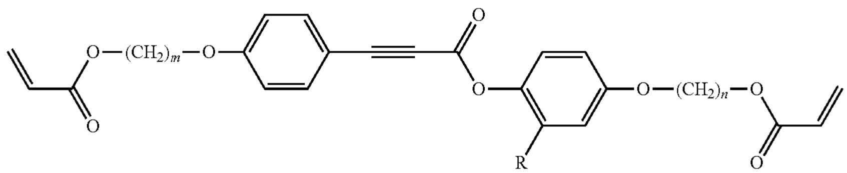
(2-b-12)
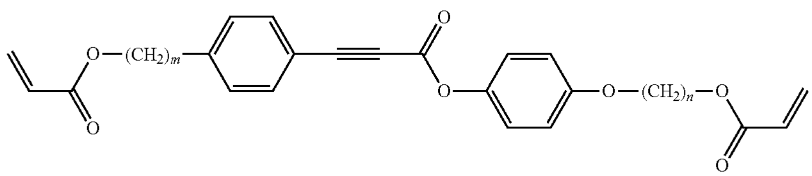
(2-b-13)
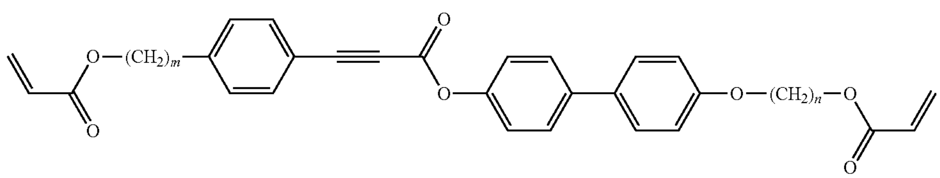
(2-b-14)
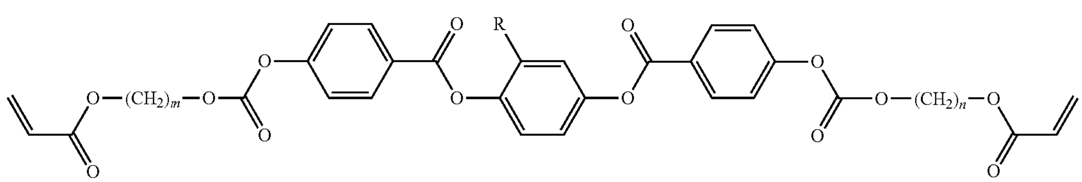
[Chem. 121]
(2-b-15)
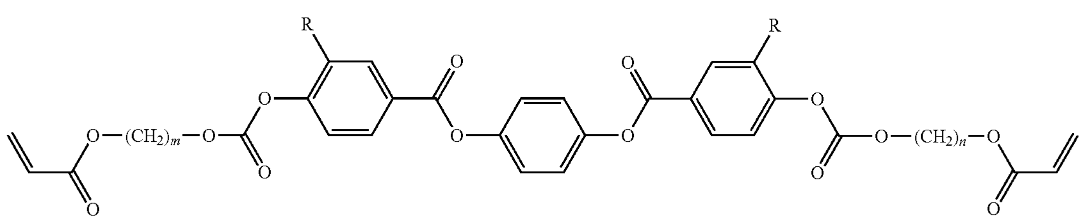
(2-b-16)
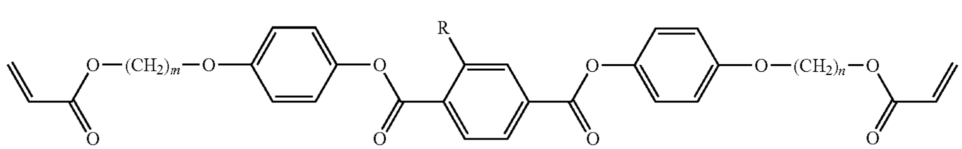

-continued
(2-b-17)
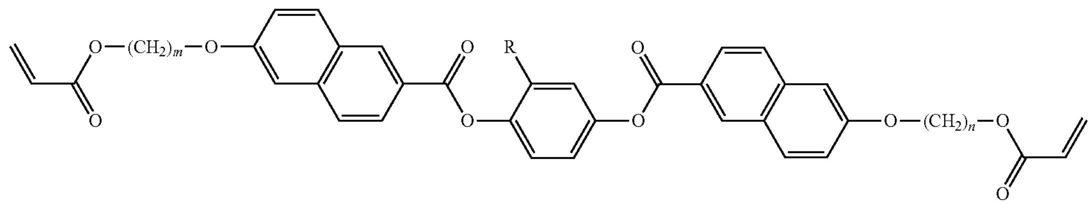
(2-b-18)
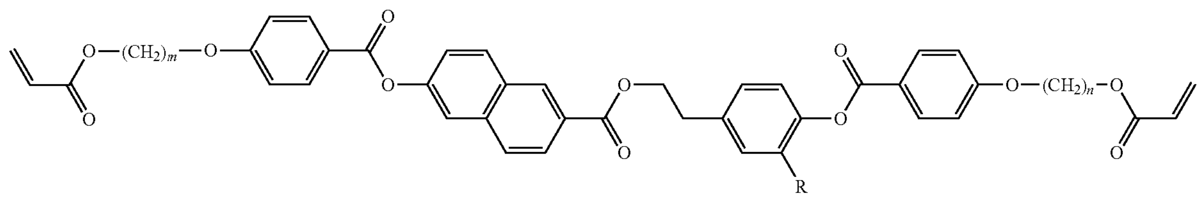
[Chem. 122]
(2-b-19)
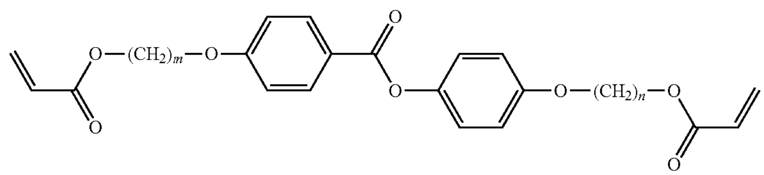
(2-b-20)
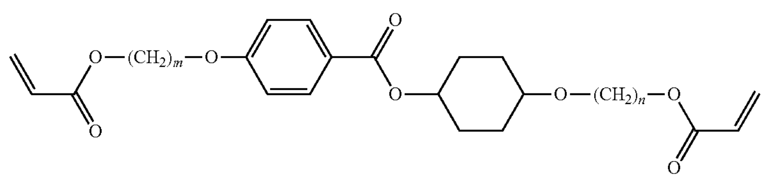
(2-b-21)
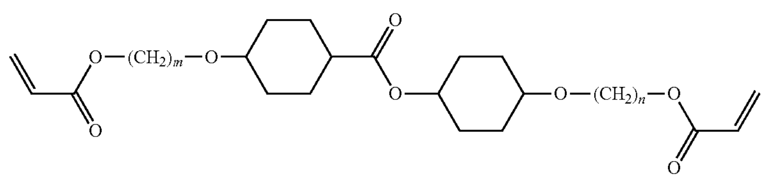
(2-b-22)
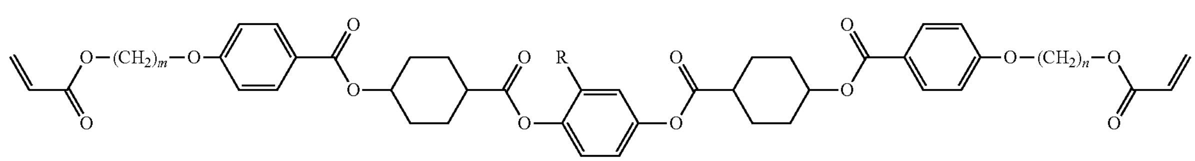
(2-b-23)
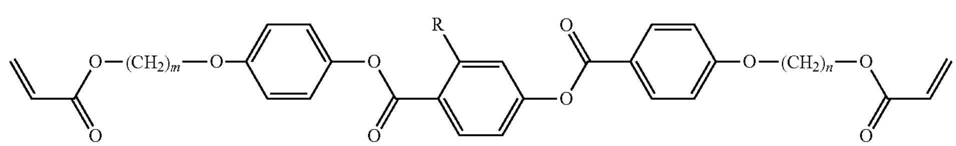
(2-b-24)
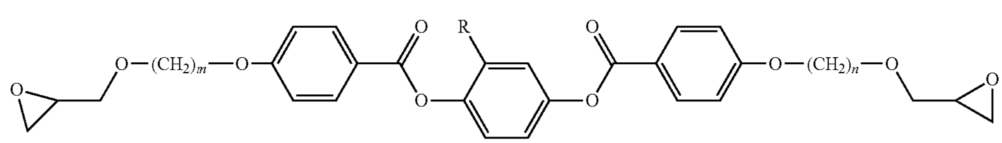

-continued
(2-b-25)
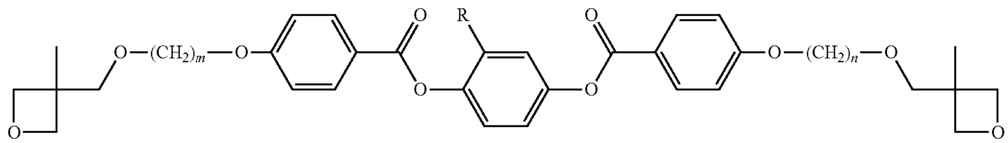
(2-b-26)
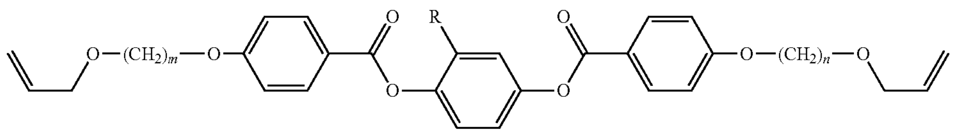
[Chem. 123]
(2-b-27)
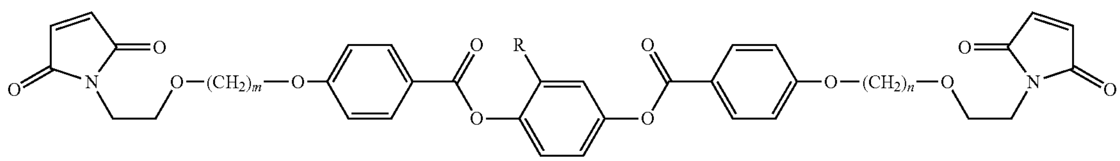
(2-b-28)
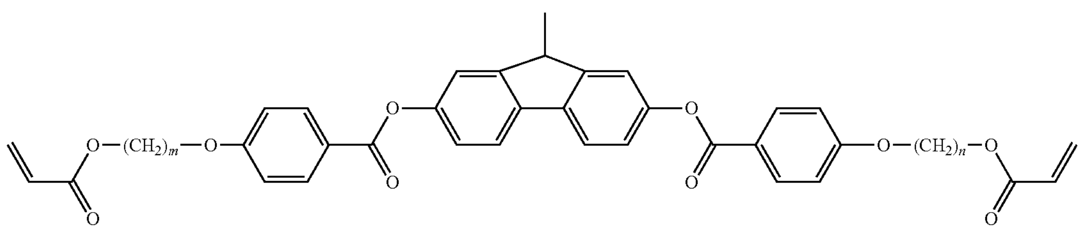
(2-b-29)
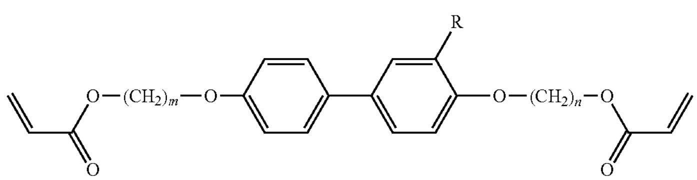
(2-b-30)
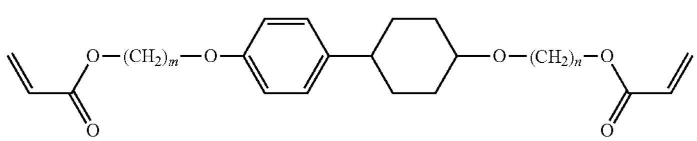
(2-b-31)
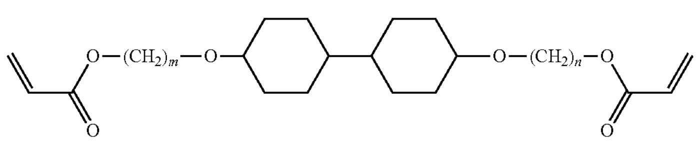
(2-b-32)
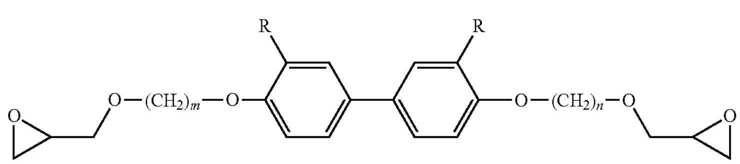

-continued (2-b-33)

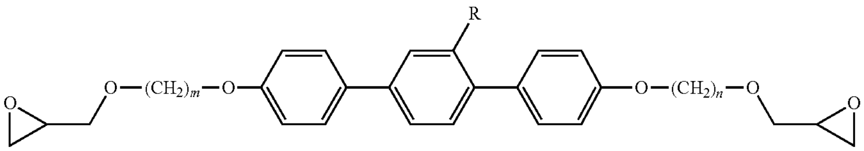

(In the formulae, m and n each independently represent an integer of 1 to 18, R represents a hydrogen atom, a halogen atom, an alkyl group having 1 to 6 carbon atoms, an alkoxy group having 1 to 6 carbon atoms, or a cyano group. In a case where these groups represent an alkyl group having 1 to 6 carbon atoms or an alkoxy group having 1 to 6 carbon atoms, all groups may be unsubstituted or substituted with one or two or more of halogen atoms.)

These liquid crystal compounds may be used alone or in combination of two or more kinds thereof.

Specific examples of the compound represented by Formula (3-b) include compounds represented by Formulae (3-b-1) to (3-b-16).

[Chem. 124]

(3-b-1)

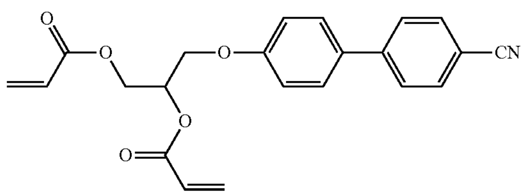

(3-b-2)

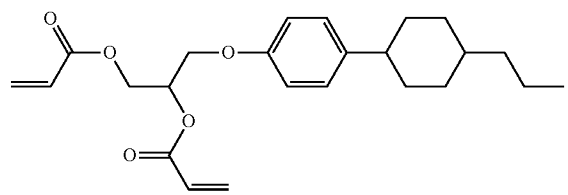

(3-b-3)

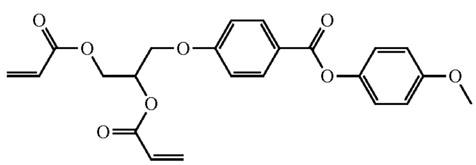

(3-b-4)

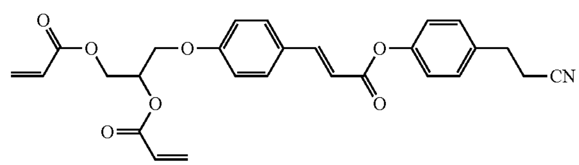

(3-b-5)

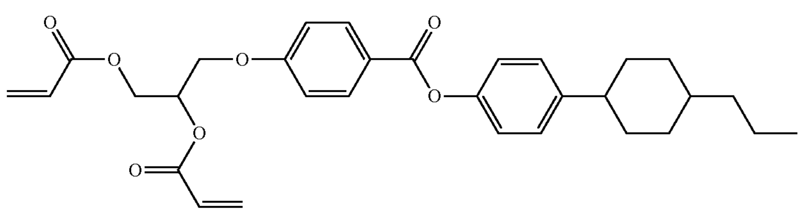

[Chem. 125]

(3-b-6)

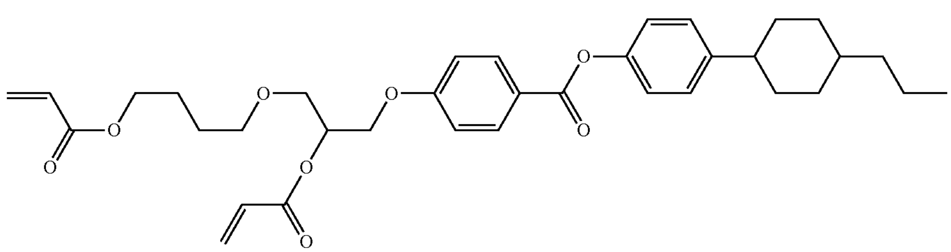

(3-b-7)

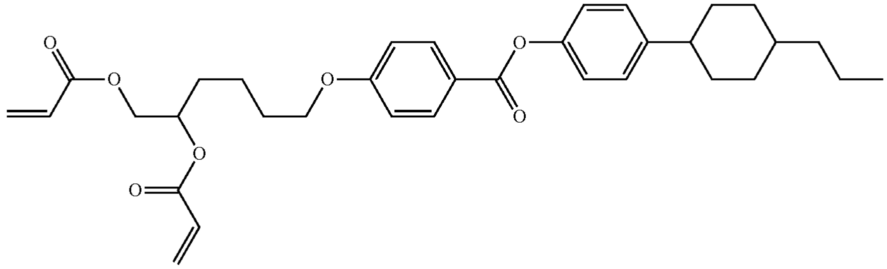

-continued
(3-b-8)
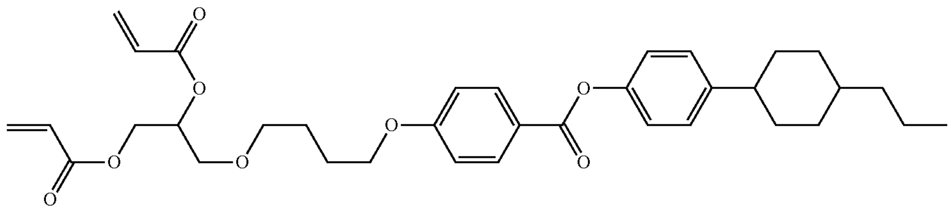
(3-b-9)
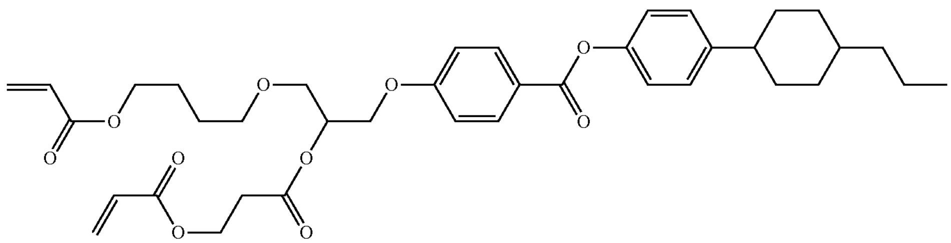
(3-b-10)
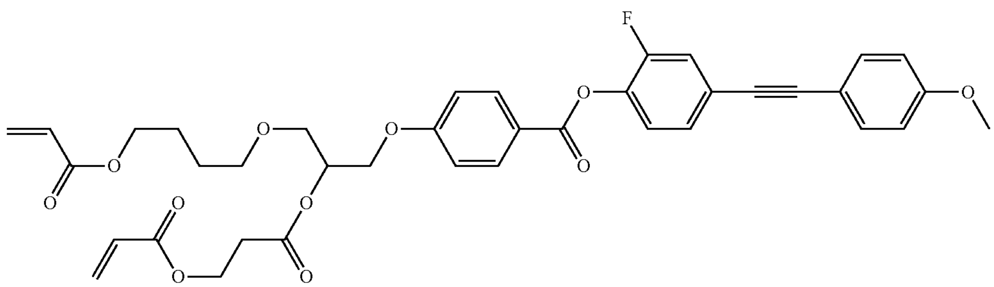
[Chem. 126]
(3-b-11)
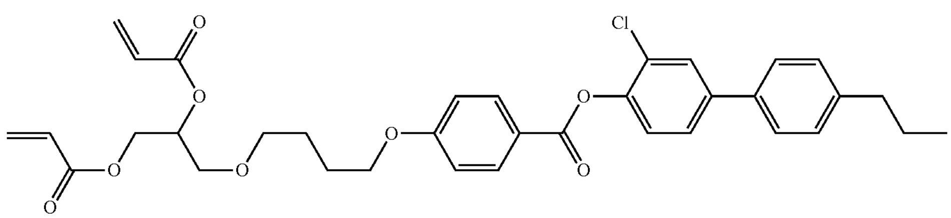
(3-b-12)
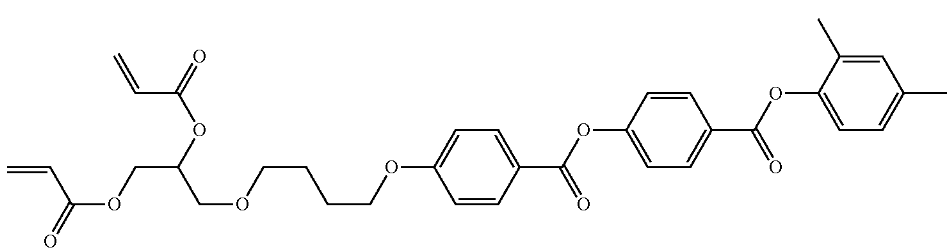
(3-b-13)
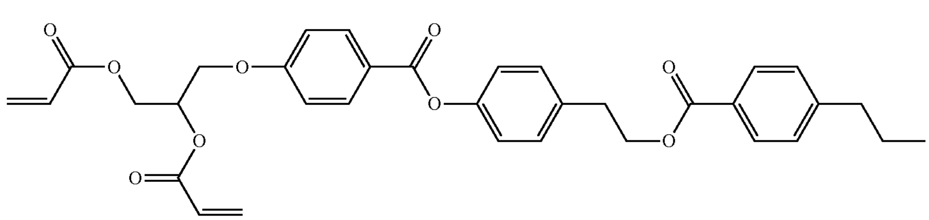

-continued
(3-b-14)
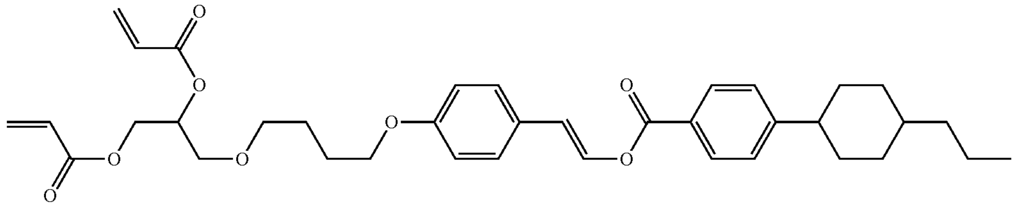
(3-b-15)
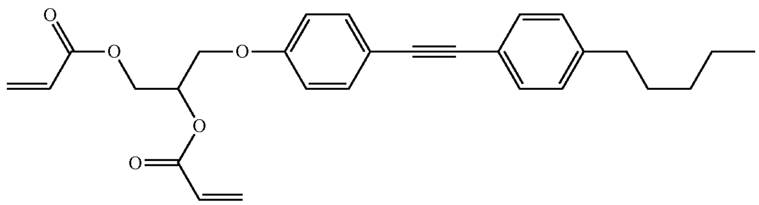
(3-b-16)
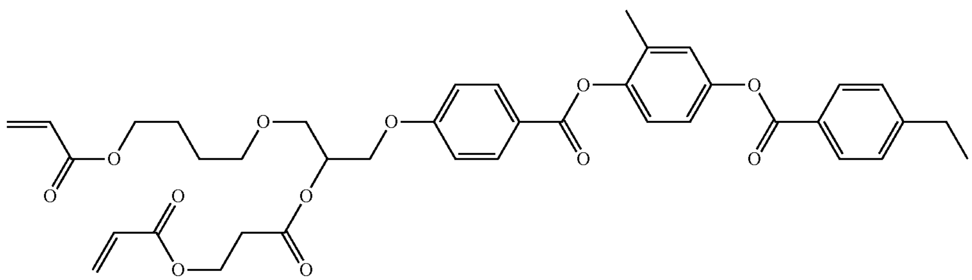
These liquid crystalline compounds may be used alone or in combination of two or more kinds thereof.
Specific examples of the compound represented by Formula (4-b) include compounds represented by Formulae (4-b-1) to (4-b-29).
[Chem. 127]
(4-b-1)
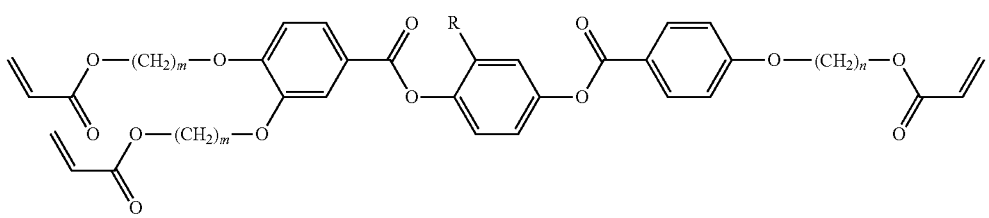
(4-b-2)
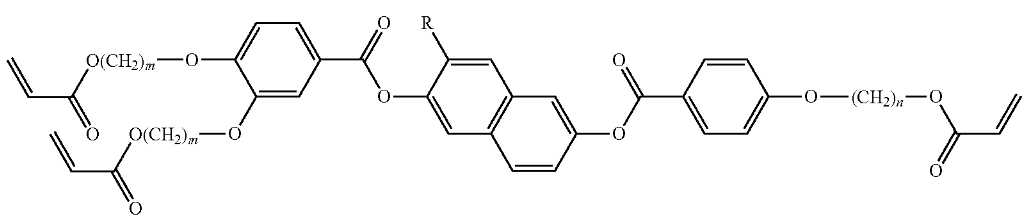
(4-b-3)
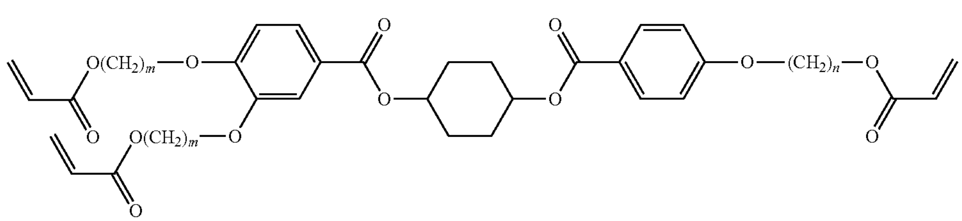

-continued
(4-b-4)
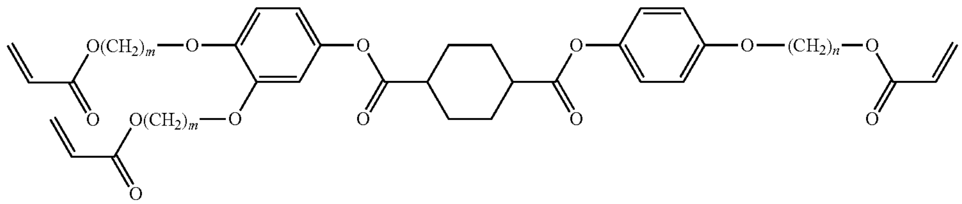
(4-b-5)
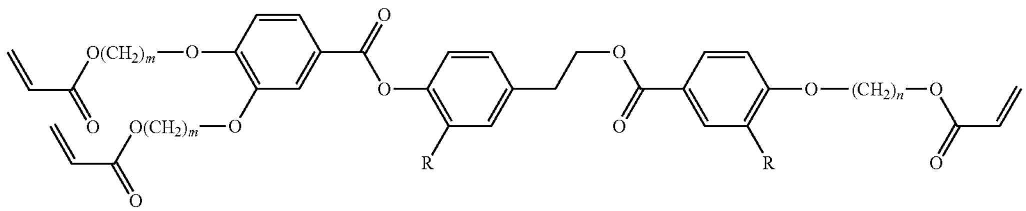
(4-b-6)
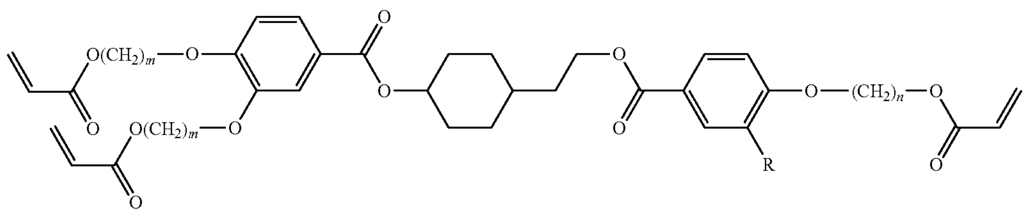
[Chem. 128]
(4-b-7)
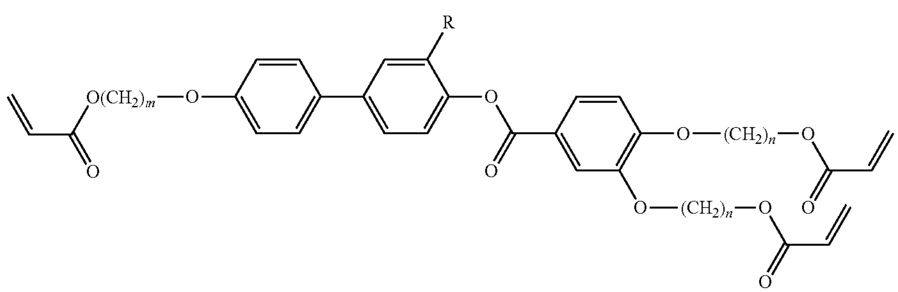
(4-b-8)
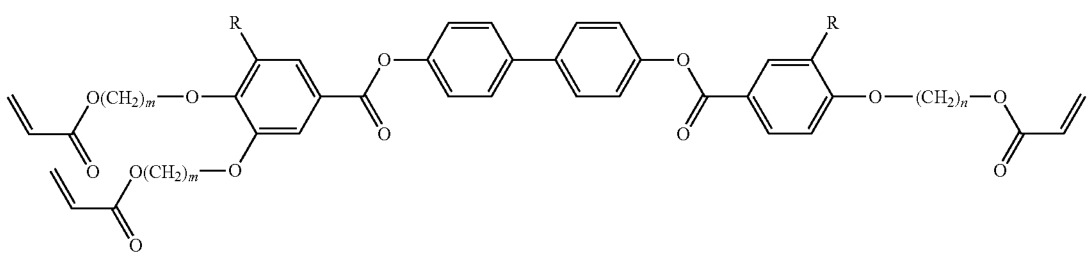
(4-b-9)
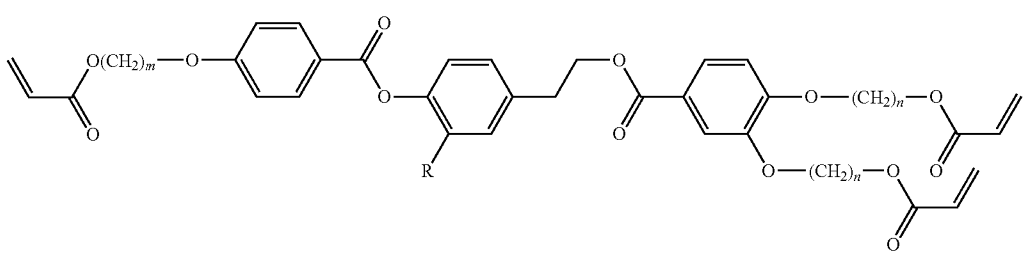

-continued
(4-b-10)
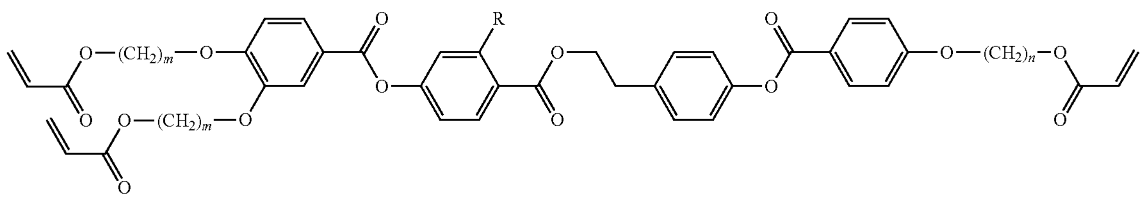
[Chem. 129]
(4-b-11)
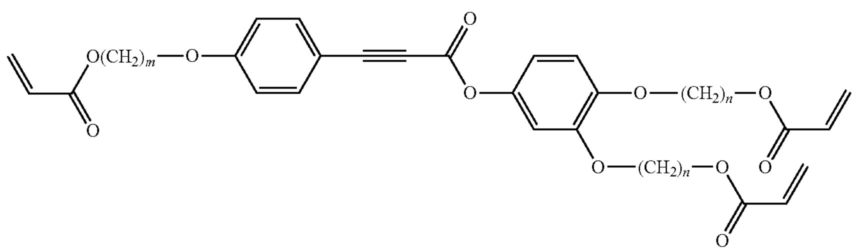
(4-b-12)
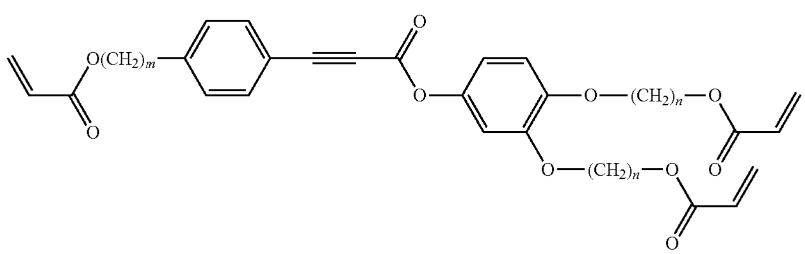
(4-b-13)
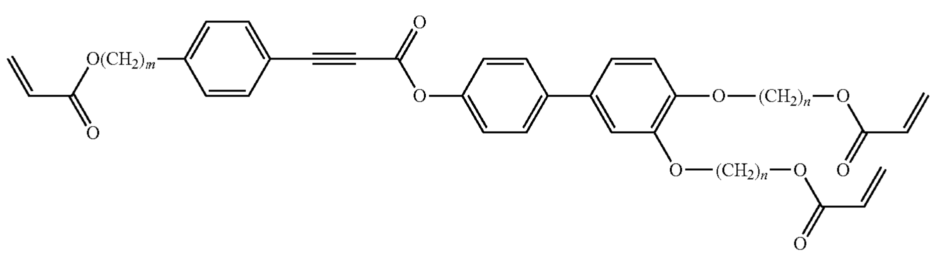
(4-b-14)
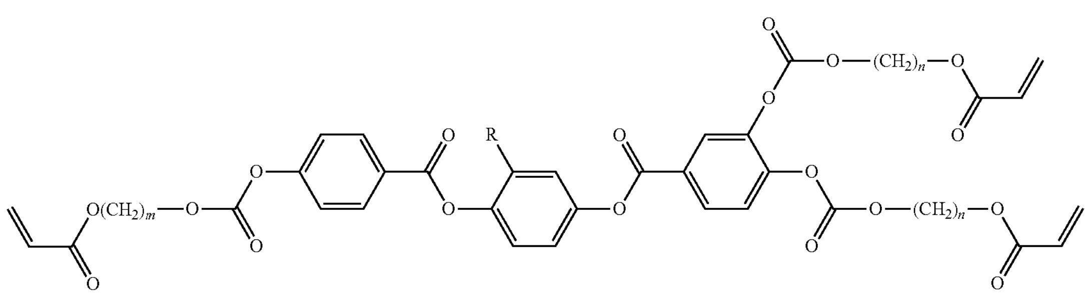
(4-b-15)
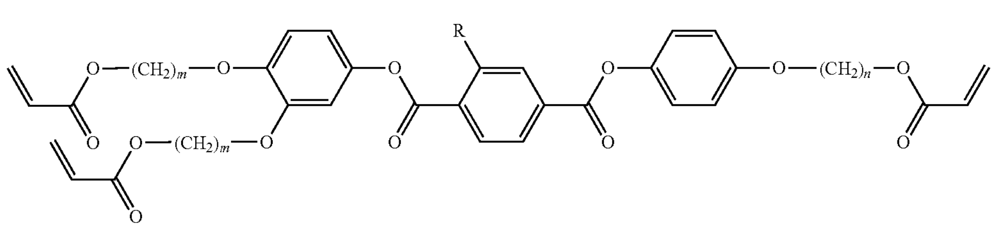

-continued
[Chem. 130]
(4-b-16)
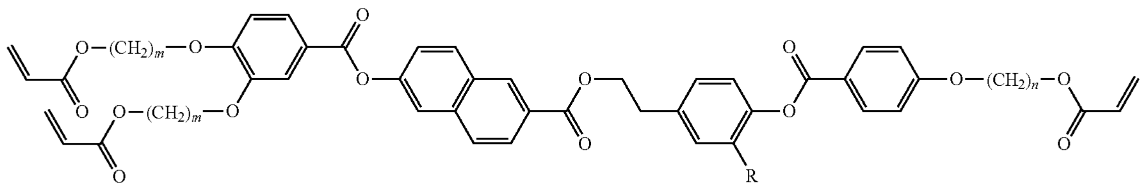
(4-b-17)
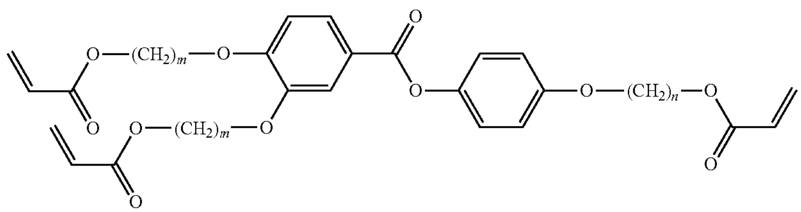
(4-b-18)
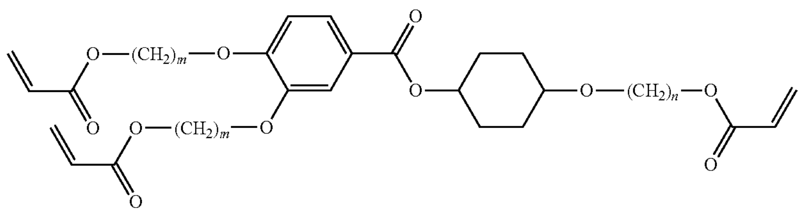
[Chem. 131]
(4-b-19)
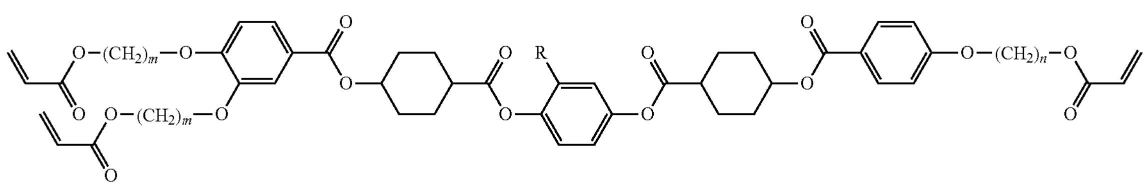
(4-b-20)
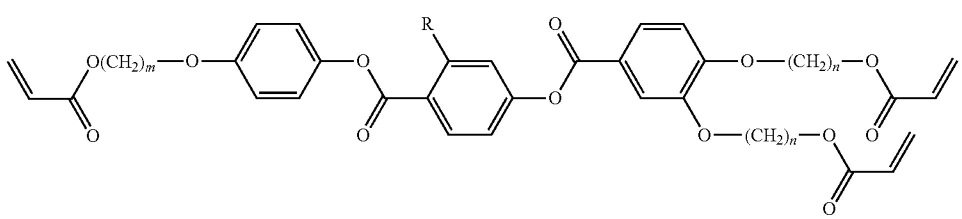
(4-b-21)
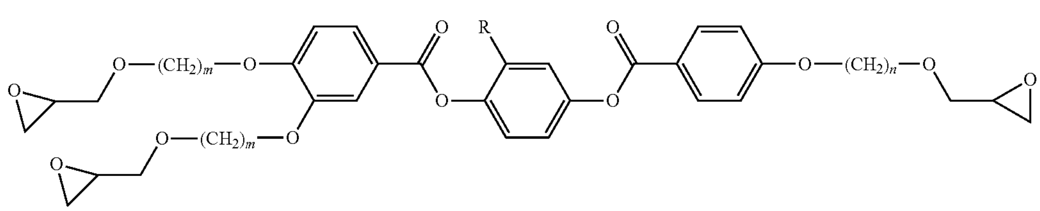
(4-b-22)
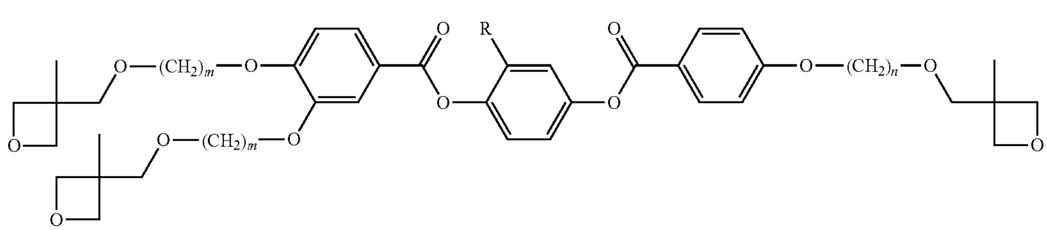

-continued
(4-b-23)
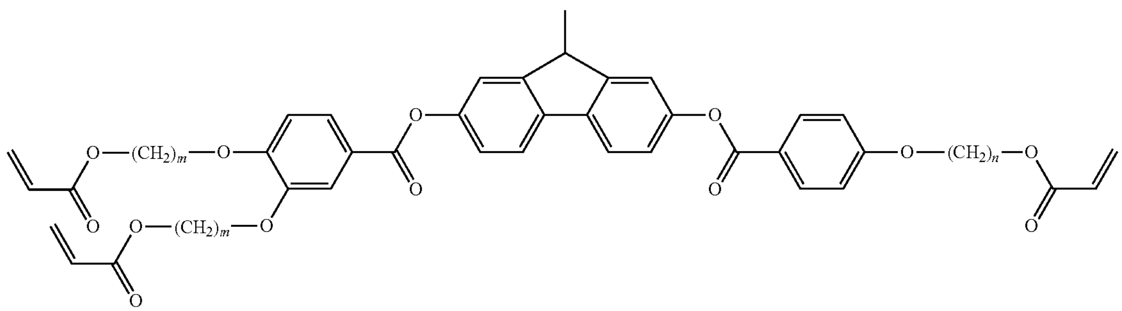
(4-b-24)
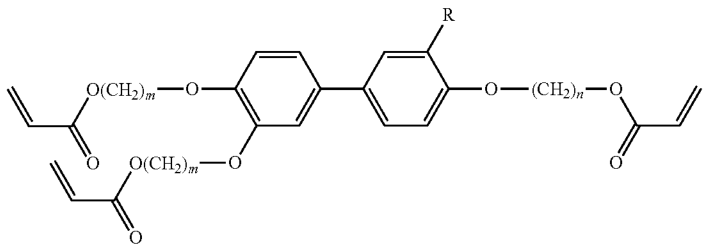
[Chem. 132]
(4-b-25)
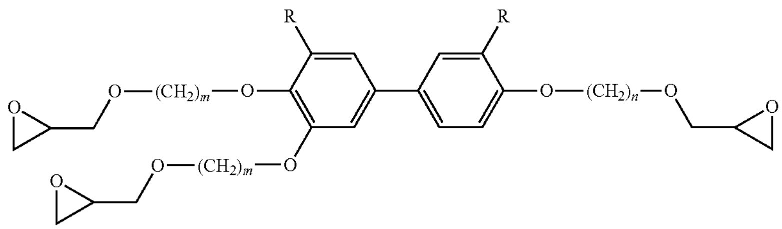
(4-b-26)
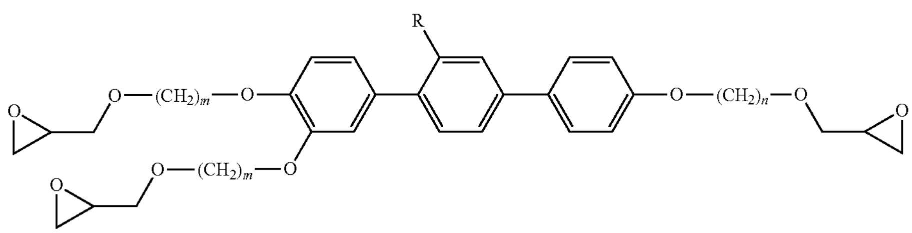
(4-b-27)
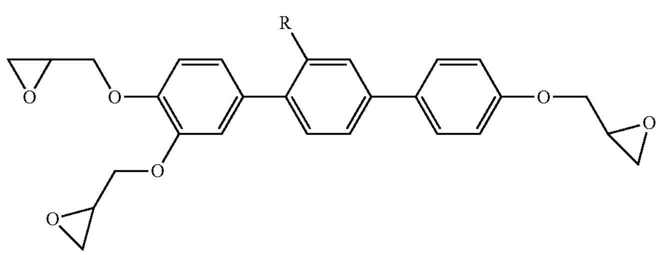
(4-b-28)
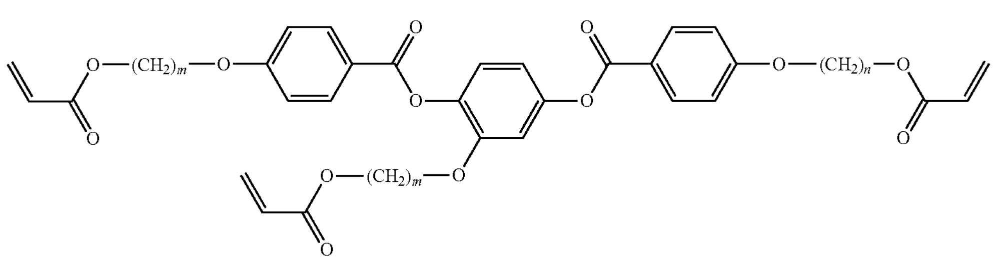

-continued (4-b-29)

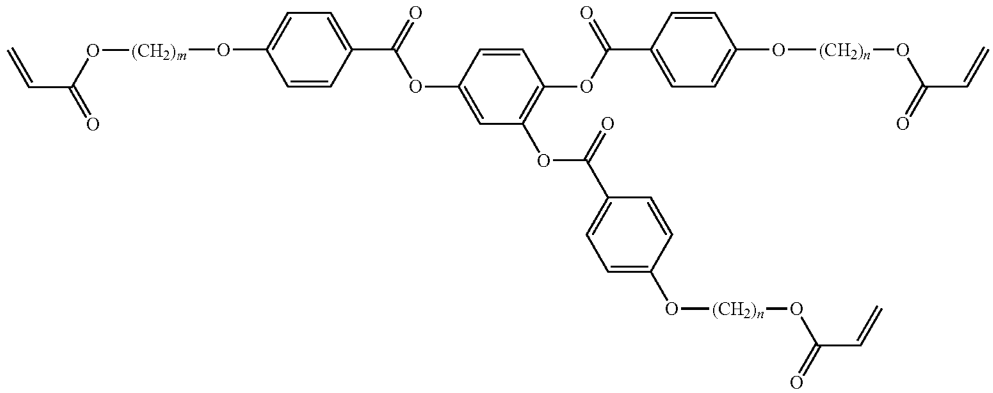

(In the formulae, m and n each independently represent an integer of 1 to 10. R represents a hydrogen atom, a halogen atom, an alkyl group having 1 to 6 carbon atoms, an alkoxy group having 1 to 6 carbon atoms, or a cyano group. In a case where these groups represent an alkyl group having 1 to 6 carbon atoms or an alkoxy group having 1 to 6 carbon atoms, all groups may be unsubstituted or substituted with one or two or more halogen atoms.)

These liquid crystalline compounds may be used alone or in combination of two or more kinds thereof.

Specific examples of the compound represented by Formula (5-b) include compounds represented by Formulae (5-b-1) to (5-b-26).

[Chem. 133]

(5-b-1)

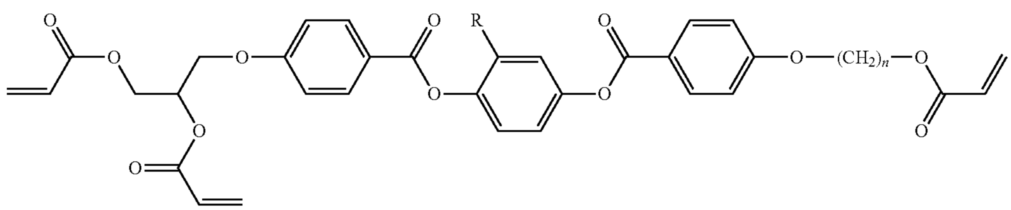

(5-b-2)

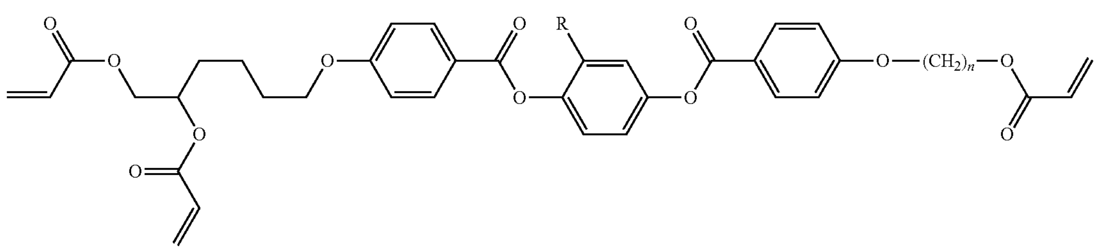

(5-b-3)

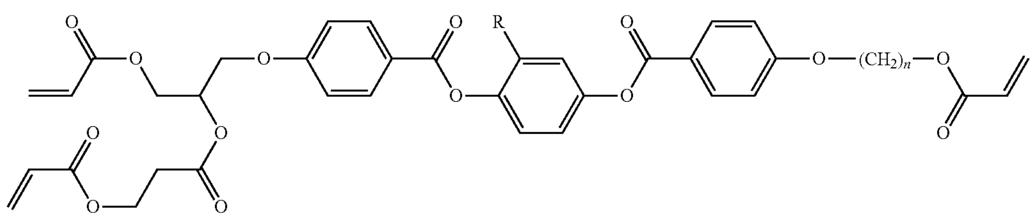

(5-b-4)

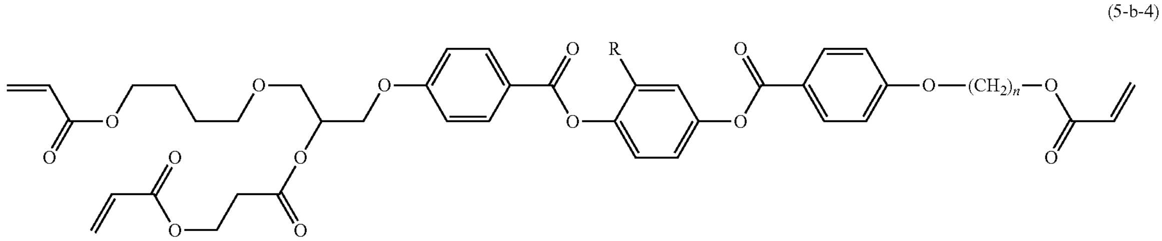

-continued
(5-b-5)
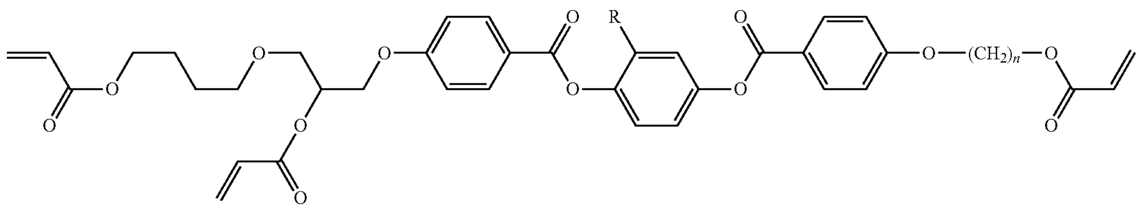
[Chem. 134]
(5-b-6)
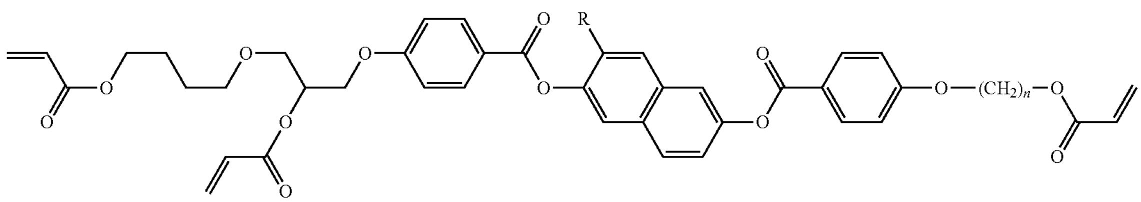
(5-b-7)
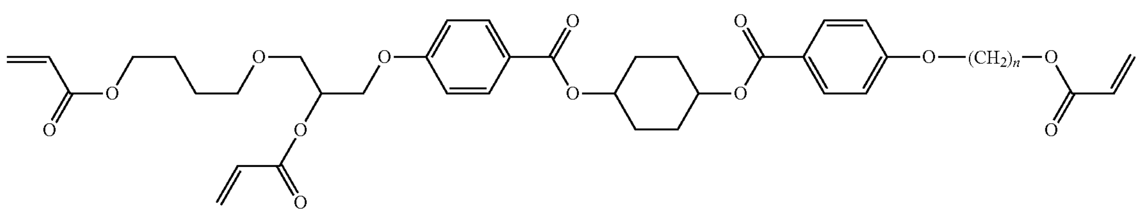
(5-b-8)
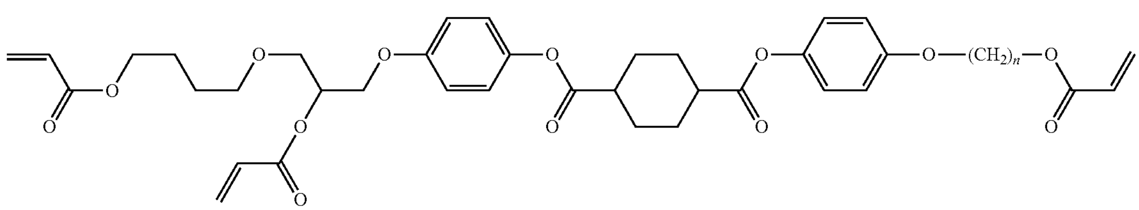
(5-b-9)
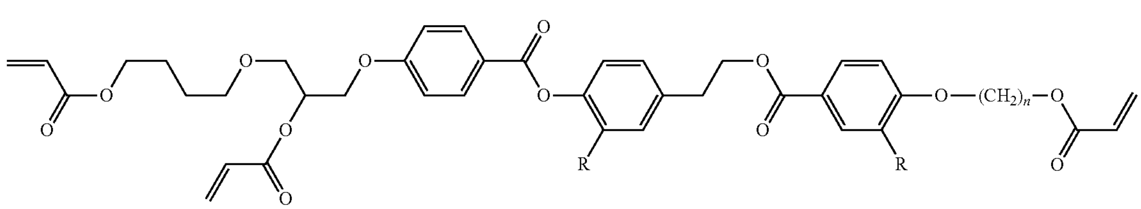
(5-b-10)
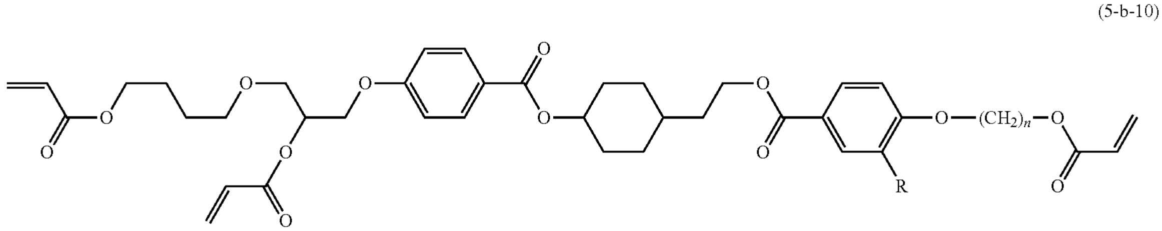

-continued
(5-b-11)
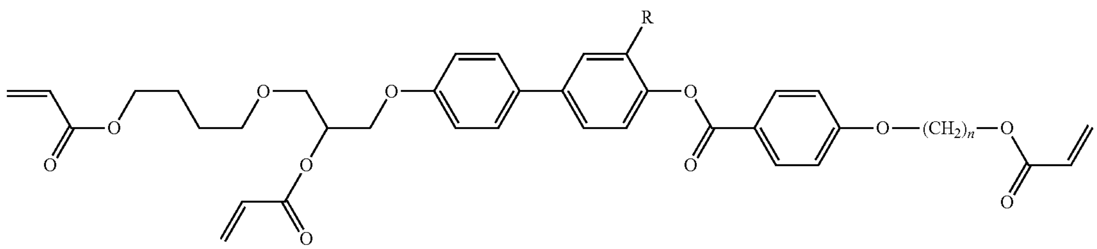
[Chem. 135]
(5-b-12)
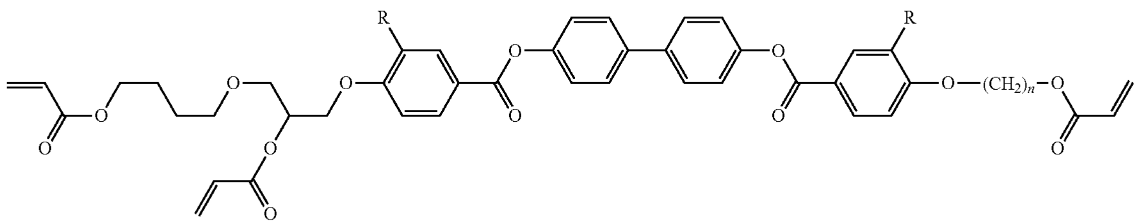
(5-b-13)
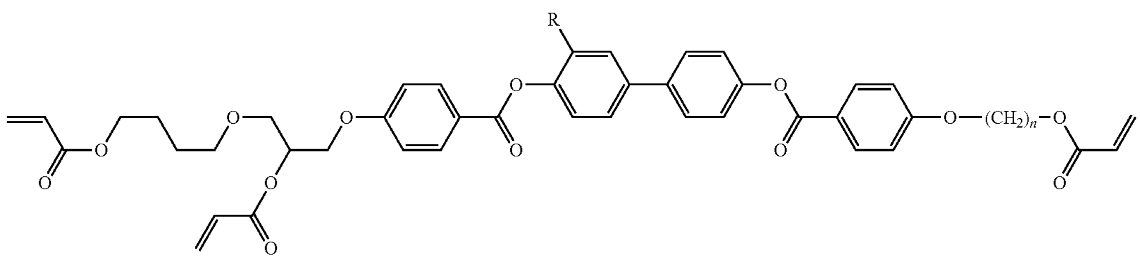
(5-b-14)
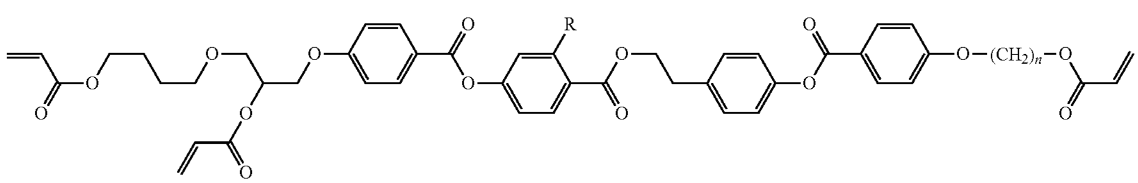
(5-b-15)
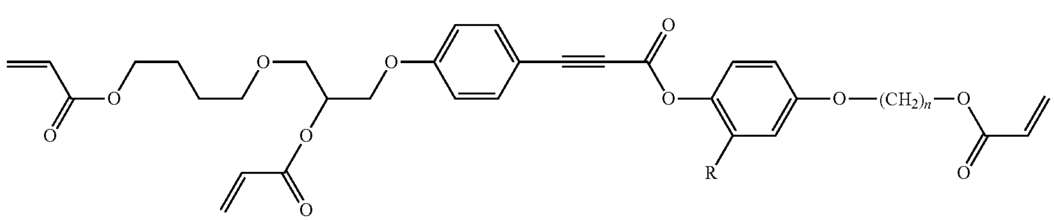
(5-b-16)
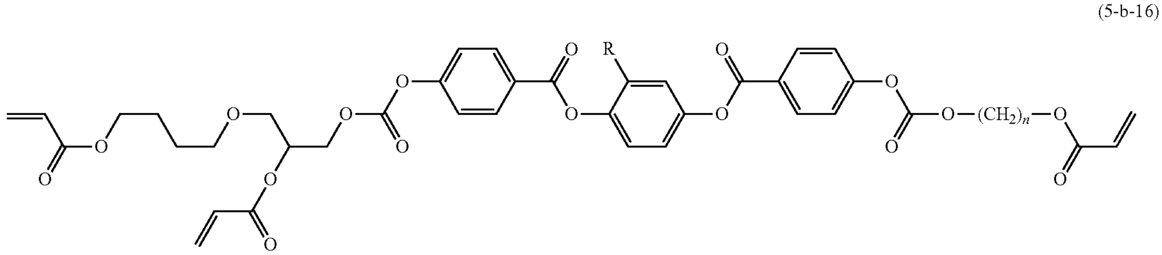

-continued
(5-b-17)
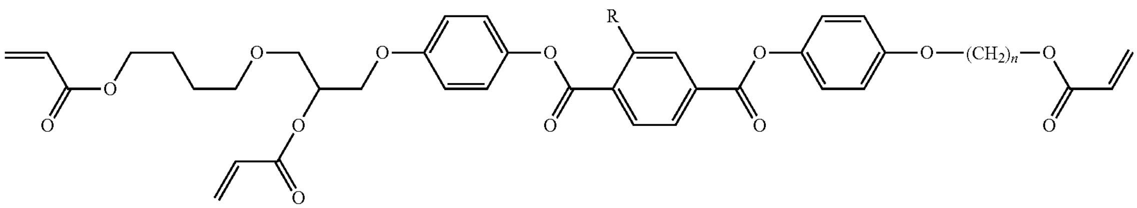
Chem. 136]
(5-b-18)
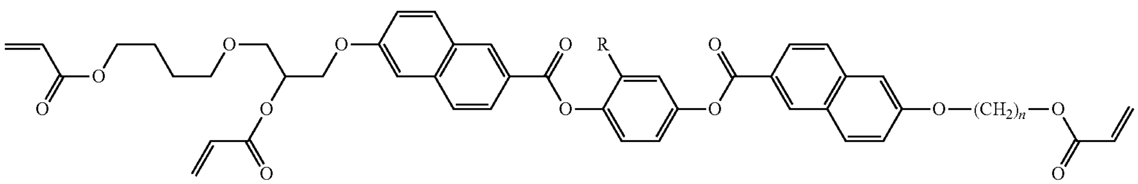
(5-b-19)
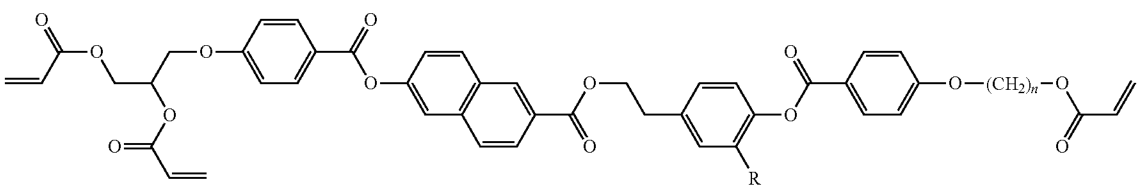
(5-b-20)
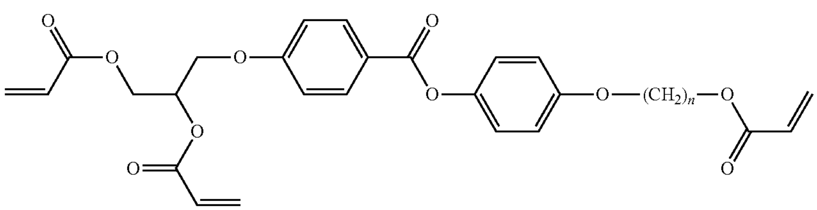
(5-b-21)
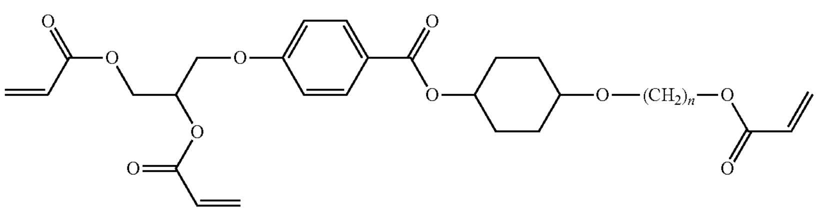
[Chem. 137]
(5-b-22)
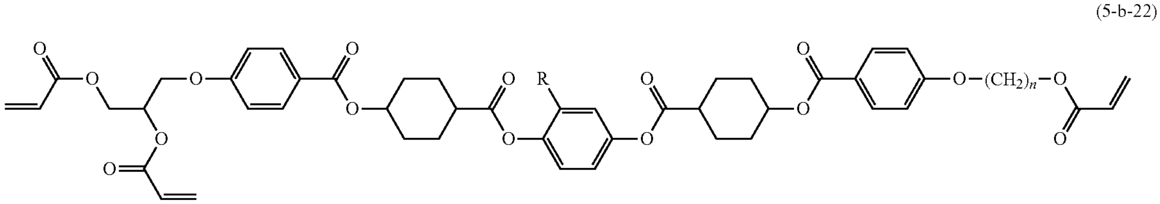
(5-b-23)
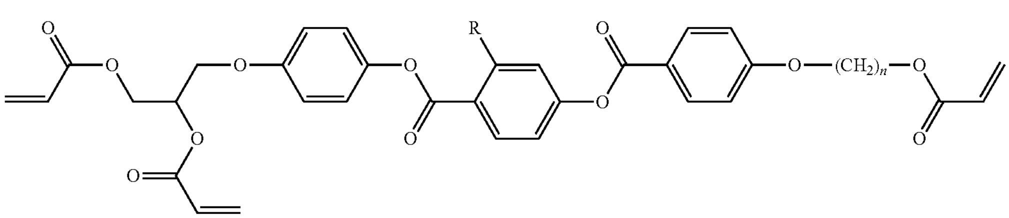

-continued (5-b-24)

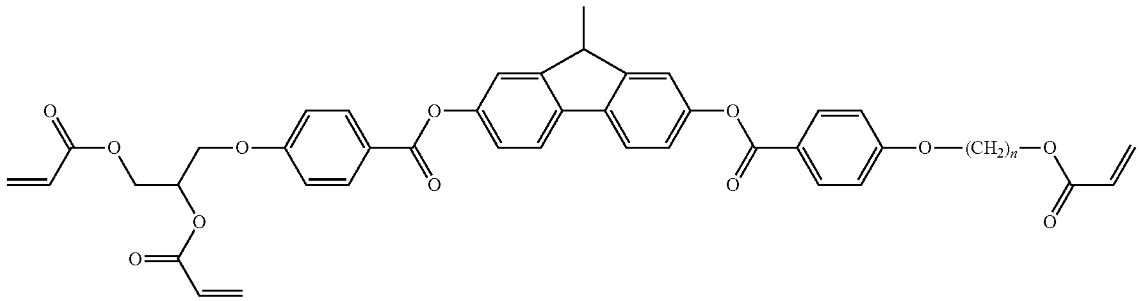

(5-b-25)

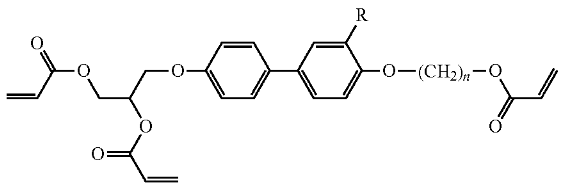

(5-b-26)

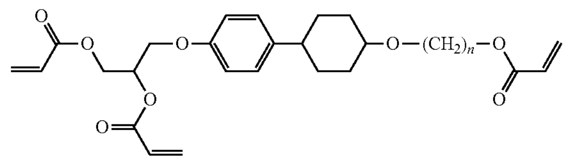

(In the formulae, n's each independently represent an integer of 1 to 10. R represents a hydrogen atom, a halogen atom, an alkyl group having 1 to 6 carbon atoms, an alkoxy group having 1 to 6 carbon atoms, or a cyano group. In a case where these groups represent an alkyl group having 1 to 6 carbon atoms or an alkoxy group having 1 to 6 carbon atoms, all groups may be unsubstituted or substituted with one or two or more of halogen atoms.)

These liquid crystalline compounds may be used alone or in combination of two or more kinds thereof.

Specific examples of the compound represented by Formula (6-b) include compounds represented by Formulae (6-b-1) to (6-b-23).

[Chem. 138]

(6-b-1)

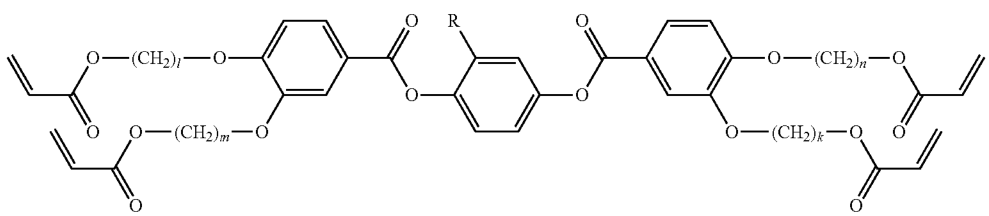

(6-b-2)

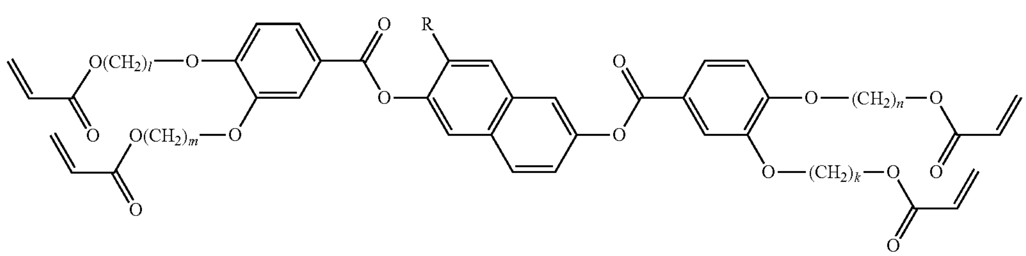

(6-b-3)

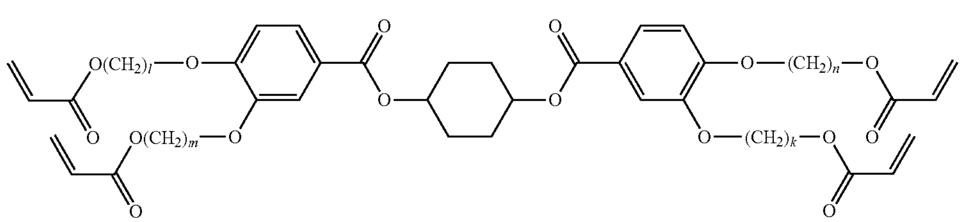

-continued
(6-b-4)
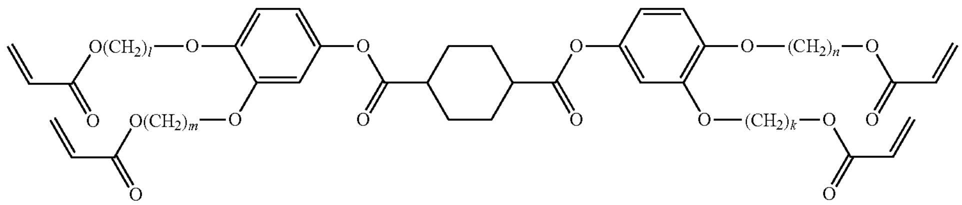
(6-b-5)
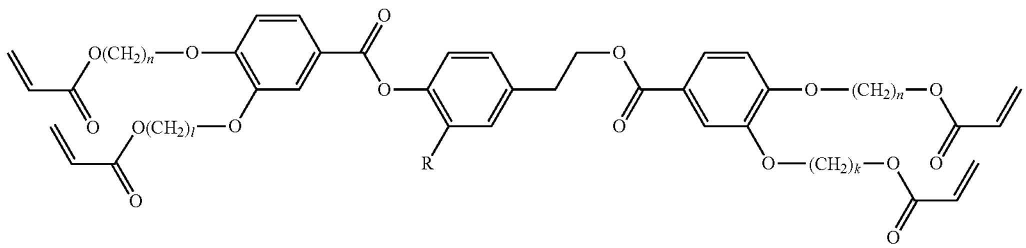
(6-b-6)
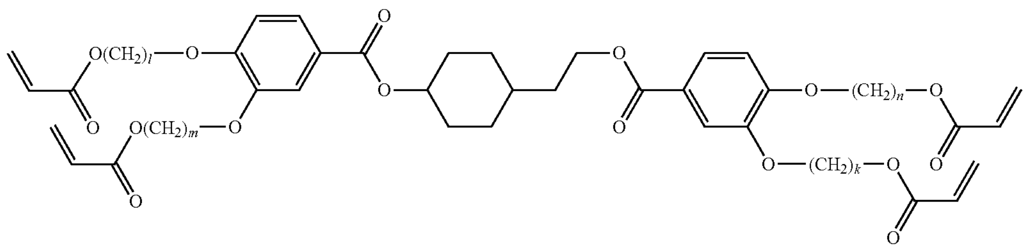
(6-b-7)
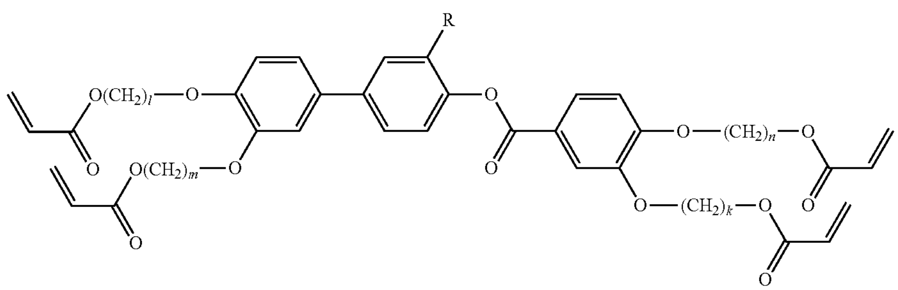
[Chem. 139]
(6-b-8)
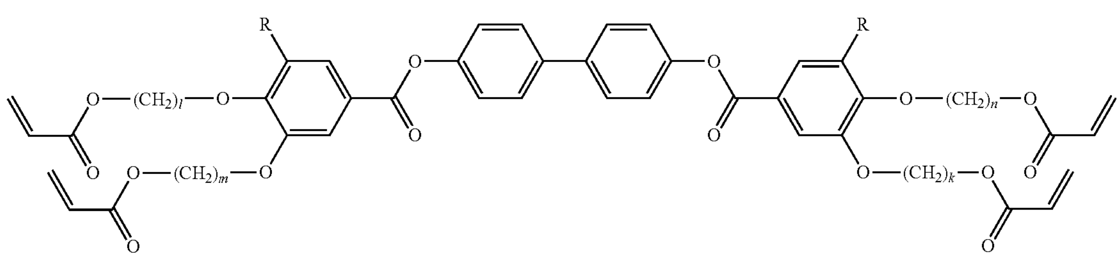
(6-b-9)
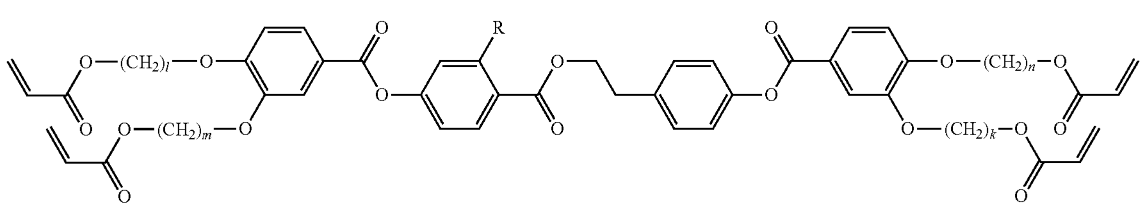

-continued
(6-b-10)
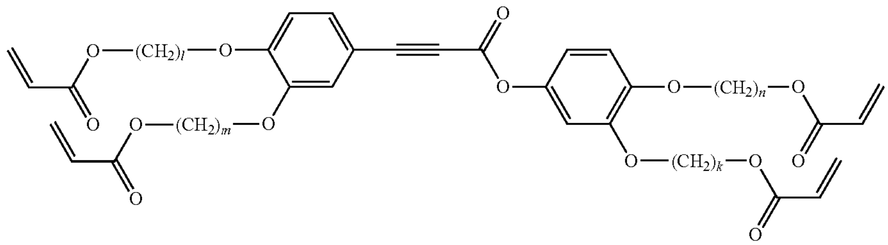
(6-b-11)
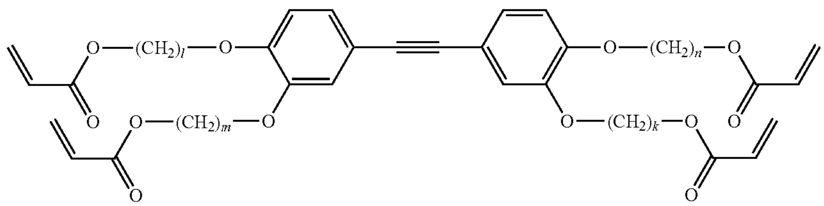
(6-b-12)
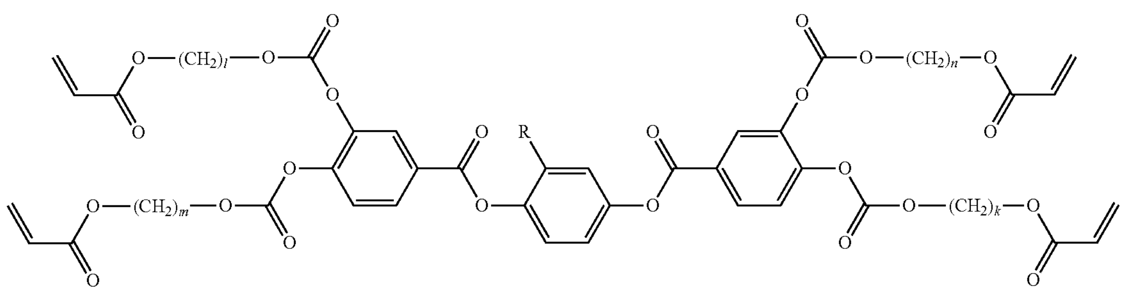
[Chem. 140]
(6-b-13)
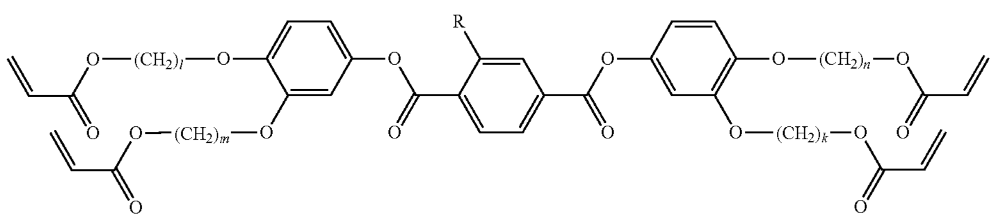
(6-b-14)
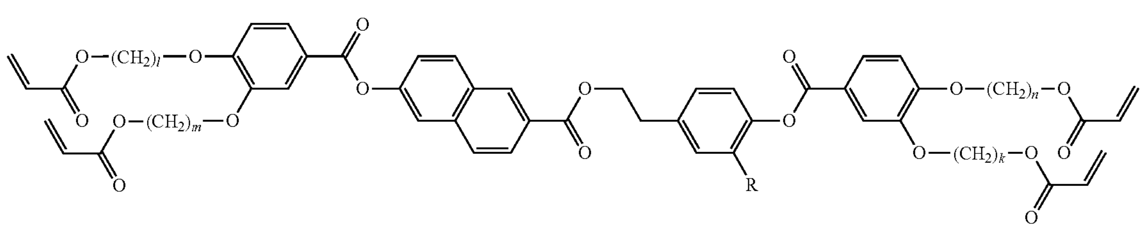
(6-b-15)
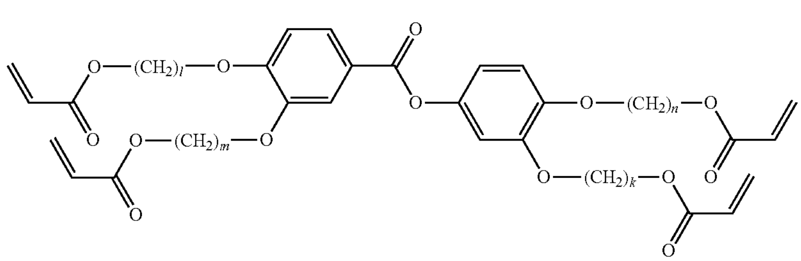

-continued
(6-b-16)
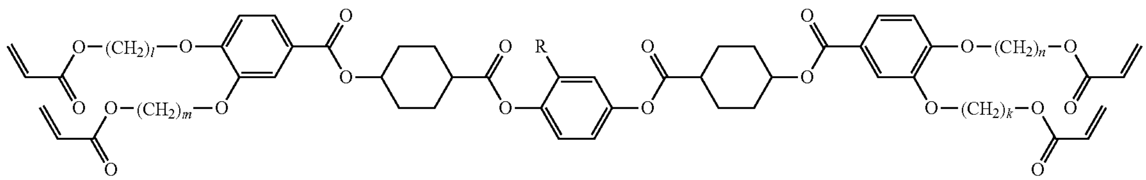
[Chem. 141]
(6-b-17)
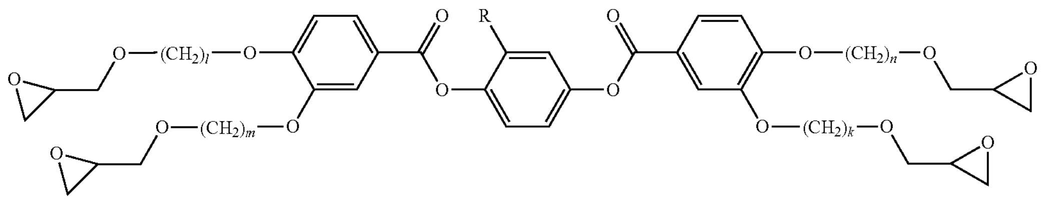
(6-b-18)
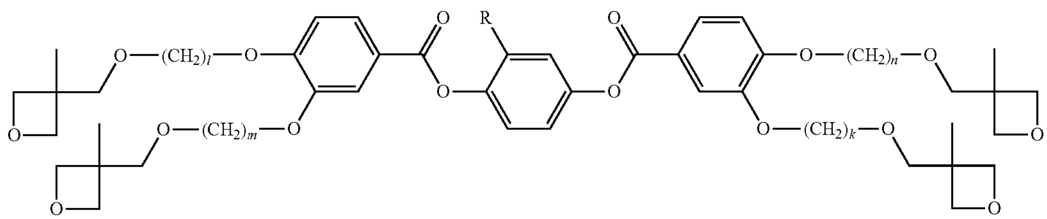
(6-b-19)
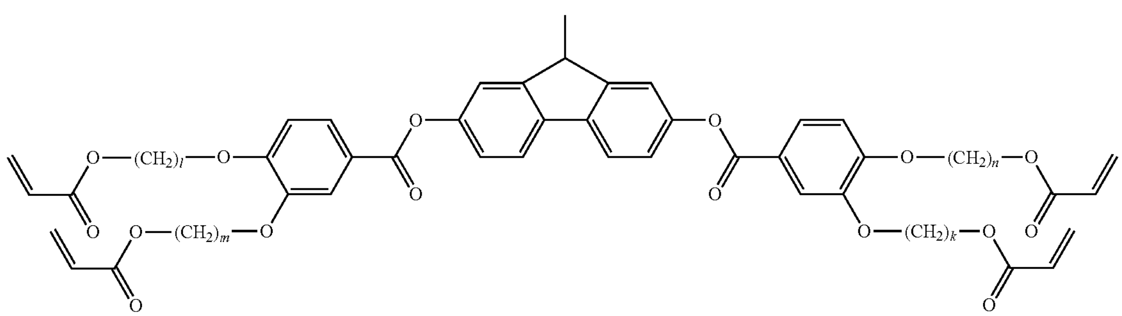
[Chem. 142]
(6-b-20)
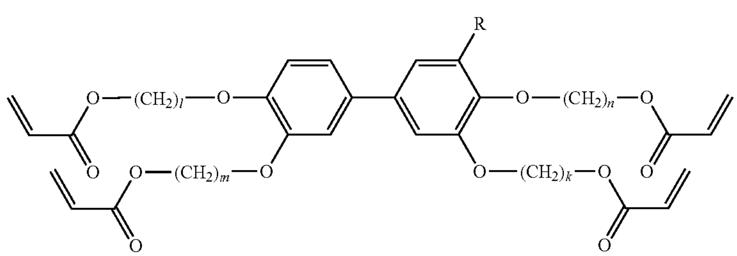
(6-b-21)
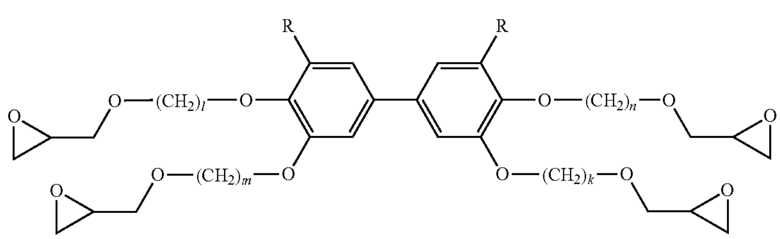

-continued (6-b-22)

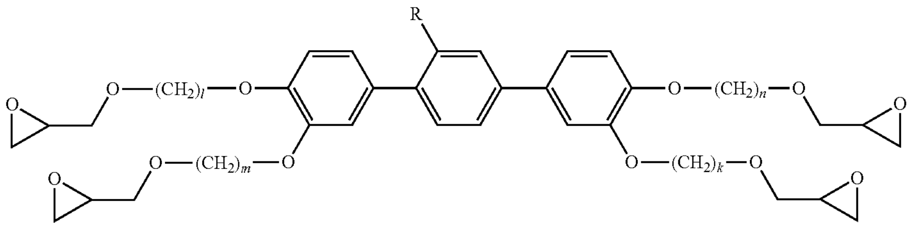

(6-b-23)

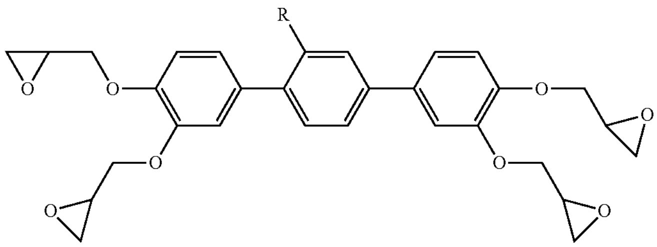

(In the formulae, k, l, m and n each independently represent an integer of 1 to 10. R represents a hydrogen atom, a halogen atom, an alkyl group having 1 to 6 carbon atoms, an alkoxy group having 1 to 6 carbon atoms, or a cyano group. In a case where these groups represent an alkyl group having 1 to 6 carbon atoms or an alkoxy group having 1 to 6 carbon atoms, all groups may be unsubstituted or substituted with one or two or more of halogen atoms.)

These liquid crystalline compounds may be used alone or in combination of two or more kinds thereof.

Specific examples of the compound represented by Formula (7-b) include compounds represented by Formulae (7-b-1) to (7-b-25).

[Chem. 143]

(7-b-1)

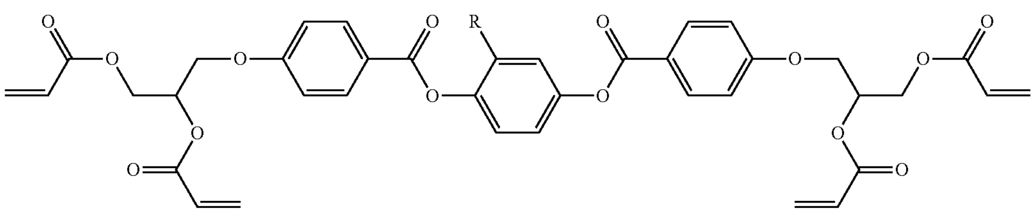

(7-b-2)

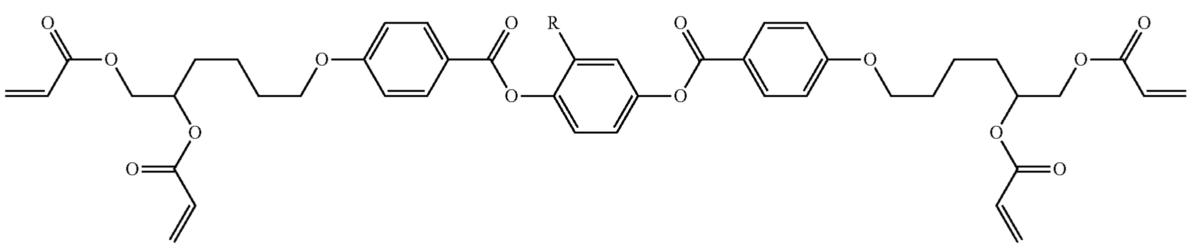

(7-b-3)

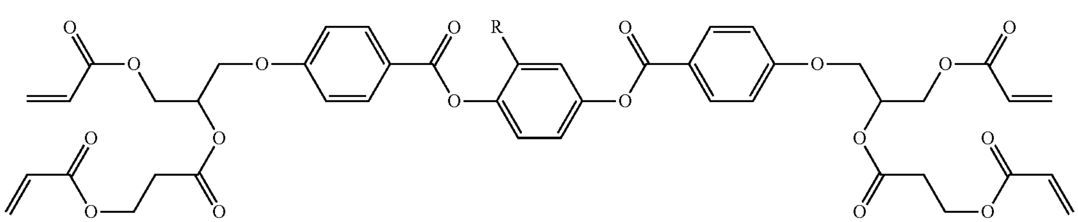

-continued
(7-b-4)
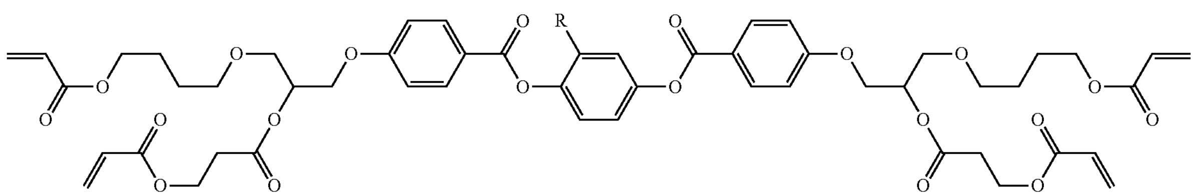
(7-b-5)
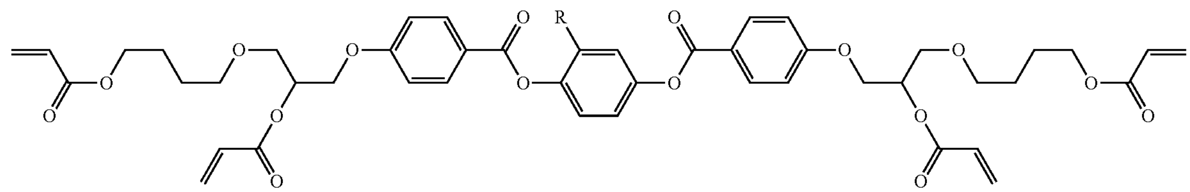
(7-b-6)
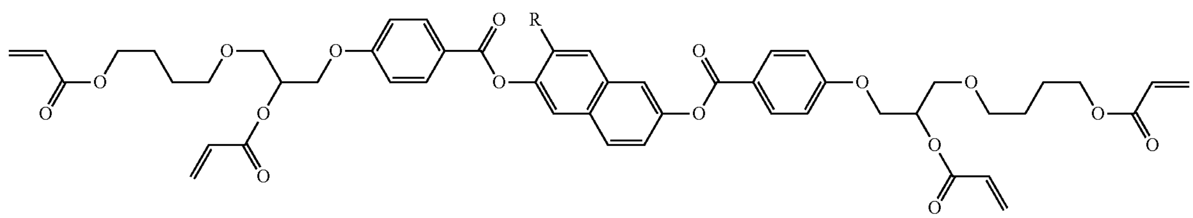
[Chem. 144]
(7-b-7)
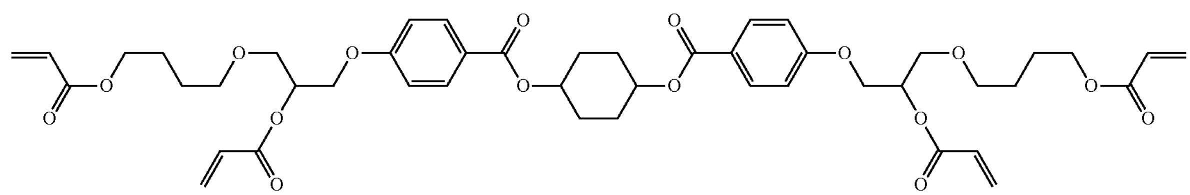
(7-b-8)
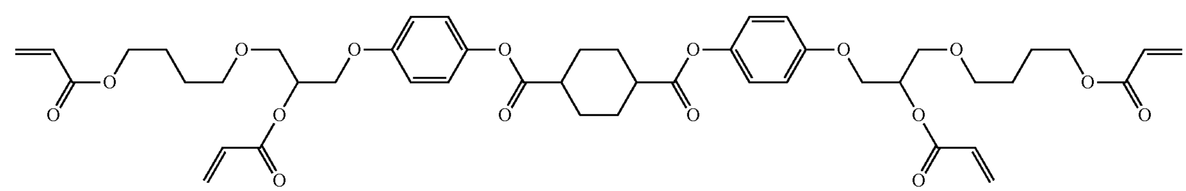
(7-b-9)
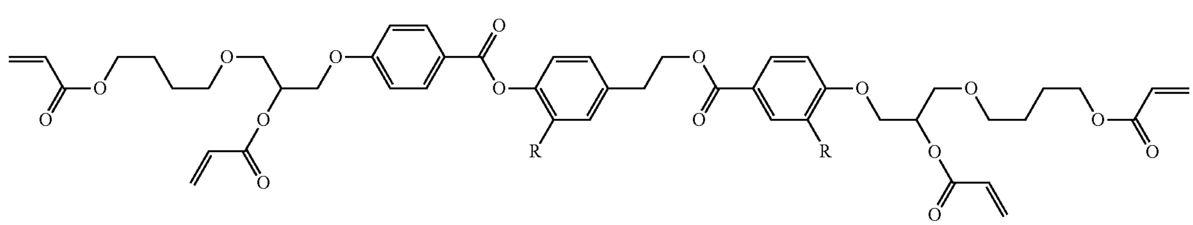
(7-b-10)
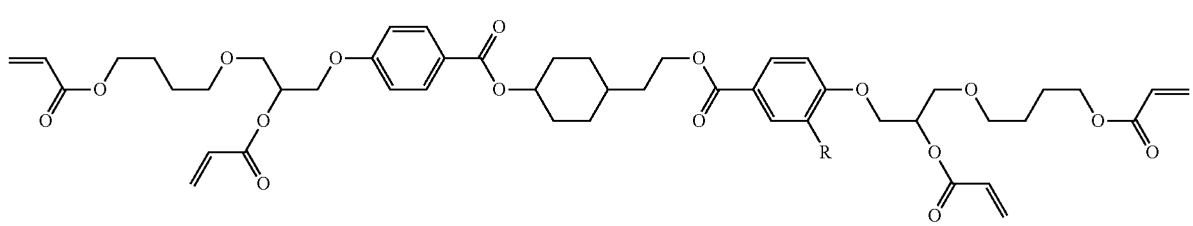

-continued
(7-b-11)
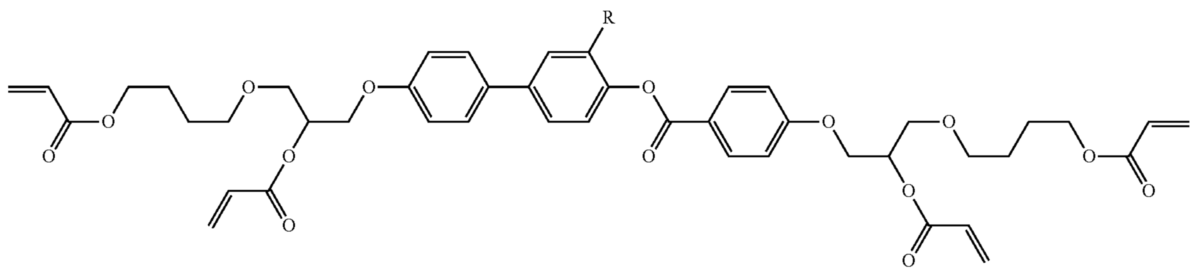
(7-b-12)
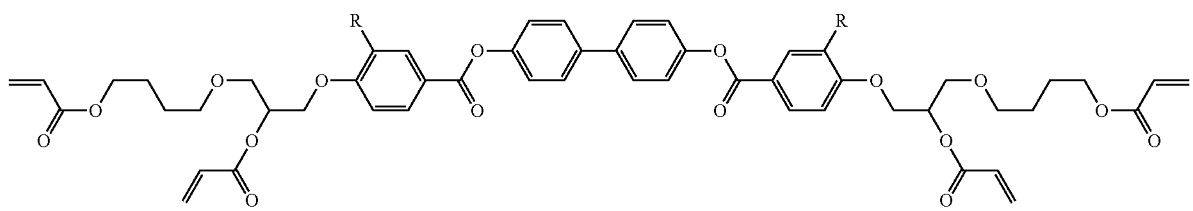
[Chem. 145]
(7-b-13)
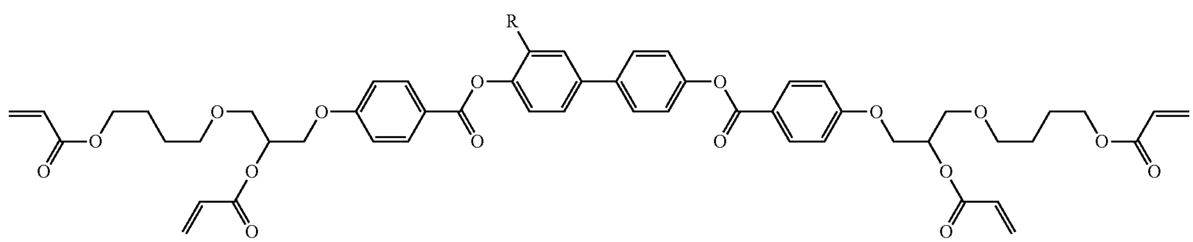
(7-b-14)
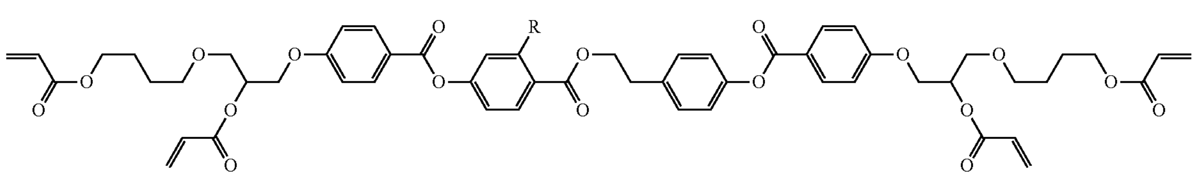
(7-b-15)
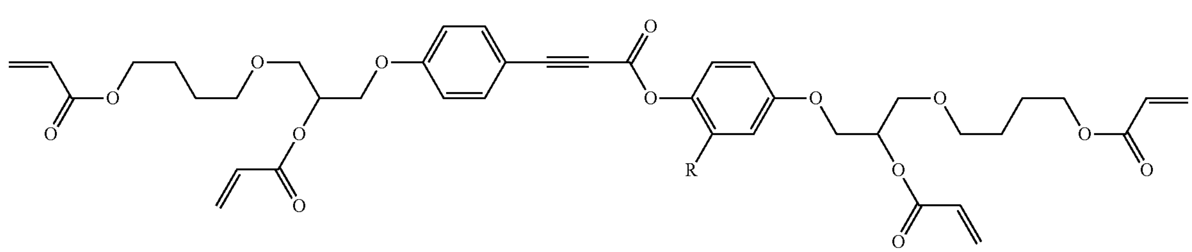
(7-b-16)
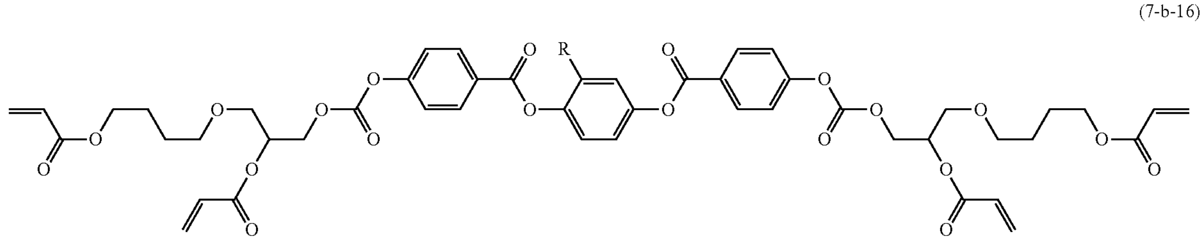

-continued
(7-b-17)
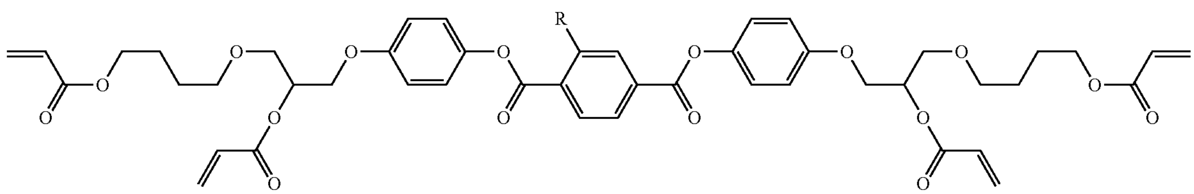
(7-b-18)
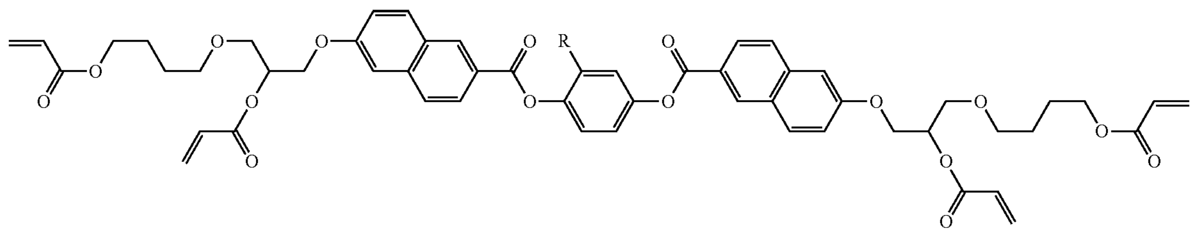
Chem. 146]
(7-b-19)
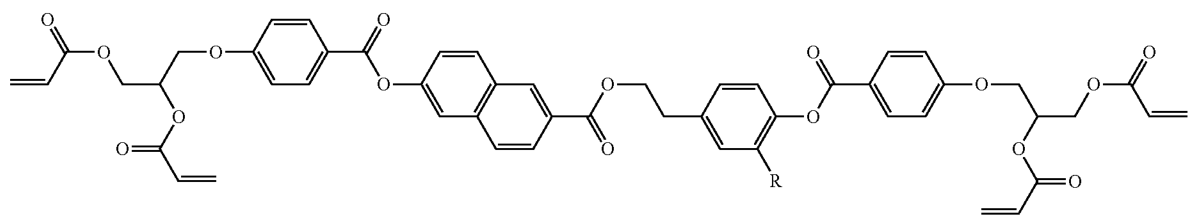
(7-b-20)
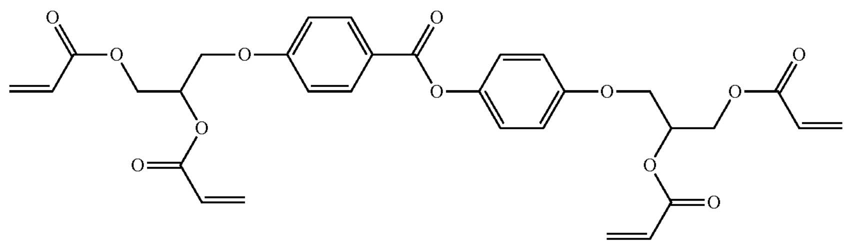
(7-b-21)
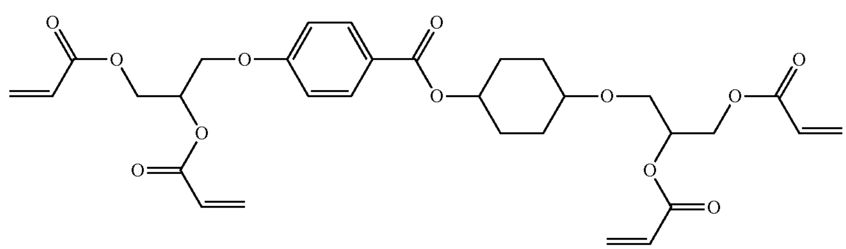
(7-b-22)
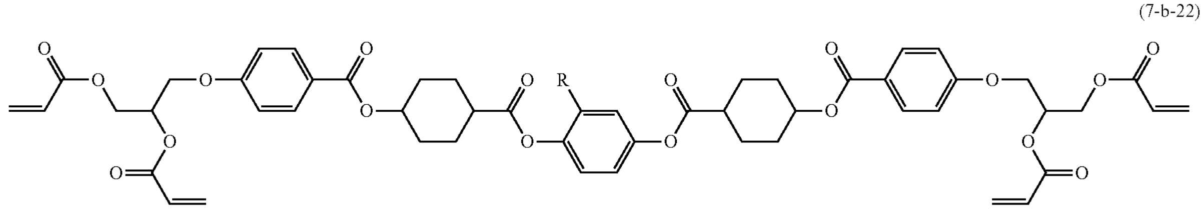

-continued (7-b-23)

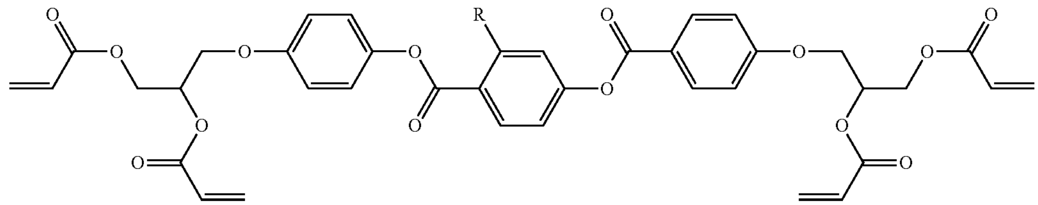

(7-b-24)

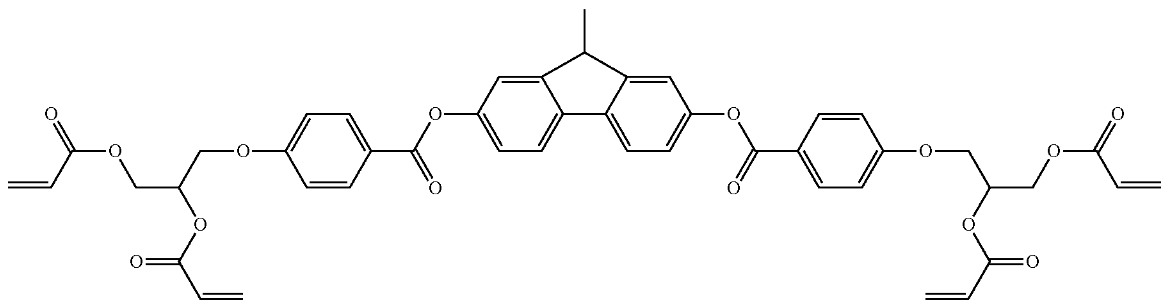

(7-b-25)

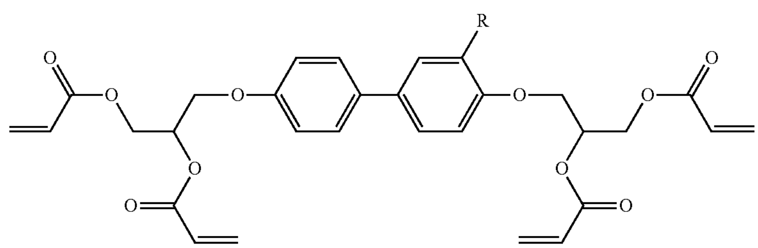

(In the formulae, R represents a hydrogen atom, a halogen atom, an alkyl group having 1 to 6 carbon atoms, an alkoxy group having 1 to 6 carbon atoms, or a cyano group. In a case where these groups represent an alkyl group having 1 to 6 carbon atoms or an alkoxy group having 1 to 6 carbon atoms, all groups may be unsubstituted or substituted with one or two or more of halogen atoms.)

These liquid crystalline compounds may be used alone or in combination of two or more kinds thereof.

<Alignment Material>

The polymerizable liquid crystal composition used in the present invention may contain an alignment material that, improves alignment properties in order to improve alignment properties. Conventionally known one can be used as the alignment material as long as the material is soluble in a solvent that dissolves the liquid crystalline compound containing a polymerizable group, which is used for the polymerizable composition of the present invention, and the alignment material can be added within the range that does not significantly degrade the alignment properties through addition. Specifically, the amount of the alignment material is preferably 0.05% to 30% by weight, more preferably 0.5% to 15% by weight, and particularly preferably 1% to 10% by weight with respect to the total amount, of the polymerizable liquid crystal compound contained in the polymerizable liquid crystal composition.

Specific examples of the alignment material include photoisomerizing or photodimerizing compounds such as polyimide, polyamide, a benzocyclobutene (BCB) polymer, polyvinyl alcohol, polycarbonate, polystyrene, polyphenylene ether, polyarylate, polyethylene terephthalate, polyether sulfone, an epoxy resin, an epoxy acrylate resin, an acrylic resin, a coumarin compound, a chalcone compound, a cinnamate compound, a fulgide compound, an anthraquinone compound, an azo compound, and an aryl ethene compound. Further, materials (photo-alignment materials) that are aligned by irradiation with ultraviolet rays or irradiation with visible light are preferable.

Examples of the photo-alignment materials include polyimide having cyclic cycloalkane, wholly aromatic polyarylate, polyvinyl cinnamate described in JP-A-5-232473, polyvinyl ester of paramethoxycinnamic acid, a cinnamate derivative described in JP-A-06-237453 and JP-06-239374, and a maleimide derivative described in JP-A-200-265541. Specifically, compounds represented by Formulae (12-1) to (12-7) are preferable.

[Chem. 147]

(12-1)

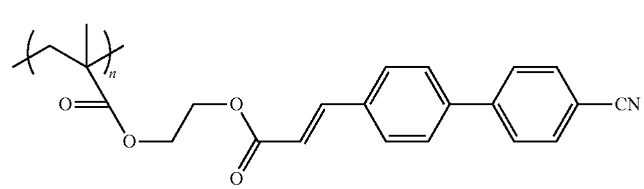

-continued (12-2)

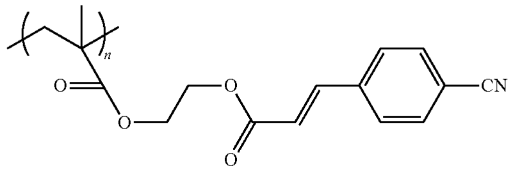

(12-3)

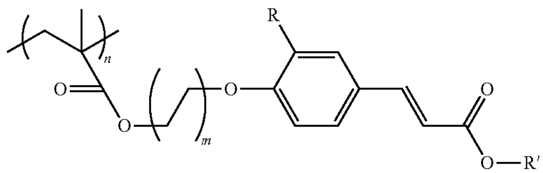

(12-4)

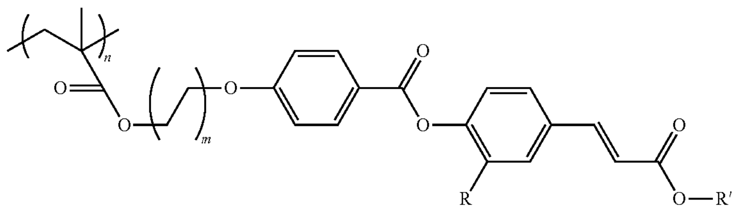

(12-5)

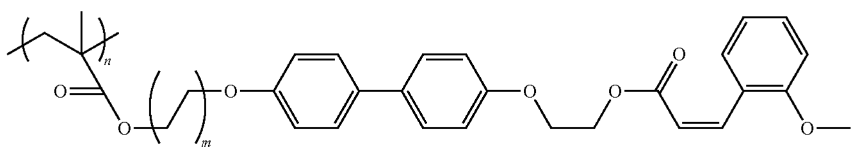

(12-6)

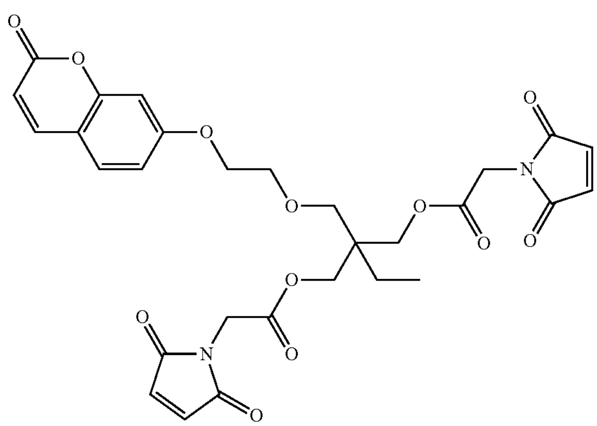

(12-7)

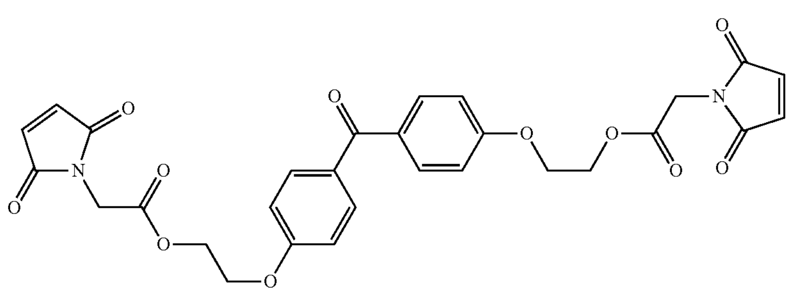

(R represents a hydrogen atom, a halogen atom, an alkyl group having 1 to 3 carbon atoms, an alkoxy group, or a nitro group, R' represents a hydrogen atom or an alkyl group having 1 to 10 carbon atoms, the alkyl group may be linear or branched, one or more of arbitrary hydrogen atoms in the alkyl group may be substituted with a fluorine atom, one —$CH_2$— or two or more of (—$CH_2$—)'s which are not adjacent to each other in the alkyl group may be each independently substituted with —O—, —S—, —CO—, —COO—, —OCO—, —CO—S—, —S—CO—, —O—CO—O—, —CO—NH—, —NH—CO—, or —C≡C—, and $CH_3$ at the terminal may be substituted with $CF_3$, $CCl_3$, a cyano group, a nitro group, an isocyano group, a thioisocyano group. n represents an integer of 4 to 100,000 and m represents an integer of 1 to 10.)

<Base Material>

A base material formed by laminating the retardation plate 1 and the retardation plate 2 used in the present invention is a base material that is typically used for a liquid crystal display element, an organic light-emitting display element, other display elements, an optical component, a colorant, a marker, printed matter, or an optical film and is not particularly limited as long as the material has heat resistance so that the material can withstand heating during the drying after the application of the polymerizable liquid crystal composition. Examples of such a base material include organic materials such as a glass base material, a metal base material, a ceramic base material, a plastic base material, and paper. Particularly in a case where the base material is an organic material, examples of the organic material include a cellulose derivative, polyolefin, polyester, polyolefin, polycarbonate, polyacrylate, polyarylate, polyether sulfone, polyimide, polyphenylene sulfide, polyphenylene ether, nylon, and polystyrene. Among these, plastic base materials such as polyester, polystyrene, polyolefin, a cellulose derivative, polyarylate, and polycarbonate are preferable. As the shape of the base material, a base material having a curved surface may be used in addition to a flat plate. These base materials may be uniaxially stretched or biaxially stretched or may have an electrode layer, an anti-reflection function, or a reflection function as necessary.

In order to improve the coating properties of the polymerizable liquid crystal composition or the adhesiveness between the base material and the polymer, the base material may be subjected to a surface treatment. Examples of the surface treatment include an ozone treatment, a plasma treatment, a corona treatment, and a silane coupling treatment. Further, in order to adjust the transmittance or reflectance of light, an organic thin film, an inorganic oxide thin film, or a metal thin film may be provided on the surface of the base material according to a vapor deposition method. Alternatively, the base material may be a pickup lens, a rod lens, an optical disc, a retardation film, a light diffusion film, or a color filter in order to add the optical added value. Among these, a pickup lens, a retardation film, a light diffusion film, and a color filter that increase the added value are preferable.

<Alignment Treatment>

Further, the base material may be subjected to a typical alignment treatment or provided with an alignment film so that the liquid crystalline compound is aligned when the polymerizable liquid crystal composition is applied and dried. Examples of the alignment treatment include a stretching treatment, a rubbing treatment, a polarized ultraviolet visible light irradiation treatment, an ion beam treatment, and an oblique vapor deposition treatment of $SiO_2$ performed on a base material. In a case of using an alignment film, conventionally known alignment films are used. Examples of such alignment films include compounds such as polyimide, polysiloxane, polyamide, polyvinyl alcohol, polycarbonate, polystyrene, polyphenylene ether, polyarylate, polyethylene terephthalate, polyether sulfone, an epoxy resin, an epoxy acrylate resin, an acrylic resin, an azo compound, a coumarin compound, a chalcone compound, a cinnamate compound, a fulgide compound, an anthraquinone compound, an azo compound, and an aryl ethene compound and polymers or copolymers of these compounds. As a compound that is subjected to an alignment treatment through rubbing, a compound that promotes crystallization of a material by performing a heating process during or after the alignment treatment is preferable. Among the compounds that are subjected to alignment treatments other than the rubbing treatment, compounds for which photo-alignment materials are used are preferable.

In a case where the liquid crystal composition is brought into contact with a substrate having an alignment function, liquid crystal molecules are aligned along a direction in which the substrate has been subjected to the alignment treatment in the vicinity of the substrate. The method of the alignment treatment performed on the substrate greatly affects whether the liquid crystal molecules are aligned horizontally to the substrate or aligned obliquely or vertically to the base material. For example, a polymerizable liquid crystal layer that is aligned substantially horizontal is obtained when an alignment film having an extremely small tilt angle, such as a film used for an in-plane switching (IPS) type liquid crystal display element, is provided on the substrate.

Further, in a case where an alignment film, such as a film used for a TN type liquid crystal display element, is provided on the substrate, a polymerizable liquid crystal layer that is slightly obliquely aligned is obtained. In a case where an alignment film, such as a film used for an STN type liquid crystal display element, is used, a polymerizable liquid crystal layer that is largely obliquely aligned is obtained.

<Coating>

As a coating method of the polymerizable liquid crystal composition that forms the retardation plate 1 and the retardation plate 2 used in the present invention, conventionally known methods such as an applicator method, a bar coating method, a spin coating method, a roll coating method, a direct gravure coating method, a reverse gravure coating method, a flexo coating method, an ink jet method, a die coating method, a cap coating method, a dip coating method, a slit coating method, and a spray coating method can be used. The polymerizable liquid crystal composition is dried after the coating.

After the coating, it is preferable that the liquid crystal molecules of the polymerizable liquid crystal composition are uniformly aligned in a state of a smectic phase or a nematic phase being maintained. As an example for this, a heat treatment method may be exemplified. Specifically, the substrate is coated with the polymerizable liquid crystal composition of the present invention, the polymerizable liquid crystal composition is heated at an N (nematic phase)-I (isotropic liquid phase) transition temperature (hereinafter, abbreviated as the N-I transition temperature) of the liquid crystal composition or higher so that the liquid crystal composition enters an isotropic phase liquid state. Thereafter, the resultant is gradually cooled to exhibit a nematic phase. At this time, it is desirable that a liquid crystal phase domain is allowed to be sufficiently grown to obtain a monodomain by temporarily maintaining the temperature at which a liquid crystal phase appears. Alternatively, after the substrate is coated with the polymerizable liquid crystal composition of the present invention, the polymerizable liquid crystal composition may be subjected to a heat treatment of maintaining the temperature range, in which a nematic phase of the polymerizable liquid crystal appears, for a certain period of time.

When the heating temperature is extremely high, there is a concern that, the polymerizable liquid crystal may undergo an undesirable polymerizable reaction and deteriorate. Further, when the polymerizable liquid crystal is extremely cooled, phase separation occurs in the polymerizable liquid crystal, crystals are precipitated, and a high-order liquid crystal phase such as a smectic phase appears. Therefore, the alignment treatment may not be performed.

A homogeneous optically anisotropic material with few alignment defects can be prepared by performing such a heat treatment, compared to a coating method of only performing coating.

After the homogeneous alignment treatment is performed as described above, when the liquid crystal phase is cooled at the lowest temperature at which phase separation does not occur, in other words, the liquid crystal phase is cooled to enter a supercooled state, and polymerization is carried out in a state in which the liquid crystal phase is aligned at the temperature, a retardation plate having a higher alignment order and excellent transparency can be obtained.

<Polymerization Process>

The polymerization treatment may be performed on the dried polymerizable liquid crystal composition typically by irradiation with light such as visible ultraviolet rays or by heating in a uniformly aligned state. In a case where the polymerization is performed by irradiation with light, it is preferable that visible ultraviolet light having a wavelength of 420 nm or less is applied and most preferable that ultraviolet light having a wavelength of 250 to 370 nm is applied. Here, in a case where decomposition or the like of the polymerizable liquid crystal is caused by visible ultraviolet light having a wavelength of 420 nm or less, it is preferable that a polymerization treatment is performed using visible ultraviolet light having a wavelength of 420 nm or greater in some cases.

<Polymerization Method>

As a method of polymerizing the polymerizable liquid crystal composition that forms the retardation plate 1 and the retardation plate 2 used in the present invention, a method of applying active energy rays or a thermal polymerization method is exemplified. From the viewpoint that heating is not necessary and the reaction proceeds at room temperature, a method of applying active energy rays is preferable. Among the examples thereof, from the viewpoint of a simple operation, a method of applying light such as ultraviolet rays or the like is preferable. The application temperature is set to a temperature at which the liquid crystal phase of the polymerizable liquid crystal composition can be maintained, and it is preferable that the temperature thereof is set to 30° C. or lower as much as possible in order to avoid induction of thermal polymerization of the polymerizable liquid crystal. Further, the polymerizable liquid crystal composition typically exhibits the liquid crystal phase in the process of raising the temperature, within the N-I transition temperature range from a C (solid phase)-N (nematic) transition temperature (hereinafter, abbreviated as the C-N transition temperature). Further, the polymerizable liquid crystal composition occasionally maintains the liquid crystal state thereof without being solidified at the C-N transition temperature or lower in the process of lowering the temperature, in order to obtain a thermodynamically non-equilibrium state. This state is referred to as a supercooled state. In the present invention, it can be said that the liquid crystal composition in the supercooled state is also in the state of maintaining the liquid crystal phase. Specifically, it is preferable to irradiate with ultraviolet light having a wavelength of 390 nm or less and most preferable to irradiate with light having a wavelength of 250 to 370 nm. In a case where decomposition or the like of the polymerizable liquid crystal is caused by the irradiation with ultraviolet light having a wavelength of 390 nm or less, if is preferable that the polymerization treatment is performed using ultraviolet light having a wavelength of 390 nm or greater in some cases. As this light, it is preferable to use diffusion light and non-polarized light. The intensity of irradiation with ultraviolet rays is preferably 0.05 $kW/m^2$ to 10 $kW/m^2$ and particularly preferably 0.2 $kW/m^2$, to 2 $kW/m^2$. In a case where the intensity of ultraviolet rays is less than 0.05 $kW/m^2$, it takes a long time to complete the polymerization. In addition, in a case where the intensity of ultraviolet rays is greater than 2 $kW/m^2$, there is a possibility that the liquid crystal molecules in the polymerizable liquid crystal composition tend to be photodecomposed, a large amount of polymerization heat is generated so that the temperature during the polymerization increases, the order parameter of the polymerizable liquid crystal composition changes, and the phase difference of the retardation plate after the polymerization deviates.

After only a specific portion is polymerized by irradiation with ultraviolet rays using a mask, when the alignment state of the unpolymerized portion is changed by applying an electric field or a magnetic field or raising the temperature and then the unpolymerized portion is polymerized, a retardation plate having a plurality of regions with different alignment directions can be obtained.

Further, a retardation plate having a plurality of regions with different alignment directions can also be obtained by means of restricting the alignment by applying an electric field or a magnetic field or raising temperature to the polymerizable liquid crystal composition in an unpolymerized state in advance and then polymerizing the unpolymerized portion by irradiation with light from the upper portion of a mask while the state is maintained when only a specific portion is polymerized by irradiation with ultraviolet rays using a mask.

An optically anisotropic material obtained by polymerizing the polymerizable liquid crystal composition of the present invention can be used alone by being peeled off from the substrate or can be used as it is without being peeled off from the substrate. Particularly, since other members are unlikely to be contaminated by the optically anisotropic material, it is useful that the optically anisotropic material is used as a substrate to be laminated or used by being bonded to another substrate.

<Lamination Method>

The process of laminating the retardation plate 1 and the retardation plate 2 used in the present invention is as follows. In other words, a rubbing treatment or an alignment treatment of laminating a photo-alignment film is performed on the base material, the polymerizable liquid crystal composition that forms the retardation plate 2 is applied, dried, and then polymerized, a rubbing treatment or an alignment treatment of laminating a photo-alignment film is performed on the formed retardation plate 2, and the polymerizable liquid crystal composition that forms the retardation plate 1 is applied, dried, and then polymerized. Alternatively, a rubbing treatment or an alignment treatment of laminating a photo-alignment film is performed on the base material, the polymerizable liquid crystal composition that forms the retardation plate 1 is applied, dried, and then polymerized, a rubbing treatment or an alignment treatment of laminating a photo-alignment film is performed on the formed retardation plate 1, and the polymerizable liquid crystal composition that forms the retardation plate 2 is applied, dried, and then polymerized. Alternatively, a rubbing treatment or an alignment treatment of laminating a photo-alignment film is performed on the base material, the polymerizable liquid crystal composition that forms the retardation plate 1 is applied, dried, and then polymerized, a rubbing treatment, or an alignment treatment of laminating a photo-alignment film is performed on a side of the base material opposite to the retardation plate 2, and the polymerizable liquid crystal composition that forms the retardation plate 2 is applied, dried, and then polymerized. The laminated retardation plate 1 and retardation plate 2 are transferred to a polarizing plate, a light-guiding plate, a brightness-enhanced film, a color filter, a display element substrate, a protective film, an anti-glare film, an anti-reflection film, a light-emitting element substrate, and the like to use the retardation plates in a state of being peeled off from the base material. Particularly, since other members are unlikely to be contaminated, it is useful that the retardation plate is used as a substrate to be laminated or used by being bonded to another substrate.

Since the retardation plate 1 and/or the retardation plate 2 used in the present invention is formed of the polymerizable liquid crystal composition, the thickness of the retardation plate in a state of being peeled off from the base material is 1 to 5 μm and the thickness of the base material with the phase difference is 20 to 50 μm. Compared to the related art, the thickness thereof can be reduced by 1 to 50% of the thickness of the related art.

In the process of laminating the retardation plate 1 and the retardation plate 2 used in the present invention, it is preferable that the alignment treatment of laminating a photo-alignment film is performed. The slow axis of the retardation plate 1 and the slow axis of the retardation plate 2 can be adjusted to an arbitrary direction by controlling the polarization vibration direction of polarized visible ultraviolet light to be applied after the material that forms the alignment film is applied and dried.

Therefore, a rail-to-roll system with extremely high production efficiency can be adopted in the process of laminating the polarizing plate and the retardation plate such that the transmission axis of the polarizing plate and the slow axis of the retardation plate intersect with each other by adjusting the slow axis of the retardation plate 1 and the slow axis of the retardation plate 2 in advance such that the angle between the slow axis and the transmission axis of the polarizing plate becomes appropriate.

<Positive C Plate>

A positive C plate may be laminated on the retardation plate of the present invention in addition to the retardation plate 1 and the retardation plate 2. The place where the positive C plate is laminated on may be between any of the base material, the retardation plate 1, and the retardation plate 2, or the outside. It is preferable that the positive C plate may be laminated between the retardation plate 1 and the retardation plate 2. Alternatively, the positive C plate is laminated between the polarizing plate and the retardation plate 1. As the lamination method, the positive C plate may be bonded thereto using an adhesive or a pressure sensitive adhesive. The positive C plate may be directly laminated by performing a rubbing treatment and an alignment treatment of laminating a photo-alignment film on the base material, the retardation plate 1, or the retardation plate 2 and providing an intermediate layer formed of a resin. The retardation plate 1 may be directly laminated by performing a rubbing treatment and an alignment treatment of laminating a photo-alignment film on the positive C plate and providing an intermediate layer formed of a resin.

<Circularly Polarizing Plate>

The circularly polarizing plate of the present invention is formed by laminating the polarizing plate on the retardation plate of the present invention. The polarizing plate is formed by being laminated on a side of the retardation plate 1 of the retardation plate of the present invention, but the polarizing plate is formed by being laminated on the positive C plate, that is, a side opposite to the retardation plate 1 in a case where the positive C plate is laminated on the side opposite to the retardation plate 1. As the lamination method, the polarizing plate may be bonded thereto using an adhesive or a pressure sensitive adhesive. Further, the retardation plate may be directly laminated by performing a rubbing treatment and an alignment treatment of laminating a photo-alignment film on the polarizing plate and providing an intermediate layer formed of a resin. The polarizing plate used at this time may be in the form of a dye-doped film or in the form of a metal such as a wire grid.

In a case where the retardation plate and the polarizing plate of the present invention are laminated on each other, the slow axis of the retardation plate 1 has an angle of 5° to 25° and the slow axis of the retardation plate 2 has an angle of 65° to 85° based on the direction of the transmission axis of the polarizing plate, and the lamination is made such that the slow axis of the retardation plate 1 is located between the slow axis of the retardation plate 2 and the polarizing plate in the transmission axis direction. It is preferable that the lamination is made such that the slow axis of the retardation plate 1 has an angle of 10° to 20° and the slow axis of the retardation plate 2 has an angle of 70° to 80°.

Further, the slow axis of the retardation plate 1 has an angle of 35° to 55° and the slow axis of the retardation plate 2 has an angle of 125° to 145° based on the direction of the transmission axis of the polarizing plate, and the lamination is made such that the slow axis of the retardation plate 1 is located between the slow axis of the retardation plate 2 and the polarizing plate in the transmission axis direction. It is preferable that the lamination is made such that the slow axis of the retardation plate 1 has an angle of 40° to 50° and the slow axis of the retardation plate 2 has an angle of 130° to 140°.

Alternatively, the slow axis of the retardation plate 1 has an angle of 65° to 85° and the slow axis of the retardation plate 2 has an angle of 5° to 25° based on the direction of the transmission axis of the polarizing plate, and the lamination is made such that the slow axis of the retardation plate 2 is located between the slow axis of the retardation plate 1 and the polarizing plate in the transmission axis direction. It is preferable that the lamination is made such that the slow axis of the retardation plate 1 has an angle of 70° to 80° and the slow axis of the retardation plate 2 has an angle of 10° to 20°.

<Display Element>

The retardation plate or the circularly polarizing plate of the present invention can be used for a display element. As the form of the display element to be used, an optical compensation film, a patterned retardation film of a liquid crystal stereoscopic display element, a retardation correction layer of a color filter, an overcoat layer, an alignment film for a liquid crystal medium, and an anti-reflection film may be exemplified. The display element, is formed by interposing at least a liquid crystal medium layer, a TFT drive circuit, a black matrix layer, a color filter layer, a spacer, or an electrode circuit corresponding to the liquid crystal medium layer between at least two base materials. An optical compensation layer, an overcoat layer of a color filter, a polarizing plate layer, or an electrode layer for a touch panel may be interposed between two base materials in some cases.

<Light-Emitting Element>

The retardation plate or the circularly polarizing plate of the present invention can be used for a light-emitting element. As the form of the light-emitting element to be used, an optical compensation film, a retardation correction layer of a color filter, an overcoat layer, and an anti-reflection film may be exemplified. The light-emitting element is formed by laminating an electron transport layer, a light-emitting layer, and a positive-hole transport layer. Further, electrons and positive holes are bonded in the light-emitting layer by applying a voltage from both ends thereof and the energy excites a light-emitting substance to emit light. The light-emitting substance may be an organic compound or an inorganic compound.

EXAMPLES

Hereinafter, the present invention will be described with reference to synthesis examples, examples, and comparative examples, but the present invention is not limited thereto.

Further, "part" and "%" are on a mass basis unless otherwise noted. Hereinafter, a retardation plate formed by laminating at least two retardation plates of the retardation plate 1 and the retardation plate 2 of the present invention is noted as a laminated retardation plate.

[Preparation of Polymerizable Liquid Crystal Composition]

[Preparation of Polymerizable Liquid Crystal Composition (1)]

55 parts of a compound represented by Formula (1-a-5), 25 parts of a compound represented by Formula (1-a-6), 10 parts of a compound which is represented by Formula (2-a-1) in which n represents 6, 10 parts of a compound which is represented by Formula (2-a-1) in which n represents 3, 3 parts of IRGACURE 907 (Irg907: manufactured by BASF SE), and 0.2 parts of MEGAFACE F-554 (F-554: manufactured by DIC Corporation) were added to 400 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (I).

[Chem. 148]

(1-a-5)

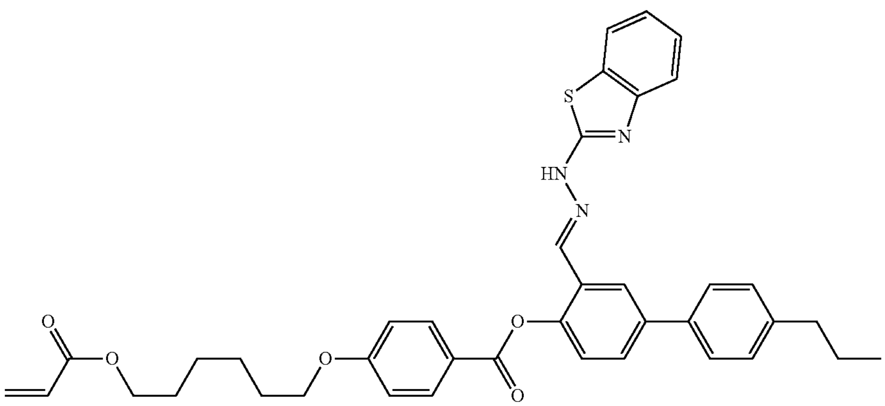

(1-a-6)

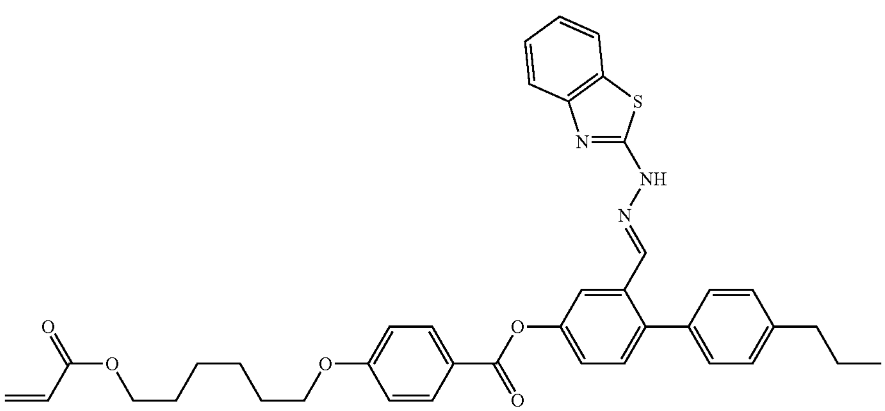

[Chem. 149]

(2-a-1)

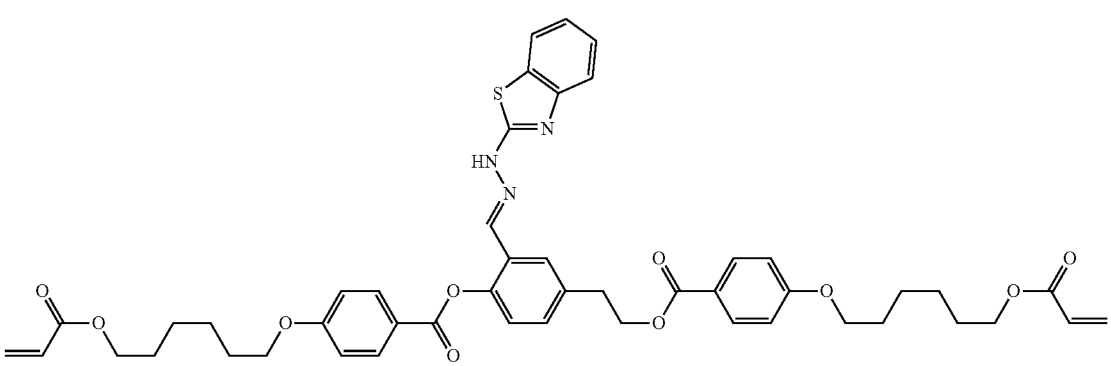

n = 6

-continued (2-a-1)

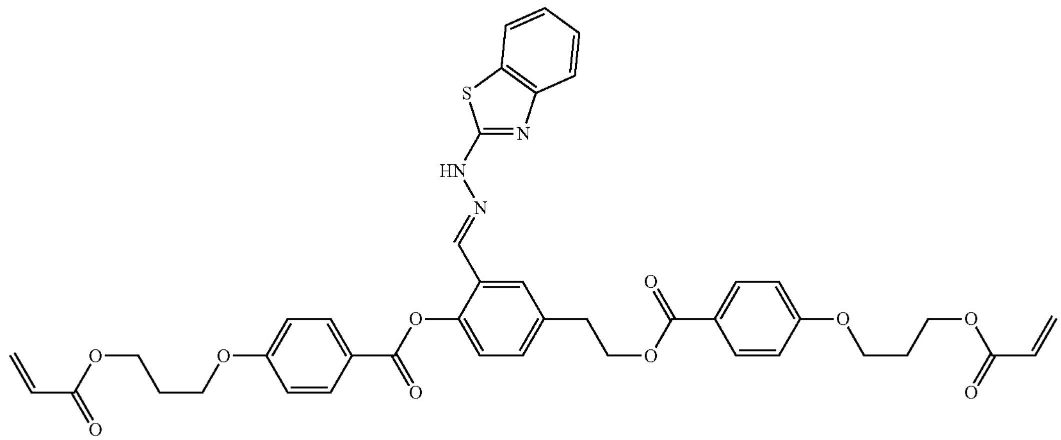

n = 3

[Preparation of Polymerizable Liquid Crystal Composition (2)]

50 parts of a compound which is represented by Formula (2-b-1) in which m represents 3, 50 parts of a compound which is represented by Formula (2-b-1) in which m represents 4, 3 parts of IRGACURE 907 (Irg907: manufactured by BASF SE), and 0.2 parts of MEGAFACE F-554 (F-554: manufactured by DIC Corporation) were added to 400 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (2).

[Chem. 150]

(2-b-1)

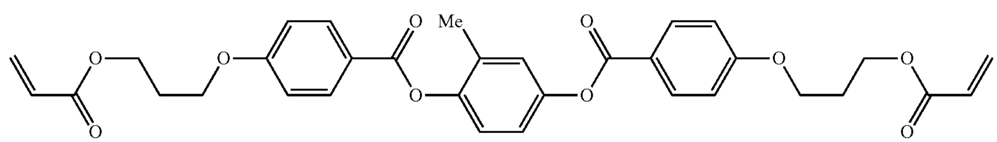

m = 3

(2-b-1)

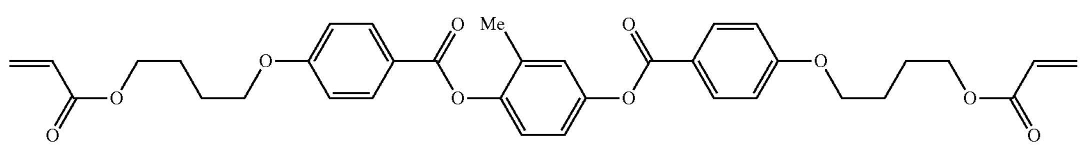

m = 4

[Preparation of Polymerizable Liquid Crystal Composition (3)]

65 parts of the polymerizable liquid crystal composition (1) and 35 parts of the polymerizable liquid crystal composition (2) were stirred under a solution temperature condition of 60° C. at a stirring speed of 500 rpm for 1 hour using a stirrer provided with a stirring propeller, thereby obtaining a polymerizable liquid crystal composition (3).

[Preparation of Retardation Plates (1) to (3)]

A glass substrate having a thickness of 0.7 mm was coated with a polyimide solution for an alignment film at room temperature according to a spin coating method, dried at 100° C. for 10 minutes, and then baked at 200° C. for 60 minutes to obtain a coated film. Thereafter, the obtained coated film was subjected to a rubbing treatment, thereby obtaining a base material. The base material each was coated with each of the prepared polymerizable liquid crystal compositions (1) to (3) using a spin coater and then dried at 80° C. for 2 minutes. Next, irradiation with UV light was performed such that the integrated light quantity was 600 mJ/cm$^2$ and to cause polymerization, thereby preparing retardation plates (1) to (3).

[Evaluation of Wavelength Dispersion of Retardation Plates (1) to (3)]

The retardations of the retardation plates (1) to (3) at a wavelength of 400 to 1,000 nm were measured using a spectroscopic ellipsometer (M-2000, manufactured by J. A. Woollam Co.). The phase difference ratio Re (450)/Re (550) of the phase difference Re (450) at a wavelength of 450 nm to the phase difference Re (550) at a wavelength of 550 nm was calculated from the measured phase differences. The obtained phase difference ratios were listed in Table 1.

TABLE 1

| Samples | Re (450) | Re (550) | Phase difference ratio |
|---|---|---|---|
| Retardation plate (1) | 124.70 | 142.72 | 0.874 |
| Retardation plate (2) | 264.48 | 236.07 | 1.120 |
| Retardation plate (3) | 175.70 | 175.29 | 1.002 |

From the results in Table 1, it was understood that the phase difference ratio of the retardation plate (1) formed of the polymerizable liquid crystal composition (1) was 0.95 or less, the phase difference ratio of the retardation plate (2) formed of the polymerizable liquid crystal composition (2) was greater than 1.05, and the phase difference ratio of the retardation plate (3) formed of the polymerizable liquid crystal composition (3) was 0.95 to 1.05.

[Preparation of Stretched Cyclic Polyolefin (COP) Films (1) and (2)]

A COP film (ARTON, manufactured by JSR Corporation) having a thickness of 100 μm was stretched at 175° C. by 25%, thereby obtaining a stretched COP film (1). In the same manner, a COP film (ARTON, manufactured by JSR Corporation) having a thickness of 100 μm was stretched at 175° C. by 50%, thereby obtaining a stretched COP film (2).

[Evaluation of Wavelength Dispersion of Stretched Cyclic Polyolefin (COP) Films (1) and (2)]

The phase difference ratios of the stretched COP films (1) and (2) were acquired in the same manner as in the cases of the retardation plates (1) to (3). The obtained phase difference ratios are listed in Table 2.

TABLE 2

| Samples | Re (450) | Re (550) | Phase difference ratio |
|---|---|---|---|
| Stretched COP film (1) | 138.55 | 134.91 | 1.027 |
| Stretched COP film (2) | 276.07 | 269.78 | 1.023 |

From the results in Table 2, it was understood that the phase difference ratios of the stretched COP films (1) and (2) were from 0.95 to 1.05.

(Examples 1 to 3 and Comparative Examples 1 to 6) Preparation of Laminated Retardation Plates (1) to (9)

Laminated retardation plates (1) to (9) formed by combining the polymerizable liquid crystal composition serving as an upper layer (retardation plate 1) and the polymerizable liquid crystal composition serving as a lower layer (retardation plate 2) listed in Table 3 were prepared by the following procedures. First, a triacetyl cellulose (TAC) film having a thickness of 0.50 μm and not having a phase difference was coated with a photo-alignment agent solution at room temperature according to a spin coating method, dried at 80° C. for 2 minutes, and then irradiated with polarized UV light while the integrated light quantity was adjusted to 100 mJ/cm$^2$ and the polarization vibration direction was set to 75° based on the MD direction of the TAC film. Next, the rotation speed was adjusted such that the phase difference was adjusted to 135 nm, and the film was coated with the polymerizable liquid crystal composition serving as a lower layer using a spin coater, dried at 80° C. for 2 minutes, irradiation with UV light was performed such that the integrated light quantity was 600 mJ/cm$^2$ to perform irradiated with UV light to perform polymerization. Further, the film was coated with a photo-alignment agent solution at room temperature according to a spin coating method, and dried at 80° C. for 2 minutes, and irradiation with polarized UV light was performed while the integrated light quantity was set to 100 mJ/cm$^2$ and the polarization vibration direction was set to 15° based on the MD direction of the TAC film. Finally, the rotation speed was adjusted such that the phase difference was set to 270 nm, and the film was coated with the polymerizable liquid crystal composition serving as an upper layer using a spin coater, and dried at 80° C. for 2 minutes, and irradiation with UV light was performed such that the integrated light quantity was 600 mJ/cm$^2$ to cause polymerization.

TABLE 3

| | Laminated retardation plate | Polymerizable liquid crystal composition serving as upper layer | Polymerizable liquid crystal composition serving as lower layer | Phase difference of upper layer | Phase difference of lower layer | Slow axis of upper layer | Slow axis of lower layer |
|---|---|---|---|---|---|---|---|
| Example 1 | (1) | Polymerizable liquid crystal composition (1) | Polymerizable liquid crystal composition (1) | 270 nm | 135 nm | 15° | 75° |
| Example 2 | (2) | Polymerizable liquid crystal composition (1) | Polymerizable liquid crystal composition (3) | 270 nm | 135 nm | 15° | 75° |
| Example 3 | (3) | Polymerizable liquid crystal composition (3) | Polymerizable liquid crystal composition (1) | 270 nm | 135 nm | 15° | 75° |
| Comparative Example 1 | (4) | Polymerizable liquid crystal composition (1) | Polymerizable liquid crystal composition (2) | 270 nm | 135 nm | 15° | 75° |
| Comparative Example 2 | (5) | Polymerizable liquid crystal composition (2) | Polymerizable liquid crystal composition (1) | 270 nm | 135 nm | 15° | 75° |
| Comparative Example 3 | (6) | Polymerizable liquid crystal composition (2) | Polymerizable liquid crystal composition (2) | 270 nm | 135 nm | 15° | 75° |
| Comparative Example 4 | (7) | Polymerizable liquid crystal composition (2) | Polymerizable liquid crystal composition (3) | 270 nm | 135 nm | 15° | 75° |
| Comparative Example 5 | (8) | Polymerizable liquid crystal composition (3) | Polymerizable liquid crystal composition (2) | 270 nm | 135 nm | 15° | 75° |
| Comparative Example 6 | (9) | Polymerizable liquid crystal composition (3) | Polymerizable liquid crystal composition (3) | 270 nm | 135 nm | 15° | 75° |

[Evaluation of Anti-Reflection Performance of Laminated Retardation Plates (1) to (9)]

The anti-reflection performance of the laminated retardation plates (1) to (9) was evaluated by the following procedures. First, in each of the laminated retardation plates (1) to (9), a polarizing plate was bonded to an upper layer side such that the MD direction of the TAC film coincided with the transmission axis of the polarizing plate, and an OLED panel serving as a light-emitting element was bonded to the side opposite to the upper layer side, thereby obtaining a light-emitting element. Next, the spectral reflectance of each light-emitting element at which the elevation angle of incident light was 45° and the azimuth angle of incident light was 0°, 30°, 60°, 90°, 120°, or 150° based on the direction of the transmission axis of the polarizing plate was measured using a spectroscopic ellipsometer (M-2000, manufactured by J. A. Woollam Co.). Thereafter, tristimulus values X, Y, and Z under a measurement condition of a two-degree field of view using a D65 light source with respect to each measured spectral reflectance were calculated in conformity with JIS Z 8722, and saturations C* in the CIELAB color space with respect to the calculated tristimulus values X, Y, and Z were calculated in conformity with JIS Z 8781. Finally, the average value of the saturations C* with respect to all azimuth angles of incident light in each light-emitting element was calculated. The average saturation obtained as the result of evaluating the anti-reflection performance was listed in Table 4.

TABLE 4

| | Laminated retardation plate | Average saturation at angle of 45° of incident light |
|---|---|---|
| Example 1 | (1) | 1.76 |
| Example 2 | (2) | 1.90 |
| Example 3 | (3) | 2.08 |
| Comparative Example 1 | (4) | 2.30 |
| Comparative Example 2 | (5) | 3.36 |
| Comparative Example 3 | (6) | 5.26 |
| Comparative Example 4 | (7) | 4.16 |
| Comparative Example 5 | (8) | 2.42 |
| Comparative Example 6 | (9) | 2.38 |

From the results in Table 4, it was understood that the saturation of reflected light with respect to light which was obliquely incident at an angle of 45° was low in the light-emitting element for which the laminated retardation plates of Examples 1 to 3 were used and the reflected light was achromatic without being colored. On the contrary, it was understood that the saturation of reflected light with respect to light which was obliquely incident at an angle of 45° was high in the light-emitting element for which the laminated retardation plates of Comparative Examples 1 to 6 were used and the reflected light was colored.

(Comparative Example 7) Preparation of Laminated Retardation Plate (10)

The stretched COP film (1) was cut into a square shape at 5 cm square such that the angle with respect to one side using the slow axis as a reference was 75°. Similarly, the stretched COP film (2) was cut into a square shape at 5 cm square such that the angle with respect to one side using the slow axis as a reference was 15°. The cut-out stretched COP films (1) and (2) were bonded to each other using a pressure sensitive adhesive such that the reference sides overlapped each other, thereby preparing a laminated retardation plate (10).

TABLE 5

| | Laminated retardation plate | Stretched COP film of upper layer | Stretched COP film of lower layer | Slow axis of upper layer | Slow axis of lower layer |
|---|---|---|---|---|---|
| Comparative Example 7 | (10) | Stretched COP film (2) | Stretched COP film (1) | 15° | 75° |

[Evaluation of Anti-Reflection Performance of Laminated Retardation Plate (10)]

The anti-reflection performance of the laminated retardation plate (10) was evaluated in the same manner as in the cases of the laminated retardation plates (1) to (9) except that the polarizing plate was bonded such that the reference one side of the stretched COP film coincided with the transmission axis of the polarizing plate. The obtained result of the anti-reflection performance was listed in Table 6.

TABLE 6

| | Laminated retardation plate | Average saturation at angle of 45° of incident light |
|---|---|---|
| Comparative Example 7 | (10) | 2.38 |

From the results in Table 6, it was understood that the saturation of reflected light with respect to light which was obliquely incident at an angle of 45° was high in the light-emitting element for which the laminated retardation plate of Comparative Example 7 was used and the reflected light was colored.

[Preparation of Polymerizable Liquid Crystal Composition (4)]

10 parts of a compound represented by Formula (1-a-5), 20 parts of a compound represented by Formula (1-a-6), 15 parts of a compound represented by Formula (1-a-82), 40 parts of a compound which is represented by Formula (2-a-44) in which n represents 6, 15 parts of a compound which is represented by Formula (2-a-45) in which n represents 6, 3 parts of IRGACURE 907 (Irg907: manufactured by BASF SE), and 0.2 parts of MEGAFACE F-554 (F-554: manufactured by DIC Corporation) were added to 400 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (4).

[Chem. 151]
(1-a-5)
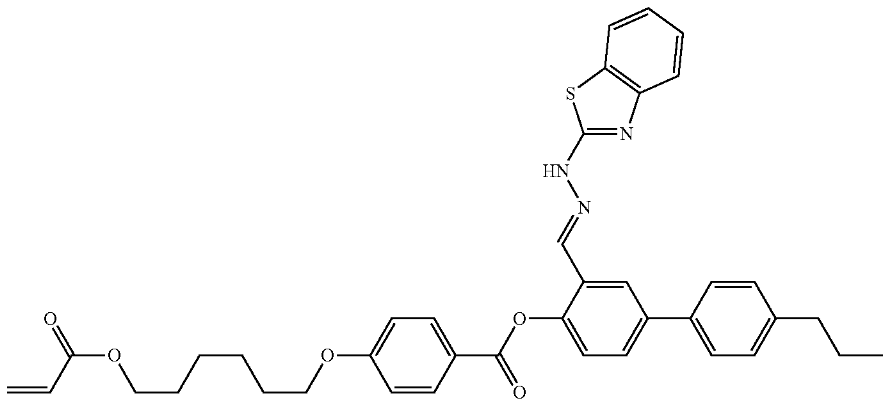
(1-a-6)
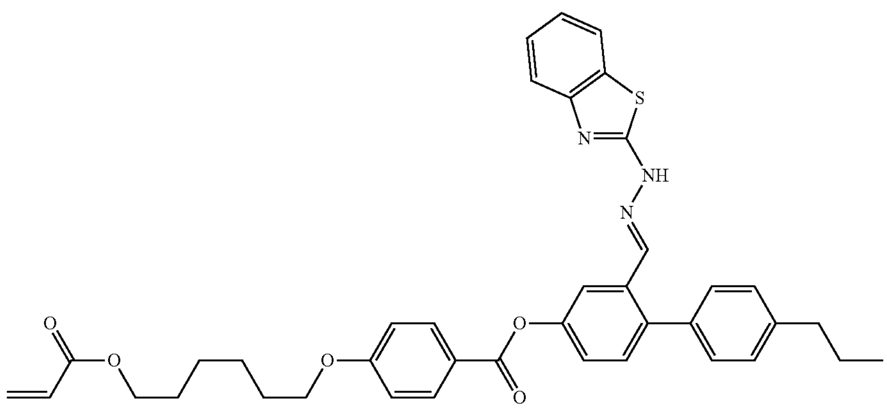
(1-a-82)
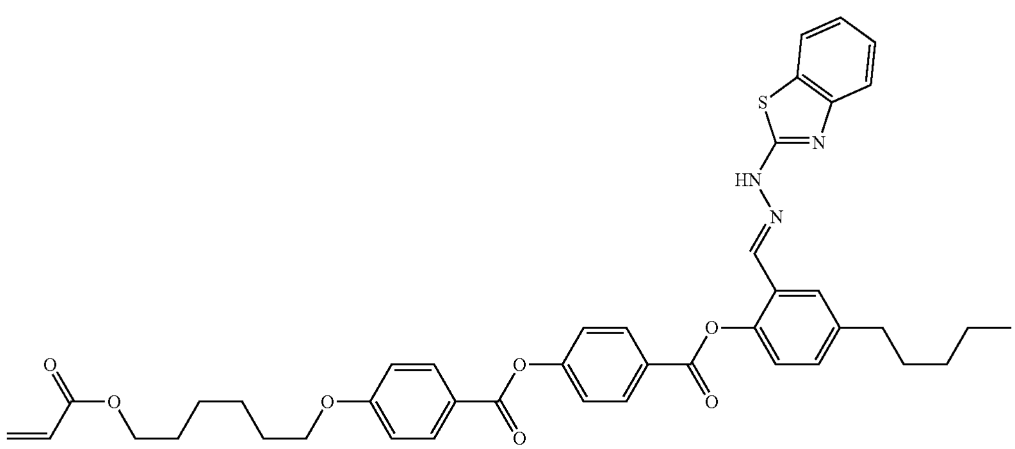

-continued

[Chem. 152]

(2-a-44)

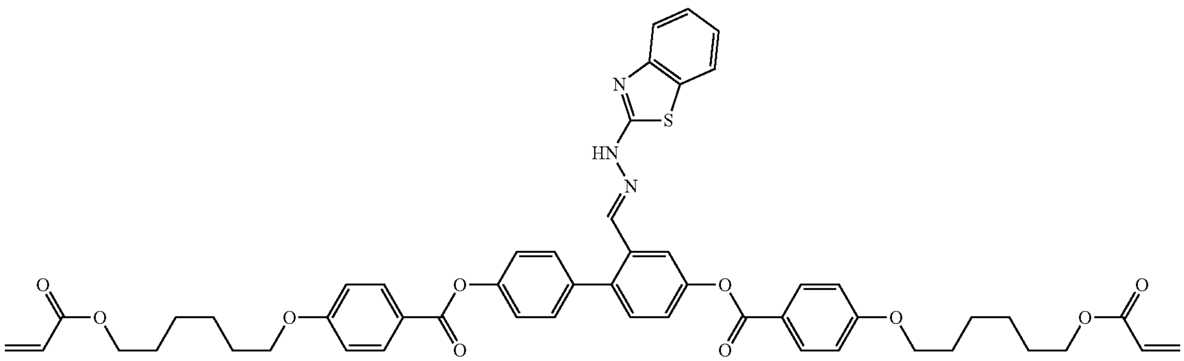

n = 6

(2-a-45)

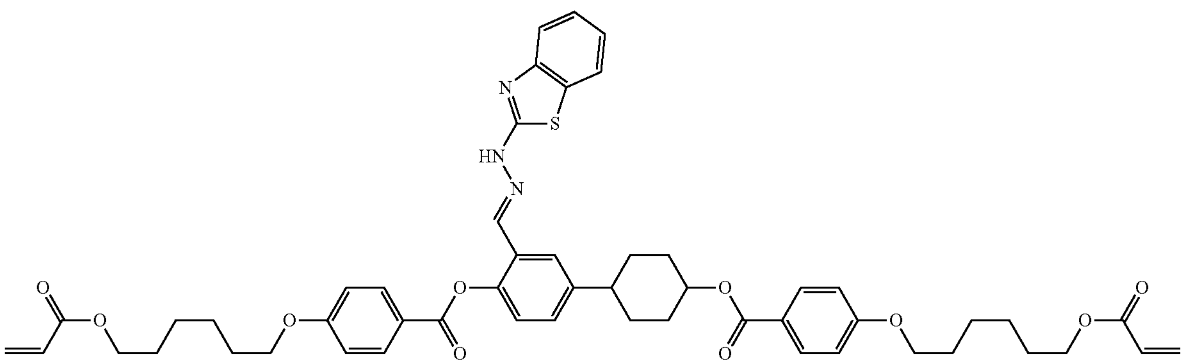

n = 6

[Preparation of Polymerizable Liquid Crystal Composition (5)]

60 parts of a compound represented by Formula (1-a-1), 20 parts of a compound represented by Formula (1-a-82), 20 parts of a compound which is represented by Formula (2-a-45) in which n represents 6, 3 parts of IRGACURE 907 (Irg907: manufactured by BASF SE), and 0.2 parts of MEGAFACE F-554 (F-554: manufactured by DIC Corporation) were added to 400 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (5).

[Chem. 153]

(1-a-1)

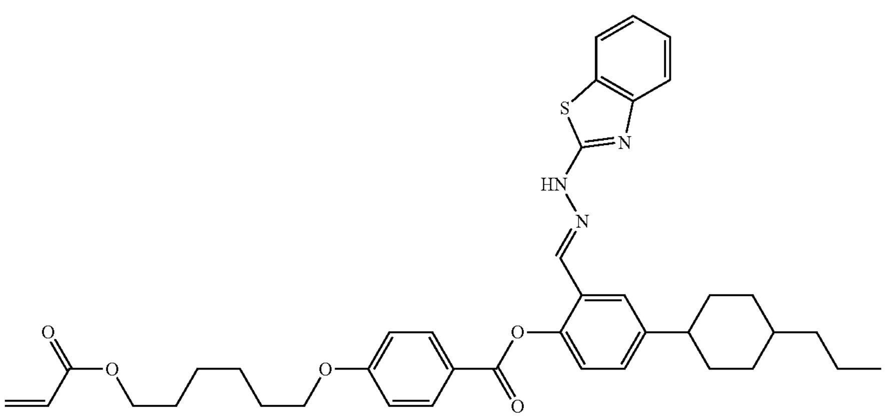

-continued (1-a-82)

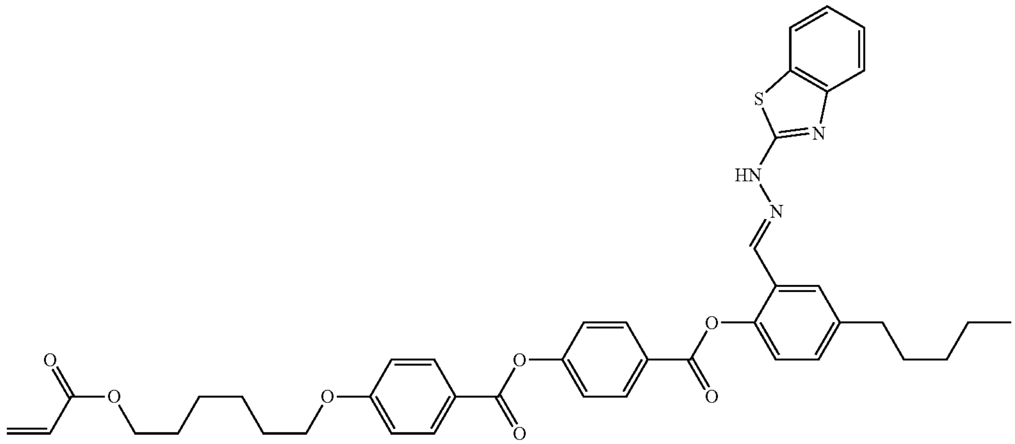

(2-a-45)

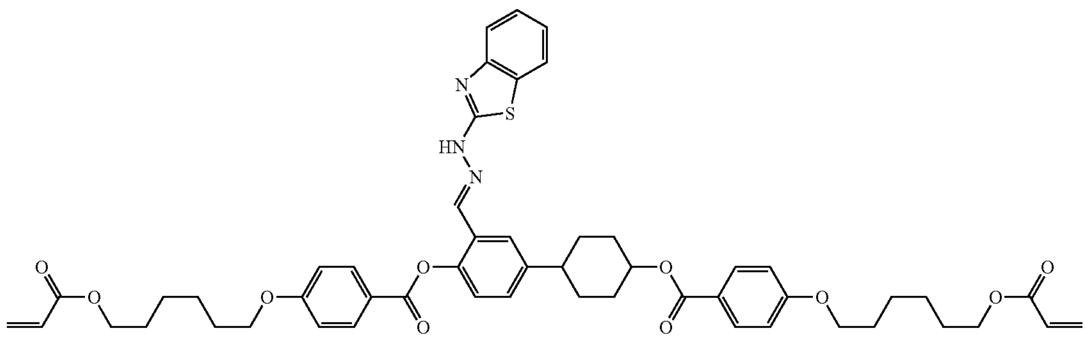

n = 6

[Preparation of Polymerizable Liquid Crystal Composition (6)]

50 parts of a compound represented by Formula (1-a-2), 30 parts of a compound represented by Formula (1-a-83), 20 parts of a compound which is represented by Formula (2-a-44) in which n represents 6, 3 parts of IRGACURE 907 (Irg907: manufactured by BASF SE), and 0.2 parts of MEGAFACE F-554 (F-554: manufactured by DIC Corporation) were added to 400 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (6).

[Chem. 154]

(1-a-2)

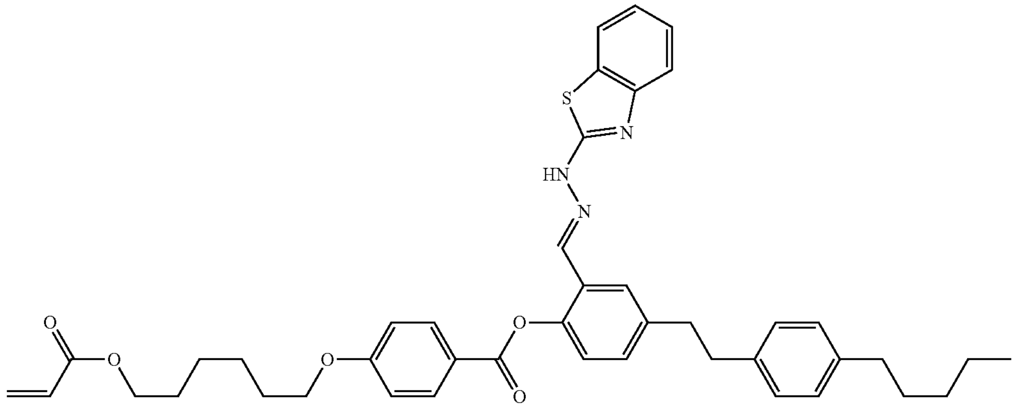

-continued (1-a-83)

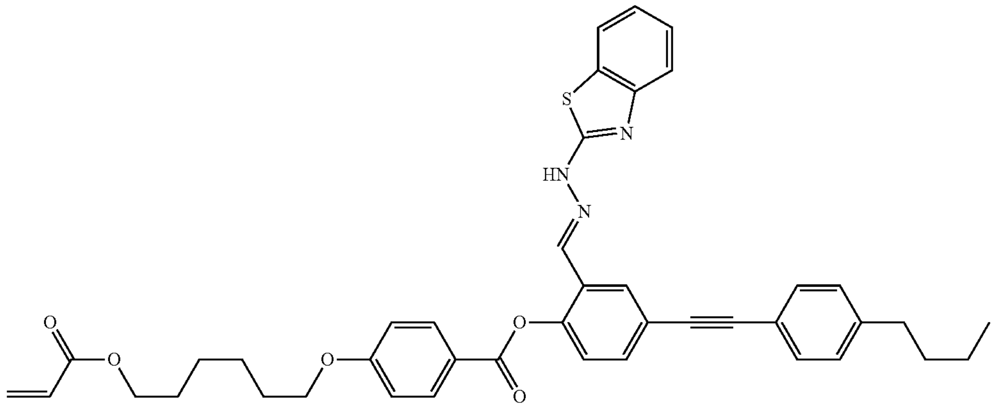

(2-a-44)

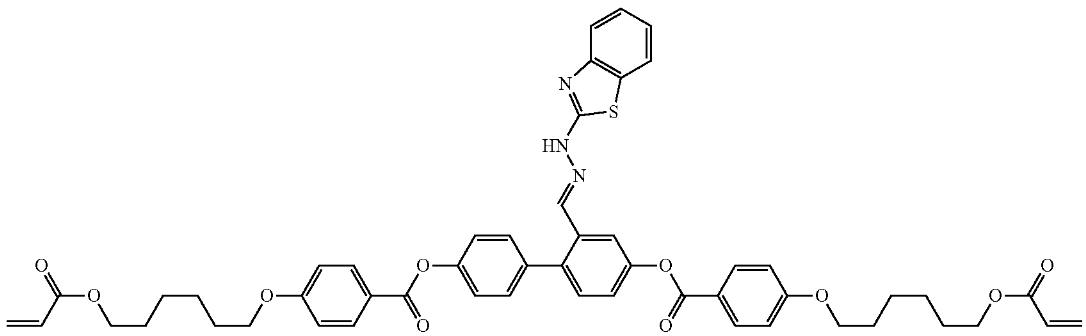

n = 6

[Preparation of Polymerizable Liquid Crystal Composition (7)]

90 parts of a compound which is represented by Formula (2-a-42) in which n represents 6, 10 parts of a compound which is represented by Formula (2-a-41) in which n represents 6, 3 parts of IRGACURE 907 (Irg907: manufactured by BASF SE), and 0.2 parts of MEGAFACE F-554 (F-554: manufactured by DIC Corporation) were added to 400 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (7).

[Chem. 155]

(2-a-42)

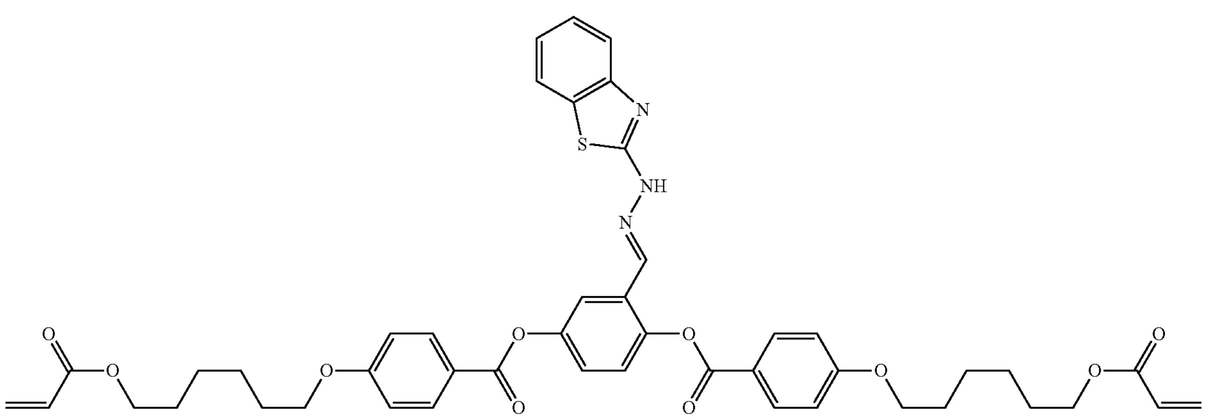

n = 6

-continued (2a-41)

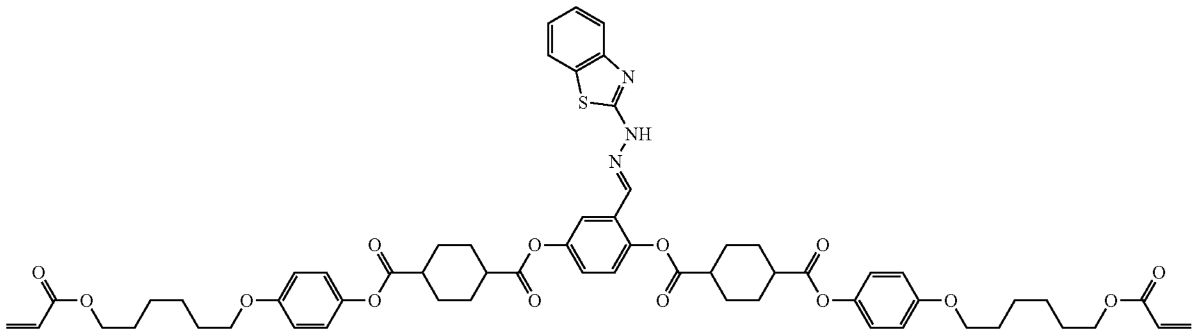

n = 6

[Preparation of Polymerizable Liquid Crystal Composition (8)]

30 parts of a compound represented by Formula (1-a-6), 20 parts of a compound represented by Formula (1-a-1), 10 parts of a compound represented by Formula (1-a-3), 20 parts of a compound represented by Formula (1-a-84), 20 parts of a compound which is represented by Formula (2-a-1) in which n represents 3, 3 parts of IRGACURE 907 (Irg907: manufactured by BASF SE), and 0.2 parts of MEGAFACE F-554 (F-554: manufactured by DIC Corporation) were added to 400 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (8).

[Chem. 156]

(1-a-6)

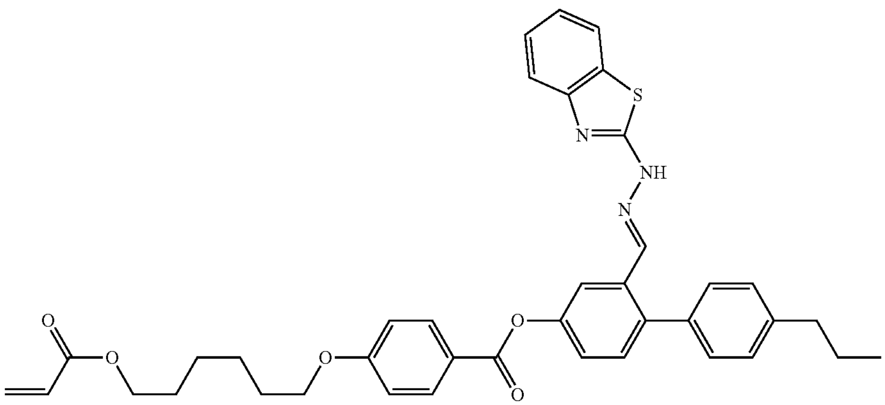

(1-a-1)

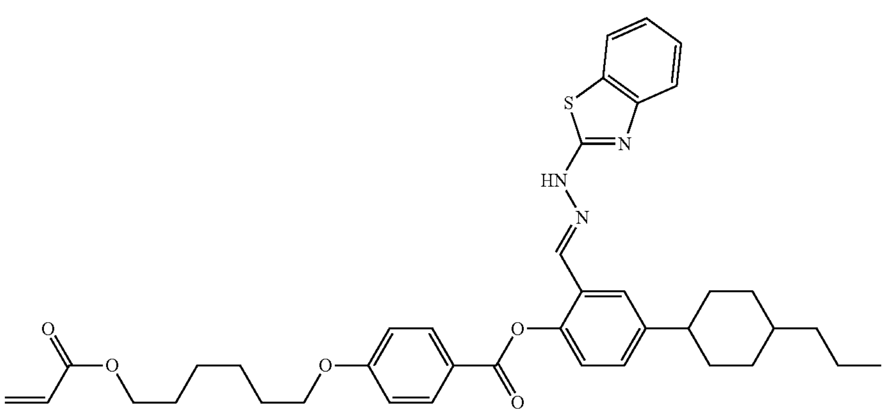

-continued (1-a-3)

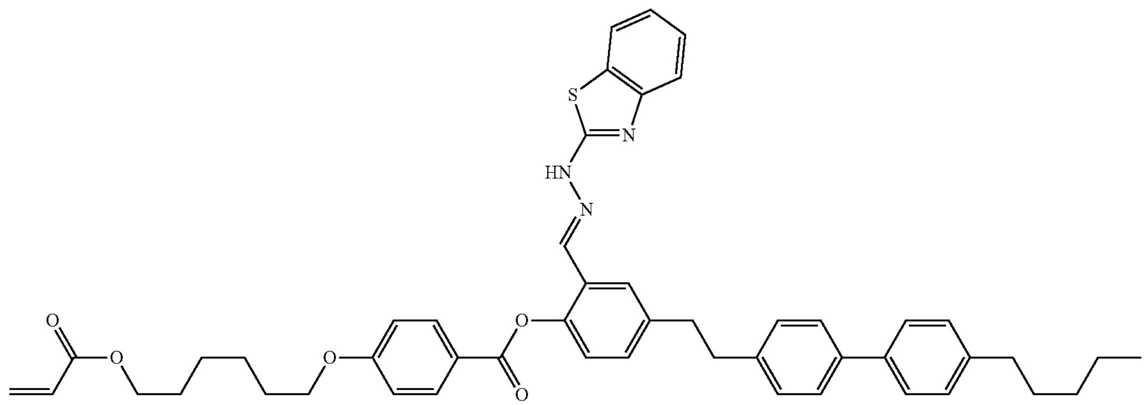

(1-a-84)

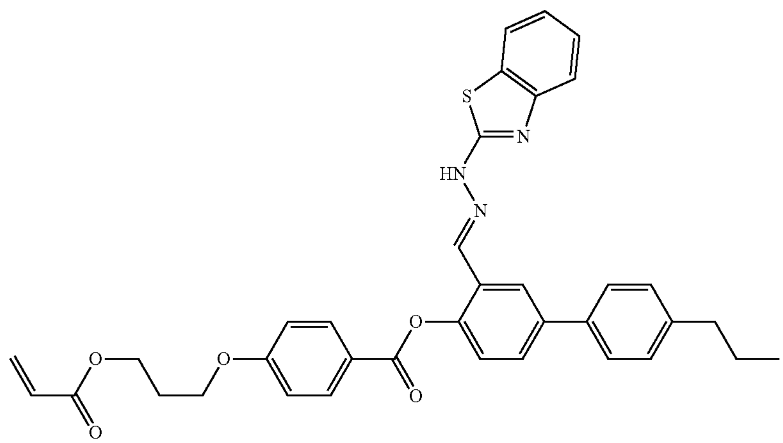

(2-a-1)

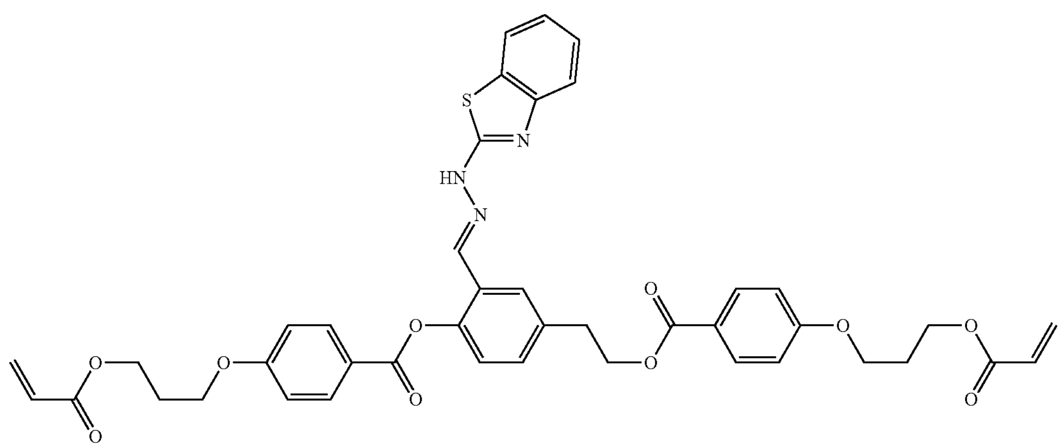

n = 3

[Preparation of Polymerizable Liquid Crystal Composition (9)]

65 parts of the polymerizable liquid crystal composition (4) and 35 parts of the polymerizable liquid crystal composition (2) were stirred under a stirring temperature condition of 60° C. at a stirring speed of 500 rpm for 1 hour using a stirrer provided with a stirring propeller, thereby obtaining a polymerizable liquid crystal composition (9).

[Preparation of Polymerizable Liquid Crystal Composition (10)]

65 parts of the polymerizable liquid crystal composition (5) and 35 parts of the polymerizable liquid crystal composition (2) were stirred under a stirring temperature condition of 60° C. at a stirring speed of 500 rpm for 1 hour using a stirrer provided with a stirring propeller, thereby obtaining a polymerizable liquid crystal composition (10).

[Preparation of Polymerizable Liquid Crystal Composition (11)]

65 parts of the polymerizable liquid crystal composition (6) and 35 parts of the polymerizable liquid crystal composition (2) were stirred under a stirring temperature condition of 60° C. at a stirring speed of 500 rpm for 1 hour using a stirrer provided with a stirring propeller, thereby obtaining a polymerizable liquid crystal composition (11).

[Preparation of Polymerizable Liquid Crystal Composition (12)]

70 parts of the polymerizable liquid crystal composition (7) and 30 parts of the polymerizable liquid crystal composition (2) were stirred under a stirring temperature condition of 60° C. at a stirring speed of 500 rpm for 1 hour using a stirrer provided with a stirring propeller, thereby obtaining a polymerizable liquid crystal composition (12).

[Preparation of Polymerizable Liquid Crystal Composition (13)]

70 parts of the polymerizable liquid crystal composition (8) and 30 parts of the polymerizable liquid crystal composition (2) were stirred under a stirring temperature condition of 60° C. at a stirring speed of 500 rpm for 1 hour using a stirrer provided with a stirring propeller, thereby obtaining a polymerizable liquid crystal composition (13).

[Preparation of Retardation Plates (4) to (13)]

Retardation plates (4) to (13) were prepared in the same manner as in the cases of the retardation plates (1) to (3) using the polymerizable liquid crystal compositions (4) to (13).

[Evaluation of Wavelength Dispersion of Retardation Plates (4) to (13)]

The phase difference ratios of the retardation plates (4) to (13) were acquired in the same manner as in the cases of the retardation plates (1) to (3). The obtained phase difference ratios are listed in Table 7.

TABLE 7

| Samples | Re (450) | Re (550) | Retardation ratio |
|---|---|---|---|
| Retardation plate (4) | 130.18 | 154.55 | 0.842 |
| Retardation plate (5) | 135.66 | 155.63 | 0.872 |
| Retardation plate (6) | 129.84 | 149.17 | 0.870 |
| Retardation plate (7) | 137.49 | 161.31 | 0.852 |
| Retardation plate (8) | 127.79 | 145.14 | 0.882 |
| Retardation plate (9) | 176.72 | 176.27 | 1.003 |
| Retardation plate (10) | 183.00 | 182.56 | 1.002 |
| Retardation plate (11) | 177.71 | 177.38 | 1.002 |
| Retardation plate (12) | 188.55 | 187.72 | 1.004 |
| Retardation plate (13) | 183.70 | 183.45 | 1.001 |

From the results in Table 7, it was understood that the phase difference ratios of the retardation plates (4) to (8) were 0.95 or less and the phase difference ratios of the retardation plates (9) to (13) were 0.95 to 1.05.

(Examples 4 to 18) Preparation of Laminated Retardation Plates (11) to (25)

Laminated retardation plates (11) to (25) formed by combining the polymerizable liquid crystal composition serving as an upper layer (retardation plate 1) and the polymerizable liquid crystal composition serving as a lower layer (retardation plate 2) listed in Table 8 were prepared in the same manner as in the cases of the laminated retardation plates (1) to (9).

TABLE 8

| | Laminated retardation plate | Polymerizable liquid crystal composition serving as upper layer | Polymerizable liquid crystal composition serving as lower layer | Phase difference of upper layer | Phase difference of lower layer | Slow axis of upper layer | Slow axis of lower layer |
|---|---|---|---|---|---|---|---|
| Example 4 | (11) | Polymerizable liquid crystal composition (4) | Polymerizable liquid crystal composition (4) | 270 nm | 135 nm | 15° | 75° |
| Example 5 | (12) | Polymerizable liquid crystal composition (4) | Polymerizable liquid crystal composition (9) | 270 nm | 135 nm | 15° | 75° |
| Example 6 | (13) | Polymerizable liquid crystal composition (9) | Polymerizable liquid crystal composition (4) | 270 nm | 135 nm | 15° | 75° |
| Example 7 | (14) | Polymerizable liquid crystal composition (5) | Polymerizable liquid crystal composition (5) | 270 nm | 135 nm | 15° | 75° |
| Example 8 | (15) | Polymerizable liquid crystal composition (5) | Polymerizable liquid crystal composition (10) | 270 nm | 135 nm | 15° | 75° |
| Example 9 | (16) | Polymerizable liquid crystal composition (10) | Polymerizable liquid crystal composition (5) | 270 nm | 135 nm | 15° | 75° |
| Example 10 | (17) | Polymerizable liquid crystal composition (6) | Polymerizable liquid crystal composition (6) | 270 nm | 135 nm | 15° | 75° |
| Example 11 | (18) | Polymerizable liquid crystal composition (6) | Polymerizable liquid crystal composition (11) | 270 nm | 135 nm | 15° | 75° |
| Example 12 | (19) | Polymerizable liquid crystal composition (11) | Polymerizable liquid crystal composition (6) | 270 nm | 135 nm | 15° | 75° |
| Example 13 | (20) | Polymerizable liquid crystal composition (7) | Polymerizable liquid crystal composition (7) | 270 nm | 135 nm | 15° | 75° |

TABLE 8-continued

| | Laminated retardation plate | Polymerizable liquid crystal composition serving as upper layer | Polymerizable liquid crystal composition serving as lower layer | Phase difference of upper layer | Phase difference of lower layer | Slow axis of upper layer | Slow axis of lower layer |
|---|---|---|---|---|---|---|---|
| Example 14 | (21) | Polymerizable liquid crystal composition (7) | Polymerizable liquid crystal composition (12) | 270 nm | 135 nm | 15° | 75° |
| Example 15 | (22) | Polymerizable liquid crystal composition (12) | Polymerizable liquid crystal composition (7) | 270 nm | 135 nm | 15° | 75° |
| Example 16 | (23) | Polymerizable liquid crystal composition (8) | Polymerizable liquid crystal composition (8) | 270 nm | 135 nm | 15° | 75° |
| Example 17 | (24) | Polymerizable liquid crystal composition (8) | Polymerizable liquid crystal composition (13) | 270 nm | 135 nm | 15° | 75° |
| Example 18 | (25) | Polymerizable liquid crystal composition (13) | Polymerizable liquid crystal composition (8) | 270 nm | 135 nm | 15° | 75° |

[Evaluation of Anti-Reflection Performance of Laminated Retardation Plates (11) to (25)]

The anti-reflection performance of the laminated retardation plates (11) to (25) was evaluated in the same manner as in the cases of the laminated retardation plates (1) to (9). The obtained results of the anti-reflection performance are listed in Table 9.

TABLE 9

| | Laminated retardation plate | Average saturation at angle of 45° of incident light |
|---|---|---|
| Example 4 | (11) | 1.69 |
| Example 5 | (12) | 1.80 |
| Example 6 | (13) | 1.99 |
| Example 7 | (14) | 1.74 |
| Example 8 | (15) | 1.89 |
| Example 9 | (16) | 2.06 |
| Example 10 | (17) | 1.71 |
| Example 11 | (18) | 1.96 |
| Example 12 | (19) | 2.09 |
| Example 13 | (20) | 1.70 |
| Example 14 | (21) | 1.82 |
| Example 15 | (22) | 2.00 |
| Example 16 | (23) | 1.81 |
| Example 17 | (24) | 1.95 |
| Example 18 | (25) | 2.09 |

From the results in Table 9, it was understood that the saturation of reflected light with respect to light which was obliquely incident at an angle of 45° was low in the light-emitting element for which the laminated retardation plates of Examples 4 to 18 were used and the reflected light was achromatic without being colored.

[Preparation of Polymerizable Liquid Crystal Composition (14)]

85 parts of a compound which is represented by Formula (2-a-43) in which n represents 6, 15 parts of a compound represented by Formula (1-a-83), 3 parts of IRGACURE 907 (Irg907: manufactured by BASF SE), and 0.2 parts of MEGAFACE F-554 (F-554: manufactured by DIC Corporation) were added to 400 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (14).

[Chem. 157]

(2-a-43)

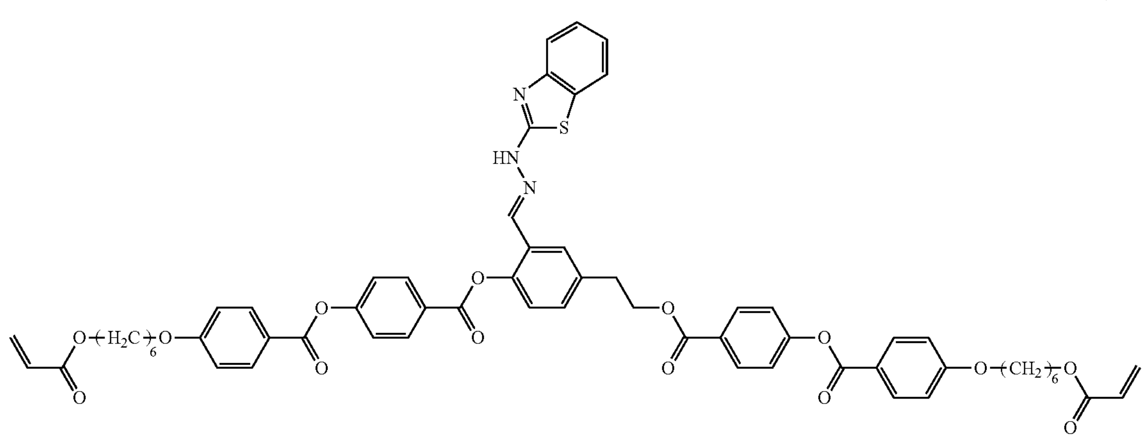

n = 6

-continued (1-a-83)

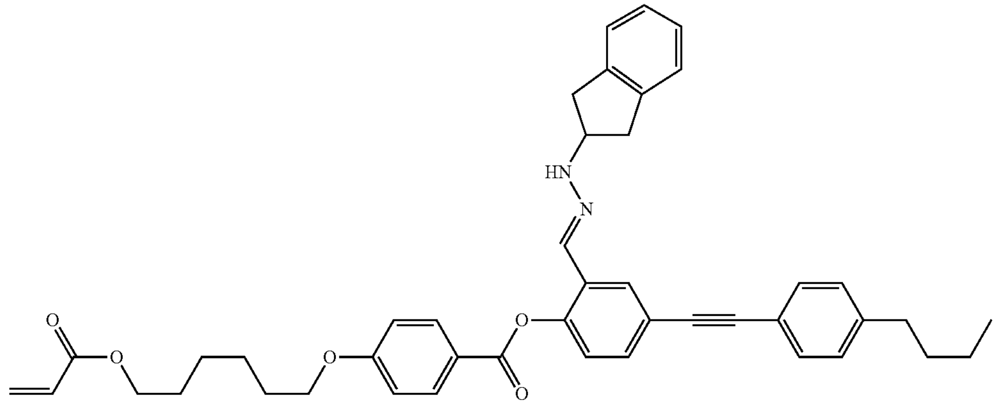

[Preparation of Polymerizable Liquid Crystal Composition (15)]

50 parts of a compound which is represented by Formula (2-a-42) in which n represents 6, 50 parts of a compound which is represented by Formula (2-a-42) in which n represents 3, 3 parts of IRGACURE 907 (Irg907: manufactured by BASF SE), and 0.2 parts of MEGAFACE F-554 (F-554: manufactured by DIC Corporation) were added to 200 parts of methyl ethyl ketone and 200 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (15).

[Chem. 158]

(2-a-42)

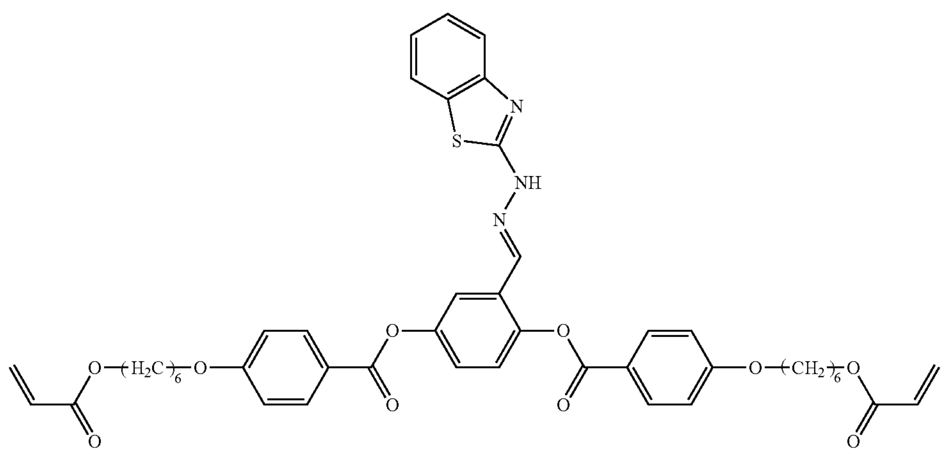

n = 6

(2-a-42)

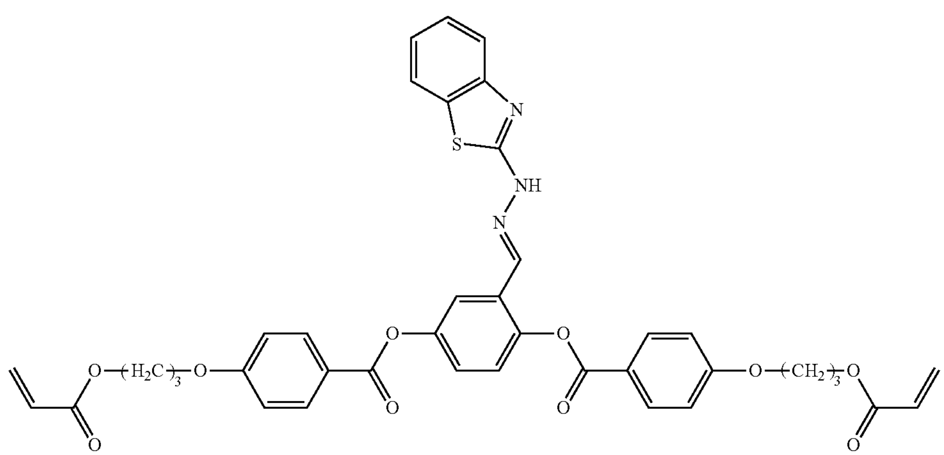

n =3

[Preparation of Retardation Plates (14) and (15)]

Retardation plates (14) and (15) were prepared in the same manner as in the cases of the retardation plates (1) to (3) using the polymerizable liquid crystal compositions (14) and (15).

[Evaluation of Wavelength Dispersion of Retardation Plates (14) and (15)]

The phase difference ratios of the retardation plates (14) and (15) were acquired in the same manner as in the cases of the retardation plates (1) to (3). The obtained phase difference ratios are listed in Table 10.

TABLE 10

| Samples | Re (450) | Re (550) | Phase difference ratio |
|---|---|---|---|
| Retardation plate (14) | 190.86 | 191.13 | 0.999 |
| Retardation plate (15) | 131.72 | 155.46 | 0.847 |

From the results in Table 10, it was understood that the phase difference ratio of the retardation plate (14) was 0.95 to 1.05 and the phase difference ratio of the retardation plate (15) was 0.95 or less.

(Examples 19 to 33) Preparation of Laminated Retardation Plates (26) to (40)

Laminated retardation plates (26) to (40) formed by combining the polymerizable liquid crystal composition serving as an upper layer (retardation plate 1) and the polymerizable liquid crystal composition serving as a lower layer (retardation plate 2) listed in Table 11 were prepared in the same manner as in the cases of the laminated retardation plates (1) to (9).

TABLE 11

| | Laminated retardation plate | Polymerizable liquid crystal composition serving as upper layer | Polymerizable liquid crystal composition serving as lower layer | Phase difference of upper layer | Phase difference of lower layer | Slow axis of upper layer | Slow axis of lower layer |
|---|---|---|---|---|---|---|---|
| Example 19 | (26) | Polymerizable liquid crystal composition (1) | Polymerizable liquid crystal composition (14) | 270 nm | 135 nm | 15° | 75° |
| Example 20 | (27) | Polymerizable liquid crystal composition (14) | Polymerizable liquid crystal composition (1) | 270 nm | 135 nm | 15° | 75° |
| Example 21 | (28) | Polymerizable liquid crystal composition (4) | Polymerizable liquid crystal composition (14) | 270 nm | 135 nm | 15° | 75° |
| Example 22 | (29) | Polymerizable liquid crystal composition (14) | Polymerizable liquid crystal composition (4) | 270 nm | 135 nm | 15° | 75° |
| Example 23 | (30) | Polymerizable liquid crystal composition (5) | Polymerizable liquid crystal composition (14) | 270 nm | 135 nm | 15° | 75° |
| Example 24 | (31) | Polymerizable liquid crystal composition (14) | Polymerizable liquid crystal composition (5) | 270 nm | 135 nm | 15° | 75° |
| Example 25 | (32) | Polymerizable liquid crystal composition (6) | Polymerizable liquid crystal composition (14) | 270 nm | 135 nm | 15° | 75° |
| Example 26 | (33) | Polymerizable liquid crystal composition (14) | Polymerizable liquid crystal composition (6) | 270 nm | 135 nm | 15° | 75° |
| Example 27 | (34) | Polymerizable liquid crystal composition (7) | Polymerizable liquid crystal composition (14) | 270 nm | 135 nm | 15° | 75° |
| Example 28 | (35) | Polymerizable liquid crystal composition (14) | Polymerizable liquid crystal composition (7) | 270 nm | 135 nm | 15° | 75° |
| Example 29 | (36) | Polymerizable liquid crystal composition (8) | Polymerizable liquid crystal composition (14) | 270 nm | 135 nm | 15° | 75° |
| Example 30 | (37) | Polymerizable liquid crystal composition (14) | Polymerizable liquid crystal composition (8) | 270 nm | 135 nm | 15° | 75° |
| Example 31 | (38) | Polymerizable liquid crystal composition (15) | Polymerizable liquid crystal composition (1) | 270 nm | 135 nm | 15° | 75° |
| Example 32 | (39) | Polymerizable liquid crystal composition (15) | Polymerizable liquid crystal composition (7) | 270 nm | 135 nm | 15° | 75° |
| Example 33 | (40) | Polymerizable liquid crystal composition (11) | Polymerizable liquid crystal composition (15) | 270 nm | 135 nm | 15° | 75° |

[Evaluation of Anti-Reflection Performance of Laminated Retardation Plates (26) to (40)]

The anti-reflection performance of the laminated retardation plates (26) to (40) was evaluated in the same manner as in the cases of the laminated retardation plates (1) to (9). The obtained results of the anti-reflection performance are listed in Table 12.

TABLE 12

| | Laminated retardation plate | Average saturation at angle of 45° of incident light |
|---|---|---|
| Example 19 | (26) | 1.89 |
| Example 20 | (27) | 2.02 |
| Example 21 | (28) | 1.91 |
| Example 22 | (29) | 2.05 |
| Example 23 | (30) | 1.92 |
| Example 24 | (31) | 2.06 |
| Example 25 | (32) | 1.93 |
| Example 26 | (33) | 2.09 |
| Example 27 | (34) | 1.90 |
| Example 28 | (35) | 2.01 |
| Example 29 | (36) | 1.87 |
| Example 30 | (37) | 2.02 |
| Example 31 | (38) | 1.77 |
| Example 32 | (39) | 1.73 |
| Example 33 | (40) | 2.01 |

From the results in Table 12, it was understood that the saturation of reflected light with respect to light which was obliquely incident at an angle of 45° was low in the light-emitting element for which the laminated retardation plates of Examples 19 to 33 were used and the reflected light was achromatic without being colored.

(Examples 34 to 33) Preparation of Laminated Retardation Plates (41) to (46)

Laminated retardation plates (41) to (46) formed by combining the polymerizable liquid crystal composition serving as an upper layer (retardation plate 1) and the stretched COP film serving as a lower layer (retardation plate 2) listed in Table 13 were prepared in the following procedures. First, the stretched COP film was cut into a square shape at 5 cm square such that the angle with respect to one side using the slow axis as a reference was 75°. Next, the cut-out stretched COP film was coated with a photo-alignment agent solution at room temperature according to a spin coating method, dried at 80° C. for 2 minutes, set such that the integrated light quantity was adjusted to 100 mJ/cm$^2$ and the polarization vibration direction was set to 15° with respect to the reference one side of the stretched COP film, and then irradiated with polarized UV light. Finally, the rotation speed was adjusted such that the phase difference was adjusted to 270 nm, and the film was coated with the polymerizable liquid crystal composition serving as an upper layer using a spin coater, dried at 80° C. for 2 minutes, set such that the integrated light quantity was adjusted to 600 mJ/cm$^2$, irradiated with UV light, and polymerized.

TABLE 13

| | Laminated retardation plate | Polymerizable liquid crystal composition serving as upper layer | Stretched COP film of lower layer | Phase difference of upper layer | Slow axis of upper layer | Slow axis of lower layer |
|---|---|---|---|---|---|---|
| Example 34 | (41) | Polymerizable liquid crystal composition (1) | Stretched COP film (1) | 270 nm | 15° | 75° |
| Example 35 | (42) | Polymerizable liquid crystal composition (4) | Stretched COP film (1) | 270 nm | 15° | 75° |
| Example 36 | (43) | Polymerizable liquid crystal composition (5) | Stretched COP film (1) | 270 nm | 15° | 75° |
| Example 37 | (44) | Polymerizable liquid crystal composition (6) | Stretched COP film (1) | 270 nm | 15° | 75° |
| Example 38 | (45) | Polymerizable liquid crystal composition (7) | Stretched COP film (1) | 270 nm | 15° | 75° |
| Example 39 | (46) | Polymerizable liquid crystal composition (8) | Stretched COP film (1) | 270 nm | 15° | 75° |

[Evaluation of Anti-Reflection Performance of Laminated Retardation Plates (41) to (46)]

The anti-reflection performance of the laminated retardation plates (41) to (46) was evaluated in the same manner as in the cases of the laminated retardation plates (1) to (9) except that the polarizing plate was bonded such that the reference one side of the stretched COP film coincided with the transmission axis of the polarizing plate. The obtained result of the anti-reflection performance was listed in Table 14.

TABLE 14

| | Laminated retardation plate | Average saturation at angle of 45° of incident light |
|---|---|---|
| Example 34 | (41) | 2.10 |
| Example 35 | (42) | 2.08 |
| Example 36 | (44) | 2.11 |
| Example 37 | (44) | 2.07 |
| Example 38 | (45) | 2.08 |
| Example 39 | (46) | 2.14 |

From the results in Table 14, it was understood that the saturation of reflected light with respect to light which was obliquely incident at an angle of 45° was low in the light-emitting element for which the laminated retardation plates of Examples 34 to 39 were used and the reflected light was achromatic without being colored.

(Examples 40 to 45) Preparation of Laminated Retardation Plates (47) to (52)

Laminated retardation plates (47) to (52) formed by combining the stretched COP film serving as an upper layer (retardation plate 1) and the polymerizable liquid crystal composition serving as a lower layer (retardation plate 2) listed in Table 15 were prepared in the following procedures. First, the stretched COP film was cut into a square shape at 5 cm square such that the angle with respect to one side using the slow axis as a reference was 15°. Next, the cut-out stretched COP film was coated with a photo-alignment agent solution at room temperature according to a spin coating method, dried at 80° C. for 2 minutes, set such that the integrated light quantity was adjusted to 100 mJ/cm$^2$ and the polarization vibration direction was set to 75° with respect to the reference one side of the stretched COP film, and then irradiated with polarized UV light. Finally, the rotation speed was adjusted such that the phase difference was adjusted to 135 nm, and the film was coated with the polymerizable liquid crystal composition serving as a lower layer using a spin coater, dried at 80° C. for 2 minutes, set such that the integrated light quantity was adjusted to 600 mJ/cm$^2$, irradiated with UV light, and polymerized.

TABLE 15

| | Laminated retardation plate | Stretched COP film of upper layer | Polymerizable liquid crystal composition serving as lower layer | Phase difference of lower layer | Slow axis of upper layer | Slow axis of lower layer |
|---|---|---|---|---|---|---|
| Example 40 | (47) | Stretched COP film (2) | Polymerizable liquid crystal composition (1) | 135 nm | 15° | 75° |
| Example 41 | (48) | Stretched COP film (2) | Polymerizable liquid crystal composition (4) | 135 nm | 15° | 75° |
| Example 42 | (49) | Stretched COP film (2) | Polymerizable liquid crystal composition (5) | 135 nm | 15° | 75° |
| Example 43 | (50) | Stretched COP film (2) | Polymerizable liquid crystal composition (6) | 135 nm | 15° | 75° |
| Example 44 | (51) | Stretched COP film (2) | Polymerizable liquid crystal composition (7) | 135 nm | 15° | 75° |
| Example 45 | (52) | Stretched COP film (2) | Polymerizable liquid crystal composition (8) | 135 nm | 15° | 75° |

[Evaluation of Anti-Reflection Performance of Laminated Retardation Plates (47) to (52)]

The anti-reflection performance of the laminated retardation plates (47) to (52) was evaluated in the same manner as in the cases of the laminated retardation plates (1) to (9) except that the polarizing plate was bonded such that the reference one side of the stretched COP film coincided with the transmission axis of the polarizing plate. The obtained result of the anti-reflection performance was listed in Table 16.

TABLE 16

| | Laminated retardation plate | Average saturation at angle of 45° of incident light |
|---|---|---|
| Example 40 | (47) | 2.15 |
| Example 41 | (48) | 2.13 |
| Example 42 | (49) | 2.16 |
| Example 43 | (50) | 2.13 |
| Example 44 | (51) | 2.12 |
| Example 45 | (52) | 2.19 |

From the results in Table 16, it was understood that the saturation of reflected light with respect to light which was obliquely incident at an angle of 45° was low in the light-emitting element for which the laminated retardation plates of Examples 40 to 45 were used and the reflected light was achromatic without being colored.

[Preparation of Polymerizable Liquid Crystal Composition (16)]

70 parts of a compound which is represented by Formula (2-a-59) in which n represents 6, 30 parts of a compound which is represented by Formula (2-a-60) in which n represents 6, 5 parts of IRGACURE OXE01 (Irg. OXE01: manufactured by BASF SE), and 0.2 parts of MEGAFACE F-554 (F-554: manufactured by DIC Corporation) were added to 200 parts of methyl ethyl ketone and 200 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (16).

[Preparation of Polymerizable Liquid Crystal Composition (17)]

20 parts of a compound represented by Formula (1-a-102), 60 parts of a compound which is represented by Formula (2-a-59) in which n represents 6, 20 parts of a compound which is represented by Formula (2-a-60) in which n represents 6, 5 parts of IRGACURE OXE01 (Irg. OXE01: manufactured by BASF SE), and 0.2 parts of MEGAFACE F-554 (F-554: manufactured by DIC Corporation) were added to 200 parts of methyl ethyl ketone and 200 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (17).

[Preparation of Polymerizable Liquid Crystal Composition (18)]

30 parts of a compound represented by Formula (1-a-105), 40 parts of a compound which is represented by Formula (2-a-59) in which n represents 6, 30 parts of a compound which is represented by Formula (2-a-60) in which n represents 6, 5 parts of IRGACURE OXE01 (Irg. OXE01: manufactured by BASF SE), and 0.2 parts of MEGAFACE F-554 (F-554: manufactured by DIC Corporation) were added to 200 parts of methyl ethyl ketone and 200 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (19).

[Preparation of Polymerizable Liquid Crystal Composition (19)]

20 parts of a compound represented by Formula (1-a-102), 10 parts of a compound represented by Formula (1-a-105), 40 parts of a compound which is represented by Formula (2-a-59) in which n represents 6, 30 parts of a compound which is represented by Formula (2-a-60) in which n represents 6, 5 parts of IRGACURE OXE01 (Irg. OXE01: manufactured by BASF SE), and 0.2 parts of MEGAFACE F-554 (F-554: manufactured by DIC Corporation) were added to 200 parts of methyl ethyl ketone and 200 parts of toluene serving as an organic solvent and stirred therein under a solution temperature condition of 60° C. at a stirring speed of 500 rpm for 1 hour using a stirrer provided with a stirring propeller, and the solution was filtered using a membrane filter having a pore diameter of 0.2 μm, thereby obtaining a polymerizable liquid crystal composition (19).

[Chem. 159]

(2-a-59)

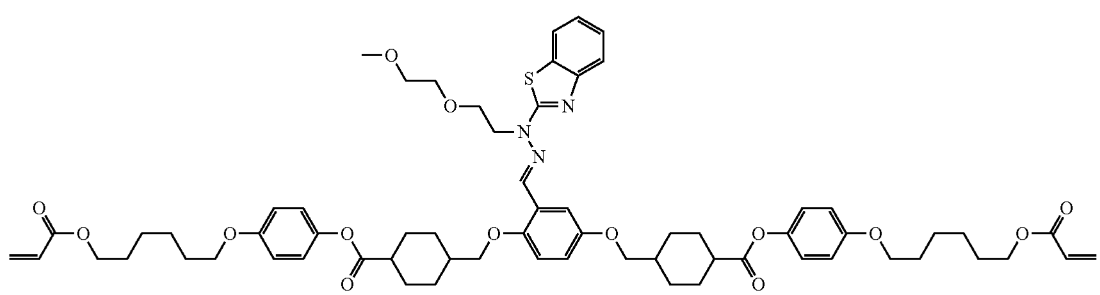

n = 6

(2-a-60)

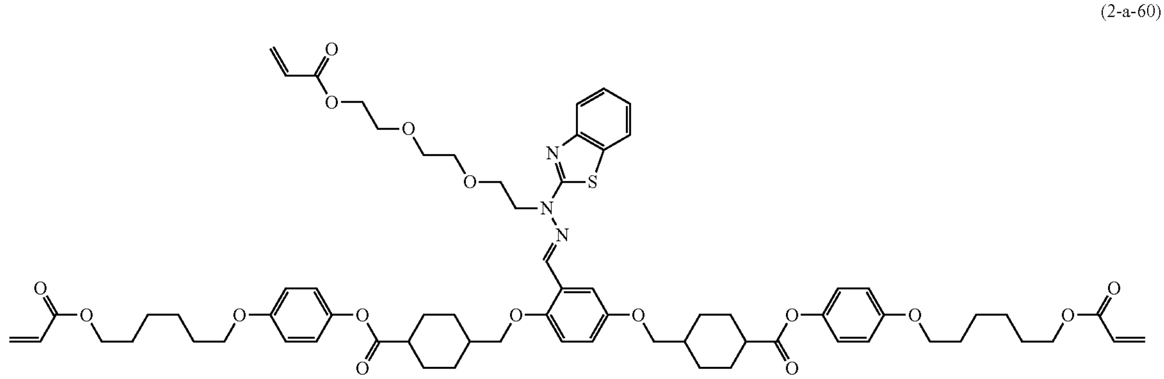

n = 6

-continued (1-a-102)

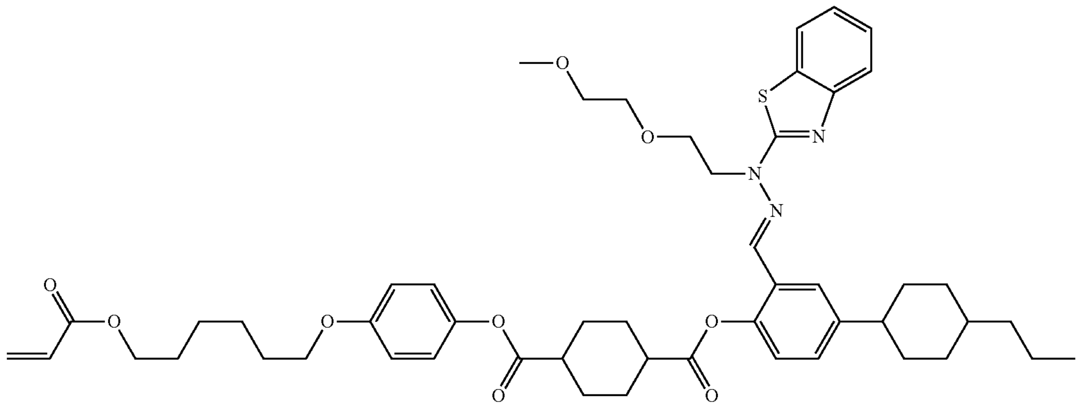

(1-a-105)

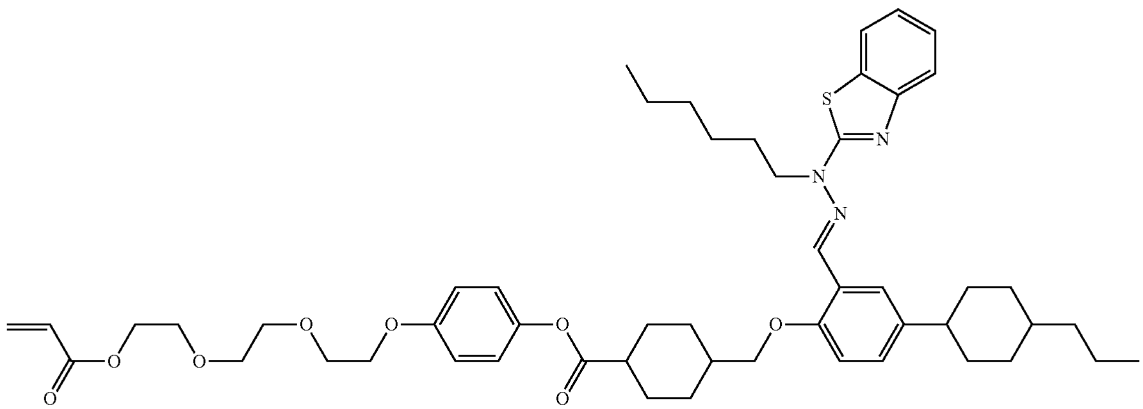

[Preparation of Retardation Plates (16) to (19)]

A glass substrate having a thickness of 0.7 mm was coated with a polyimide solution for an alignment film at room temperature according to a spin coating method, dried at 100° C. for 10 minutes, and then baked at 200° C. for 60 minutes to obtain a coated film. Thereafter, the obtained coated film was subjected to a rubbing treatment, thereby obtaining a base material. The base material was coated with the prepared polymerizable liquid crystal compositions (16) to (19) using a spin coater and then dried at 90° C. for 2 minutes. Next, the base material was set such that the integrated light quantity was adjusted to 600 mJ/cm$^2$, irradiated with UV light, and then polymerized, thereby preparing retardation plates (16) to (19).

[Evaluation of Wavelength Dispersion of Retardation Plates (16) to (19)]

The phase difference ratios of the retardation plates (16) to (19) were acquired in the same manner as in the cases of the retardation plates (1) to (3). The obtained phase difference ratios are listed in Table 17.

TABLE 17

| Samples | Re (450) | Re (550) | Phase difference ratio |
|---|---|---|---|
| Retardation plate (16) | 112.95 | 138.25 | 0.817 |
| Retardation plate (17) | 106.23 | 128.14 | 0.829 |
| Retardation plate (18) | 111.82 | 135.54 | 0.825 |
| Retardation plate (19) | 105.42 | 129.83 | 0.812 |

From the results in Table 17, it was understood that the phase difference ratios of the retardation plates (16) to (19) were 0.95 or less.

(Examples 46 to 57) Preparation of Laminated Retardation Plates (53) to (64)

Laminated retardation plates (53) to (64) formed by combining the polymerizable liquid crystal composition serving as an upper layer (retardation plate 1) and the polymerizable liquid crystal composition serving as a lower layer (retardation plate 2) listed in Table 18 were prepared in the same manner as in the cases of the laminated retardation plates (1) to (9).

TABLE 18

| | Laminated retardation plate | Polymerizable liquid crystal composition serving as upper layer | Polymerizable liquid crystal composition serving as lower layer | Phase difference of upper layer | Phase difference of lower layer | Slow axis of upper layer | Slow axis of lower layer |
|---|---|---|---|---|---|---|---|
| Example 46 | (53) | Polymerizable liquid crystal composition (1) | Polymerizable liquid crystal composition (16) | 270 nm | 135 nm | 15° | 75° |
| Example 47 | (54) | Polymerizable liquid crystal composition (1) | Polymerizable liquid crystal composition (17) | 270 nm | 135 nm | 15° | 75° |
| Example 48 | (55) | Polymerizable liquid crystal composition (1) | Polymerizable liquid crystal composition (18) | 270 nm | 135 nm | 15° | 75° |
| Example 49 | (56) | Polymerizable liquid crystal composition (1) | Polymerizable liquid crystal composition (19) | 270 nm | 135 nm | 15° | 75° |
| Example 50 | (57) | Polymerizable liquid crystal composition (16) | Polymerizable liquid crystal composition (13) | 270 nm | 135 nm | 15° | 75° |
| Example 51 | (58) | Polymerizable liquid crystal composition (17) | Polymerizable liquid crystal composition (13) | 270 nm | 135 nm | 15° | 75° |
| Example 52 | (59) | Polymerizable liquid crystal composition (18) | Polymerizable liquid crystal composition (13) | 270 nm | 135 nm | 15° | 75° |
| Example 53 | (60) | Polymerizable liquid crystal composition (19) | Polymerizable liquid crystal composition (13) | 270 nm | 135 nm | 15° | 75° |
| Example 54 | (61) | Polymerizable liquid crystal composition (16) | Polymerizable liquid crystal composition (16) | 270 nm | 135 nm | 15° | 75° |
| Example 55 | (62) | Polymerizable liquid crystal composition (16) | Polymerizable liquid crystal composition (17) | 270 nm | 135 nm | 15° | 75° |
| Example 56 | (63) | Polymerizable liquid crystal composition (16) | Polymerizable liquid crystal composition (18) | 270 nm | 135 nm | 15° | 75° |
| Example 57 | (64) | Polymerizable liquid crystal composition (19) | Polymerizable liquid crystal composition (16) | 270 nm | 135 nm | 15° | 75° |

[Evaluation of Anti-Reflection Performance of Laminated Retardation Plates (53) to (64)]

The anti-reflection performance of the laminated retardation plates (53) to (64) was evaluated in the same manner as in the cases of the laminated retardation plates (1) to (9). The obtained results of the anti-reflection performance are listed in Table 19.

TABLE 19

| | Laminated retardation plate | Average saturation at angle of 45° of incident light |
|---|---|---|
| Example 46 | (53) | 1.58 |
| Example 47 | (54) | 1.65 |
| Example 48 | (55) | 1.64 |
| Example 49 | (56) | 1.56 |
| Example 50 | (57) | 1.75 |
| Example 51 | (58) | 1.78 |
| Example 52 | (59) | 1.77 |
| Example 53 | (60) | 1.73 |
| Example 54 | (61) | 1.50 |
| Example 55 | (62) | 1.53 |
| Example 56 | (63) | 1.52 |
| Example 57 | (64) | 1.49 |

From the results in Table 19, it was understood that the saturation of reflected light with respect to light which was obliquely incident at an angle of 45° was low in the light-emitting element for which the laminated retardation plates of Examples 19 to 33 were used and the reflected light was achromatic without being colored.

The invention claimed is:

1. A circularly polarizing plate comprising a retardation plate comprising at least a retardation plate 1 laminated to a retardation plate 2, and a polarizing plate laminated on to the retardation plate, at least one of the retardation plate 1 and the retardation plate 2 comprising a polymer of a polymerizable liquid crystal composition, a phase difference at a wavelength of 550 nm of the retardation plate 1 being greater than a phase difference at a wavelength of 550 nm of the retardation plate 2, a phase difference ratio represented by Re (450)/Re (550), which is a ratio of a phase difference Re (450) at a wavelength of 450 nm to a phase difference Re (550) at a wavelength of 550 nm of one of the retardation plate 1 and the retardation plate 2, being 0.95 or less, the phase difference ratio represented by Re (450)/Re (550) of the other retardation plate being 1.05 or less, the phase difference ratio of the retardation plate 1 and the phase difference ratio of the retardation plate 2 each is 0.95 or less, and wherein a slow axis of one of the retardation plate 1 or the retardation plate 2 has an angle of 5° to 25° and a slow axis of the other one of the retardation plate 1 or the retardation plate 2 has an angle of 65° to 85° based on a direction of a transmission axis of the polarizing plate, and the slow axis of the retardation plate having an angle of 5° to 25° is located between the polarizing plate in the direction of the transmission axis and the slow axis of the retardation plate having an angle of 65° to 85°.

2. The circularly polarizing plate according to claim 1, wherein the polymerizable liquid crystal composition comprises at least one liquid crystalline compound represented by any of Formulae (1) to (7):

$$P^{11}\text{-}(S^{11}\text{-}X^{11})_{m11}\text{-}MG^{11}\text{-}R^{11} \tag{1}$$

$$P^{21}\text{-}(S^{21}\text{-}X^{21})_{m2}\text{-}MG^{21}\text{-}(X^{22}\text{-}S^{22})_{n2}\text{-}P^{22} \tag{2}$$

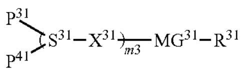

(3)

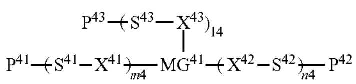

(4)

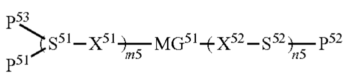

(5)

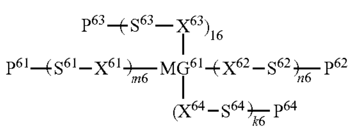

(6)

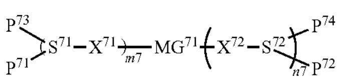

(7)

wherein $P^{11}$ to $P^{74}$ each represent a polymerizable group;

$S^{11}$ to $S^{72}$ each represent a spacer group or a single bond, and in a case where a plurality of each of $S^{11}$ to $S^{72}$ is present, these may be the same as or different from each other;

$X^{11}$ to $X^{72}$ each represent —O—, —S—, —$OCH_2$—, —$CH_2O$—, —CO—, —COO—, —OCO—, —CO—S—, —S—CO—, —O—CO—O—, —CO—NH—, —NH—CO—, —$SCH_2$—, —$CH_2S$—, —$CF_2O$—, —$OCF_2$—, —$CF_2S$—, —$SCF_2$—, —CH═CH—COO—, —CH═CH—OCO—, —COO—CH═CH—, —OCO—CH═CH—, —COO—$CH_2CH_2$—, —OCO—$CH_2CH_2$—, —$CH_2CH_2$—COO—, —$CH_2CH_2$—OCO—, —COO—$CH_2$—, —OCO—$CH_2$—, —$CH_2$—COO—, —$CH_2$—OCO—, —CH═CH—, —N═N—, —CH═N—N═CH—, —CF═CF—, —C≡C—, or a single bond, and in a case where a plurality of each of $X^{11}$ to $X^{72}$ is present, these may be the same as or different from each other, provided that a P—(S—X)— bond each does not contain —O—O—;

$MG^{11}$ to $MG^{71}$ each independently represent Formula (a):

$$-(A^{11}\text{-}Z^{11})_{j11}\text{-}\underset{}{\overset{G}{\overset{|}{M}}}\text{-}(Z^{12}\text{-}A^{12})_{j12}- \tag{a}$$

wherein $A^{11}$ and $A^{12}$ each independently represent a 1,4-phenylene group, a 1,4-cyclohexylene group, a pyridine-2,5-diyl group, a pyrimidine-2,5-diyl group, a naphthalene-2,6-diyl group, a naphthalene-1,4-diyl group, a tetrahydronaphthalene-2,6-diyl group, a decahydronaphthalene-2,6-diyl group, or a 1,3-dioxane-2,5-diyl group, these groups may be unsubstituted or substituted with one or more of $L^1$'s, and in a case where a plurality of each of $A^{11}$ and $A^{12}$ is present, these may be the same as or different from each other;

$Z^{11}$ and $Z^{12}$ each independently represent —O—, —S—, —$OCH_2$—, —$CH_2O$—, —$CH_2CH_2$—, —CO—, —COO—, —OCO—, —CO—S—, —S—CO—, —O—CO—O—, —CO—NH—, —NH—CO—, —$SCH_2$—, —$CH_2S$—, —$CF_2O$—, —$OCF_2$—, —$CF_2S$—, —$SCF_2$—, —CH═CH—OCO—, —CH═CH—OCO—, —COO—CH═CH—, —OCO—CH═CH—, —COO—$CH_2CH_2$—, —OCO—$CH_2CH_2$—, —$CH_2CH_2$—COO—, —$CH_2CH_2$—OCO—, —COO—$CH_2$—, —OCO—$CH_2$—, —$CH_2$—COO—, —$CH_2$—OCO—, —CH═CH—, —N═N—, —CH═N—, —N═CH—, —CH═N—N═CH—, —CF═CF—, or a single bond, and in a case where a plurality of each of $Z^{11}$ and $Z^{12}$ is present, these may be the same as or different from each other;

M represents a group selected from groups represented by Formula (M-1) to Formula (M-11), which may be unsubstituted or substituted with one or more of $L^1$'s:

(M-1)

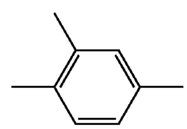

(M-2)

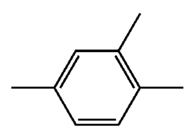

(M-3)

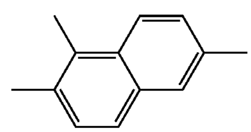

(M-4)

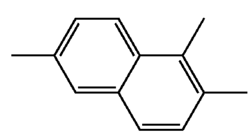

(M-5)

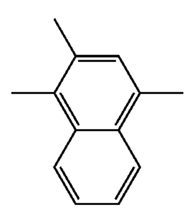

(M-6)

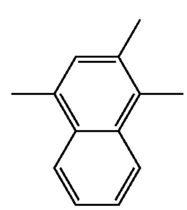

-continued (M-7)

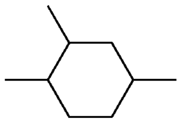

(M-8)

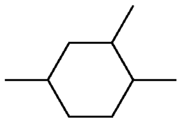

(M-9)

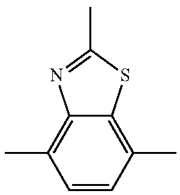

(M-10)

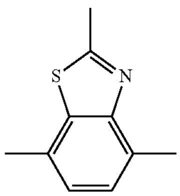

(M-11)

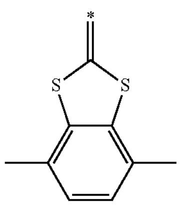

G represents a group selected from groups represented by Formula (G-1) to Formula (G-6):

(G-1)

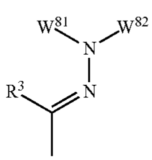

(G-2)

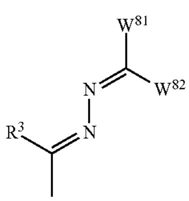

(G-3)

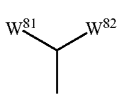

(G-4)

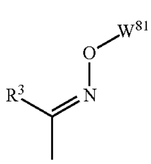

-continued (G-5)

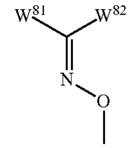

(G-6)

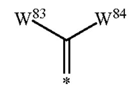

wherein $R^3$ represents a hydrogen atom or an alkyl group having 1 to 20 carbon atoms, the alkyl group may be linear or branched, one or more of arbitrary hydrogen atoms in the alkyl group may be substituted with a fluorine atom, and one-$CH_2$- or two or more of (—$CH_2$—)'s which are not adjacent to each other in the alkyl group may be each independently substituted with —O—, —S—, —CO—, —COO—, —OCO—, —CO—S—, —S—CO—, —O—CO—O—, —CO—NH—, —NH—CO—, or —C≡C—;

$W^{81}$ represents a group having at least one aromatic group and 5 to 30 carbon atoms, which may be unsubstituted or substituted with one or more of $L^1$'s;

$W^{82}$ represents a hydrogen atom or an alkyl group having 1 to 20 carbon atoms, the alkyl group may be linear or branched, one or more of arbitrary hydrogen atoms in the alkyl group may be substituted with a fluorine atom, one —$CH_2$— or two or more of (—$CH_2$—)'s which are not adjacent to each other in the alkyl group may be each independently substituted with —O—, —S—, —CO—, —COO—, —OCO—, —CO—S—, —S—CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—;

$W^{82}$ may have the same definition as $W^{81}$;

$W^{81}$ and $W^{82}$ may be linked to each other to form the same ring structure, or $W^{82}$ represents a group represented by the following formula:

$$P^{W82} \!-\!\!\left( S^{W82} - X^{W82} \right)_{n^{W82}}$$

wherein $P^{W82}$ has the same definition as $P^{11}$, $S^{W82}$ has the same definition as $S^{11}$, $X^{W82}$ has the same definition as $X^{11}$, and $n^{W82}$ has the same definition as m11;

$W^{83}$ and $W^{84}$ each independently represent a halogen atom, a cyano group, a hydroxy group, a nitro group, a carboxyl group, a carbamoyloxy group, an amino group, a sulfamoyl group, a group having at least one aromatic group and 5 to 30 carbon atoms, an alkyl group having 1 to 20 carbon atoms, a cycloalkyl group having 3 to 20 carbon atoms, an alkenyl group having 2 to 20 carbon atoms, a cycloalkenyl group having 3 to 20 carbon atoms, an alkoxy group having 1 to 20 carbon atoms, an acyloxy group having 2 to 20 carbon atoms, or an alkylcarbonyloxy group having 2 to 20 carbon atoms, and one-$CH_2$- or two or more of (—$CH_2$—)'s which are not adjacent to each other in the alkyl group, the cycloalkyl group, the alkenyl group, the cycloalkenyl group, the alkoxy group, the acyloxy group, and the alkylcarbonyloxy group may be each independently substituted with —O—, —S—, —CO—, —COO—, —OCO—, —CO—S—, —S—CO—, —O—CO—O—, —CO—NH—, —NH—CO—, or —C≡C—;

G represents a group selected from groups represented by Formula (G-1) to Formula (G-5) in a case where M represents a group selected from groups represented by Formula (M-1) to Formula (M-10);

G represents a group represented by Formula (G-6) in a case where M represents a group represented by Formula (M-11);

$L^1$ represents a fluorine atom, a chlorine atom, a bromine atom, an iodine atom, a pentafluorosulfuranyl group, a nitro group, an isocyano group, an amino group, a hydroxyl group, a mercapto group, a methylamino group, a dimethylamino group, a diethylamino group, a diisopropylamino group, a trimethylsilyl group, a dimethylsilyl group, a thioisocyano group, or an alkyl group having 1 to 20 carbon atoms which may be linear or branched, in which one or more of arbitrary hydrogen atoms may be substituted with a fluorine atom and one —$CH_2$— or two or more of (—$CH_2$—)'s which are not adjacent to each other in the alkyl group may be each independently substituted with a group selected from —O—, —S—, —CO—, —COO—, —OCO—, —CO—S—, —S-CO—, —O—CO—O—, —CO—NH—, —NH—CO—, —CH═CH—COO—, —CH═CH—OCO—, —COO—CH═CH—, —OCO—CH═CH—, —CH═CH—, —CF═CF—, or —C≡C—, and in a case where a plurality of $L^1$ is present, these may be the same as or different from each other;

j11 represents an integer of 1 to 5;

j12 represents an integer of 1 to 5; and j11+j12 represents an integer of 2 to 5;

$R^{11}$ and $R^{31}$ represent a hydrogen atom, a fluorine atom, a chlorine atom, a bromine atom, an iodine atom, a pentafluorosulfuranyl group, a cyano group, a nitro group, an isocyano group, a thioisocyano group, or an alkyl group having 1 to 20 carbon atoms, the alkyl group may be linear or branched, one or more of arbitrary hydrogen atoms in the alkyl group may be substituted with a fluorine atom, and one —$CH_2$— or two or more of (—$CH_2$—)'s which are not adjacent to each other in the alkyl group may be each independently substituted with —O—, —S—, —CO—, —COO—, —OCO—, —CO—S—, —S—CO—, —O—CO—O—, —CO—NH—, —NH—CO—, or —C≡C—;

m11 represents an integer of 0 to 8; and m2 to m7, n2 to n7, 14 to 16, and k6 each independently represent an integer of 0 to 5.

3. The circularly polarizing plate according to claim 1, wherein a phase difference Re1 (550) at a wavelength of 550 nm of the retardation plate 1 is from 230 to 290 nm, and a phase difference Re2 (550) at a wavelength of 550 nm of the retardation plate 2 is from 115 to 145 nm.

4. The circularly polarizing plate according to claim 1, wherein a slow axis of the retardation plate 1 has an angle of 5° to 25° and a slow axis of the retardation plate 2 has an angle of 65° to 85° based on a direction of a transmission axis of the polarizing plate, and the slow axis of the retardation plate 1 is located between the polarizing plate in the direction of the transmission axis and the slow axis of the retardation plate 2.

5. The circularly polarizing plate according to claim 1, wherein a slow axis of the retardation plate 1 has an angle of 65° to 85° and a slow axis of the retardation plate 2 has an angle of 5° to 25° based on a direction of a transmission axis of the polarizing plate, and the slow axis of the retardation plate 2 is located between the polarizing plate in the direction of the transmission axis and the slow axis of the retardation plate 1.

6. A display element comprising:

the circularly polarizing plate according to claim 1.

7. A light-emitting element comprising:

the circularly polarizing plate according to claim 1.

* * * * *